US007353144B1

(12) United States Patent
Rinks et al.

(10) Patent No.: US 7,353,144 B1
(45) Date of Patent: Apr. 1, 2008

(54) METHOD FOR DETERMINING A SET OF MATERIALS

(76) Inventors: Michael Shane Rinks, 3490 W. Lake Rd., Clio, MI (US) 48420; Timothy Steven Bennett, 6320 W. Vienna Rd., Clio, MI (US) 48420

( * ) Notice: Subject to any disclaimer, the term of this patent is extended or adjusted under 35 U.S.C. 154(b) by 326 days.

(21) Appl. No.: 10/694,492

(22) Filed: Oct. 27, 2003

Related U.S. Application Data

(60) Provisional application No. 60/421,378, filed on Oct. 25, 2002.

(51) Int. Cl.
*G06F 17/50* (2006.01)

(52) U.S. Cl. ............................................ 703/1; 703/22

(58) Field of Classification Search .................... 703/1, 703/2, 22; 705/400, 500; 707/104.1
See application file for complete search history.

(56) References Cited

U.S. PATENT DOCUMENTS

| | | | | |
|---|---|---|---|---|
| 6,446,053 | B1 * | 9/2002 | Elliott | 705/400 |
| 6,816,819 | B1 * | 11/2004 | Loveland | 703/1 |
| 6,826,516 | B1 * | 11/2004 | Ito | 703/1 |
| 6,922,701 | B1 * | 7/2005 | Ananian et al. | 707/104.1 |
| 2003/0115163 | A1 * | 6/2003 | Moore et al. | 705/500 |
| 2004/0073410 | A1 * | 4/2004 | Maly et al. | 703/1 |

OTHER PUBLICATIONS

Eastman, C.M. Database Facilities for Engineering Design, Proceedings of the IEEE, vol. 69, No. 10, Oct. 1981, pp. 1249-1263.*

Tarabia et al., A. Static and Dynamic Modeling of Light-Frame Wood Buildings, Computers & Structures, vol. 63, Iss. 2, Apr. 1997, pp. 319-334.*

Fig. 1-14 Cad Quest Jan. 28, 2001.

Fig. 15-37 20/20 Tech. Apr. 3, 2001.

Fig. 38-45 Menards Dec. 28, 2001.

Fig. 46-62, 64 20/20 Tech. Mar. 25, 2002.

Fig. 63 20/20 Tech. Jun. 21, 2000.

Fig. 65-89 Mr. Ken White Oct. 30, 2002.

Fig. 1-23 Rinks Construction, Inc. 1997.

Fig. 24-105 Rinks Construction, Inc. Oct. 2000.

Fig. 1-22 Chief Architect Residential Planner Version 7.02 Sep. 5, 2001.

* cited by examiner

*Primary Examiner*—Russell Frejd
(74) *Attorney, Agent, or Firm*—Flint Patent Service; Jack E. Tubbs

(57) ABSTRACT

A computer-implemented method includes determining a set of materials for constructing a wood frame building, comprising selecting a plurality of parameters for the wood frame building, accessing a database having information about a set of raw and finished goods, determining the set of materials based on the plurality of parameters for the wood frame building and the information about the set of raw and finished goods, and displaying the set of materials, wherein selecting a plurality of parameters for the wood frame building comprises selecting a plurality of parameters for walls, selecting a plurality of parameters for a roof, and selecting a plurality of parameters for at least one building opening.

61 Claims, 153 Drawing Sheets

FIG. 95

Construction Maestro version 2.0 planning made simple by Symun

| | |
|---|---|
| XYZ Lumber Co. | X Y Z Lumber Co.<br>2300 Austins Parkway Flint, MI 48507<br>Business: 810-233-3226 Fax: 810-233-3227<br>Sales Associate: Ernie |

Building Specfications

| | |
|---|---|
| Building Width | 24 Ft. |
| Building Length | 24 Ft. |
| Building Height | 10 Ft. |
| Eave Overhang | 12 in. |
| Gable Overhang | 12 in. |
| Pitch of Roof | 4 in./12 |
| Style of Building | Pole Barn |

| | |
|---|---|
| Customer Name | Jerry Jackson |
| Customer Address | 5522 W. Vienna Rd. Clio, MI 48420 |
| Customer Phone | Call 810.687.2211 |
| Estimate Number | 114 |
| Date of Estimate | 10/21/2002 This quote is good for 30 days. |

powered by Symun Systems, Inc. www.symun.com

Note: The reports, elevations, diagrams, and drawings included in this estimate are not architectural blueprints. The builder is responsible for structural integrity, proper usage of materials, and adhering to local building codes. Always be sure to verify the materials and drawing packet with your local building inspector, engineer, or architect. Every effort has been made to create accurate and detailed drawings and reports. However, due to the number of combinations of materials that can be used, there exists the possibility for errors. This packet is an estimate and should be reviewed by the builder before starting the project. Symun Systems, Inc accepts no responsibility for engineering, building codes violations, or the structural integrity of the building.

Copyright Symun Systems, Inc. 2001

East Side Elevation

West Side Elevation

South Side Elevation

North Side Elevation

Construction Maestro version 2.0

East Side-Gable Side 1 Wall Girt View

West Side- Gable Side 2 Wall Girt View

Construction Maestro version 2.0

South Side-Eave Side 1 Wall Girt View

Construction Maestro version 2.0

North Side-Eave Sid 2 Wall Girt View

Construction Maestro version 2.0

PLYWOOD LAYOUT

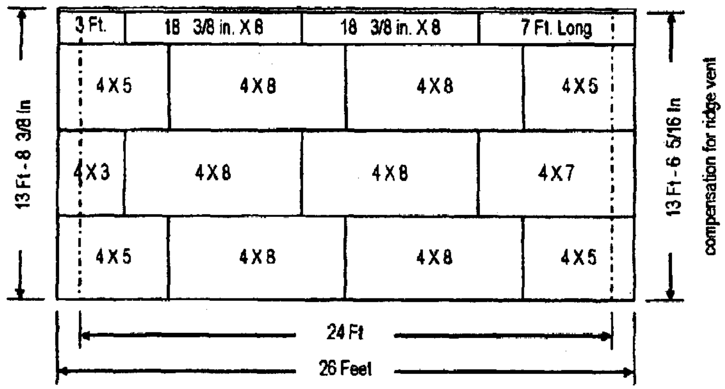

Estimate Number: 114

Customer Name: Jerry Jackson

Building Size: 24 ft. wide X 24 ft. long X 10 ft. tall

Pitch: 4 /12

Eave Overhang: 12 in. Gable Overhang: 12 in.

Truss Spacing: 24 in.

Top row starting piece is: 18 3/8 in. wide X 3 ft. long

Top row ending piece is: 18 3/8 in. wide X 7 ft. long

Beginning & odd row starter sheets are: 4 ft wide X 5 ft. long

2nd & even row starter sheets are: 4 ft wide X 3 ft. long

Beginning & odd row end sheets are: 4 ft wide X 5 ft. long

2nd & even row end sheets are: 4 ft. wide X 7 ft. long

Number of sheets per side: 13 pcs.

FIG. 106

Construction Maestro version 2.0

MASTER MATERIALS LIST

XYZ Lumber Co.

| QUANTITY | SKU | DESCRIPTION | COST @ | TOTAL COST |
|---|---|---|---|---|
| **BAGGED CEMENT** | | | | |
| 15 | C1099-4787 | Redi-Mix Concrete 80 Lbs. | $ 3.69 | $ 55.35 |
| **POLES** | | | | |
| 6 | 8614 | 4 x 6 x 14 Treated Southern Yellow Pine | $ 15.49 | $ 92.94 |
| 9 | 8616 | 4 x 6 x 16 Treated Southern Yellow Pine | $ 19.29 | $ 173.61 |
| **RATWALL** | | | | |
| 5 | 6128 | 2 x 12 Treated Southern Yellow Pine 8 Ft. | $ 10.59 | $ 52.95 |
| 1 | 61210 | 2 x 12 Treated Southern Yellow Pine 10 Ft. | $ 13.39 | $ 13.39 |
| 1 | 61216 | 2 x 12 Treated Southern Yellow Pine 16 Ft. | $ 22.49 | $ 22.49 |
| **WALL IRT** | | | | |
| 19 | 2496 | 2 x 4 Spf #2 Standard & Better 8 Ft. | $ 1.75 | $ 33.25 |
| 2 | 2410 | 2 x 4 Spf #2 Standard & Better 10 Ft. | $ 2.21 | $ 4.42 |
| 1 | 2412 | 2 x 4 Spf #2 Standard & Better 12 Ft. | $ 2.88 | $ 2.88 |
| 1 | 2414 | 2 x 4 Spf #2 Standard & Better 14 Ft. | $ 3.36 | $ 3.36 |
| 4 | 2418 | 2 x 4 Spf #2 Standard & Better 18 Ft. | $ 5.34 | $ 21.36 |
| **TRUSS CARRIER EXTERIOR EAVE** | | | | |
| 1 | 2108 | 2 x 10 Spf #2 Standard & Better 8 Ft. | $ 5.13 | $ 5.13 |
| 1 | 21012 | 2 x 10 Spf #2 Standard & Better 12 Ft. | $ 8.00 | $ 8.00 |
| 1 | 21014 | 2 x 10 Spf #2 Standard & Better 14 Ft. | $ 11.43 | $ 11.43 |
| 1 | 21020 | 2 x 10 Spf #2 Standard & Better 20 Ft. | $ 15.33 | $ 15.33 |
| **TOP GIRT EXTERIOR GABLE** | | | | |
| 1 | 2496 | 2 x 4 Spf #2 Standard & Better 8 Ft. | $ 1.75 | $ 1.75 |
| 1 | 2410 | 2 x 4 Spf #2 Standard & Better 10 Ft. | $ 2.21 | $ 2.21 |
| 1 | 2416 | 2 x 4 Spf #2 Standard & Better 16 Ft. | $ 3.99 | $ 3.99 |
| 1 | 2418 | 2 x 4 Spf #2 Standard & Better 18 Ft. | $ 5.34 | $ 5.34 |
| **TRUSS CARRIER INTERIOR** | | | | |

FIG. 107

Construction Maestro version 2.0

MASTER MATERIALS LIST

XYZ Lumber Co.

| QUANTITY | SKU | DESCRIPTION | COST @ | TOTAL COST |
|---|---|---|---|---|
| 1 | 2108 | 2 x 10 Spf #2 Standard & Better 8 Ft. | $ 5.13 | $ 5.13 |
| 1 | 21012 | 2 x 10 Spf #2 Standard & Better 12 Ft. | $ 8.00 | $ 8.00 |
| 1 | 21014 | 2 x 10 Spf #2 Standard & Better 14 Ft. | $ 11.43 | $ 11.43 |
| 1 | 21020 | 2 x 10 Spf #2 Standard & Better 20 Ft. | $ 15.33 | $ 15.33 |
| **TRUSS** | | | | |
| | | Note: Tail Size: 10.5 In, Eave Overhang: 12 in. 24 in. O.C. | | |
| 13 | C1099-4905 | Bear Truss Co. 24' 4/12 Pitch | $ 40.00 | $ 520.00 |
| **TRUSS SEAT** | | | | |
| 3 | 2496 | 2 x 4 Spf #2 Standard & Better 8 Ft. | $ 1.75 | $ 5.25 |
| 3 | 2418 | 2 x 4 Spf #2 Standard & Better 18 Ft. | $ 5.34 | $ 16.02 |
| **LATERAL BRACING** | | | | |
| 3 | 2496 | 2 x 4 Spf #2 Standard & Better 8 Ft. | $ 1.75 | $ 5.25 |
| 3 | 2418 | 2 x 4 Spf #2 Standard & Better 18 Ft. | $ 5.34 | $ 16.02 |
| **TRUSS BLOCK** | | | | |
| 2 | 2616 | 2 x 6 Spf #2 Standard & Better 16 Ft. | $ 6.32 | $ 12.64 |
| **FACIA STOCK** | | | | |
| 2 | 2696 | 2 x 6 Spf #2 Standard & Better 8 Ft. | $ 2.98 | $ 5.96 |
| 4 | 2614 | 2 x 6 Spf #2 Standard & Better 14 Ft. | $ 5.04 | $ 20.16 |
| 2 | 2620 | 2 x 6 Spf #2 Standard & Better 20 Ft. | $ 8.50 | $ 17.00 |
| **DOOR HEADER** | | | | |
| 2 | C1099 | 3.13 x 12 Glue Lam 9.25 Ft. | $ 91.80 | $ 183.60 |
| 2 | C1099-1405 | 3.13 x 16.5 Glue Lam 18.75 Ft. | $ 239.78 | $ 479.56 |
| **WINDOW FRAMING** | | | | |
| 2 | 2496 | 2 x 4 Spf #2 Standard & Better 8 Ft. | $ 1.75 | $ 3.50 |

FIG. 108

Construction Maestro version 2.0

MASTER MATERIALS LIST

XYZ Lumber Co.

| QUANTITY | SKU | DESCRIPTION | COST @ | TOTAL COST |
|---|---|---|---|---|
| **POLE BRACING** | | | | |
| 23 | 2416 | 2 x 4 Spf #2 Standard & Better 16 Ft. | $ 3.99 | $ 91.77 |
| **WALL LAYER 1** | | | | |
| 297.5 LF | C1099-1105 | Metal Sales Classic Rib Steel Siding- Color: Red | $ 1.65 | $ 490.88 |
| **ADDITIONAL STEEL PANEL FOR SLIDER** | | | | |
| 8 LF | C1099-1105 | Eave2: 1 14W x 8H Split Slider | $ 1.65 | $ 13.20 |
| **TRANSLUCENT PANELS** | | | | |
| 2 pcs. | C1099-59 | For: Eave1 White Classic Rib Pattern - 10 ft. 0 in. 0 % waste per panel | $ 21.79 | $ 43.58 |
| **WALL STEEL ACCESSORIES** | | | | |
| 15 pcs. | C1099-1921 | Brite White J-Channel 12 ft 0 in | $ 3.50 | $ 52.50 |
| 3 pcs. | C1099-2183 | Brite White Drip Cap 12 ft 0 in | $ 3.35 | $ 10.05 |
| 6 pcs. | C1099-2235 | Red Rat Guard 12 ft 0 in | $ 5.62 | $ 33.72 |
| 4 pcs. | C1099-1968 | Brite White Double Angle 12 ft 0 in | $ 3.50 | $ 14.00 |
| 4 pcs. | C1099-2097 | Brite White Outside Corner/Gable Trim 12 ft 0 in | $ 9.38 | $ 37.52 |
| 2 pcs. | C1099-2292 | Brite White 5 1/2 Post Trim 12 ft 0 in For Eave1 Door # 1 | $ 5.65 | $ 11.30 |
| 2 pcs. | C1099-2292 | Brite White 5 1/2 Post Trim 12 ft 0 in For Eave1 Door # 2 | $ 5.65 | $ 11.30 |
| **ROOF LAYER 1** | | | | |
| 26 | 86518 | 7/16 - 4 x 8 Oriented Strand Board | $ 4.99 | $ 129.74 |
| **ROOF LAYER 2** | | | | |
| 2 rolls | 90051 | #15 Warrior Brand Felt | $ 8.29 | $ 16.58 |
| **ROOF LAYER 3** | | | | |
| 22 bdls. | C1099-4855 | Owens Corning Classic Weathered Wood | $ 3.00 | $ 66.00 |

FIG. 109

Construction Maestro version 2.0

MASTER MATERIALS LIST

XYZ Lumber Co.

| QUANTITY | SKU | DESCRIPTION | COST @ | | TOTAL COST | |
|---|---|---|---|---|---|---|
| **PLY CLIPS** | | | | | | |
| 104 pcs. | 220921 | Kant-Sag Steel Ply-Clips (Sold by: Piece ) | $ | 0.10 | $ | 10.40 |
| **ROOF CAP** | | | | | | |
| 1 bdle. | C1099-4855 | Owens Coming Classic Weathered Wood | $ | 3.00 | $ | 3.00 |
| **ALUMINUM DRIP EDGE** | | | | | | |
| 11 pcs. | C1099 | White Wide Faced 10 ft Aluminum Drip Edge | $ | 3.29 | $ | 36.19 |
| **ROOF VENTS** | | | | | | |
| 2 rolls | 90050 | O.C. Vent Sure Roll Type Ridge Vent 20 ft | $ | 39.99 | $ | 79.98 |
| **FACIA & SOFFIT MATERIALS** | | | | | | |
| 11 pcs. | 16003 | Amerimax White Aluminum Facia 6 In in x 12 ft x 0 in | $ | 7.99 | $ | 87.89 |
| | | Soffit Installation (Vented Vrs. Solid) Ratios:<br>Eave Sides: For Every 4 Solid Panels Installed, Use 1 Vented Panel.<br>Gable Sides: Use All Solid Panels. | | | | |
| 8 pcs. | 16001 | White Aluminum Soffit 12 In x 12 ft x 0 in Solid (per Pc.) | $ | 8.99 | $ | 71.92 |
| 1 pcs. | 16002 | White Aluminum Soffit 12 in x 12 ft x 0 in Perforated Panel (per Pc.) | $ | 8.99 | $ | 8.99 |
| 10 pcs. | 16006 | White Aluminum FChannel 12 ft x 0 in | $ | 4.29 | $ | 42.90 |
| **OVERHEAD DOORS** | | | | | | |
| 2 | 6787 | 9100 White Torque Master 8' 0" x 7' 0" | $ | 287.00 | $ | 574.00 |
| **SERVICE DOORS & LOCKSETS** | | | | | | |
| 1 | 2118 | 3/0 C S 255 | $ | 154.00 | $ | 154.00 |
| 1 pc. | 221345 | Quality Craft Entry - Brass | $ | 7.69 | $ | 7.69 |

FIG. 110

Construction Maestro version 2.0

MASTER MATERIALS LIST

XYZ Lumber Co.

| QUANTITY | SKU | DESCRIPTION | COST @ | TOTAL COST |
|---|---|---|---|---|
| **WINDOWS** | | | | |
| 1 | 2284 | P S H 3040 Wh. Vinyl S/H W/Screen | $ 95.85 | $ 95.85 |
| **14W x 8H Split Slider** | | | | |
| 2 cnt | 711055 | 9 1/2" Delrin 4-Way Adj. Offset Bolt 711055 | $ 38.00 | $ 76.00 |
| 1 cnt | 711117 | Bracketrack System Rail-Face Mount 8 ft | $ 30.00 | $ 30.00 |
| 2 cnt | 711118 | Bracketrack System Rail-Face Mount 10 ft | $ 35.00 | $ 70.00 |
| 2 cnt | 646514 | Rail End Cap | $ 1.00 | $ 2.00 |
| 2 cnt | 724304 | #200 B White Vertical Side Rail 10 ft | $ 18.00 | $ 36.00 |
| 2 cnt | 724324 | #216 B White Not Punched Double Couple 10 ft | $ 20.00 | $ 40.00 |
| 1 cnt | 724828 | #210 Bottom Rail 14 ft | $ 28.00 | $ 28.00 |
| 1 cnt | 724576 | Stay Guide 2 10 ft | $ 20.00 | $ 20.00 |
| 2 cnt | 643411 | Heavy Duty Door Stop | $ 15.00 | $ 30.00 |
| 2 cnt | 651403 | Galvanized Adjustable Wind Stop | $ 15.00 | $ 30.00 |
| 2 cnt | 654501 | Zinc Plated Door Pull | $ 15.00 | $ 30.00 |
| 2 cnt | 711504 | Cam Latch | $ 15.00 | $ 30.00 |
| 1 cnt | 714359 | Center Stop | $ 15.00 | $ 15.00 |
| 1 cnt | 643404 | Door Snuggler | $ 15.00 | $ 15.00 |
| 3 cnt | C1099-2585 | Metal Sales Cannonball Track Cover | $ 6.89 | $ 20.67 |
| 3 cnt | C1099-2538 | Metal Sales Post Trim | $ 5.65 | $ 16.95 |
| 2 cnt | 465101 | Round Splice Collar | $ 2.00 | $ 4.00 |
| 1 cnt | 2696 | Track Board: 2 x 6 x 8 Spf #2 Standard & Better | $ 2.98 | $ 2.98 |
| 1 cnt | 2620 | Track Board: 2 x 6 x 20 Spf #2 Standard & Better | $ 8.50 | $ 8.50 |
| 1 cnt | 288 | Track Support: 2 x 8 x 8 Spf #2 Standard & Better | $ 3.84 | $ 3.84 |
| 1 cnt | 2820 | Track Support: 2 x 8 x 20 Spf #2 Standard & Better | $ 12.59 | $ 12.59 |
| 4 cnt | 2414 | Girts: 2 x 4 x 14 Spf #2 Standard & Better | $ 3.36 | $ 13.44 |
| **WEATHERSTRIPPING** | | | | |
| 2 | 409490 | White Overhead Door Weatherstrip 7 ft | $ 5.89 | $ 11.78 |
| 2 | C1099-5004 | White Overhead Door Weatherstrip 8 ft | $ 11.00 | $ 22.00 |

FASTENERS, Aluminum Facia, Aluminum Soffit

FIG. 111

Construction Maestro version 2.0

MASTER MATERIALS LIST

XYZ Lumber Co.

| QUANTITY | SKU | DESCRIPTION | COST @ | TOTAL COST |
|---|---|---|---|---|
| 2 box | C1099-2449 | White 1 1/4" Alum. Trim Nails | $ 6.95 | $ 13.90 |
| **FASTENERS, Steel Wall Trim** | | | | |
| 3 box | C1099-3155 | Metal Sales Brite White 2 1/2" Neoprene Siding Screws | $ 18.75 | $ 56.25 |
| **FASTENERS, Wall Layer 1 Steel Siding** | | | | |
| 5 box | C1099-3164 | Metal Sales Red 2 1/2" Neoprene Siding Screws | $ 18.75 | $ 93.75 |
| **FASTENERS, Roof Layer 2 Felt** | | | | |
| 1 pkg | 217100 | 3/8" T50 506 Arrow Staples | $ 3.49 | $ 3.49 |
| **FASTENERS, Roof Layer 3 Shingles** | | | | |
| 3 box | 80414 | 5 Lb. Box 3G 1 1/4" Galv H.D. Roofing Nails | $ 5.99 | $ 17.97 |
| **FASTENERS, Truss** | | | | |
| 1 box | 80187 | 5 Lb. Box 3G 16D C.C. Sinkers | $ 4.99 | $ 4.99 |
| **FASTENERS, Ratwall** | | | | |
| 1 box | 80102 | 5 Lb. Box 3G 16D Galv. Spiral Nails | $ 6.99 | $ 6.99 |
| **FASTENERS, Wall Girt** | | | | |
| 2 box | 80300 | 5 Lb. Box 3G 16D Stiff Polebarn Nails | $ 6.99 | $ 13.98 |
| **FASTENERS, Top Girt Exterior, Top Girt Interior** | | | | |
| 11 lbs | C1099-4828 | 3G 60D Stiff Polebarn Nails | $ 1.79 | $ 19.69 |
| **FASTENERS, Roof Layer 1 Plywood or OSB** | | | | |
| 2 box | 80184 | 5 Lb. Box 3G 8D C.C. Sinkers | $ 4.99 | $ 9.98 |
| **MISCELLANEOUS ITEMS** | | | | |
| 1 | 712136 | Cannonball;H N P Cover Retainer Bracket 712136 | $ 2.00 | $ 2.00 |
| **SUBTOTAL:** | | | | $4,860.72 |

FIG. 112

Construction Maestro version 2.0

MASTER MATERIALS LIST

XYZ Lumber Co.

| QUANTITY | SKU | DESCRIPTION | COST @ | TOTAL COST |
|---|---|---|---|---|
| TAX: | | | | $291.64 |
| GRAND TOTAL: | | | | $5,152.36 |

FIG. 113

Construction Maestro version 2.0

MASTER MATERIALS LIST

XYZ Lumber Co.

| QUANTITY | SKU | DESCRIPTION | COST @ | TOTAL COST |
|---|---|---|---|---|
| **CEMENT, SPREAD FOOTING** | | | | |
| 0.89 yds | | Concrete | | |
| **CEMENT, SLAB** | | | | |
| 1.78 yds | | Concrete per inch thickness | | |
| **TRUSS** | | | | |
| | | Note: Tail Size: 10.5 In, Eave Overhang: 12 In. 24 in. O.C. | | |
| 13 | C1099-4905 | Bear Truss Co. 24' 4/12 Pitch | $ 40.00 | $ 520.00 |
| **TRUSS SEAT** | | | | |
| 3 | 2496 | 2 x 4 Spf #2 Standard & Better 8 Ft. | $ 1.75 | $ 5.25 |
| 3 | 2418 | 2 x 4 Spf #2 Standard & Better 18 Ft. | $ 5.34 | $ 16.02 |
| **LATERAL BRACING** | | | | |
| 3 | 2496 | 2 x 4 Spf #2 Standard & Better 8 Ft. | $ 1.75 | $ 5.25 |
| 3 | 2418 | 2 x 4 Spf #2 Standard & Better 18 Ft. | $ 5.34 | $ 16.02 |
| **FACIA STOCK** | | | | |
| 2 | 2696 | 2 x 6 Spf #2 Standard & Better 8 Ft. | $ 2.98 | $ 5.96 |
| 4 | 2614 | 2 x 6 Spf #2 Standard & Better 14 Ft. | $ 5.04 | $ 20.16 |
| 2 | 2620 | 2 x 6 Spf #2 Standard & Better 20 Ft. | $ 8.50 | $ 17.00 |
| **DOOR HEADER** | | | | |
| 2 | 2696 | 2 x 6 Spf #2 Standard & Better 8 Ft. | $ 2.98 | $ 5.96 |
| **STUD BRACING** | | | | |
| 12 | 2416 | 2 x 4 Spf #2 Standard & Better 16 Ft. | $ 3.99 | $ 47.88 |
| **STUDS** | | | | |
| 78 | 2492 | 2 x 4 Spf #2 Standard & Better 7.72 Ft. | $ 1.66 | $ 129.48 |

FIG. 114

Construction Maestro version 2.0

SPECIAL ORDER MATERIALS LIST

XYZ Lumber Co.

| QUANTITY | SKU | DESCRIPTION | ORDER CODE | COST @ |
|---|---|---|---|---|
| **TRUSS** | | | | |
| 13 | C1099-4905 | Bear Truss Co. 24' 4/12 Pitch | | $ 40.00 |
| **SERVICE DOORS & LOCKSETS** | | | | |
| 1 | 2118 | 3/0 C S 255 | | $ 154.00 |
| **14W x 8H Split Slider** | | | | |
| 2 cnt | 711055 | 9 1/2" Delrin 4-Way Adj. Offset Bolt 711055 | | $ 38.00 |
| 1 cnt | 711117 | Bracketrack System Rail-Face Mount 8 ft | | $ 30.00 |
| 2 cnt | 711118 | Bracketrack System Rail-Face Mount 10 ft | | $ 35.00 |
| 2 cnt | 646514 | Rail End Cap | | $ 1.00 |
| 2 cnt | 724304 | #200 B White Vertical Side Rail 10 ft | | $ 18.00 |
| 2 cnt | 724324 | #216 B White Not Punched Double Couple 10 ft | | $ 20.00 |
| 1 cnt | 724828 | #210 Bottom Rail 14 ft | | $ 28.00 |
| 1 cnt | 724576 | Stay Guide 2 10 ft | | $ 20.00 |
| 2 cnt | 643411 | Heavy Duty Door Stop | | $ 15.00 |
| 2 cnt | 651403 | Galvanized Adjustable Wind Stop | | $ 15.00 |
| 2 cnt | 654501 | Zinc Plated Door Pull | | $ 15.00 |
| 2 cnt | 711504 | Cam Latch | | $ 15.00 |
| 1 cnt | 714359 | Center Stop | | $ 15.00 |
| 1 cnt | 643404 | Door Snuggler | | $ 15.00 |
| 3 cnt | C1099-2585 | Metal Sales Cannonball Track Cover | 42703-39 | $ 6.89 |
| 3 cnt | C1099-2538 | Metal Sales Post Trim | 42464-39 | $ 5.85 |
| 2 cnt | 465101 | Round Splice Collar | | $ 2.00 |
| TOTAL ITEMS: | | | | 19 |
| TOTAL PIECES: | | | | 45 |

FIG. 115

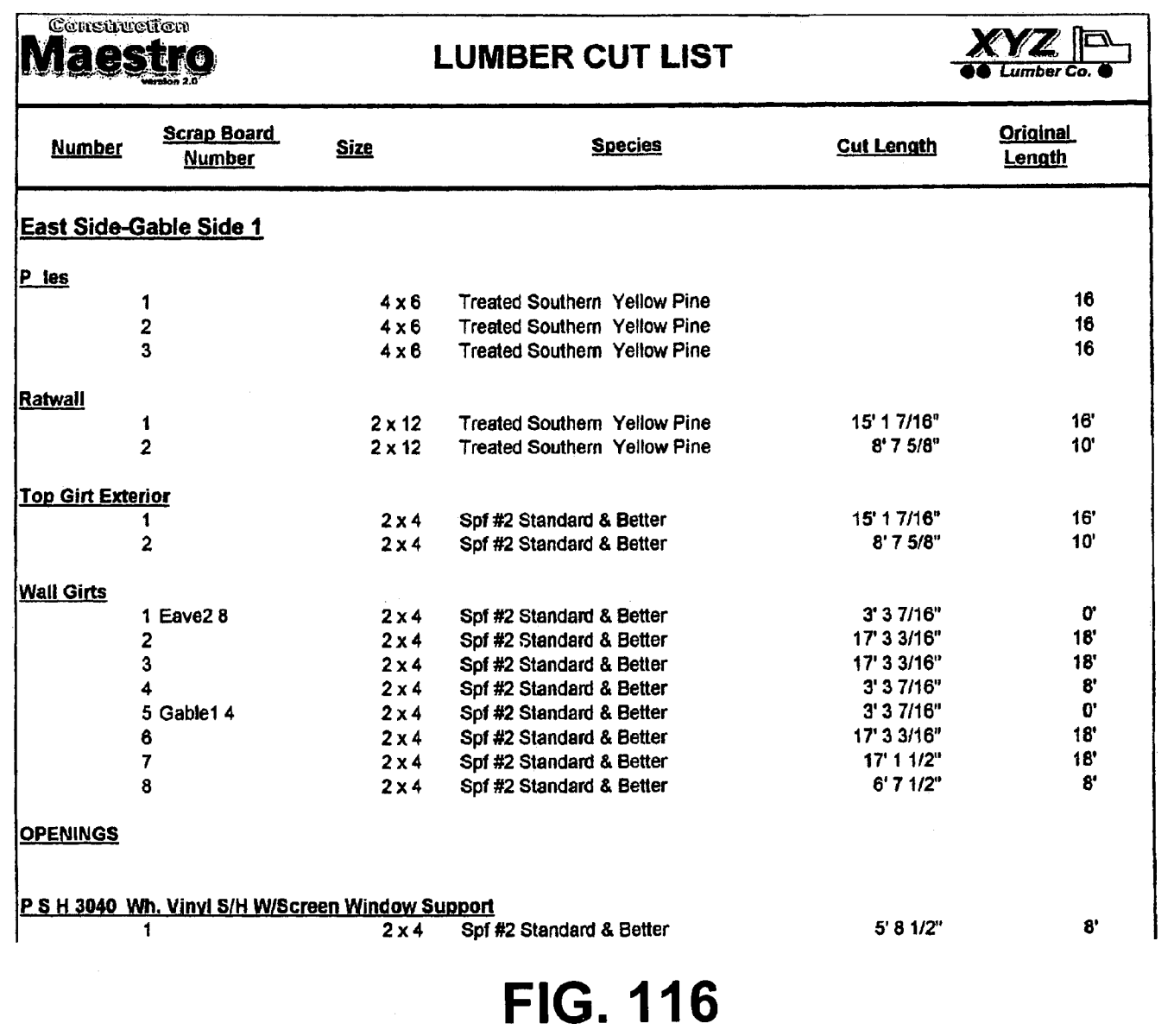

Construction Maestro version 2.0

LUMBER CUT LIST

XYZ Lumber Co.

| Number | Scrap Board Number | Size | Species | Cut Length | Original Length |
|---|---|---|---|---|---|
| **East Side-Gable Side 1** | | | | | |
| **P les** | | | | | |
| 1 | | 4 x 6 | Treated Southern Yellow Pine | | 16 |
| 2 | | 4 x 6 | Treated Southern Yellow Pine | | 16 |
| 3 | | 4 x 6 | Treated Southern Yellow Pine | | 16 |
| **Ratwall** | | | | | |
| 1 | | 2 x 12 | Treated Southern Yellow Pine | 15' 1 7/16" | 16' |
| 2 | | 2 x 12 | Treated Southern Yellow Pine | 8' 7 5/8" | 10' |
| **Top Girt Exterior** | | | | | |
| 1 | | 2 x 4 | Spf #2 Standard & Better | 15' 1 7/16" | 16' |
| 2 | | 2 x 4 | Spf #2 Standard & Better | 8' 7 5/8" | 10' |
| **Wall Girts** | | | | | |
| 1 | Eave2 8 | 2 x 4 | Spf #2 Standard & Better | 3' 3 7/16" | 0' |
| 2 | | 2 x 4 | Spf #2 Standard & Better | 17' 3 3/16" | 18' |
| 3 | | 2 x 4 | Spf #2 Standard & Better | 17' 3 3/16" | 18' |
| 4 | | 2 x 4 | Spf #2 Standard & Better | 3' 3 7/16" | 8' |
| 5 | Gable1 4 | 2 x 4 | Spf #2 Standard & Better | 3' 3 7/16" | 0' |
| 6 | | 2 x 4 | Spf #2 Standard & Better | 17' 3 3/16" | 18' |
| 7 | | 2 x 4 | Spf #2 Standard & Better | 17' 1 1/2" | 18' |
| 8 | | 2 x 4 | Spf #2 Standard & Better | 6' 7 1/2" | 8' |
| **OPENINGS** | | | | | |
| **P S H 3040 Wh. Vinyl S/H W/Screen Window Support** | | | | | |
| 1 | | 2 x 4 | Spf #2 Standard & Better | 5' 8 1/2" | 8' |

FIG. 116

East Side-Gable Side 1 Steel Layout

West Side-Gable Side 2 Steel Layout

South Side-Eave Side 1 Steel Layout

North Side-Eave Side 2 Steel Layout

Construction Maestro version 2.0

DETAIL A

Panel # 4 on East Side-Gable Side 1

DETAIL B

Panel # 4 on West Side-Gable Side 2

Construction Maestro version 2.0

STEEL PANEL LAYOUT

Metal by metal sales manufacturing corporation

| Panel Number | Width | Height | GABLE ONLY | | PEAK ONLY | | | |
|---|---|---|---|---|---|---|---|---|
| | | | Low Side | High Side | Lap Side | High Point | Opposite of Lap Side | Horizontal From Lap End To High Point |
| **METAL SIDING** | | | | | | | | |
| **South Side-Eave Side 1** | | | | | | | | |
| 1 | 38 in | 96 in. | | | | | | |
| 2 | 38 in | 9 11/16 in | | | | | | |
| 3 | 38 in | 9 11/16 in | | | | | | |
| 4 | 38 in | 96 in. | | | | | | |
| 5 | 38 in | 96 in. | | | | | | |
| 6 | 38 in | 9 11/16 in | | | | | | |
| 7 | 38 in | 9 11/16 in | | | | | | |
| 8 | 36 in | 96 in. | | | | | | |
| **North Side-Eave Side 2** | | | | | | | | |
| 1 | 38 in | 116 in. | | | | | | |
| 2 | 38 in | 116 in. | | | | | | |
| 3 | 38 in | 116 in. | | | | | | |
| 4 | 38 in | 116 in. | | | | | | |
| 5 | 38 in | 116 in. | | | | | | |
| 6 | 38 in | 116 in. | | | | | | |
| 7 | 38 in | 116 in. | | | | | | |
| 8 | 36 in | 116 in. | | | | | | |
| **East Side-Gable Side 1** | | | | | | | | |
| 1 | 38 in | | 119 5/8 in | 132 5/16 in | | | | |
| 2 | 38 in | | 131 5/8 in | 144 5/16 in | | | | |
| 3 | 38 in | | 143 5/8 in | 156 5/16 in | | | | |
| 4 | 38 in | | 155 5/8 in | 167 5/8 in | 155 5/8 in | 167 5/8 in | 166 15/16 in | 36 in. |
| 5 | 38 in | | 154 15/16 in | 167 5/8 in | | | | |
| 6 | 38 in | | 142 15/16 in | 155 5/8 in | | | | |

FIG. 123

Construction Maestro version 2.0

STEEL PANEL LAYOUT

Metal by metal sales manufacturing corporation

| Panel Number | Width | Height | GABLE ONLY | | PEAK ONLY | | | |
|---|---|---|---|---|---|---|---|---|
| | | | Low Side | High Side | Lap Side | High Point | Opposite of Lap Side | Horizontal From Lap End To High Point |
| 7 | 38 in | | 130 15/16 in | 143 5/8 in | | | | |
| 8 | 36 in | | 119 5/8 in | 131 5/8 in | | | | |
| **West Side-Gable Side 2** | | | | | | | | |
| 1 | 38 in | | 119 5/8 in | 132 5/16 in | | | | |
| 2 | 38 in | | 131 5/8 in | 144 5/16 in | | | | |
| 3 | 38 in | | 143 5/8 in | 156 5/16 in | | | | |
| 4 | 38 in | | 57 5/16 in | 69 5/16 in | 57 5/16 in | 69 5/16 in | 68 5/8 in | 36 in. |
| 5 | 38 in | | 56 5/8 in | 69 5/16 in | | | | |
| 6 | 38 in | | 142 15/16 in | 155 5/8 in | | | | |
| 7 | 38 in | | 130 15/16 in | 143 5/8 in | | | | |
| 8 | 36 in | | 119 5/8 in | 131 5/8 in | | | | |

FIG. 124

Construction Maestro version 2.0

STEEL ORDER FORM courtesy of metal sales manufacturing corporation

| Count | Order Code | Type | Description | Dimensions | Color Code | Color |
|---|---|---|---|---|---|---|
| **SIDING** | | | | | | |
| 4 | | Panel | Classic Rib | 10" | (24) | Red |
| 2 | | Panel | Classic Rib | 5' 10" | (24) | Red |
| 5 | | Panel | Classic Rib | 8' | (24) | Red |
| 8 | | Panel | Classic Rib | 9' 8" | (24) | Red |
| 2 | | Panel | Classic Rib | 11' | (24) | Red |
| 2 | | Panel | Classic Rib | 11' 1" | (24) | Red |
| 2 | | Panel | Classic Rib | 12' | (24) | Red |
| 2 | | Panel | Classic Rib | 12' 1" | (24) | Red |
| 2 | | Panel | Classic Rib | 13' | (24) | Red |
| 2 | | Panel | Classic Rib | 13' 1" | (24) | Red |
| 2 | | Panel | Classic Rib | 14' | (24) | Red |
| **WALL STEEL ACCESSORIES** | | | | | | |
| 15 | 42264-39 | Accessory | Brite White J-Channel 12 ft | 12 ft 0 in | (39) | Brite White |
| 3 | 42924-39 | Accessory | Brite White Drip Cap 12 ft 0 | 12 ft 0 in | (39) | Brite White |
| 6 | 42226-24 | Accessory | Red Rat Guard 12 ft 0 in | 12 ft 0 in | (24) | Red |
| 4 | 49070-39 | Accessory | Brite White Double Angle 12 | 12 ft 0 in | (39) | Brite White |
| 4 | 42164-39 | Accessory | Brite White Outside Corner/C | 12 ft 0 in | (39) | Brite White |
| 2 | 42464-39 | Accessory | Brite White 5 1/2 Post Trim | 12 ft 0 in | (39) | Brite White |
| 2 | 42464-39 | Accessory | Brite White 5 1/2 Post Trim | 12 ft 0 in | (39) | Brite White |
| **FASTENERS** | | | | | | |

FIG. 125

Construction Maestro version 2.0

STEEL ORDER FORM courtesy of metal sales manufacturing corporation

| Count | Order Code | Type | Description | Dimensions | Color Code | Color |
|---|---|---|---|---|---|---|
| 3 Box | | Fastener | Metal Sales Brite White 2 1/2" Neoprene Sidin | | (39) | Brite White |
| 5 Box | | Fastener | Metal Sales Red 2 1/2" Neoprene Siding Screv | | (24) | Red |

CUSTOMER

Name: Jerry Jackson
Address: 5522 W. Vienna Rd.
Clio, MI 48420
Phone: 810.687.2211

Company: X Y Z Lumber Co.
Salesperson: Ernie
Phone: 810-233-3226
PO: 10114

Steel Co. Phone 812-246-1866
Fax To: 812-246-0893

FIG. 126

Construction Maestro version 2.

Truss Application Detail 1-T

GENERAL NOTES
CONTACT LOCAL BUILDING OFFICIAL FOR MINIMUM NAILING PATTERNS FOR ALL CONNECTIONS.
DETAILS ARE FOR GENERAL USE AND NOT INTENDED TO ANSWER ALL LOCAL STRUCTURAL SNOW AND WIND SHEAR LOADS.

Construction Maestro version 2.0

Overhang Detail 1-O

Construction Maestro version 2.0

Overhang Detail 1-O

Construction Maestro version 2.0

Wall Section 1-W

Estimate Number: 114
Customer: Jerry Jackson

Construction Maestro version 2.0

Wall Section 1-W

Estimate Number: 119
Customer: Tom Jones

Construction
Maestro
version 2.

Purlin Application Detail

GENERAL NOTES
CONTACT LOCAL BUILDING OFFICIAL FOR MINIMUM NAILING PATTERNS FOR ALL CONNECTIONS.
DETAILS ARE FOR GENERAL USE AND NOT INTENDED TO ANSWER ALL LOCAL STRUCTURAL SNOW AND WIND SHEAR LOADS.

Construction Maestro version 2.0

Purlin Application Detail

Construction
Maestro
version 2.0

Purlin Application Detail

Construction Maestro version 2.0

Bracing Detail 1-T

Construction
Maestro
version 2.

Bracing Detail

GENERAL NOTES
CONTACT LOCAL BUILDING OFFICIAL FOR MINIMUM NAILING PATTERNS FOR ALL CONNECTIONS.
DETAILS ARE FOR GENERAL USE AND NOT INTENDED TO ANSWER ALL LOCAL STRUCTURAL SNOW AND WIND SHEAR LOADS.

Construction Maestro version 2.0

Pole Barn Cross Section

Construction Maestro version 2.0

Garage Cross Section

Messages That Can Be Loaded To The Message Center Window

"All Openings For This Estimate Will Be Deleted Due To Dimension Changes."
-User will receive this message if they have changed the dimensions to an existing estimate or template.

"Y Bracing Is Not Necessary For Pole Configuration & A Plywood Wall Layer."
-User will receive this message if the user has chosen both plywood as a wall layer and Y bracing. Plywood is sufficient to replace the Y Bracing.

"Contact Between Steel Gutters & Aluminum Facia Can Cause Corrosion."
"Contact Between Aluminum Gutters & Steel Facia Can Cause Corrosion."
-User will receive this message if the user has chosen Steel Gutters and Aluminum Facia or vice versa.

"Insulation Is Not An Approved Exposed Wall Layer"
-User will receive this message if the user has chosen the LAST wall layer that is something other than Wood Panel Siding, Steel Siding, Vinyl Siding, or Wood Siding. They would be picking Insulation, Wall Wrap or Plywood to receive this message.

"Felt Is Not An Approved Exposed Roof Layer"
-User will receive this message if the user has chosen the LAST roof layer that is something other than Shingles, Steel Panel, or Special Roofing Product. They would be picking Insulation, Felt or Plywood to receive this message.

"Warning: There Are No Vents Selected For The Shingled Roof."
-User picked a shingled roof without some type of vents (roll, pan, or ridge)

"No Felt Was Selected For The Shingled Roof"
-User picked a shingled roof but did not pick felt as a previous layer.

"All Steel Jamb Covering Has Been Changed To Coil Stock Aluminum."
-In the event that the user changes an existing estimate from a steel sided building to a building sided with something else other than steel, (Vinyl, Wood Siding, Wood Panel). Therefore, any steel jamb covering used must change to Aluminum Facia, Vinyl Facia, or Coil Stock. If the user changed from steel siding to vinyl siding, the system tries to replace the steel jamb covering with vinyl facia, matching the color of the vinyl siding. Otherwise change to coil stock aluminum.

FIG. 158A

Messages That Can Be Loaded To The Message Center Window (continued)

"Converted Steel Jamb For Opening 1"
-In the event that the user changes steel companies for an existing estimate, the system will try to convert the steel jamb covering to a new matching jamb covering for the new steel company by matching on appropriate size, color, and style. In the event that it cannot match, the user will receive the following message:
"Could Not Convert Steel Jamb For Opening 1"

"All Sliders Will Be Deleted Due To Change In Outside Wall Layer."
-In the event that the user changes from a steel wall to a wall other than steel, sliders will be deleted since the steel track cover is no longer valid.

"All Translucent Panels Have Been Removed: Not Compatible With Current Outside Wall Layer."
-In the event that the user changes from a steel wall to a wall other than steel, translucent panels will be deleted since they are no longer valid.

"Pole Barn Looks Great! No Warnings or Conflicts To Report."
-In the event that none of the above events occur, the user receives a compliment message when creating a pole barn.

"Garage Looks Great! No Warnings or Conflicts To Report."
-In the event that none of the above events occur, the user receives a compliment message when creating a garage.

FIG. 158B

North Side-Eave Side 2 Wall Girt View

Construction Maestro version 2.0 matchpolestotruss.xls

South Side-Eave Side 1 Wall Girt View

Construction Maestro version 2.0 matchpolestotruss.xls

Construction Maestro version 2.0

East Side-Gable Side 1 Wall Girt View matchpolestotruss.xls

Construction Maestro version 2.0

West Side-Gable Side 2 Wall Girt View matchpolestotruss.xls matchpolestotruss.xls letsystemoptimize.xls

SUMMARY OF EXAMPLES:

Must have at least one Wall Material Layer.

Wall Material Layers must be compatible.

Must have at least one Roofing Material Layer.

Roofing Material Layers must be compatible.

If Steel Panel is a Roofing Material Layer, a steel panel supplier must be chosen.

If Steel Panel is a Roofing Material Layer, a Roof Trim color must be chosen.

If Steel Panel is a Roofing Material Layer, roof purlins must be specified.

Maximum number of ridge vents is limited, based on the length of the roof and vents selected.

Purlin Spacing cannot be less than 1 inch.

For Fasten Purlin on Edge between Trusses, selection of Bird Board is prevented.

Use of shingles also requires roof Vents (only one type is permitted).

Truss Top, Bottom Chord Live load cannot be less than zero.

Truss Top, Bottom Chord Dead load cannot be less than zero.

For Trusses, Non-Standard Heel Height must be a number.

Translucent Panels may not be selected for the Gable walls.

At least one nonwindow/non translucent panel opening is required per building. (I.e. a valid entryway for a person.)

Currently No Fasteners To Choose From message appears if the user selects Add Fastener to Building Component without first selecting a building component.

FIG. 174A

If the spacing for wall girts is modified while keeping translucent panels, when the program recalculates the estimate, BIPEC will inform the user that the Height of the translucent panels has also been changed.

OTHER EXAMPLES:

Main Tab

"You Must Choose A Type Before Continuing."
Forces user to choose either Estimates or Custom Templates Template Tab "You Must Choose A Template Update Type Before Continuing."
Forces user to choose either Update Template or Create A New Estimate From Selected Template Customer Tab Directions – If user has set directions as required in system settings, directions cannot be a space or null value Tax – Must be a numeric value from 0 to 100

Salesperson – If user has set salesperson as required in system settings, salesperson cannot be [NONE], space, or null value Email Address – If user has set email address as required in system settings, email cannot be a space or null value, and must be less than 51 characters Phone Number – If user has set phone number as required in system settings, phone cannot be a space or null value, and must be less than 21 characters Zip Code – If user has set zip code as required in system settings, zip code cannot be a space or null value, and must be 5 digits in length State - If user has set state as required in system settings, state must be 2 characters long, and one of the selections provided.

FIG. 174B

City - If user has set city as required in system settings, cannot be a space or null value, and must be less than 51 characters Address - If user has set address as required in system settings, cannot be a space or null value, and must be less than 51 characters Last Name - If user has set last name as required in system settings, cannot be a space or null value, and must be less than 31 characters First Name - If user has set first name as required in system settings, cannot be a space or null value, and must be less than 26 characters Walls Tab Wall Layer- If user has set wall layer as required in system settings, user must pick at least one wall layer.

Truss Block/Hurricane Clip – If the user is using a truss carrier, the user must pick a truss block or hurricane clip or both.

Top Girt Exterior – User must choose a top girt exterior species and size

Wall Girt – User must choose wall girt species and size

Skirt Board – User must choose a skirt board species and size, as well as number of rows Poles – User must choose a pole species and size Foundation – User must choose a foundation type Length – Must be numeric from 8 ft to 2000 ft Width – Must be numeric from 8 ft to 100 ft Ceiling Height – Must be numeric from 7 ft to 40 ft Max Pole Length - Based on the ceiling height, foundation depth, height of foundation, difference between finished earth grade point and finished floor point, the system will verify that there are poles long enough. If not the user will be forced to pick different poles or change ceiling height or foundation dimensions.

FIG. 174C

Assure that the skirt board, wall girts, top girt exterior, and top girt interior are long enough to span the pole spacing distances – The system checks the selections made for these components and verifies that there lumber in product setup long enough to span the pole spacing values on the eave and gable ends.

Truss Block – Verifies that the truss block chosen matches the size and orientation of the eave poles if truss blocks are required/chosen.

In the event of any dimension change (ceiling height, width, length) to an existing estimate, the user will be notified that all doors and openings will be removed. Further, if the user changes the width on an existing estimate, the user will be notified that they will need to pick a new truss.

Roof Tab

Vents – Only required if user has system setting of vents on shingled roof selected.

Overhangs – Must be an integer value unless using soffit/facia combo, then the overhang can be a decimal value. If user changes overhangs on an existing estimate from a value greater than 0 to 0, delete soffit from the estimate.

Purlins – required for a steel roof or if truss spacing is over 24"

Pitch – required, minimum 3, maximum 24. If user changes pitch on an existing estimate, user will need to enter a new truss product.

Roof Layer 1 – Only required if user has system setting or required roof layer selected.

Steel Roof – If the user had changed the steel company for steel walls on an existing estimate and the estimate had a steel roof, the system will verify that the user had picked a new steel roof panel and color.

If the user changes an existing estimate from an overhang greater than 0 to 0 overhang, and the user had previously selected soffit/facia combo, the soffit/facia combo is removed from the estimate and the user is forced to choose a new facia covering.

FIG. 174D

If the user changes an existing estimate from a 0 overhang to an overhang greater than 0, the user will be forced to make a soffit selection.

Truss Tab

Truss phone, company, contact name, sku, price, bottom chord size, top chord size, plys, non standard heel height (if chosen), heel height (if chosen), bottom chord dead load, bottom chord live load, top chord live load, top chord dead load, and truss spacing are required. The user can search for a matching truss product. If found, the user can select it and load the truss product information section. If the truss product is not found, the user must enter in a new truss product.

Facia/Soffit/Gutter

Facia Stock – User is required to pick facia stock unless the last wall layer is steel, the last roof layer is steel, and has a 0 overhang.

Window/Corner Trim – If the user has picked wood panel siding or wood siding as a wall layer, the user must choose a window/corner trim species and size.

If overhangs are greater than 0, soffit is required.

Facia Covering is required unless the user chose 0 overhangs, steel wall, and steel roof.

System verifies that the facia covering selected fits the facia stock selected.

System verifies that the overhang values are integer values unless the user chose soffit/facia combo in which case the overhang values could be decimal values.

Fasteners

System verifies that for each component listed, the user has selected a fastener.

FIG. 174E

Garage

Sill Type – User must choose a sill type, depending on the foundation selected.

- For Slab foundation, user must pick the following:
  - "Concrete Slab With Bottom Plate"
- For a Block or Poured Foundation user has the following choices:
  - "Block or Poured Foundation With Foundation Sill Plate"
  - "Block or Poured Foundation Without Foundation Sill Plate"

Foundation Sill Plate – User must choose a foundation sill plate species & size if the user has selected a sill type of "Block or Poured Foundation With Foundation Sill Plate".

User must choose a stud species and size

User must choose a foundation type, block or slab.

Steel Siding: User must choose either plywood or wall girts to have steel siding on a garage.

Openings

System will not allow openings to overlap each other. In this case the system will prompt the user to move the currently selected opening left or right.

System will not allow windows to be placed on top of a pole. In this case the system will prompt the user to move the window left or right.

System will not allow the user to add openings when the total width of all the openings combined for the current structure side exceeds the length of that side.

System will prevent user from adding an opening when the total combined height of the opening, door jamb thickness and header exceeds the ceiling height on the eave sides.

System will prevent the user from adding an opening when the total combined height of the opening and door jamb thickness exceeds the ceiling height on any side.

FIG. 174F

System will not allow the user to add an overhead door when the total combined height of the overhead door and the height needed for the track radius exceeds the ceiling height on the eave side.

System will not allow an opening to be added when the components for the selected header configuration cannot span the combination of the opening width, door jamb thickness, and bearing value.

System will not allow a slider to be added on the eave ends if the height of the slider door opening, in combination with the door jamb thickness and height of the track board over the opening exceeds the point at which the soffit panel planes into the eave side of the structure.

User is only allowed one color of coil stock for all openings on a particular structure. If the user changes coil stock color, the user is prompted to either change all the other previously selected coil stock to the new color or keep the previously selected coil stock color.

For an existing estimate, system verifies that all opening components still exist in product setup. If the system encounters a missing component, the user is notified and given an opportunity to make a change.

If the user has set the At Least One Opening in the required section of system settings, at least one valid entry type opening will be required.

Lumber Components

If the user has chosen lumber components for skirt board, wall girt, top girt exterior, top girt interior, or track support and there is no lumber in setup for these components to span the necessary distance, the user will receive a warning message indicating that the materials list will be incomplete. The user is offered a number of options to correct the issue such as choosing a different species and size, adding longer materials in lumber setup, using plug poles, or making changes to the pole spacing configuration or distance.

FIG. 174G

METHOD FOR DETERMINING A SET OF MATERIALS

This application is based on and claims priority to U.S. Provisional Patent Application No. 60/421,378 filed on Oct. 25, 2002. Provisional Patent Application No. 60/421,378 is incorporated herein by reference in its entirety.

TECHNICAL FIELD

The present invention relates to computer-based algorithms for designing wood frame buildings such as pole barns and garages, and for determining the materials needed to construct them.

BACKGROUND OF THE INVENTION

The invention is a method for rapidly and accurately estimating the materials needed to build various structures. These structures include post frame buildings (or "pole barns") and stud frame buildings (or "garages), also referred to together herein as wood frame buildings.

The invention has been reduced to practice in a computer program which will be described below. The invention is an automated materials estimating system that uses a Graphical User Interface (GUI) programming language as the intermediary between the main system engine and relational database.

A relational database stores all product and estimate information. Due to the considerable size and complexity of the data being stored, a relational database was chosen as the database platform for the following reasons:

- Ability to store and retrieve information quickly
- Create relationships between related sets of data
- Ability to cascade primary key information from one table to another
- Ability to cascade the deletion of associated records
- Use the native database system for database functions The main system engine contains the windows, programming language, as well as the interface for the finished reports, drawings, plans, and lists. In this case, Microsoft® Excel was chosen as the container for the main system engine for the following reasons:

- Provided a platform for creating professional reports
- Drawing capability
- Flexibility in reporting
- Utilization of existing functions
- Common availability by client base
- Provides interface for creating/modifying Visual Basic for Application® programming language.

Although other programming languages could be used such as Visual Basic®, Visual C++®, or VB.Net®, Visual Basic for Application® was chosen for the following reasons:

- Ability to interface with both the main system engine, Microsoft® Excel and the relational database container, Microsoft® Access
- Ability to create a custom Microsoft® Windows based system.
- Faster design time through the use of predefined functions and features

SUMMARY OF THE INVENTION

The present invention is a computer-implemented method for determining a set of materials for constructing a wood frame building.

The present invention is a computer-implemented method for determining a set of materials for constructing a wood frame building, comprising selecting a plurality of parameters for the wood frame building, accessing a database having information about a set of raw and finished goods, determining the set of materials based on the plurality of parameters for the wood frame building and the information about the set of raw and finished goods, and displaying the set of materials.

The present invention is a computer-implemented method for determining a set of materials for constructing a wood frame building, comprising selecting a plurality of parameters for the wood frame building, accessing a database having information about a set of raw and finished goods, determining the set of materials based on the plurality of parameters for the wood frame building and the information about the set of raw and finished goods, displaying the set of materials, and displaying a visual model of at least one aspect of the wood frame building.

The present invention is a computer-implemented method for determining a set of materials for constructing a wood frame building, comprising selecting a plurality of parameters for the wood frame building, accessing a database having information about a set of raw and finished goods, determining the set of materials based on the plurality of parameters for the wood frame building and the information about the set of raw and finished goods, displaying the set of materials, displaying a visual model of at least one aspect of the wood frame building, and displaying a plurality of dimensions for the at least one aspect of the wood frame building.

The present invention is a computer-implemented method for determining a set of materials for constructing a wood frame building, comprising selecting a plurality of parameters for the wood frame building, accessing a database having information about a set of raw and finished goods, determining the set of materials based on the plurality of parameters for the wood frame building and the information about the set of raw and finished goods, and displaying the set of materials, wherein selecting a plurality of parameters for the wood frame building comprises selecting a plurality of parameters for walls, selecting a plurality of parameters for a roof, and selecting a plurality of parameters for at least one building opening.

The invention is a method for rapidly and accurately estimating the materials needed to build wood frame buildings.

This and additional objects, features and advantages of the present invention will become clearer from the following specification of a preferred embodiment.

DESCRIPTION OF THE PREFERRED EMBODIMENT

Figure 1:
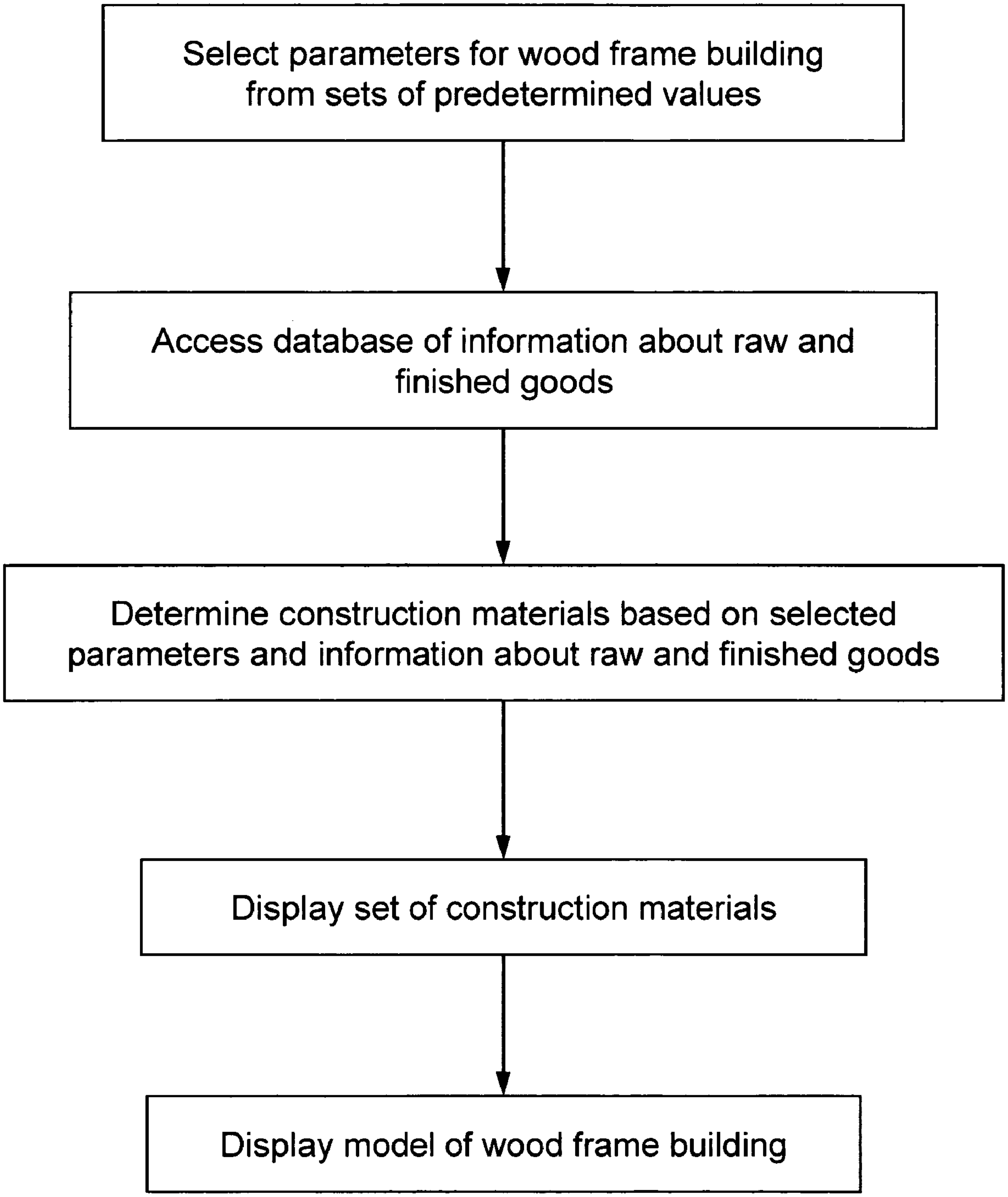
FIG. 1 is a flowchart of the overall method.

Referring to FIG. 1, the invention is a computer-implemented method for determining a set of materials for constructing a wood frame building. Determining such a set of materials is commonly known as creating an estimate of the materials needed. The invention contains a number of features that address the specific requirements of designing a wood frame building. The method uses computer readable program code means embodied in a computer usable medium for causing the application program known as "Construction Maestro™ Version 2.0" available from Symun Systems, Inc., 3469 Pierson Place, Flushing, Mich. 48433, to execute on a computer. The method comprises selecting a plurality of parameters for the wood frame building. This is performed by a step-by-step process in which the user is guided by the computer program through selecting the parameters. The method further comprises accessing a database having information about a set of raw and finished goods. The program allows the entry and manipulation of thousands of items that can be used in the design of the building. The method further comprises determining the set of materials based on the plurality of parameters for the wood frame building and the information about the set of raw and finished goods. As one example, the user specifies the overall building height, length and width, and the computer program makes all of the necessary calculations to arrive at the combinations of lumber sizes, lengths, etc. to achieve the user's specifications. Further, the set of materials is generated from what has been included in the database of raw and finished goods as supplied with the computer program, together with additional entries to the database made by the user to customize the program to the user's needs. The program further comprises displaying the set of materials in formats that are easy to use for ordering the materials, and for using them once they arrive at the job site. Visual models are generated by the program to display a number of aspects of the wood frame building which has been designed by the user.

Figure 2:
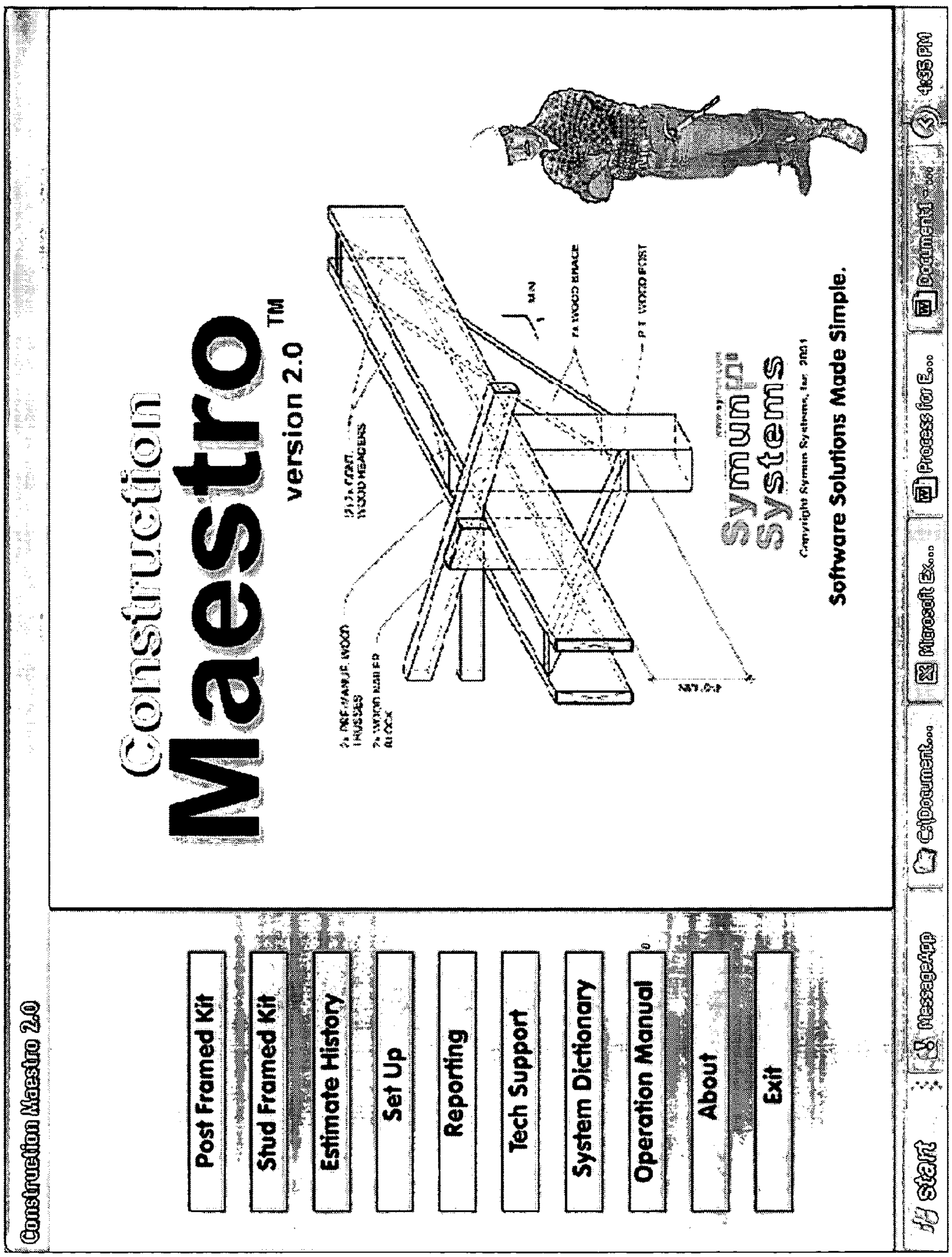
FIG. 2 is the beginning point for the computer program.
Figure 3:
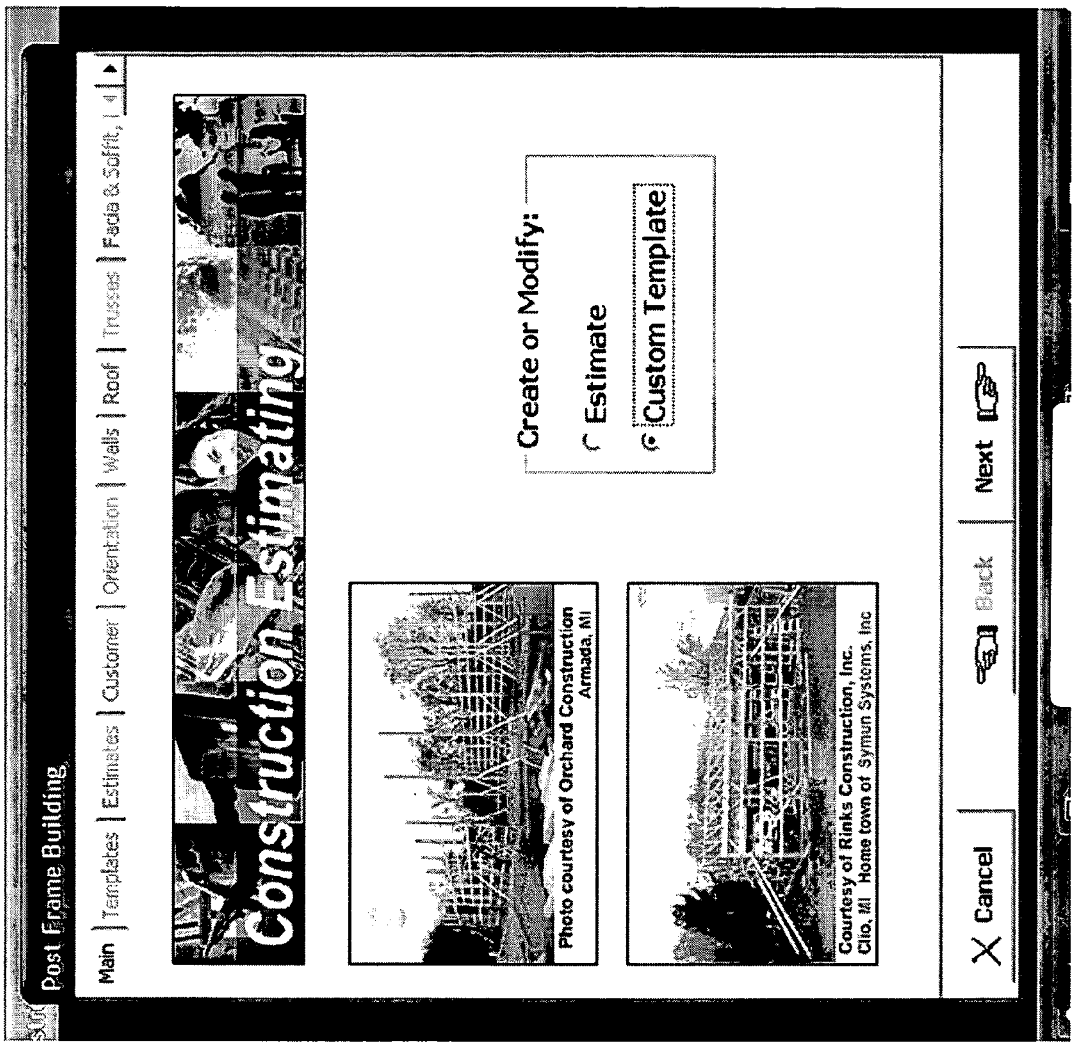
FIGS. 3-176 demonstrate the operation and features of the computer program.

Referring to FIG. 2, an estimate of the construction materials needed for a post frame building is initiated by selecting Post Framed Kit on the Main Menu Page of the program. This selection takes the user to the next screen (tab entitled "Main") shown in FIG. 3. The user can create, or modify, an estimate starting at the beginning of the process by selecting Estimate. Or, a completed estimate previously created as a template may be used by selecting Custom Template. A template typically has characteristics (for example, use of chemically-treated wood for the skirt board, foundation requirements, door requirements, roof pitch, etc.) that are desired or required by a particular building contractor, region or building package. Therefore the use of a Custom Template results in further time savings for completing the estimate.

Figure 4:
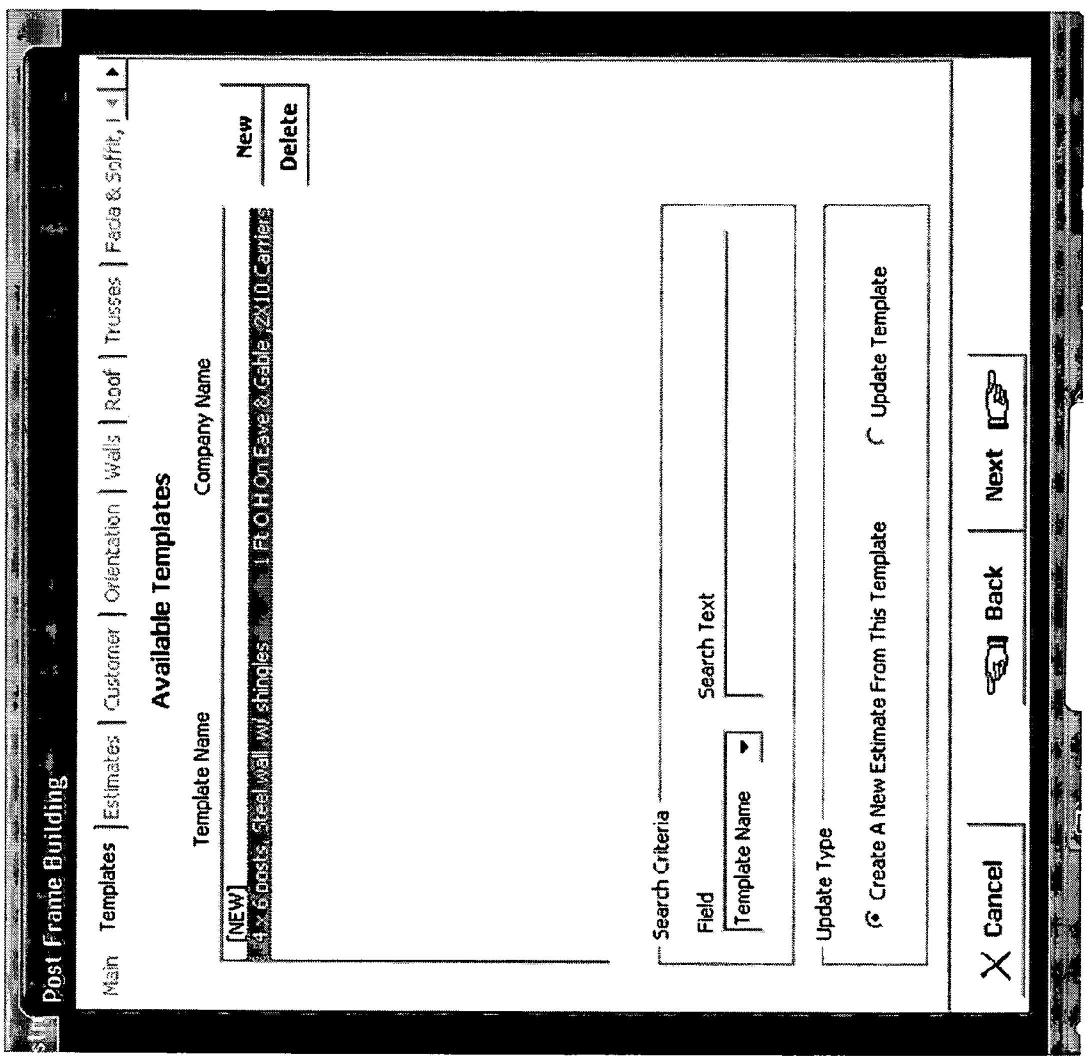

By way of example, the basic steps needed for a complete estimate will now be described. There are many possible variations of these steps (such variations being useful for achieving the user's design and cost objectives). Creating a new estimate from a template begins by selecting Custom Template, then Next. This takes the user to the tab entitled Templates, an example of which is shown in FIG. 4. Previously stored templates (called Available Templates) are listed here for review and retrieval using various Search Criteria. If the user selects [NEW] Template (or the New command button, i.e. soft button) and Next, the creation of a new template is initiated. If the user selects one of the existing templates, all of the parameters of that template will be recalled. The user can then select the Update Type, to either Create A New Estimate From This Template or Update Template. The first of these two options will now be described using the preloaded template named "4×6 posts, Steel wall w/ shingles."

After selecting Create a New Estimate From This Template and Next, the user is taken to the Customer tab. (Note: this approach will not make changes to the template. That is done using the command Update Template.) Here information for a specific customer can be entered.

If no changes to the design of the post frame building are desired, the user can successively select Next until the Finish command appears. Then, pressing Finish, and finally the Finish command at the display of one of the walls, will recalculate the estimate. This will lead to the same result as when the template was first created. Or the result will be different if, for example, changes to the design or material prices were made since creating the template. These kinds of changes will now be described in greater detail.

Figure 5:
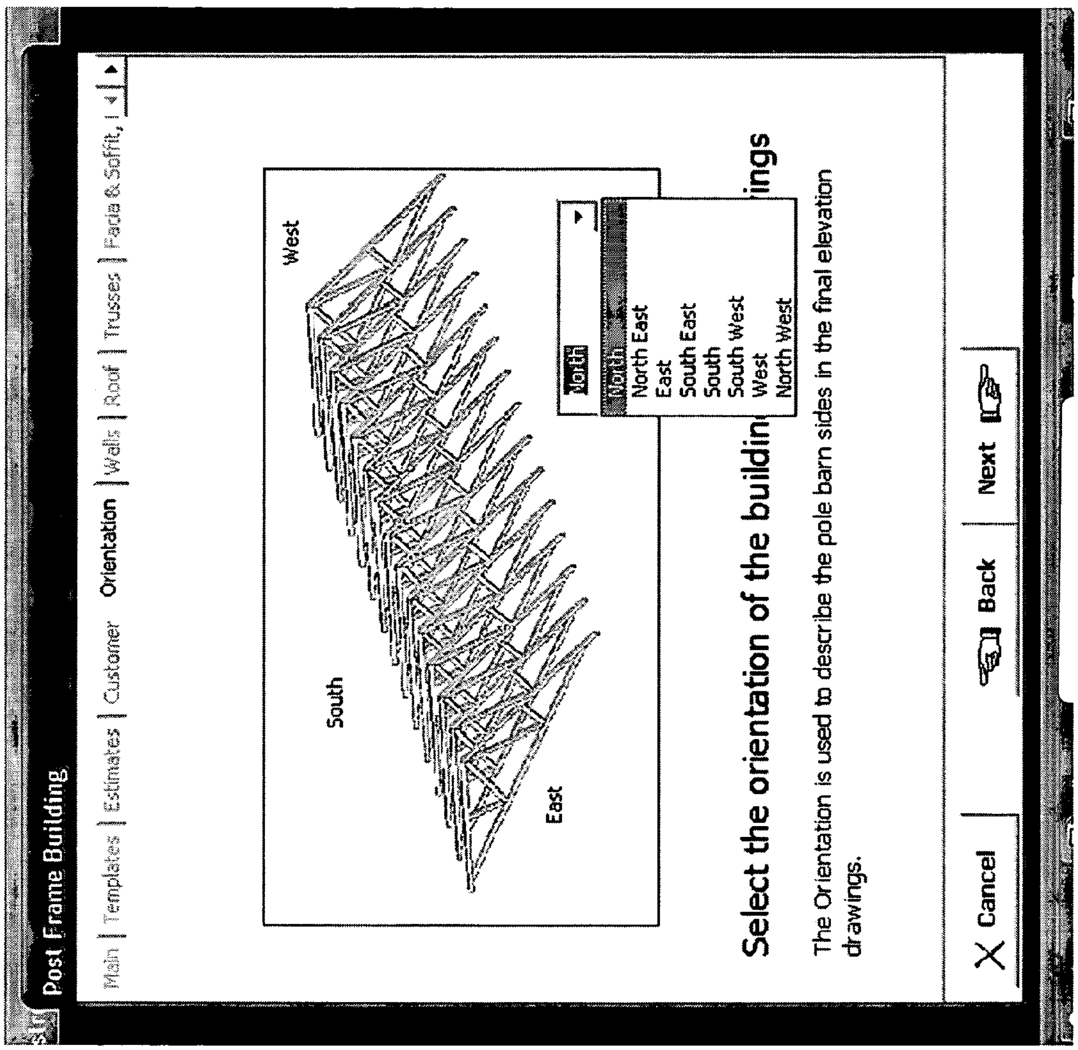

After completing the information for the Customer tab, the user can select Next to go to the Orientation tab. See FIG. 5. The user can choose the orientation of the building from a pull-down menu (or "picklist"). This permits the sides of the pole barn to be defined for the final elevation drawings and the wall girt views. Choosing the orientation is also helpful for mentally picturing the eventual structure on its building site, as well as for picking the sides where doors, windows, etc. will be most advantageous.

Use of the Next command, or soft button, to go to the following step is repeated throughout the program. It will be implied in the remainder of the invention description.

Figure 6:
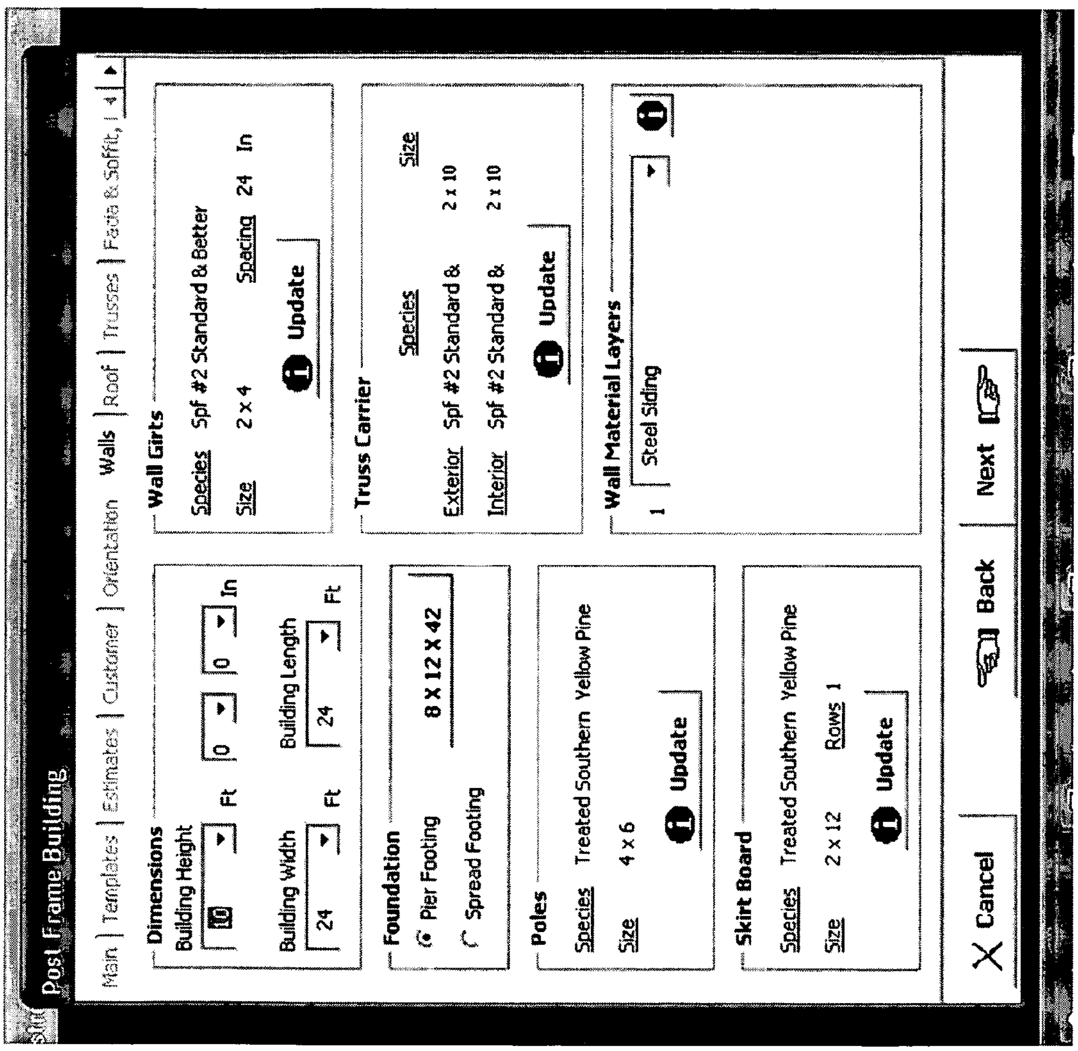

Referring to FIG. 6, the user next selects the Walls tab in order to choose the following: the building Dimensions, Foundation, Poles, Skirt Board, Wall Girts, Truss Carrier/Top Girt and Wall Material Layers.

Under Dimensions, the Building Height, Building Width and Building Length are selected from picklists. The Building Height being chosen is the distance from the top of the finished floor to the bottom of the bottom chord of the trusses. Throughout the computer program product, a plurality of parameters for the wood frame building can be selected from sets of predetermined values for the parameters, as for example, from picklists. In other instances, the user enters a numeric value, numeric dimension, color, or other choice directly from a computer input device, typically a keyboard.

Figure 7:
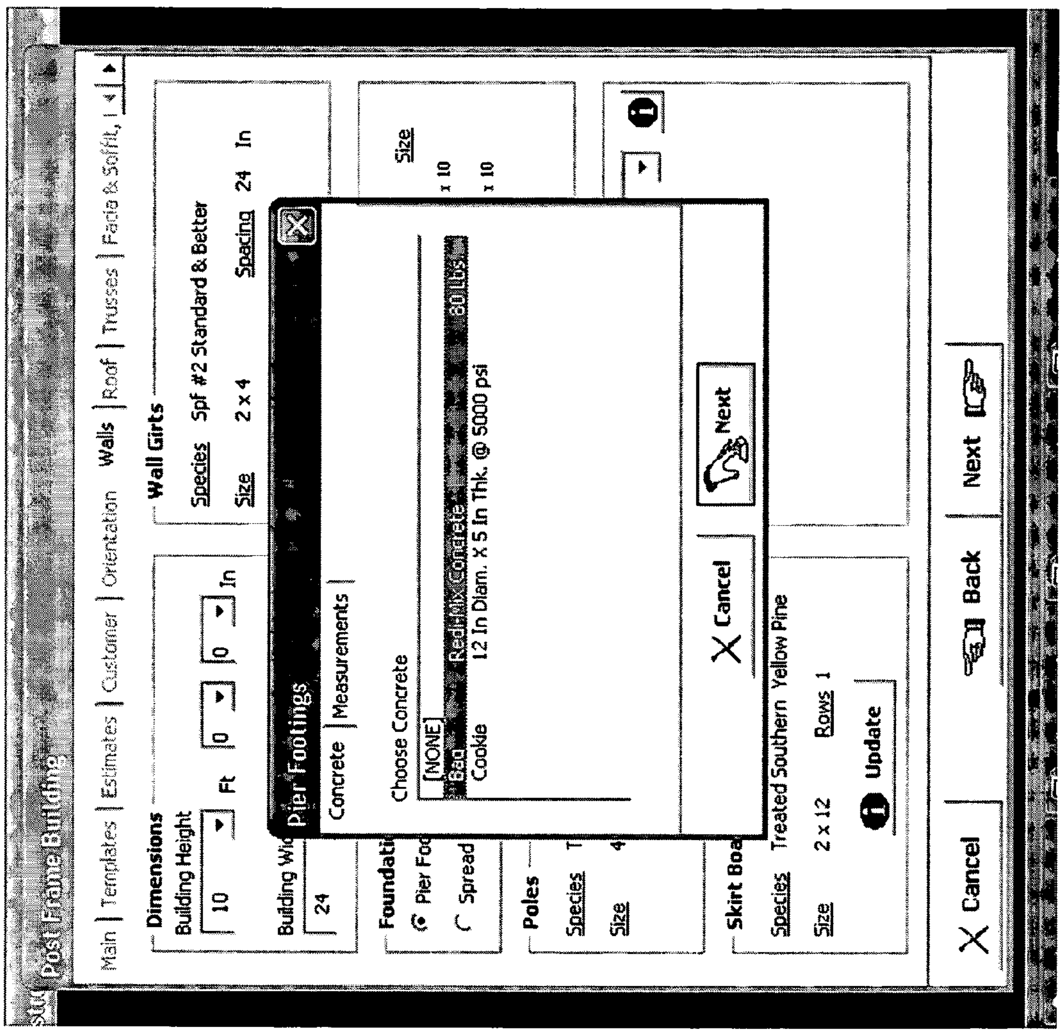
Figure 8:
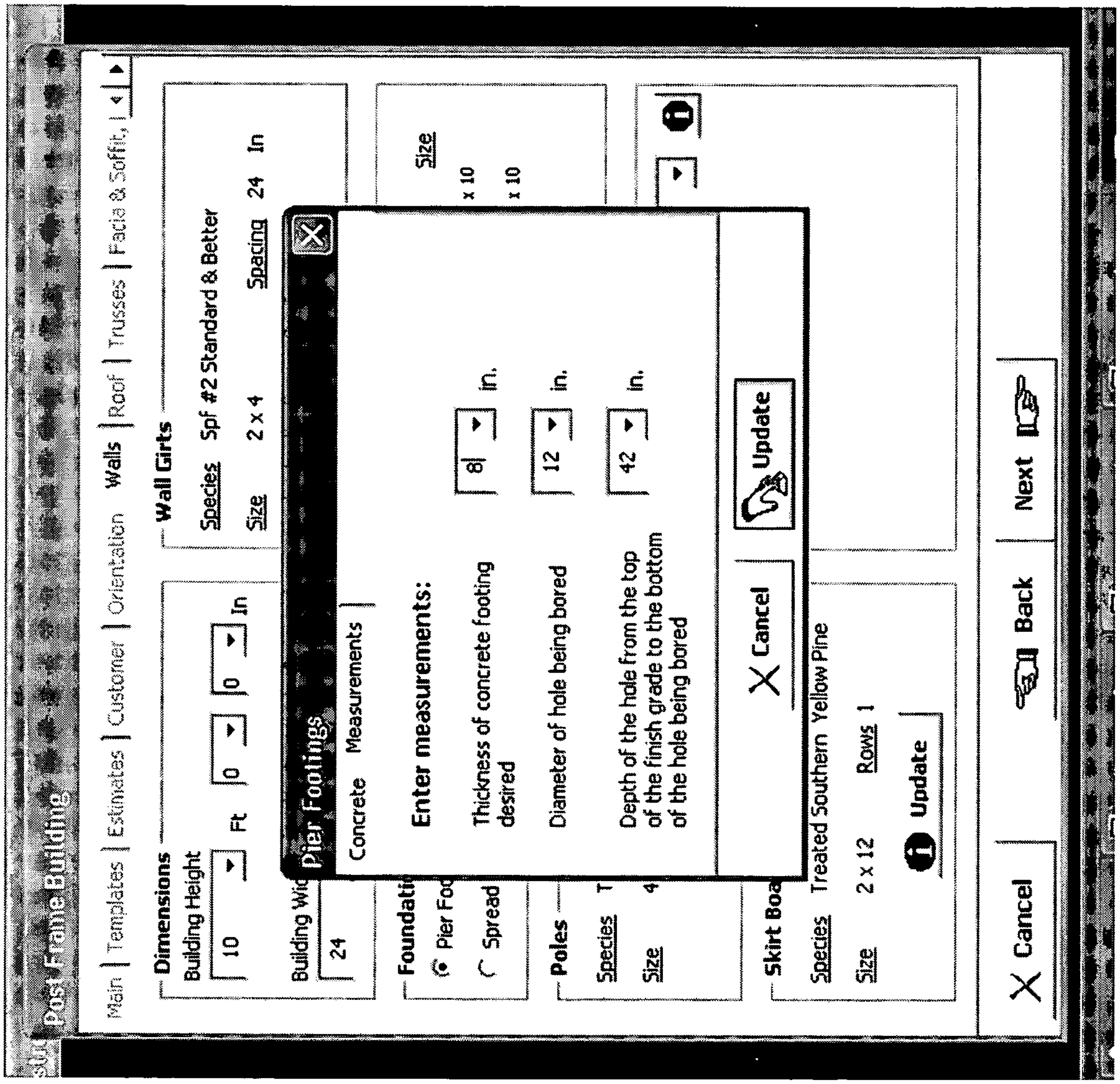

Under Foundation, one of two types must be chosen: Pier Footing or Spread Footing. For a Pier Footing, selecting the Foundation soft button allows the user to choose the Concrete and Measurements, as shown in FIGS. 7-8. If Bag is chosen, the program computes the number of bags of concrete that will need to be mixed at the job site. If Cookie is chosen, the program only computes the total number of concrete cookies needed for the job. If None is chosen, the program computes the cubic yards of wet concrete needed for delivery to the job site, and inserts this information into the Master Materials List (or "MML") for the estimate. The MML is further described below in the section entitled "Set Up (or Product Setup and Pricing)."

For a Spread Footing, the user selects only the measurements of the footing. Based on these measurements, the program computes the cubic yards of wet concrete needed for delivery to the job site, and inserts this information into the MML.

Note: the process for completing an estimate for a Stud Frame Building will be described only where it differs from the process for a Post Frame Building. One such difference is with respect to part of the foundation. For the cement slab of a Stud Frame Building, the program computes the cubic yards of wet concrete needed for delivery to the job site PER INCH OF SLAB THICKNESS. This is because slab thickness is not a parameter which is put into the program—the slab (or floor) being somewhat independent of the building proper (walls and rood. Therefore the user must manually finish the calculation for the total amount of concrete for the slab by multiplying the figure provided by the program in the MML times the thickness of the slab (in inches). However, the calculation for the concrete footings (pier or spread) is substantially the same as for a Post Frame Building.

Figure 9:
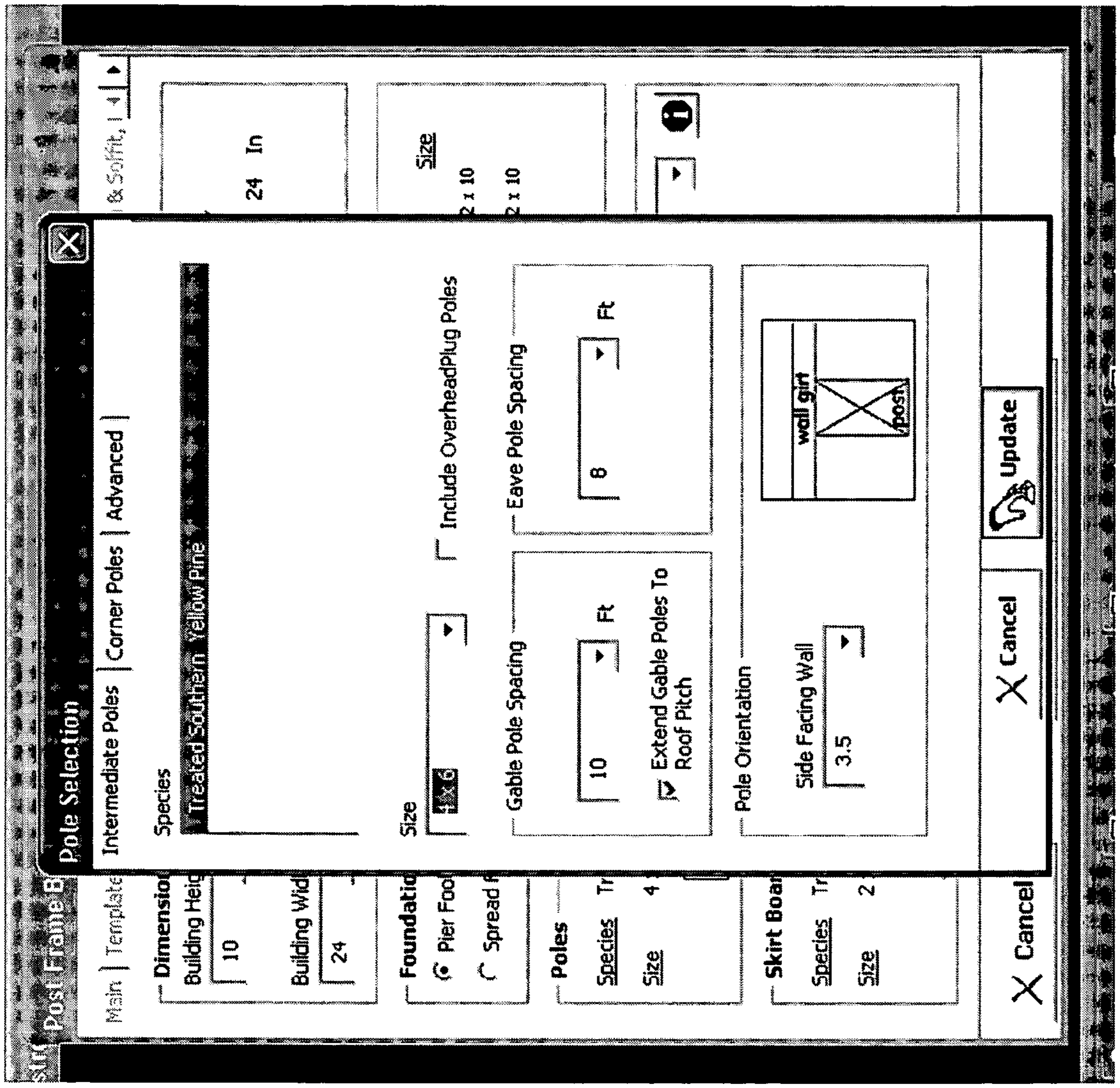

Next the user selects the Update soft button for Poles, then the wood Species and Size under the Intermediate Poles tab of Pole Selection as shown in FIG. 9. The user can specify the following: Include Overhead Plug Poles (to include poles for those portions of a given wall above an overhead door, general opening (that a person can simply walk through), or slider door. Gable Pole Spacing (select the desired spacing), Extend Gable Poles to Roof Pitch (increase the length of a pole as its placement approaches the peak of the gable end), Eave Pole Spacing (select the desired spacing) and Pole Orientation (determines whether the longer or shorter side of a rectangular cross-section pole or post will face the wall girt). Note that a diagram of the pole/wall girt orientation is displayed to make it easy to see the resulting design. When picking a Species for any lumber component the Size is reloaded to those sizes available in Product Setup for the building component and Species selected.

Figure 14:
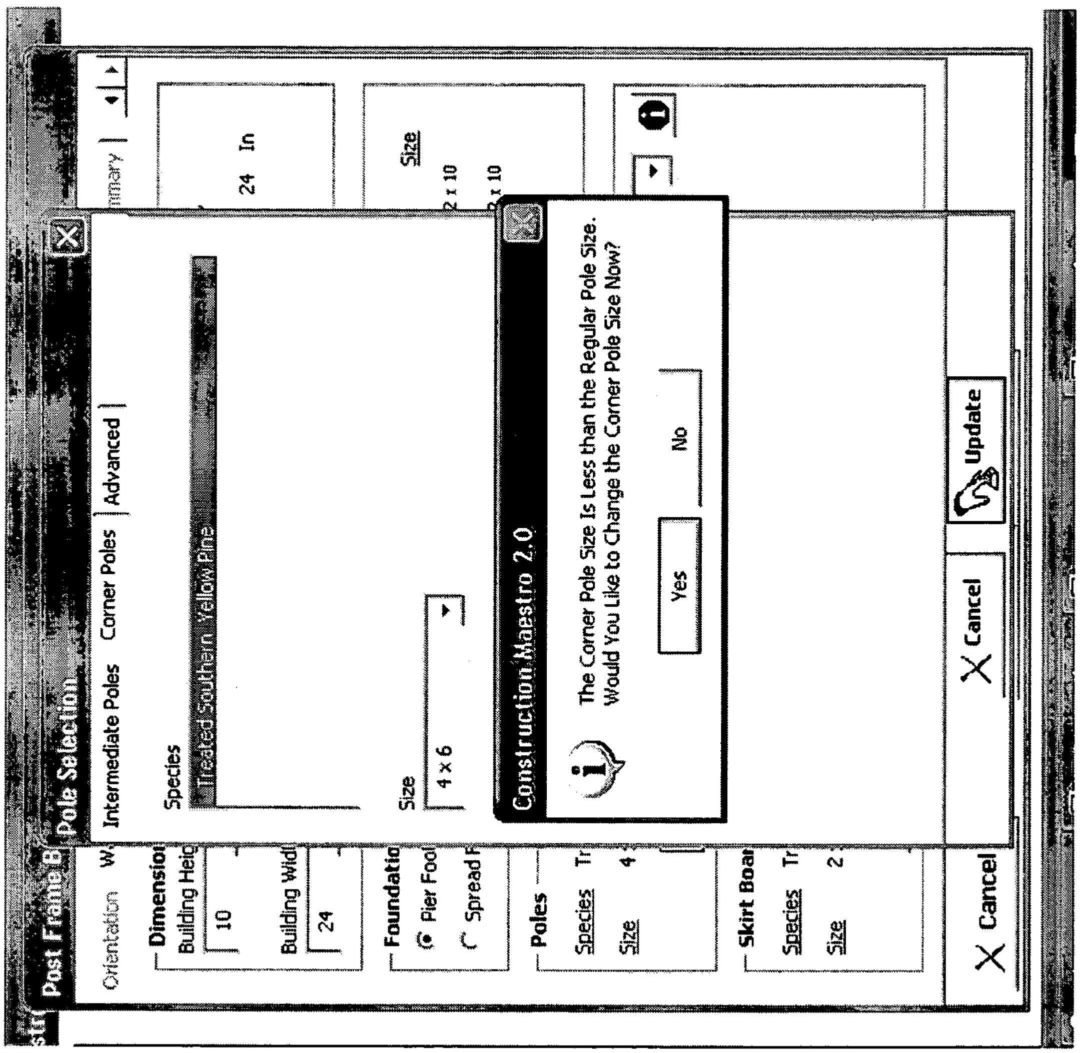

Under the Corner Poles tab the user can specify the Species, Size and Pole Orientation for this item. See FIG. 10. Note the diagram of the pole/wall girt orientation. The corner poles can be a different size from that used for the intermediate posts. However if a corner pole size is selected that is smaller than for the intermediate poles, the dialog box of FIG. 14 is displayed, so that the user can confirm this nonstandard choice of sizes.

Figure 11:
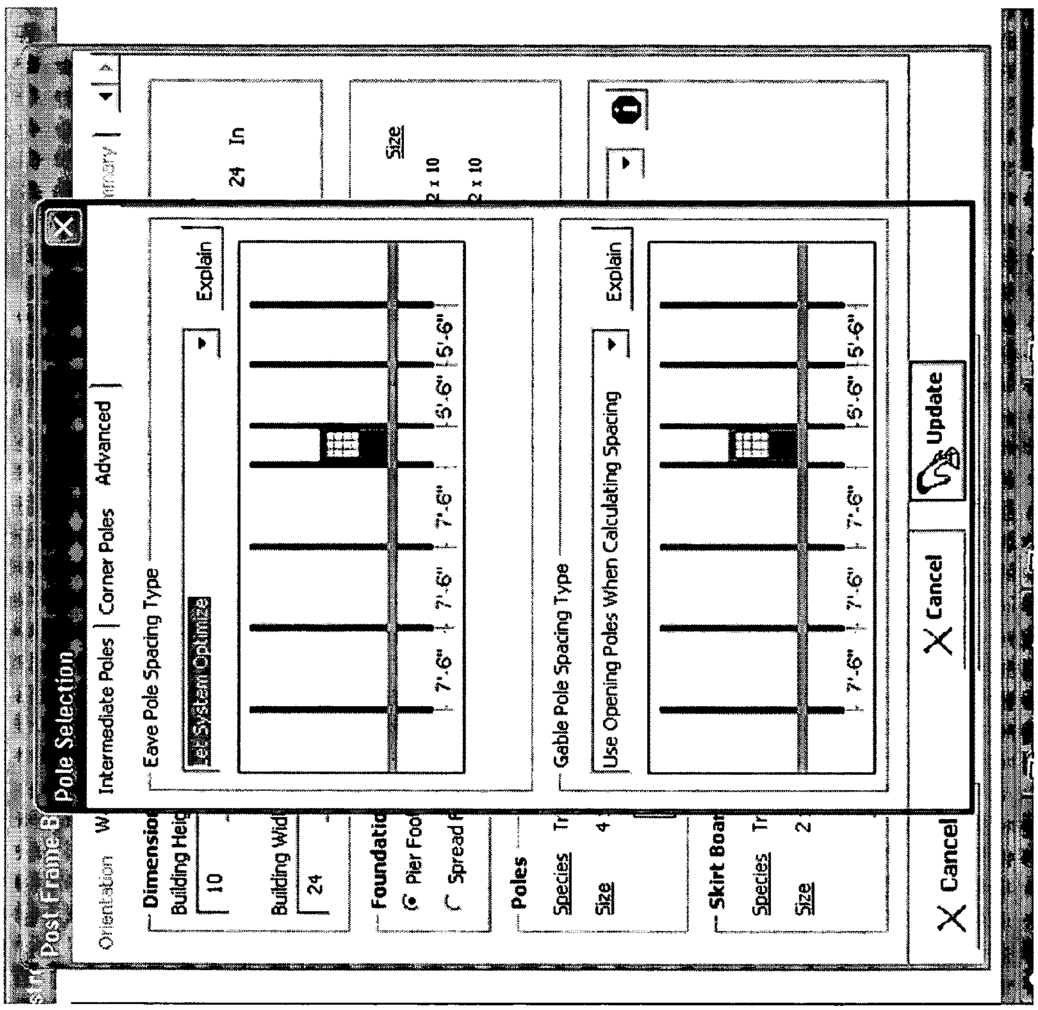
Figure 12:
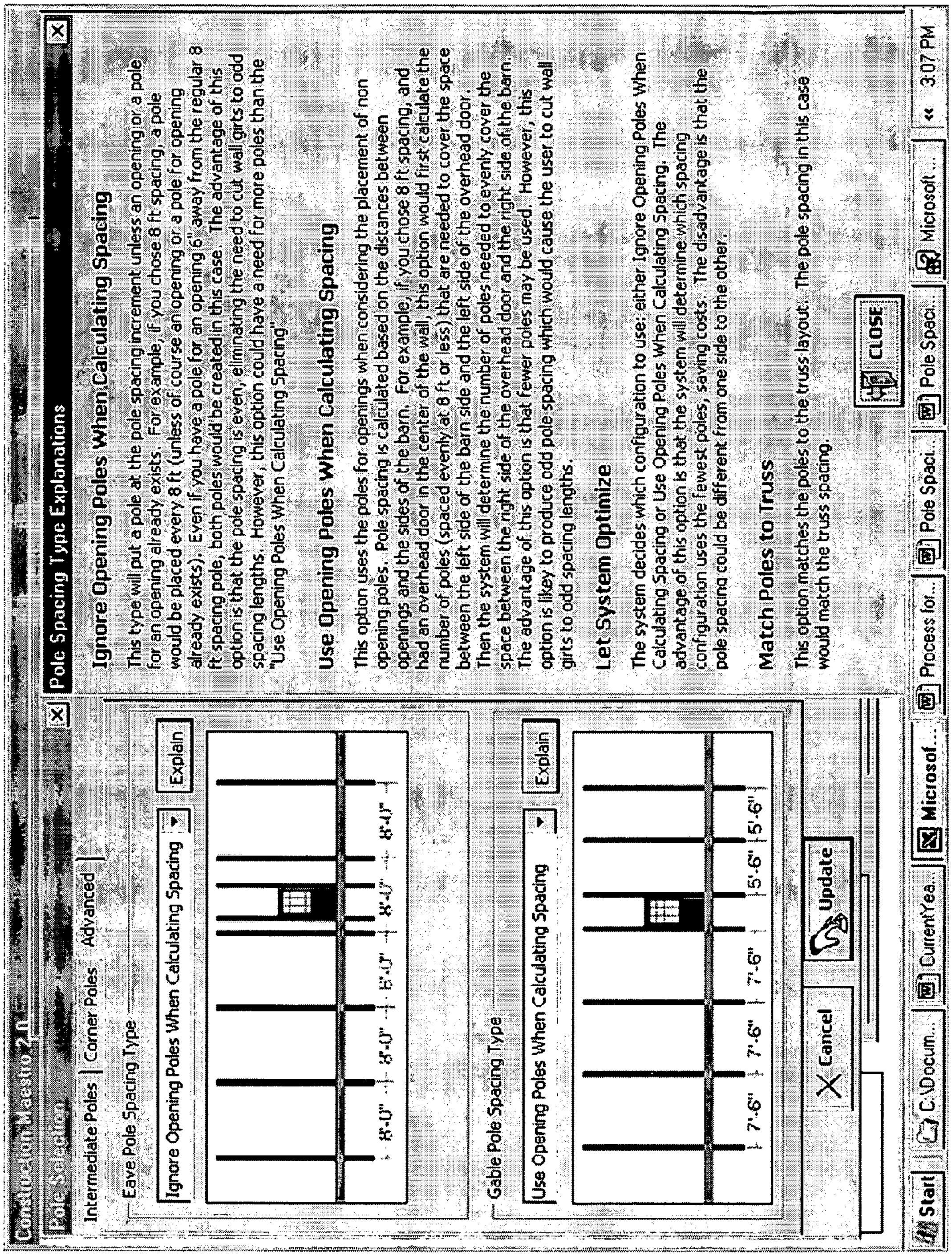

Referring to FIG. 11, refinements to the Eave Pole Spacing and Gable Pole Spacing can be made under the Advanced tab of Pole Selection. In estimating the materials required to construct a post frame building, one consideration for both design and cost purposes is the appropriate spacing of the vertical posts (or poles). In some instances it may be desirable to keep the spacing of the poles consistent, i.e. at a substantially fixed distance over the entire length of a side of a structure. One reason for doing this is to maximize the use of the full original board length and reduce the amount of cuts to be made for Wall Girts, Skirt Board and Truss Carrier/top girts. According to the method of this invention shown in FIG. 12, the user can select this option (called Ignore Opening Poles When Calculating Spacing) for the desired pole spacing increment and poles will be located accordingly, unless an opening in the structure is specified in the design by the user for that particular location, or a pole that frames an opening already exists from a previous calculation. Note: the pole spacing and length of the girts are still permitted to vary for small sections of the building as dictated, for example, by the overall length of the structure.

This method can lead to situations where a pole is closer than desired to a pole that is required for an opening in the structure. In this case it may be better to utilize the pole that is needed for the opening, in order to save the expense of the additional pole. According then to the method of this invention shown in FIG. 12, the user can select a pole spacing scheme (called Use Opening Poles When Calculating Spacing) in which the opening poles are considered in the overall pole layout. This leads to pole spacing that is nonuniform but with potentially more efficient use of the poles. One result is that more cuts will need to be made for Wall Girts, Skirt Board, and Truss Carrier/top girts.

Another option is to permit the invention to select the pole spacing scheme that results in the fewest number of poles. In this case (called Let System Optimize), the invention of FIG. 13 will be employed, depending on all of the specified design criteria and the placement of entry openings. The minimum number of poles will be inserted into the overall design. As a result, the pole spacing may differ from one side of the building to another.

Figure 13:
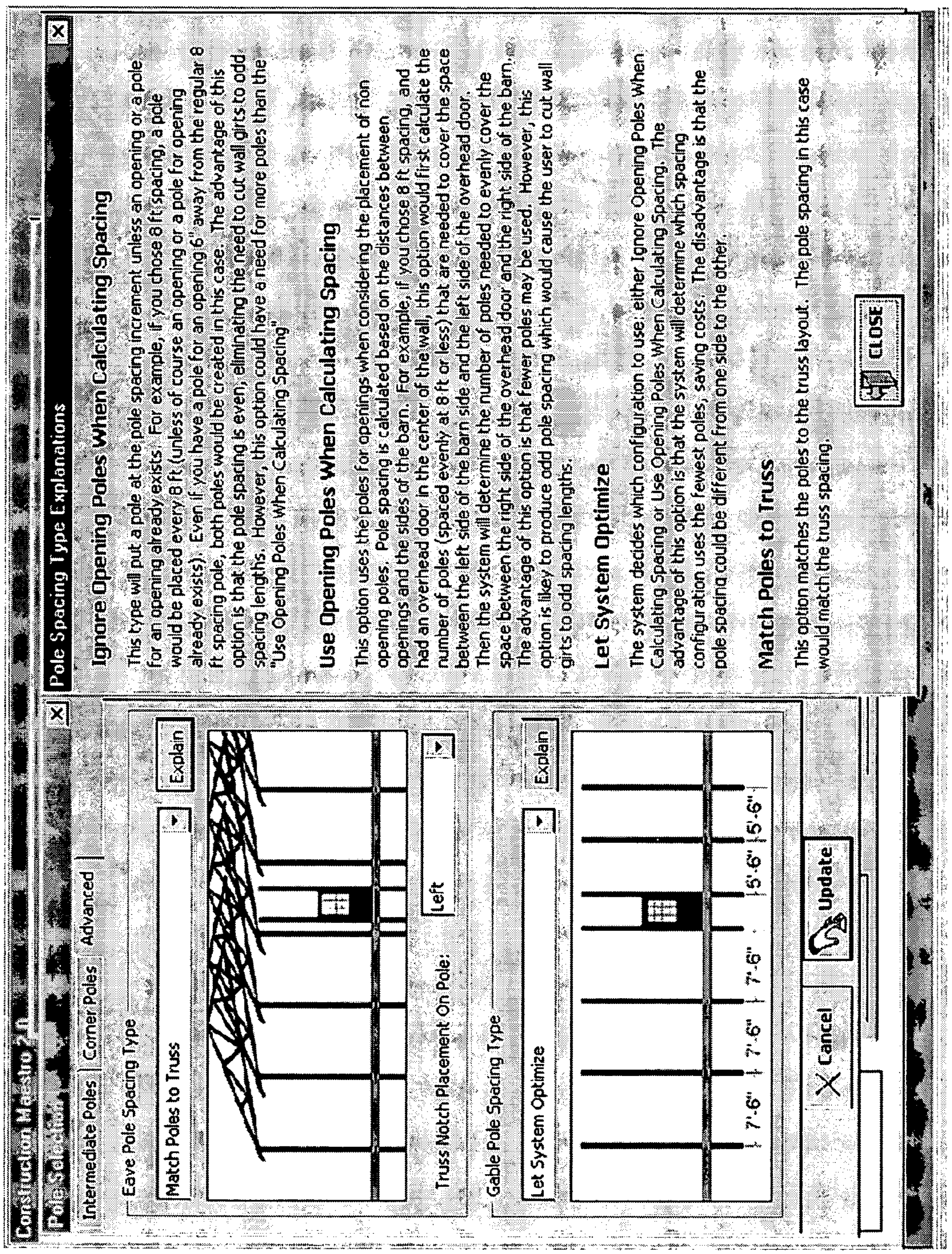

Another option for determining pole spacing is indicated in FIG. 13 (called Match Poles to Truss). In some designs it is advantageous to place the poles so that the weight of the roof trusses bears directly on the poles. The pole spacing then matches the truss spacing. Additionally, the user can specify that the uppermost portion of the poles be notched, such that the trusses are attached to the poles at these notched locations (either on the right or left side, or center, of the pole), or are bolted to the poles.

Match Poles To Truss:

Applies to the eave sides only. See FIGS. 165-170. Pole spacing on the eave sides will equal the truss spacing, starting from the left to right. For each truss, a pole is created on each eave side, with the exception of where a truss lands above an overhead door, slider, or general opening. If a truss lands above an opening, an overhead plug pole is created for support of the truss.

The user has several alignment types for attaching the truss to the pole:

"Notched On Left"
"Notched In Middle"
"Notched On Right"
"Bolted To Both Sides"
"Bolted To Left Side"
"Bolted To Right Side"

Based on the alignment type, the pole will be adjusted to the left or right.

Figure 171:
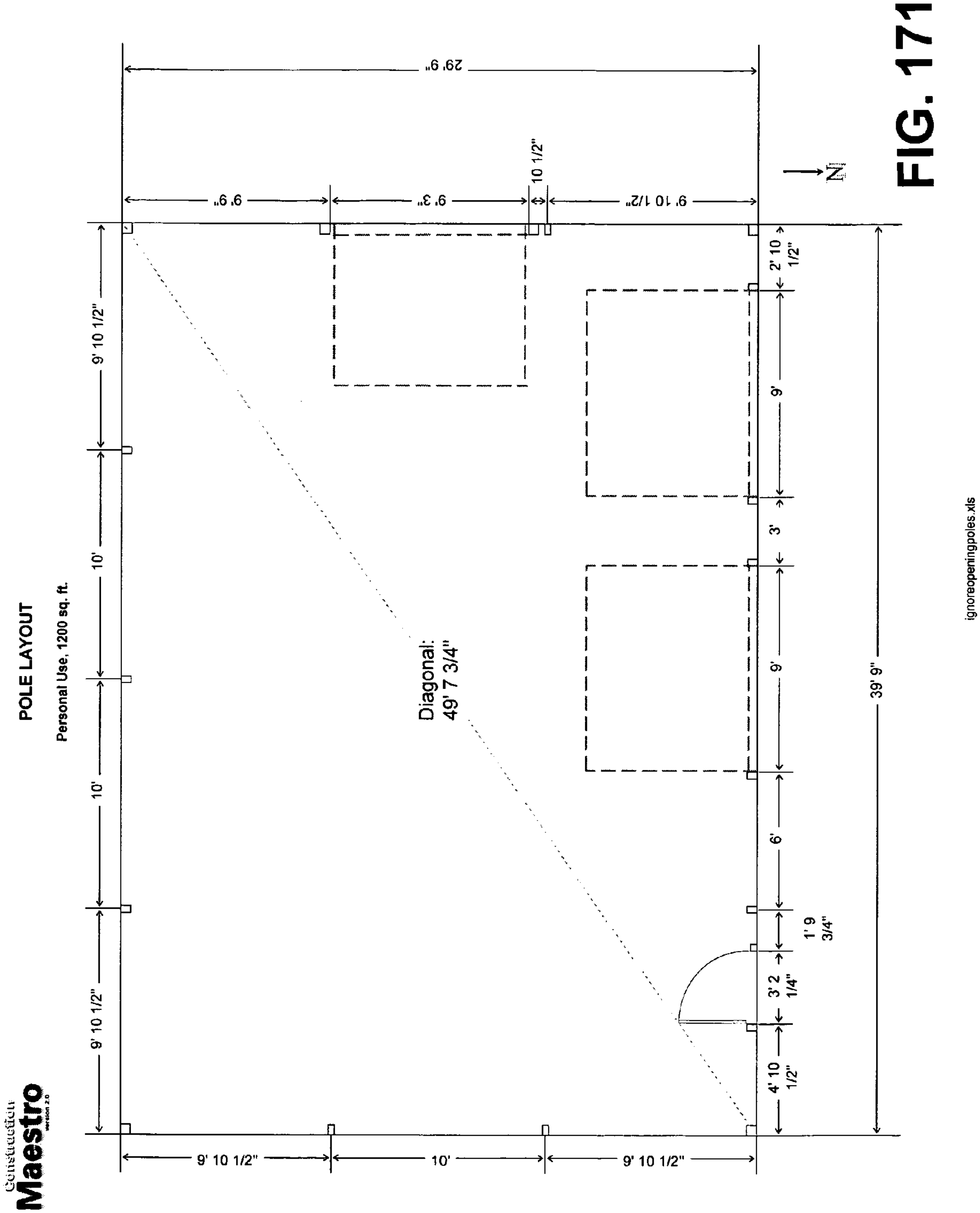

Ignore Opening Poles:

Applies to both the gable or eave sides. Pole spacing will be exactly the spacing amount the user specifies. For example, if the pole spacing is 10 ft, the poles will be placed 10 ft apart, to the center of the pole regardless of the placement of openings. In this case, the poles for openings are not used in the intermediate pole configuration. In the case that a pole lands in the area where an overhead door, slider or general opening is, the system will place a plug pole (if the user chose "Use Overhead Plug Poles") above the opening, but still spaced at the constant pole spacing value. This option provides for consistent pole spacing. Refer to ignoreopeningpoles.xls, FIG. 171.

Figure 172:
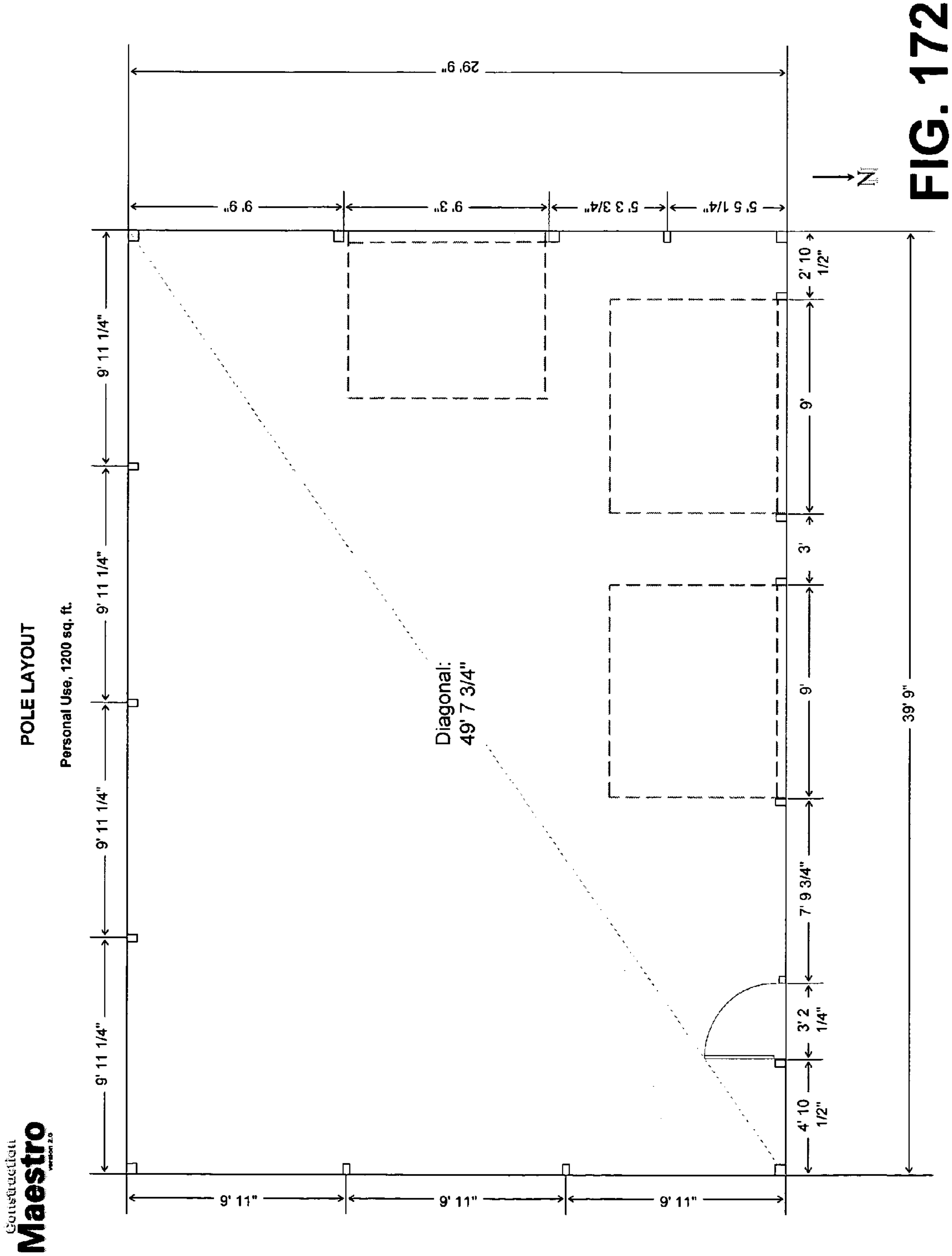

Use Opening Poles:

Applies to both the gable or eave sides. Pole spacing will be exactly the spacing amount or less than the user specifies. On a side that has no entry openings, the system will divide the space between the left and right sides evenly such that the spacing value the user specified is not exceeded. On a side that has entry openings, the system will use the entry opening poles as part of the configuration for the intermediate poles. Spaces between entry openings are divided evenly so that the spacing value the user specified is not exceeded. This option provides for inconsistent pole spacing, depending on the placement of openings. Refer to useopeningpole.xls, FIG. 172.

Figure 173:
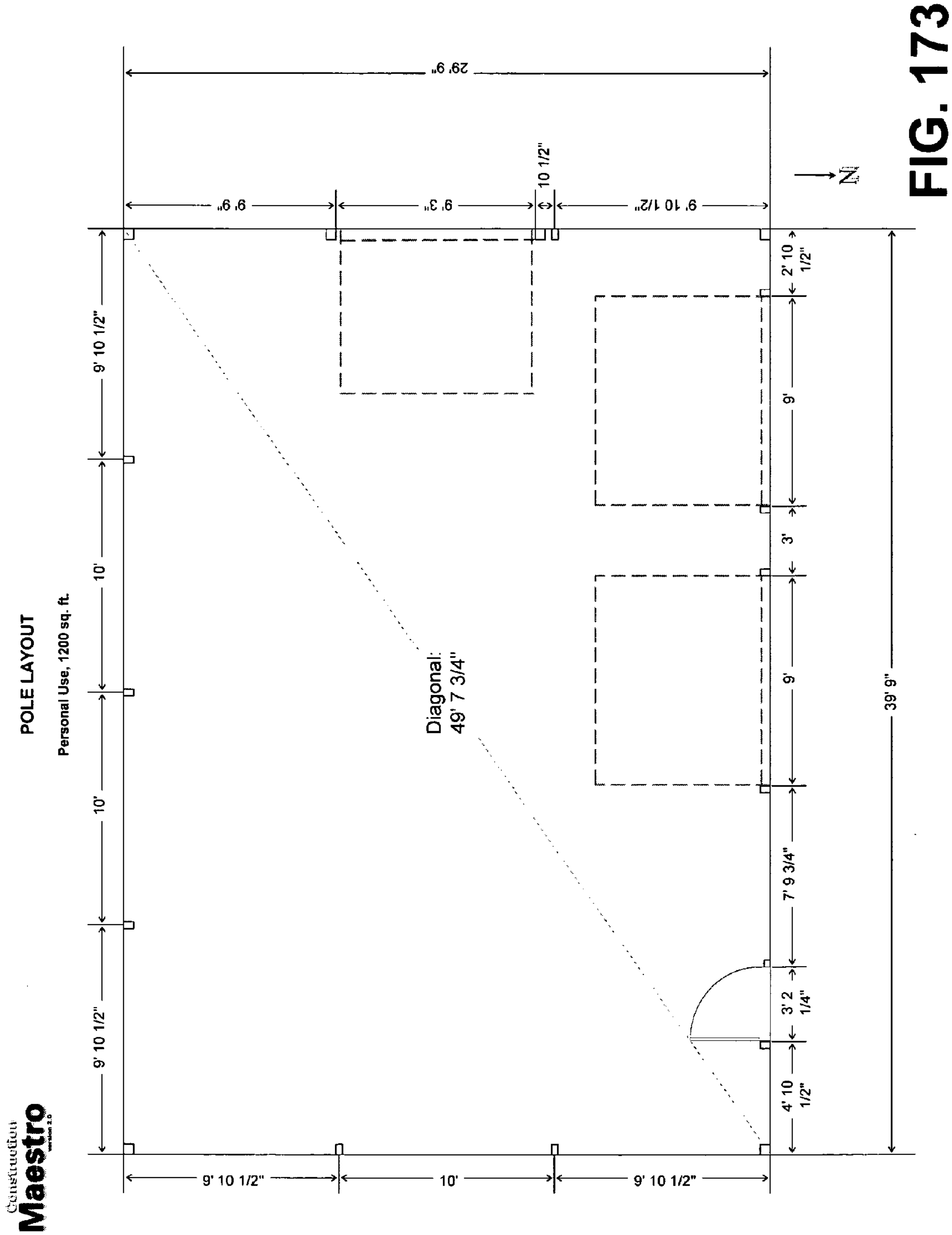

Let System Optimize:

Applies to both the gable or eave sides. The system will either use the Ignore Opening Poles or the Use Opening Poles configurations, depending on which configuration uses the fewest poles for the current side. Also, for Ignore Opening Poles, the system will determine the number of poles when going from left to right as well as going from right to left. Depending on the placement of entry openings, a layout going from right to left may yield fewer poles than going from left to right. Refer to letsystemoptimize.xls, FIG. 173.

Figure 15:
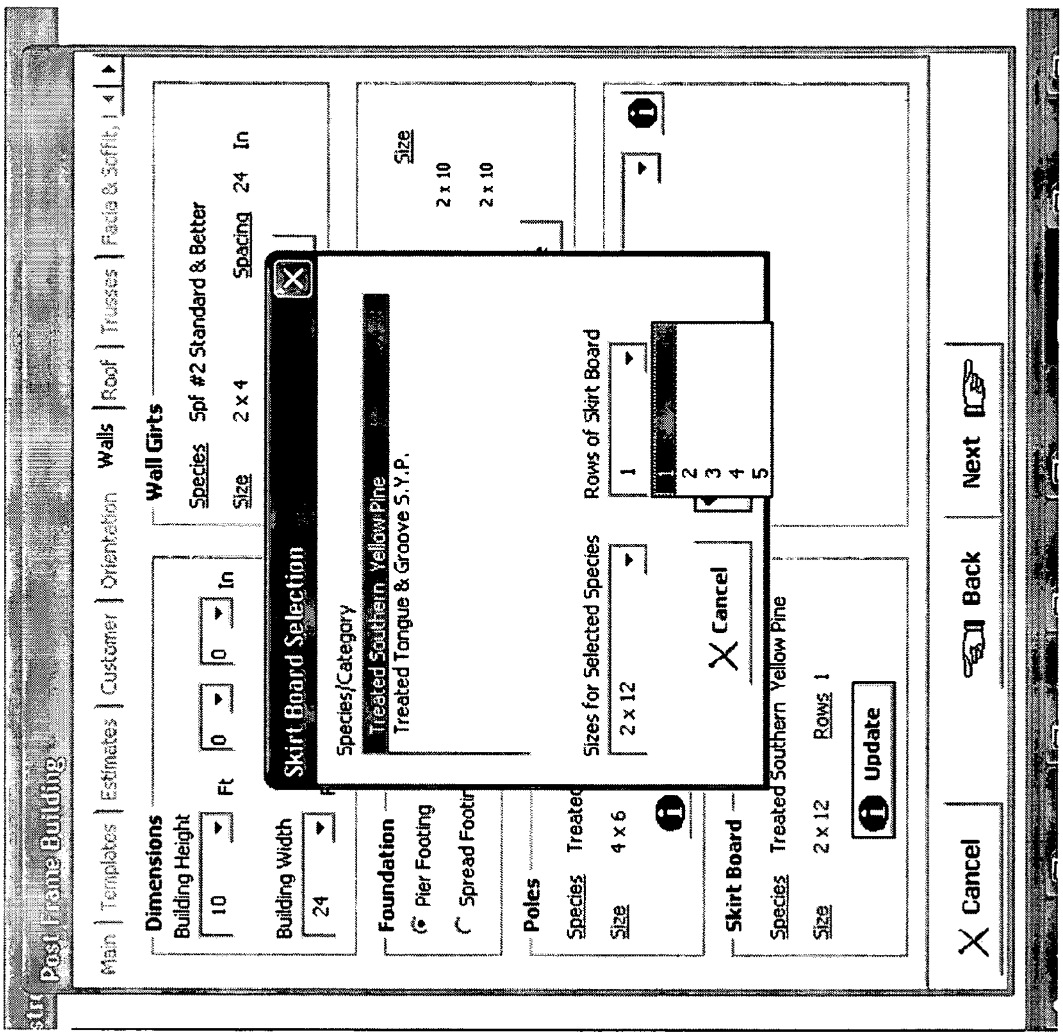

Referring to FIG. 15, the user can select the Update soft button for Skirt Board and then choose the skirt board species/category, size and number of skirt board rows.

Figure 16:
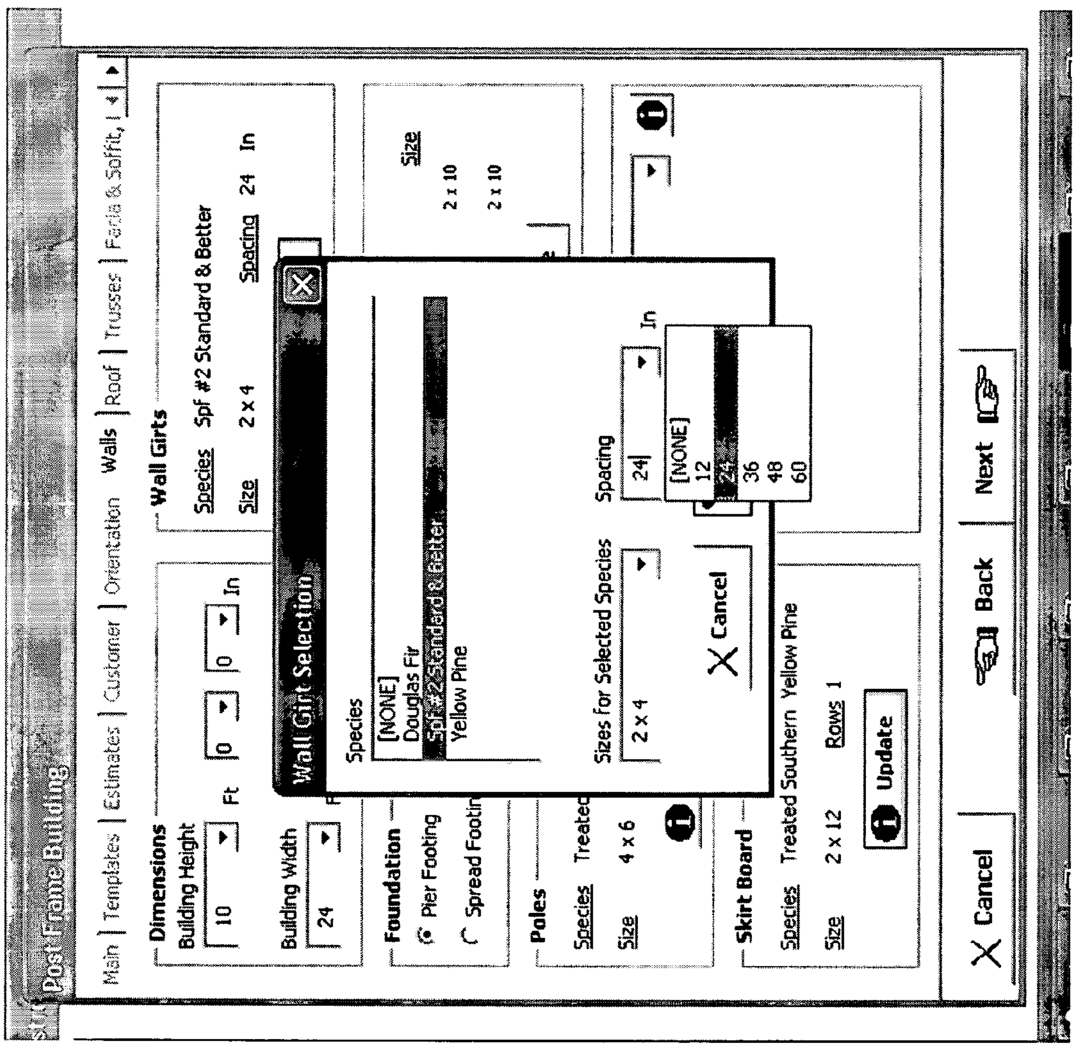

Referring to FIG. 16, the user can select the Update soft button for Wall Girts and then choose the wall girt species, size and spacing.

Use of the Update command, or soft button, to view and change design parameters is repeated throughout the program. It will be implied in the remainder of the invention description. In some places in the program, Update is simply indicated by a soft button labeled "i."

Figure 17:
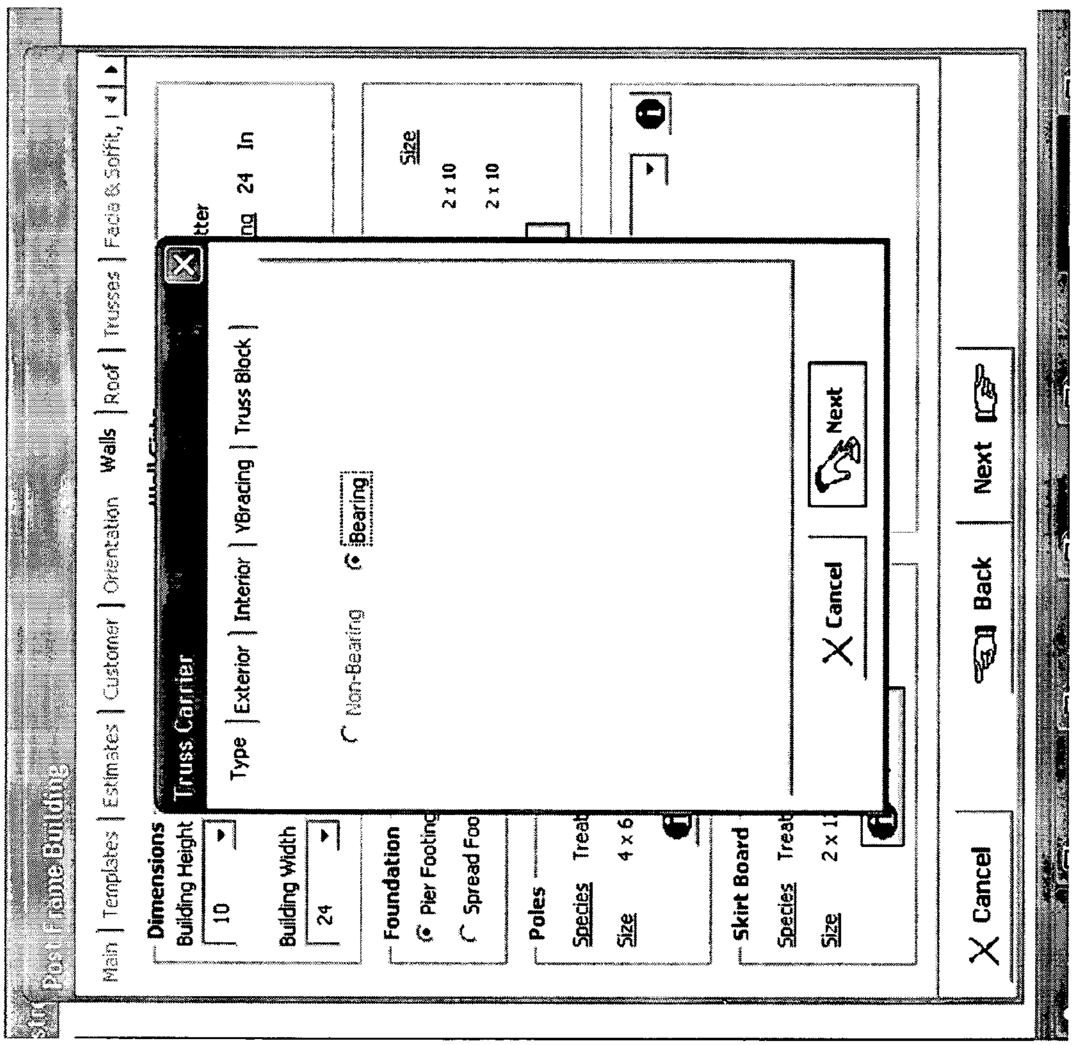
Figure 18:
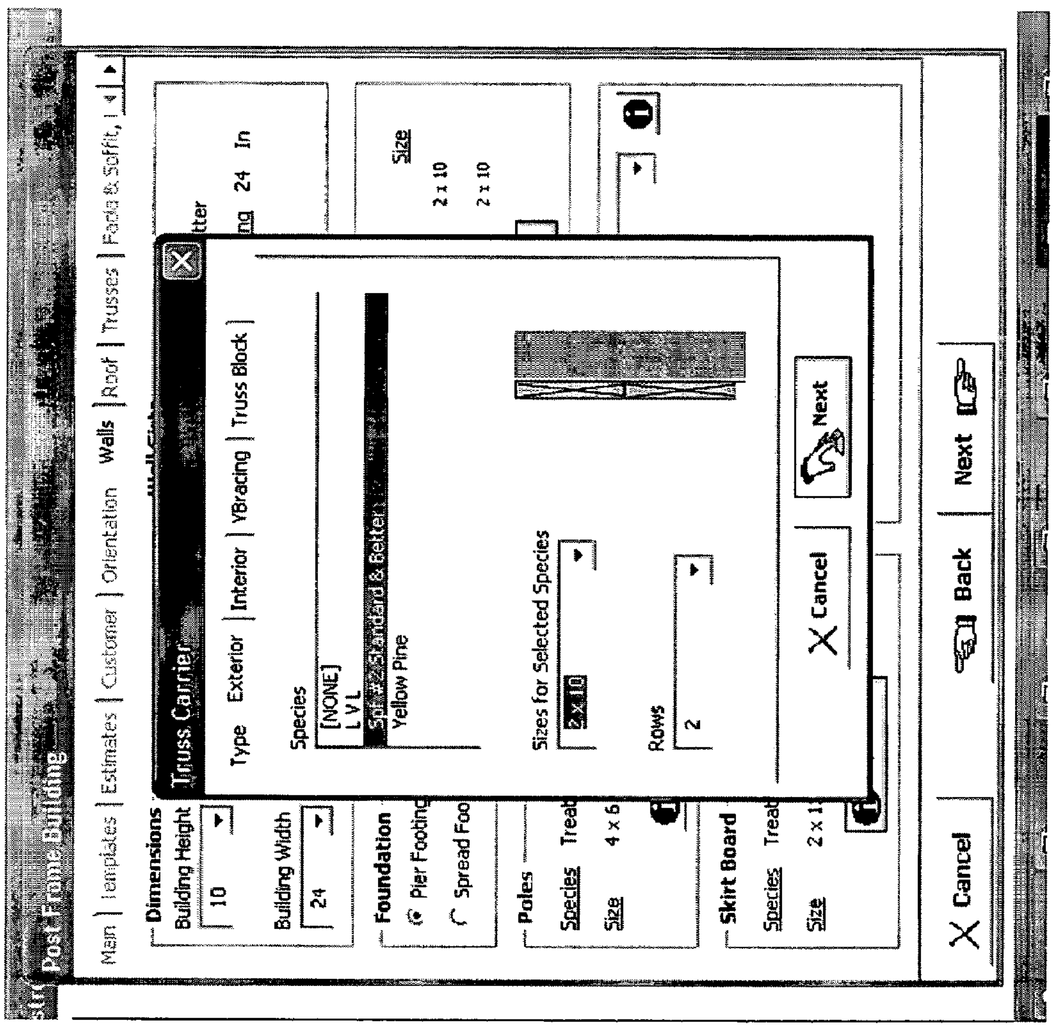
Figure 19:
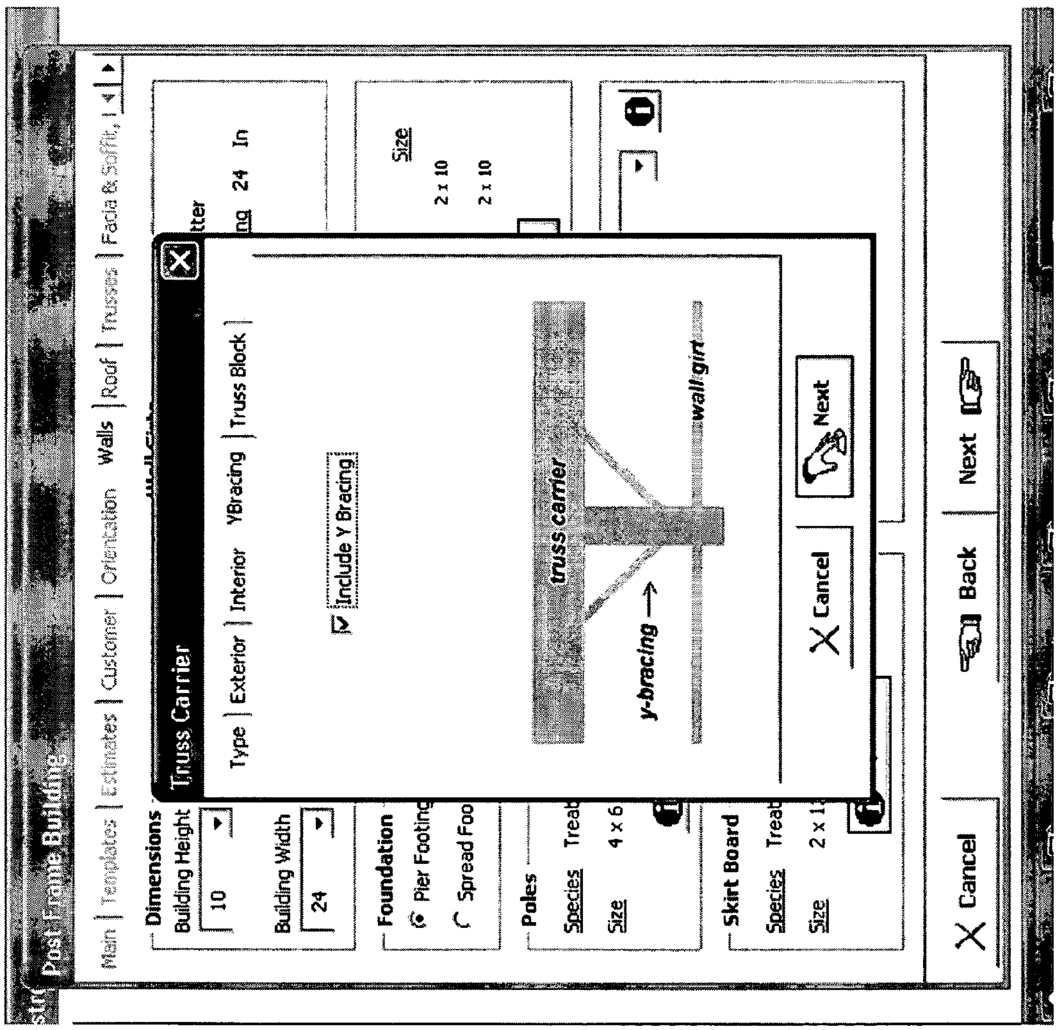

Referring to FIGS. 17-19, the user can update the following parameters for the Truss Carrier (a.k.a. the top plate, girder, header or top girt): whether the Type of truss carrier is load bearing or nonbearing, attachment to the Exterior- or Interior-facing surfaces of the poles, the wood Species and Sizes, whether there will be one or two Rows of truss carriers, whether to Include Y-Bracing between the truss carrier and poles, and the Species and Size of the Truss Block.

Figure 20:
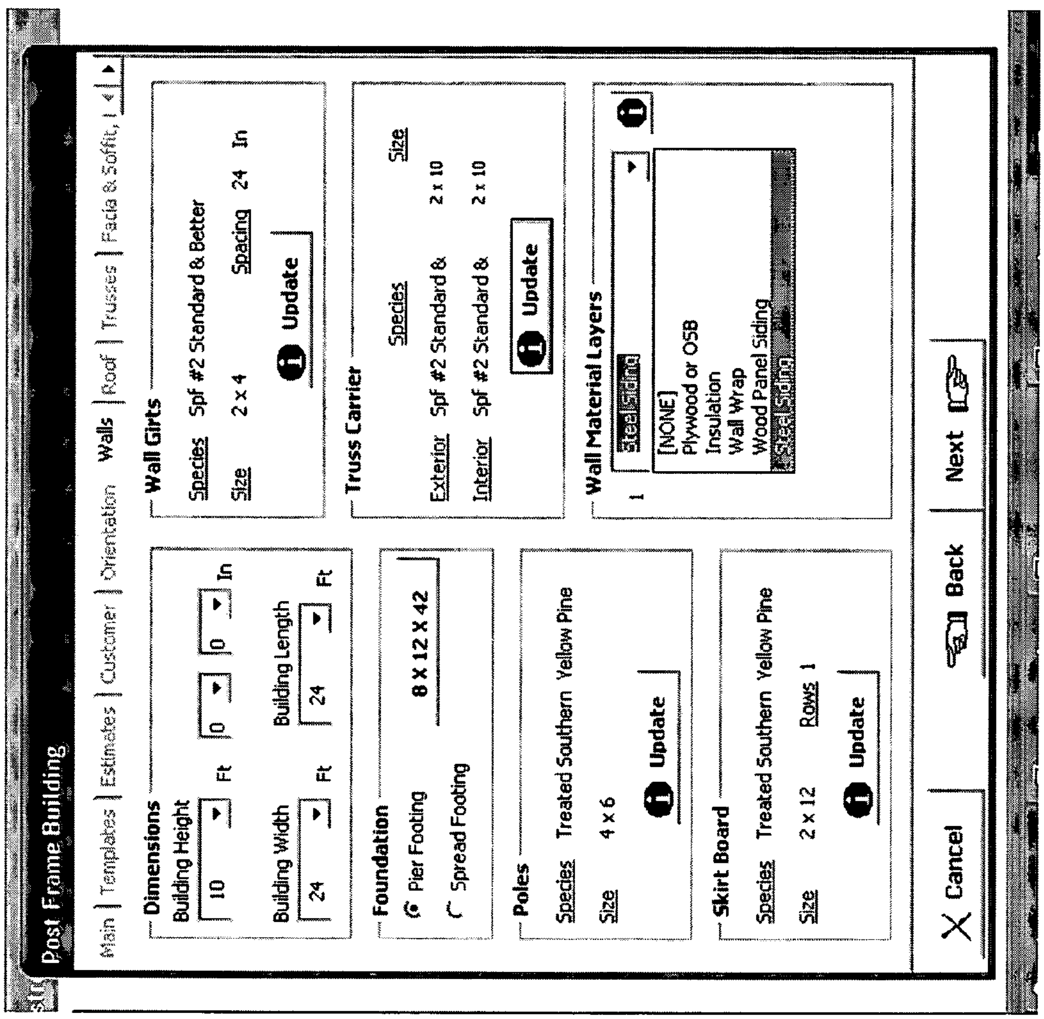

Referring to FIG. 20, one or more generic Wall Material Layers can be selected from a picklist. Then for a given layer, specific products from building material suppliers (that have been previously input into the database; see Set Up below) can be displayed and selected. Builders commonly use more than one wall material layer. For example, plywood covered with a layer of insulation sheeting, followed by vinyl siding. According to the method of this invention, the user can successively select different material layers.

A feature of the invention, called Built-In Positive Error Checking (or "BIPEC"), requires the user to make choices for the estimate that will produce a complete and feasible design. BIPEC is implemented in many ways and determines whether a parameter or group of parameters is within a range of selected values. Throughout the program a user cannot continue with an estimate if a required entry isn't made. Instead of allowing a user to spend time completing a desired estimate, only to learn of an invalid parameter forcing them to backtrack and discover where the problem lies and what might be done to fix it, the invention prevents the user from advancing to the next step until a substantially feasible alternative is entered for the current step. When the user makes a choice that is not proper, the region and heading for that entry are highlighted in red, and/or a dialog box is used to display an error message indicating corrective action to be taken in order to proceed. These steps are cyclically repeated until the parameter or group of parameters is within the range of selected values.

By way of example, one implementation of BIPEC is that selection of incompatible wall layers is not permitted. In this situation, after the user makes an initial wall material layer selection, any subsequent material selections are governed by that previously selected parameter so as to result in a feasible combination. For instance, vinyl siding cannot be used without first choosing a layer of plywood or OSB (Oriented Strand Board); and wood panel siding cannot follow metal siding.

Figure 28:
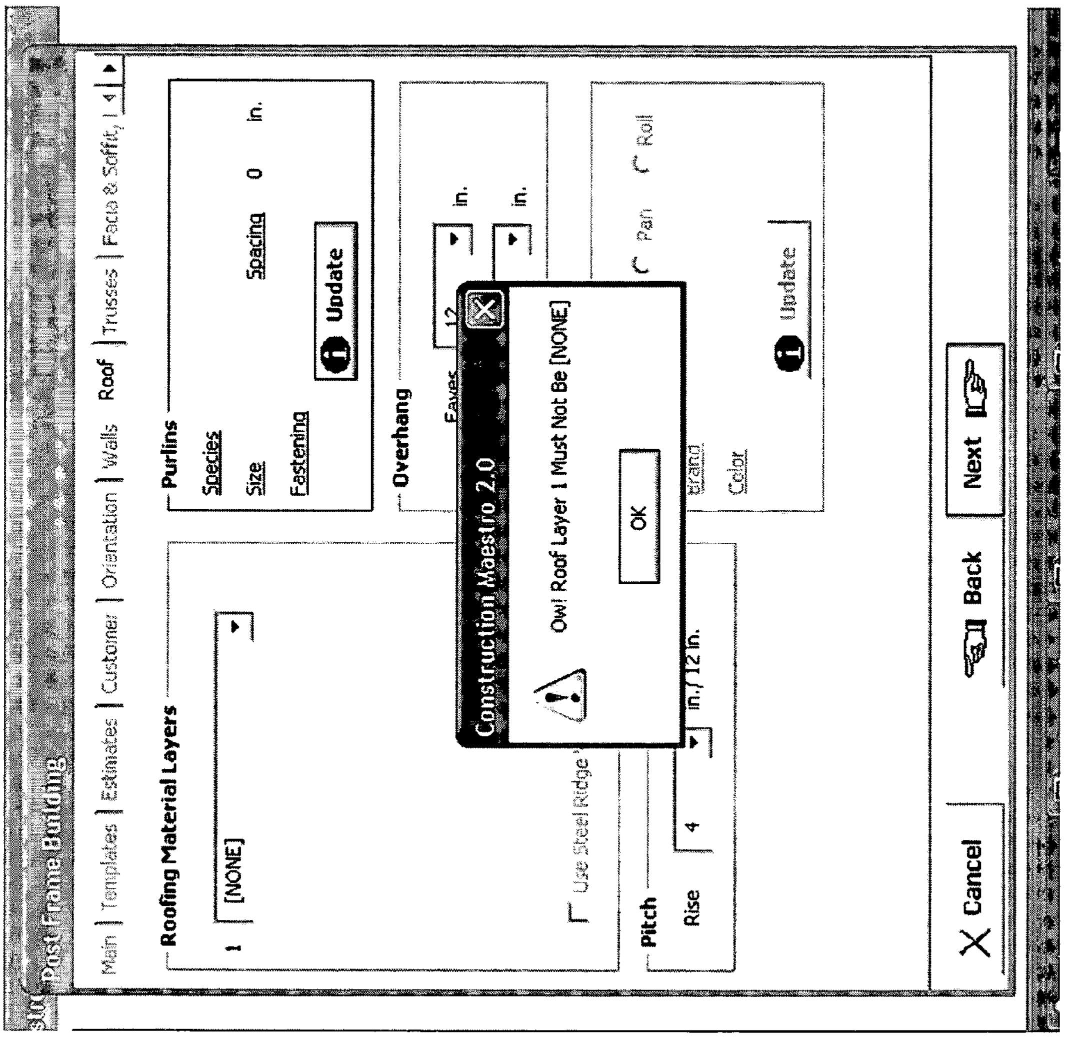
Figure 29:
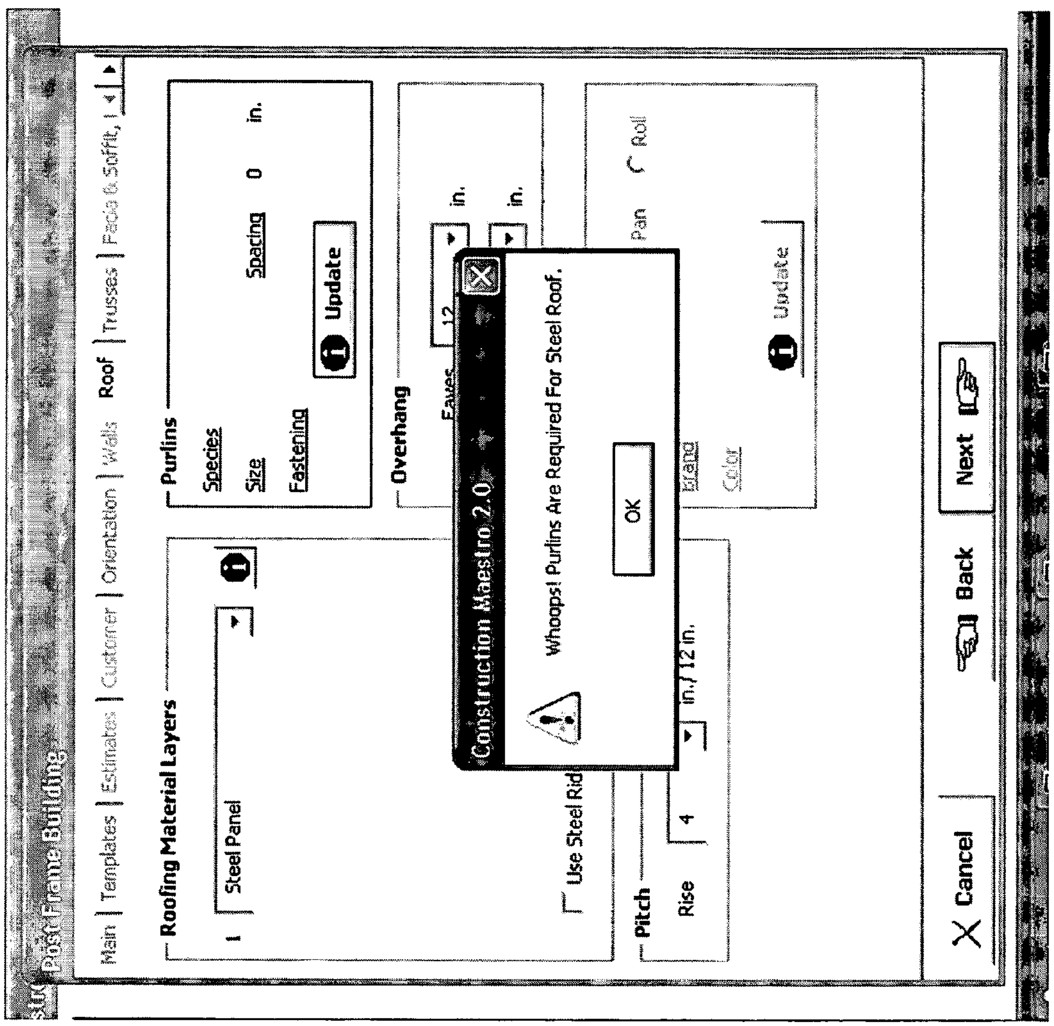
Figure 175:
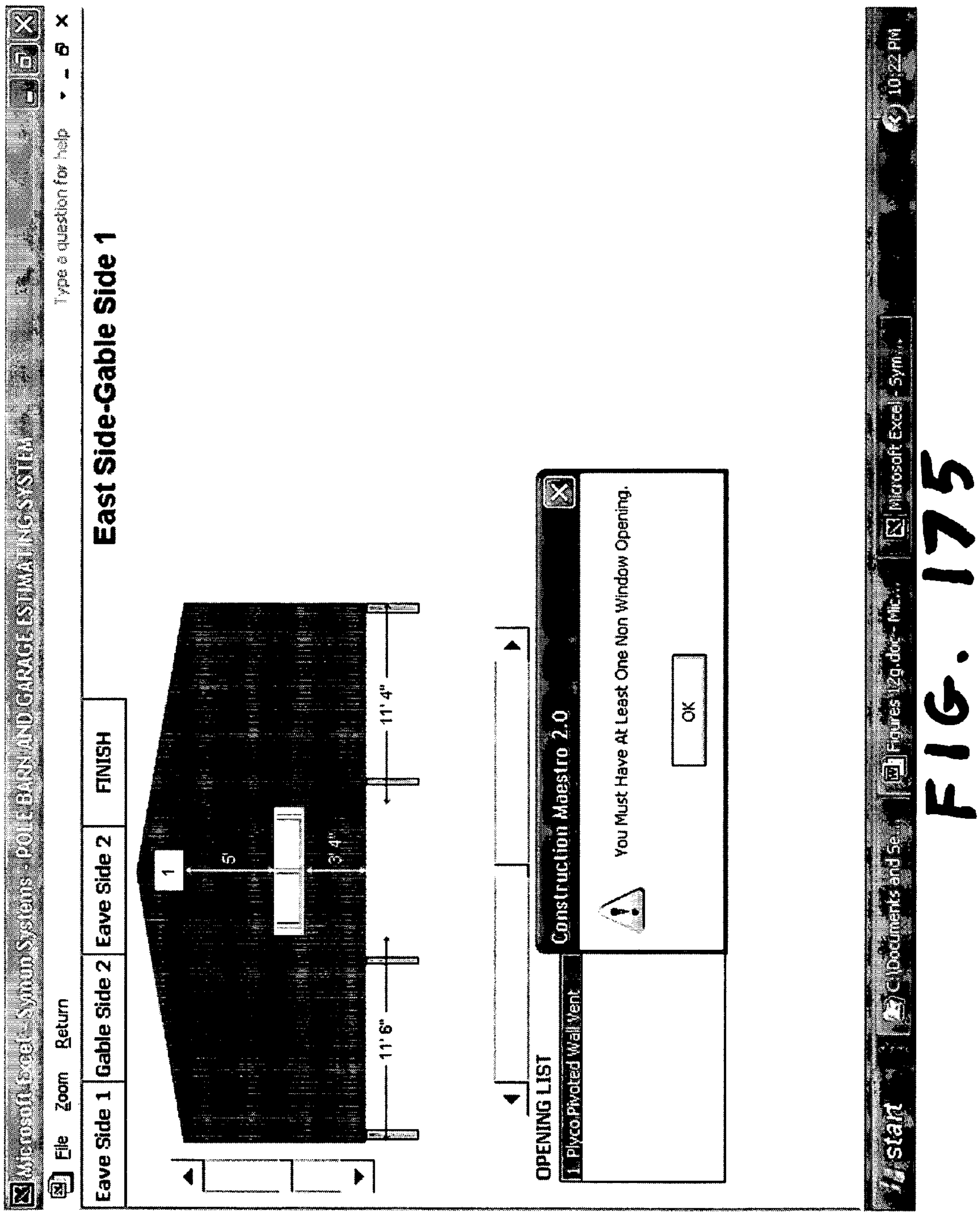

Referring to FIG. 28, the default roofing material layer of "none" was not updated before the user tried to proceed to the next step of the program. According to the invention, a message is displayed advising the user that "none" is not a valid choice. When the user enters a valid choice, the estimate can proceed. What constitutes valid choices has been selected in advance and coded into the software. The valid choices encompass a wide variety of building considerations. Referring to FIG. 175, single parameters are checked such as, for example, that at least one opening for the building that is not a window must be specified, i.e. some type of door or other opening at the ground level is required. For other situations governed by BIPEC, such as numeric dimensions and whether suitable goods exist in the database to permit given user selections, etc., refer to FIGS. 29, 33, 37 and 174A-174G.

In another embodiment of BIPEC, when the parameters for an estimate have been initially selected but prior to choosing doors and windows, the program loads messages concerning the initial estimate to a Message Center Window. See FIG. 50 and FIG. 158A-158B. These messages provide guidance to the user, too, regarding the feasibility of the initial estimate. If the user decides to change any part of the estimate in response to this information, the Back command can be used to edit the appropriate parameter. An example shown in FIG. 158A is that insulation is not an approved exposed wall layer, and that some kind of siding material such as wood panel siding, steel siding, etc. which is approved must be used. A further example of FIG. 158A is that felt must be selected as a previous layer when shingles are selected to cover the roof.

Figure 21:
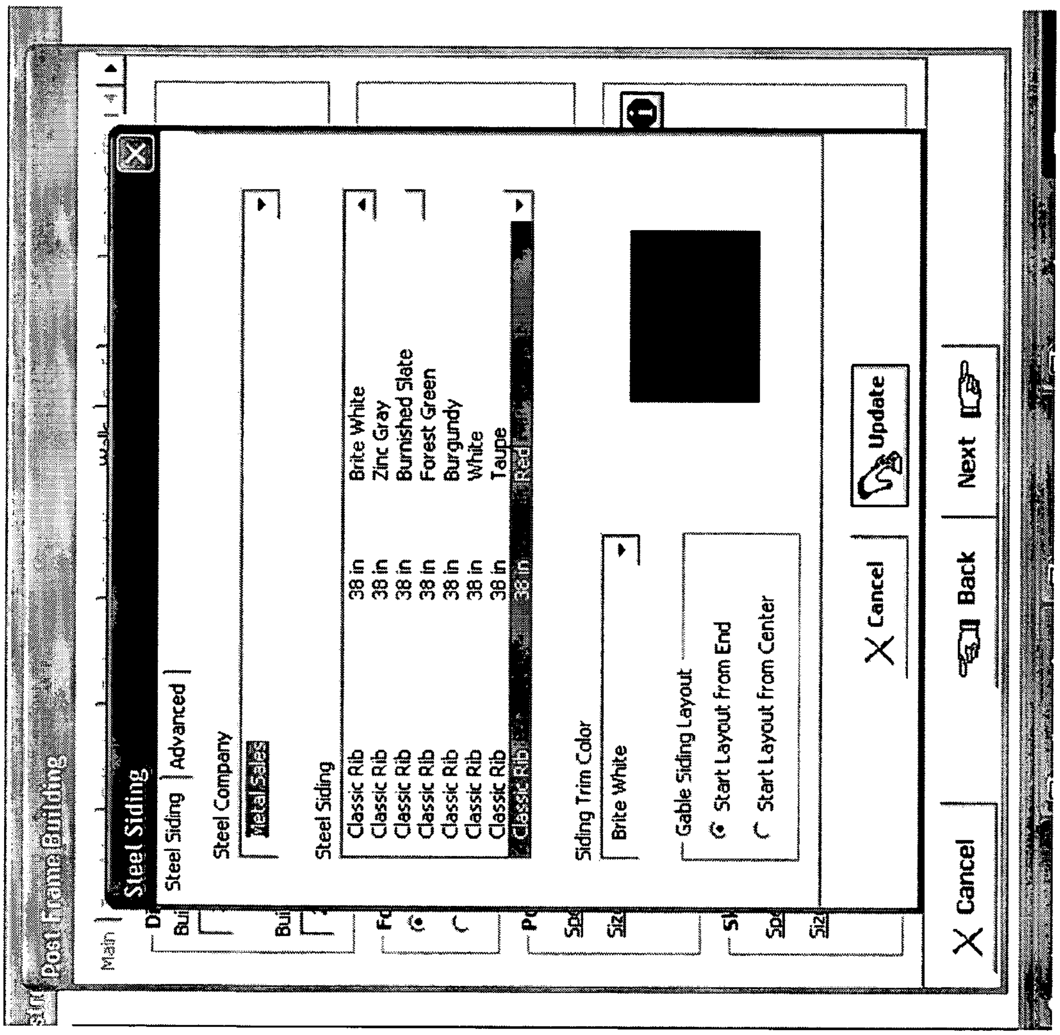

Referring to FIG. 20, if Steel Siding is selected as the wall material, the user is taken to the Steel Siding tab of FIG. 21. Then the user can select, from suppliers and products previously input into the database, the Steel Company, type/width/color of Steel Siding, and the Siding Trim Color. The color for Steel Siding or Siding Trim is shown in the display for reference.

Figure 176:
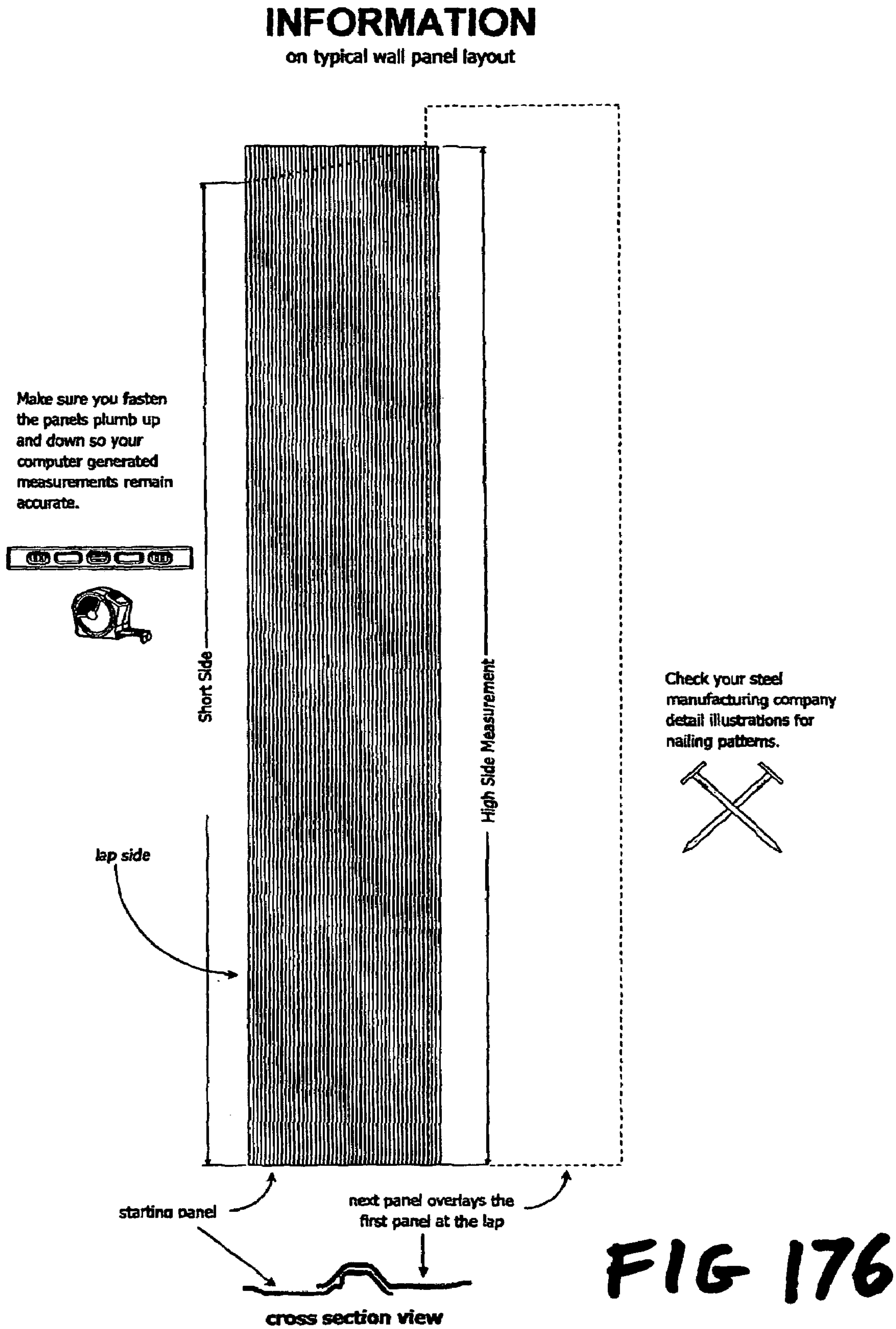

Referring to FIGS. 90, 93, and 117-120, the invention includes the ability to display a wall having a plurality of metal panels and the location on the wall of each panel. Metal panels for a wood frame building are typically made of corrugated steel, with a feature along each longitudinal edge called a lap which facilitates overlapping the panels to form a substantially weatherproof joint. See FIG. 176. The laps are also helpful for aligning adjoining panels. Examples of intermediate dimensions for the plurality of metal panels before final trimming are shown in FIGS. 117-120. For the gable end of FIG. 117, the length of each metal panel before trimming for the pitch of the roof is shown. This trimming operation is typically done by a building crew prior to installation of the metal panels on the wall. By indicating the roof line and showing the intermediate lengths of each of the metal panels, together with the dimensions provided in the Steel Panel Layout of FIGS. 123-125, the building crew can properly locate each panel on the wall without the actual panels being numbered or otherwise identified, which they are usually not. However, the identity of each metal panel is displayed in the visual model of FIGS. 117-120, so as to correspond with the list of the metal panels in FIGS. 123-125. This helps to assure that all of the individual metal panels required to assemble the building are at the job site. It is helpful to display other information in the listing of all the panels, like a parameter such as the panel height in inches before trimming for the pitch of the roof, for gable end panels. Furthermore, other parameters such as the low or short side and high side heights of each individual panel can be shown in the listing, in other words, clearly identifying the specific geometry that will be needed for the specific location the panel is intended for. Given this information creates a "cut list," and now the metal panels can be cut on the ground and attached to the building without further modification.

The building openings, i.e. windows, doors, etc., are indicated by dashed lines in the metal panel layout views of FIGS. 117-120 to assist the building crew with the proper location of each of the individual panels with respect to the walls of the building. To further assure that the user understands how the openings correlate with the panels, the specific opening is labeled with text that identifies the type of door, window, etc. represented by the dashed lines. This is helpful in cases where similar openings are in close proximity for a given wall of the building.

A reference point for determining the vertical location of components of the building is a key aspect of providing an accurate building design. This reference point can be one of a number of choices, including the top surface of a finished floor of the building, the top surface of the finished earth grade adjacent to the building, and the top of the rat wall, i.e. the boards extending around the perimeter of the building, usually partly below the finished earth grade. The rat wall is also know as the skirt board, grade board and green board. By whatever name, its function is to prevent animals from burrowing under the walls to get inside, and also serves as a place of attachment for the bottom of the metal panels. In many instances the top of the finished floor corresponds with the top of the rat wall, and therefore either can serve as the reference point for vertical measurements for the building. The grade level of the ground adjacent the building is another possible reference point. The reference point or reference line is indicated by dashed or solid lines. Furthermore, text is used to identify where the reference point is. In addition to defining the location of the entire structure in the vertical axis, the reference point can be used for displaying the vertical distance from the reference point to a bottom edge of an individual metal panel when attached to the wood frame building. The correct starting point at the bottom of a wall for attaching the metal panels will have a significant impact on whether the plurality of panels will match up to the top of the eave side, or the pitch of the roof for a gable end. The reference point can also be used for displaying the vertical distance from the reference point to various aspects of the wood frame building, including the distance to the top surface of the finished floor, the top surface of the finished earth grade adjacent to the building, and the top surface of a skirt board attached to a wall.

Referring to FIG. 21, when selecting parameters for the walls, the user can select a layout for the metal panels starting at an end such as the left end, or side, of a gable end. For this type of layout, a longitudinal edge of a metal panel is substantially aligned with the side. Under Gable Siding Layout, the user selects Start Layout from End, in other words, from the left side as one faces the gable end. This permits installation of sheet metal at the left end to begin with a full-width, i.e. nominal width, sheet. However the piece of sheet metal at the peak of the gable will usually require the cutting of two angles in order to match the peak. Starting the layout from an end makes it simpler to begin siding a wall, in that a cut along the length of the first panel is not required. The trade-off is that a more complex cut may be necessary for the panel at the center of the wall. This is because the angle for the peak of the gable end will have to be cut at two places in order to form the "point" that matches the pitch of the roof. Starting the layout from an end is illustrated in the Steel Panel Layout of FIG. 117, where Panel Number 8 of Gable Side 1, for example, is intended to be the last one installed on that side and is the only one narrower than the nominal width of 38 inches, as shown in FIGS. 123-124, "East Side—Gable Side 1" at Panel Number "8."

Referring again to FIG. 21, the metal panel layout can be selected for a gable end by choosing Start Layout from Center. In this case, the user will not have to cut two angles for the piece of sheet metal used at the peak of the gable. Rather, the sheet metal layout will begin at the center of the gable end, with sheet metal on the left side having one angle, and sheet metal on the right side having the opposite angle cut at the top of the sheet. A metal panel having a nominal width and a longitudinal edge is placed in the model of the building so that the longitudinal edge is substantially aligned with the peak of the gable end. In practice, two adjoining metal panels will each have a respective lap, as described above, and the middle of the overlaying laps will be substantially aligned with the peak.

Figure 121:
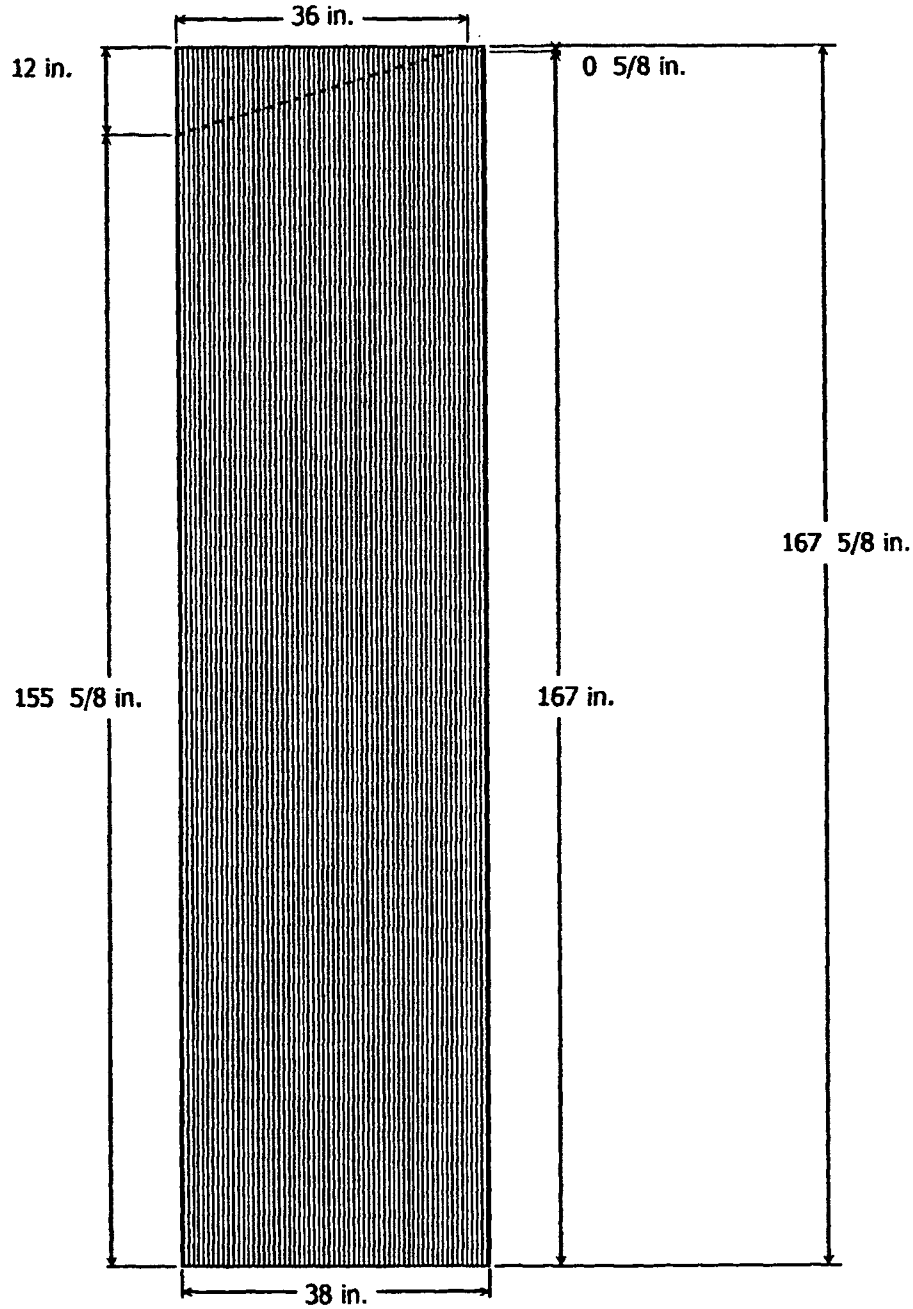
Figure 122:
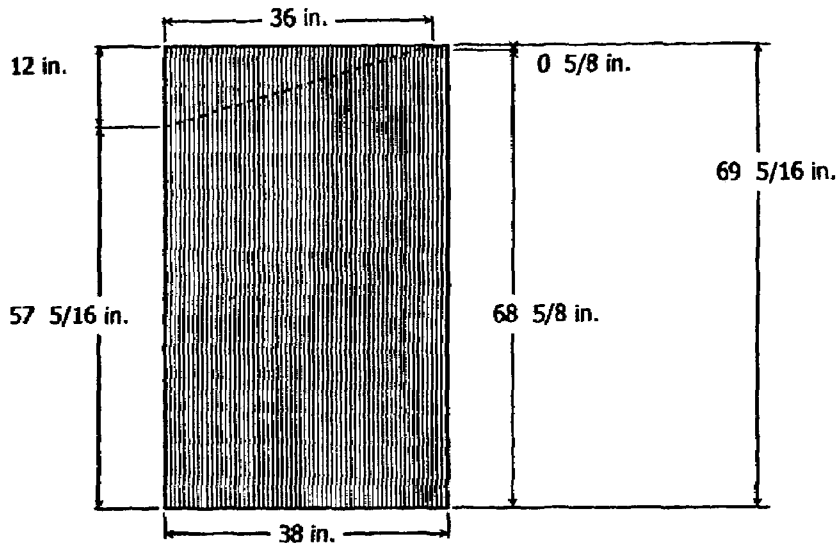

In showing various aspects of the visual model it is desirable to display a detailed view of an individual metal panel for a wall. This is helpful for relating the information in the steel panel layout to the panel, particularly when the panel is the one under the peak of a gable end, where proper fit is important. The final dimensions for the individual metal panel can be obtained from the steel panel layout of FIGS. 123-124. Alternatively, the final dimensions can be displayed for the individual panel as in FIGS. 121-122, to show even more clearly where angles need to be cut, and provide greater confidence that this will be done properly the first time.

Figure 22:
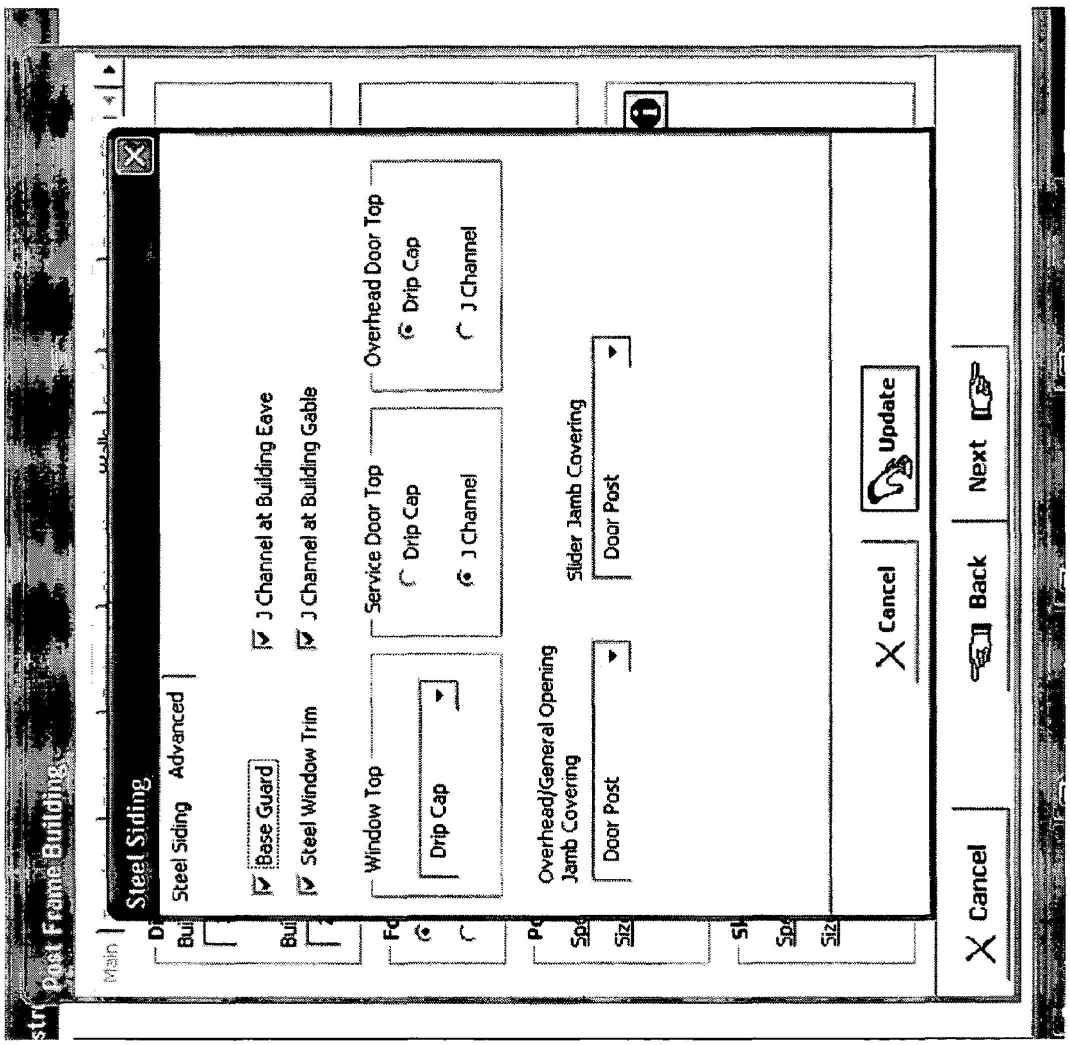

Referring to FIG. 22, under the Advanced tab for Steel Siding, the user can select a number of details: Base Guard, Steel Window Trim, J Channel at Building Eave, J Channel at Building Gable, Window Top (if any), Service Door Top, Overhead Door Top, Overhead/General Opening Jamb Covering, and Slider Door Covering.

Figure 23:
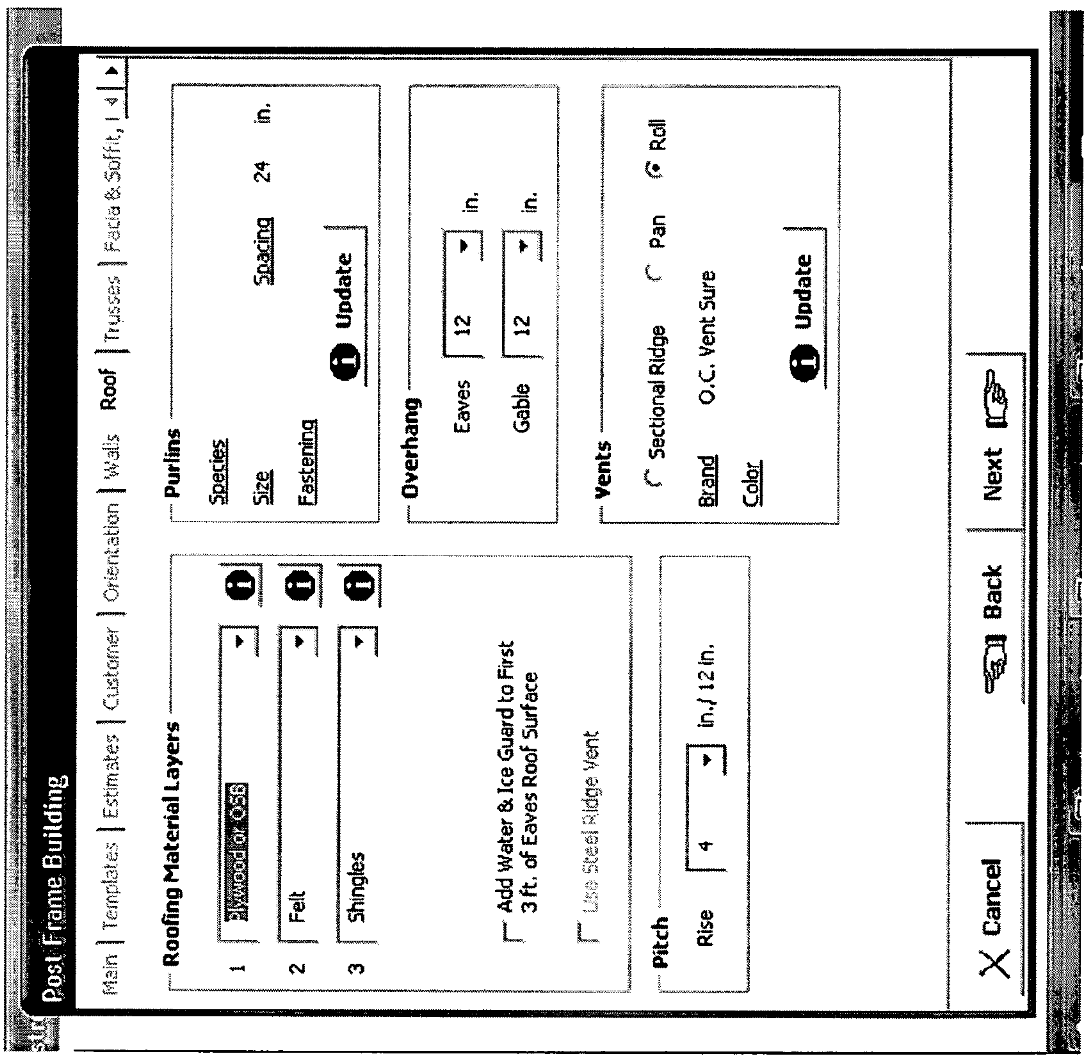

Referring to FIG. 23, the user next moves to the Roof tab in order to choose the following: the Roofing Material Layers, Pitch, Purlins, Overhang and Vents. In a similar fashion to that for wall material layers, one or more generic Roofing Material Layers can be selected from a picklist. Then for a given roofing material layer the desired product for the estimate can be selected (from suppliers and products previously input into the database). Builders commonly use more than one roofing material layer. For example, plywood covered with felt, then shingles. According to the method of this invention, the user can successively select different roofing material layers. However as explained above, because of BIPEC the user is not permitted to select layers that are incompatible. For example, the user cannot choose shingles unless plywood or OSB has already been selected; nor can the user choose shingles if the underlying layer is steel panel.

Figure 24:
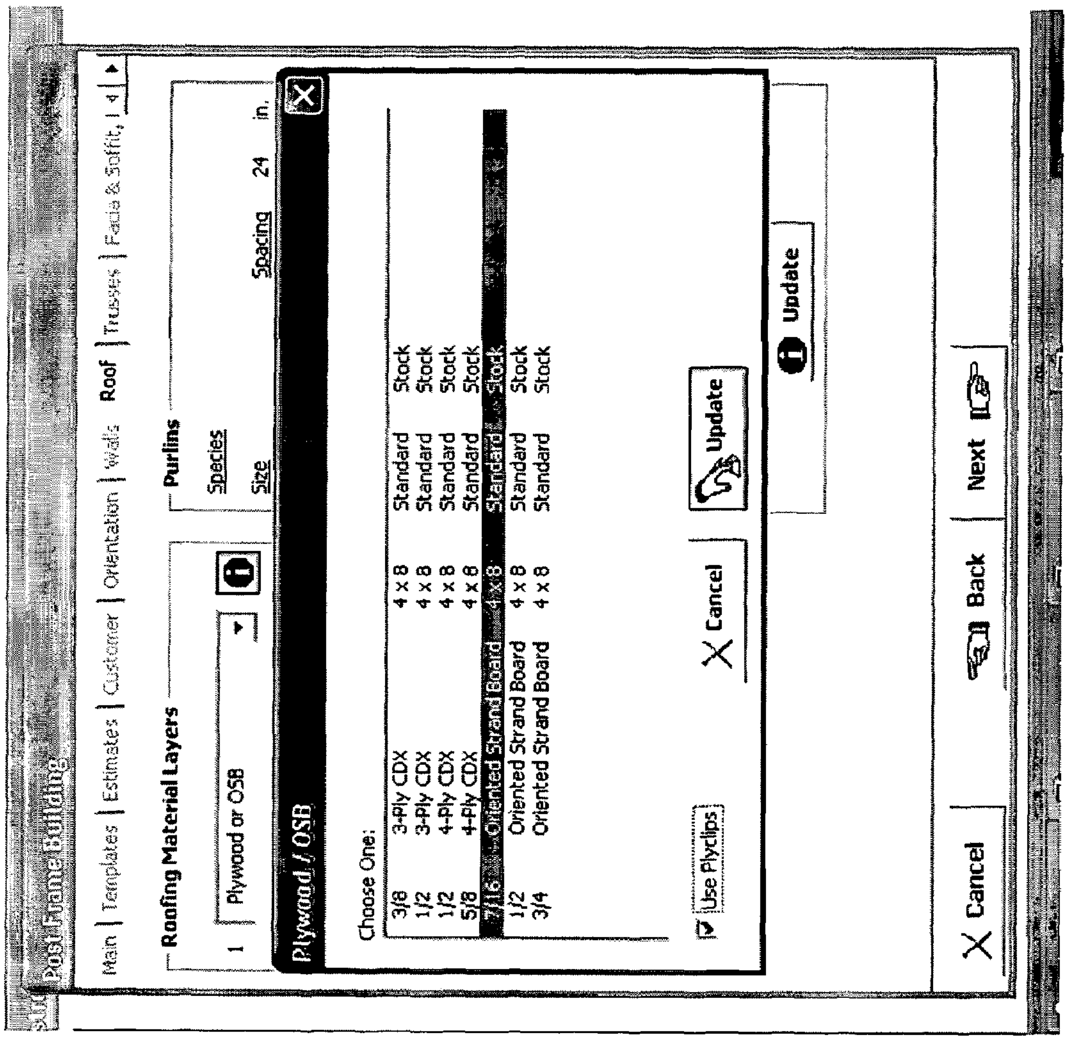

Referring to FIG. 24, if Plywood or OSB is selected, the kind of board, thickness and size of sheet must be chosen, as well as whether to use plyclips. Plyclips are only an option if the product database has plyclips that fit the thickness of the plywood or OSB.

Figure 25:
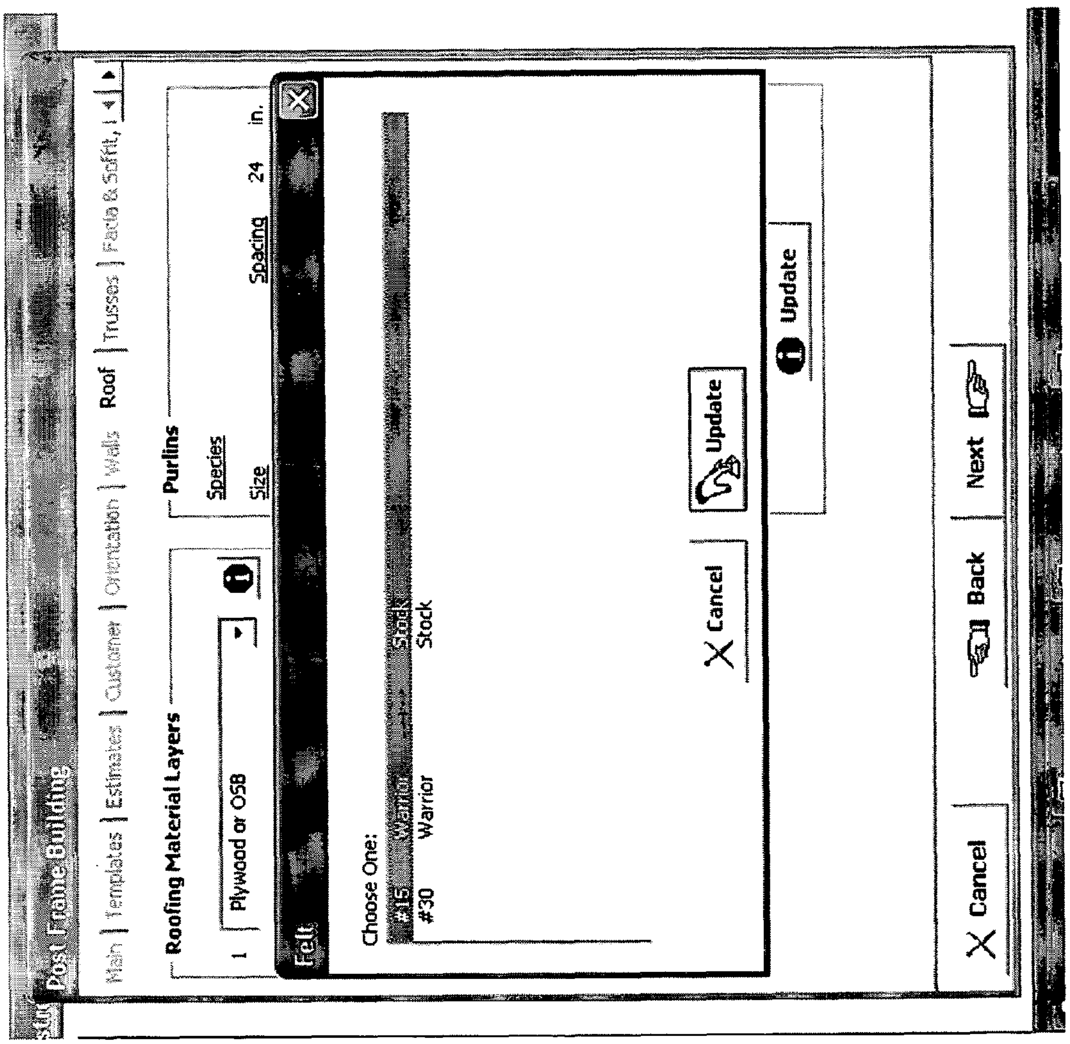

Referring to FIG. 25, if Felt is selected then the kind must be chosen.

Figure 26:
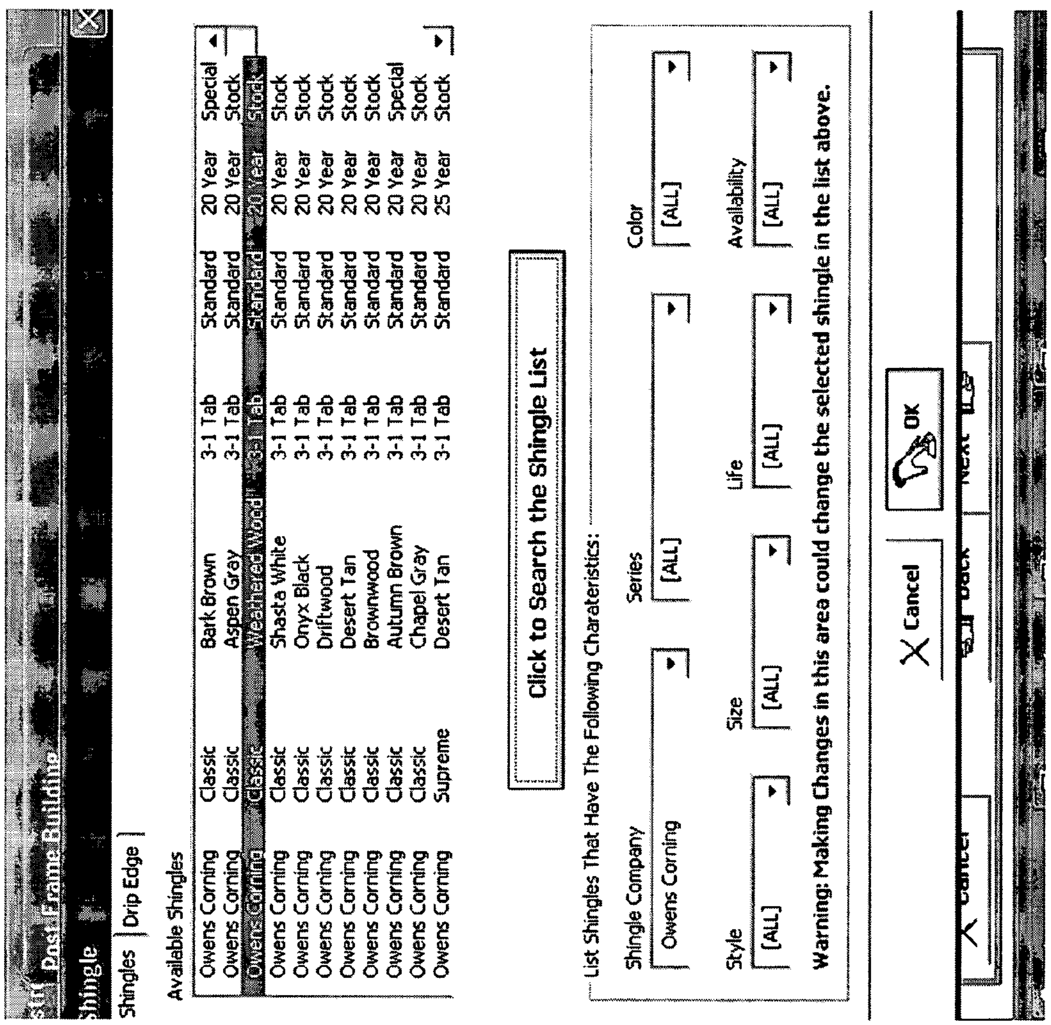

Referring to FIG. 26, if Shingles are selected they must be specified from the list of Available Shingles. (Refer to the description of Setup regarding how to supplement the list.) The soft button "Click to Search the Shingle List" will initiate a search algorithm that finds shingles according to these characteristics: Shingle Company, Series, Color, Style, Size, Life and/or Availability. Under the Drip Edge tab the desired selection can be made. Water and ice guard can be added for the first three feet of the eaves roof surface.

If Steel Panel is the roofing material layer, a Steel Ridge Vent can also be included. Besides the Company and type of Ridge Vents, the number of vents must be specified. However, in another example of BIPEC the maximum number of vents (or "count") is limited based on the length of the roof and vents selected.

Figure 27:
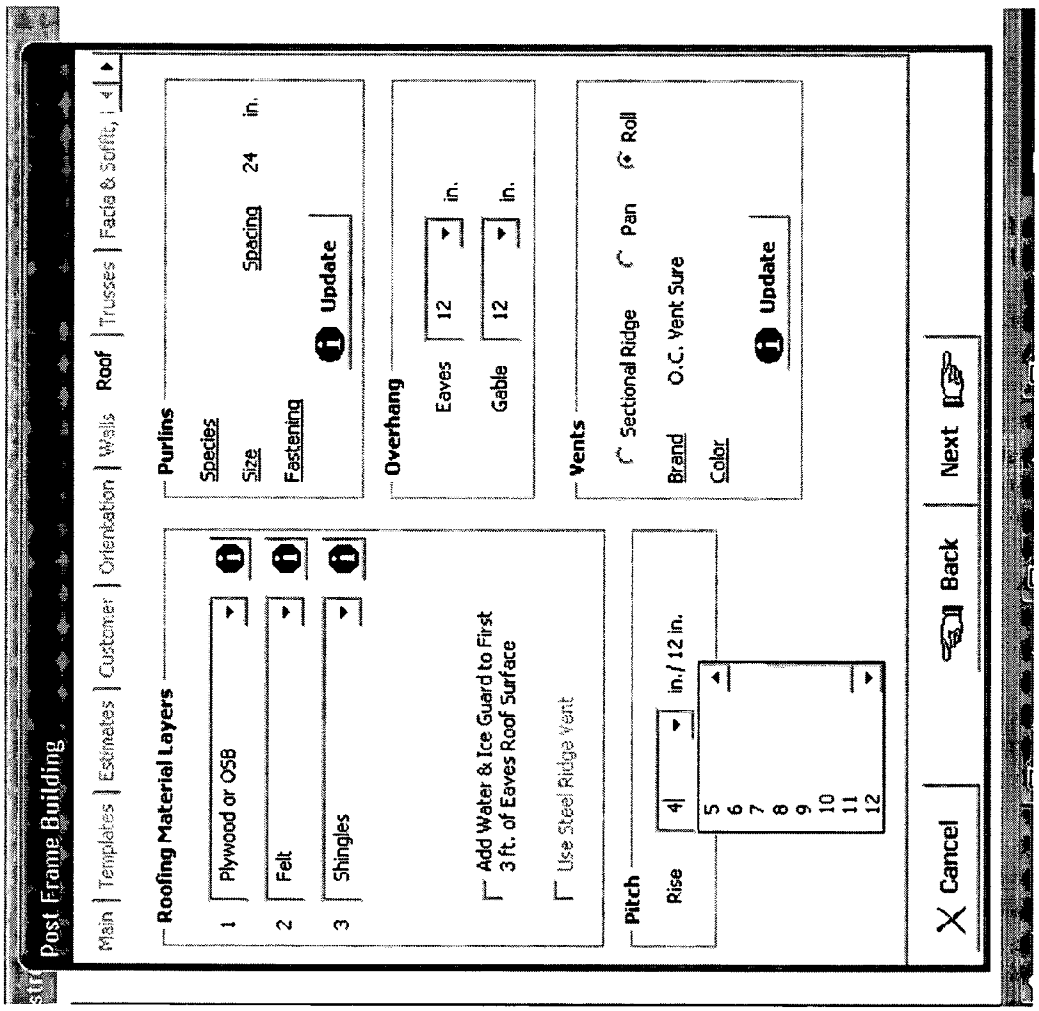

Referring to FIG. 27, the Pitch for the roof can be selected from values between 3 and 12 inches per 12 inches of roof Rise.

Figure 30:
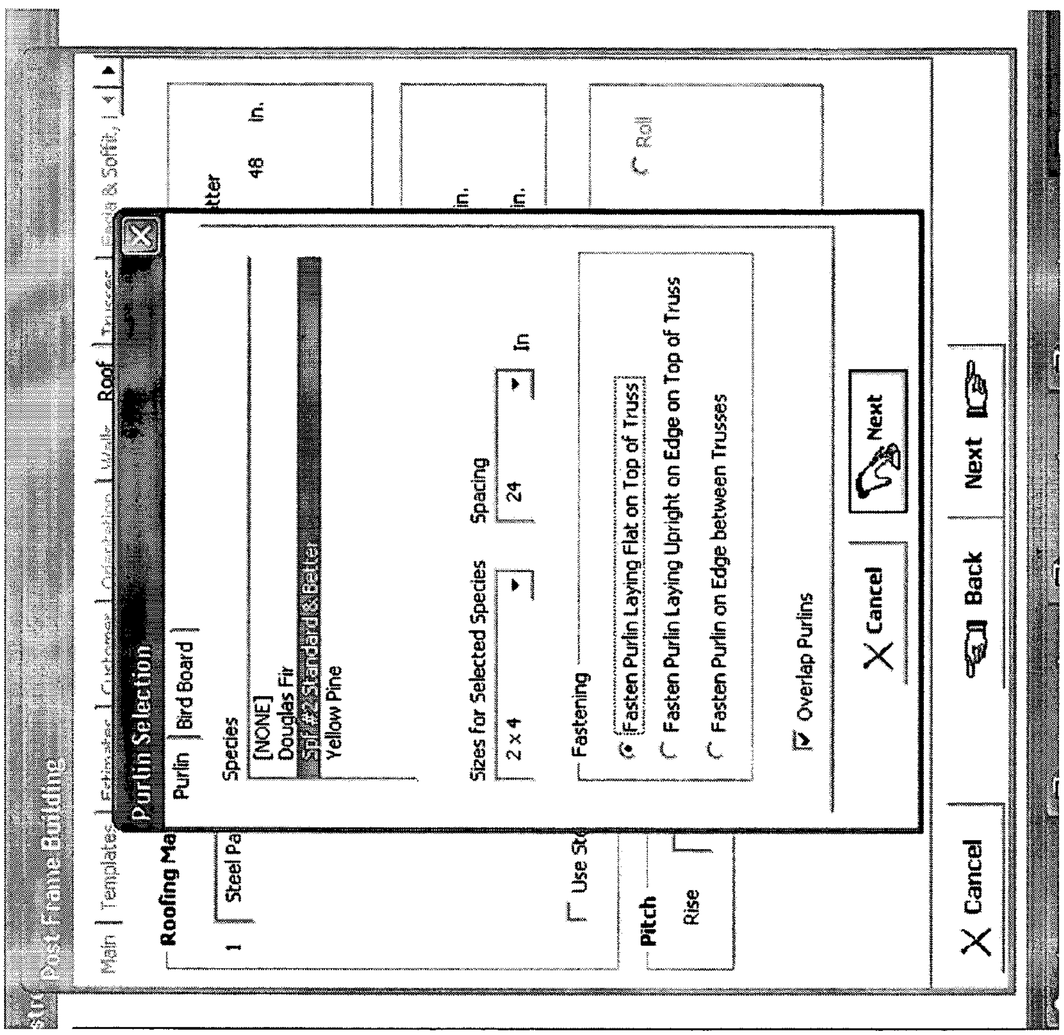

Referring to FIG. 30 concerning roof Purlins, the wood Species, Size, Spacing, Fastening method, and whether to Overlap Purlins can be selected. Purlins are generally not used if the trusses will be 24 inches on center or less, with plywood as a roofing material layer (as in the current estimate being described). However, if the roofing layer selected is Steel Panel, purlins are required according to BIPEC. The purlins can be fastened Laying Flat on Top of Truss, Laying Upright on Edge on Top of Truss, or on Edge between Trusses. For the first two fastening methods, the wood Species and Size of the Bird Board (if desired) can be chosen. (Bird Board can be, for example, a 1.5 inch×1.5 inch piece of wood blocking that is fastened between the roof purlins along the top of the top chord of a truss. By taking up that otherwise open space, it prevents birds from building nests there.) For the third fastening method, Use Joist Hangers can be chosen.

Figure 31:
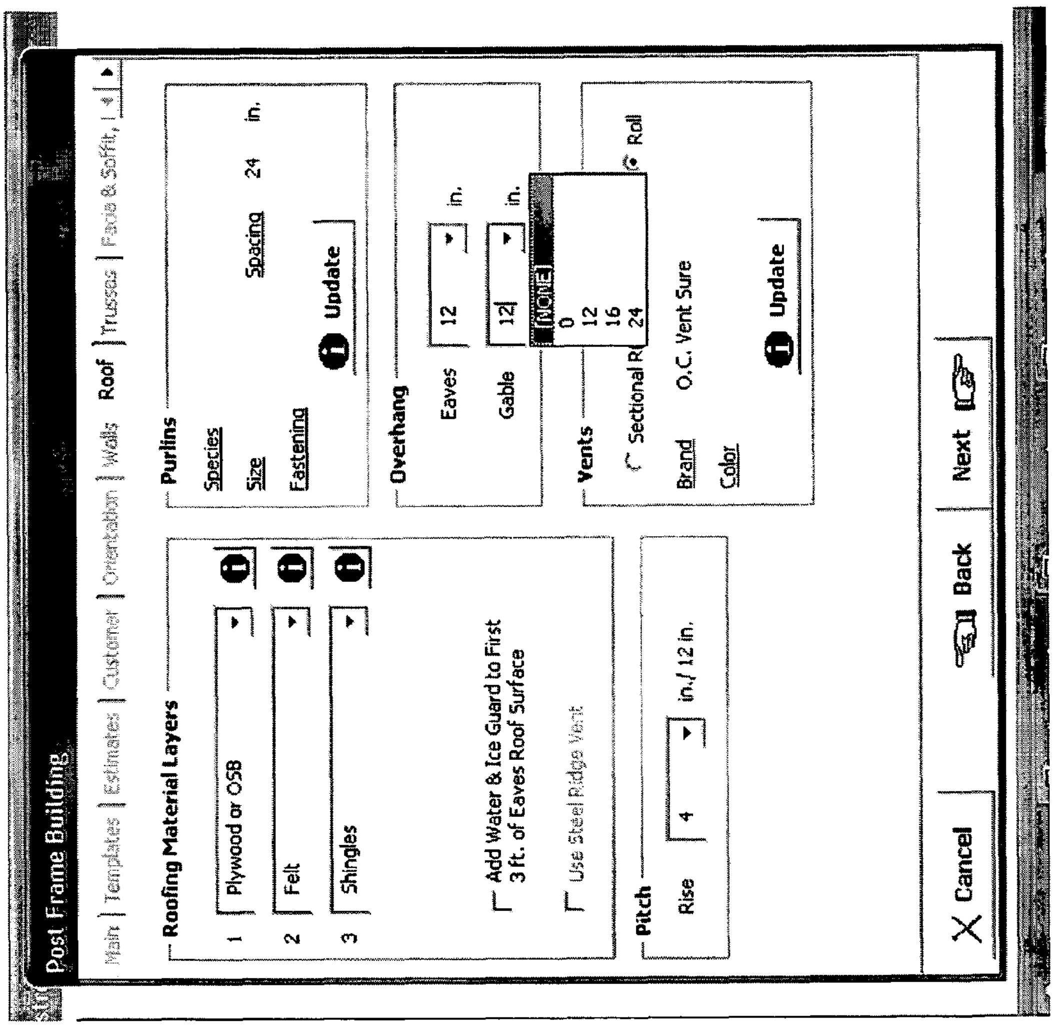

Referring to FIG. 31, the Overhang of the roof for the Eaves and the Gable walls can be selected from respective picklists.

If shingles are selected as a roofing material, by BIPEC the user is required to select roof Vents by type, Brand and Color. The types of vents are Sectional Ridge (or Ridge Vent), Pan Vent and Roll Vent. In each case the supplier, length and/or color must be picked. However, the user is only permitted to select one type of roof vent.

Figure 32:
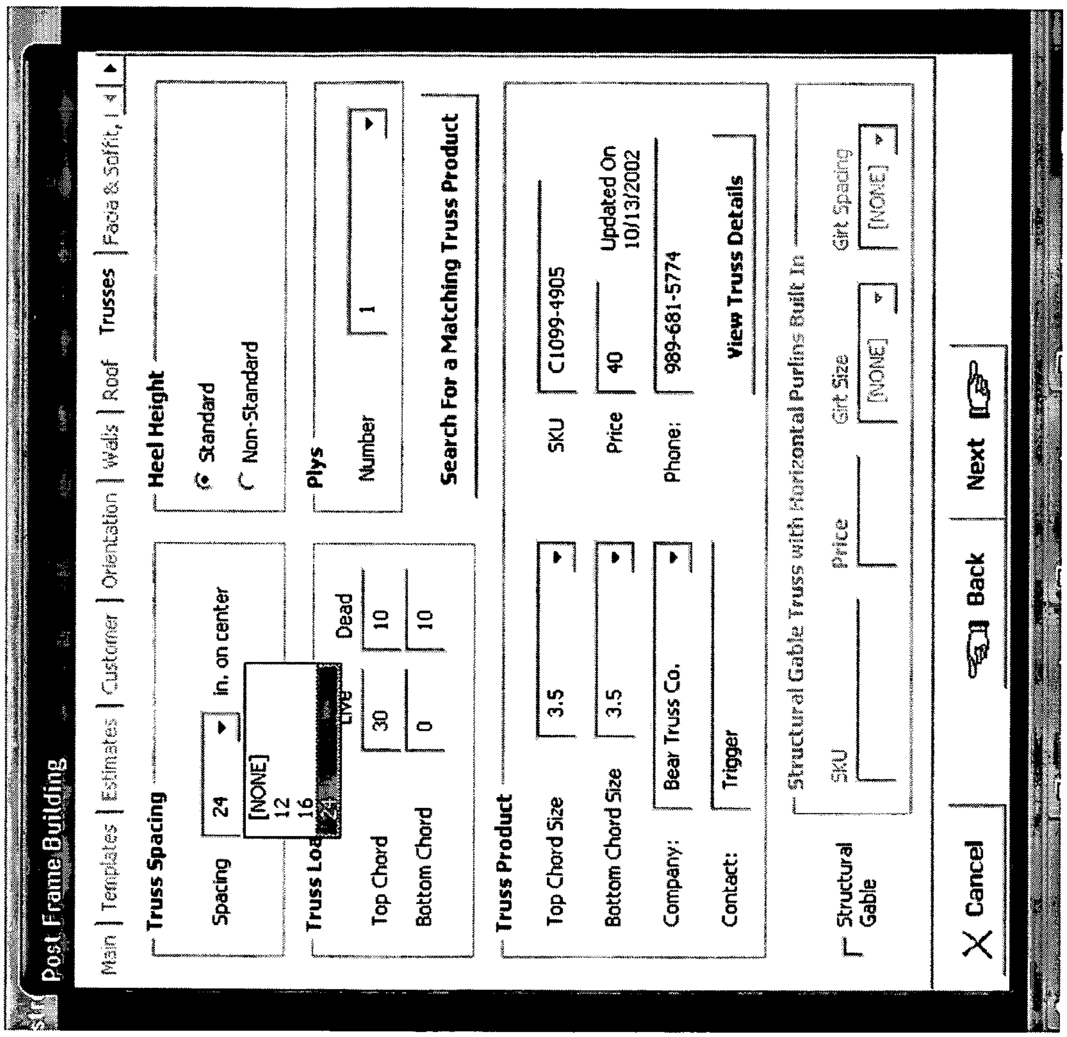
Figure 33:
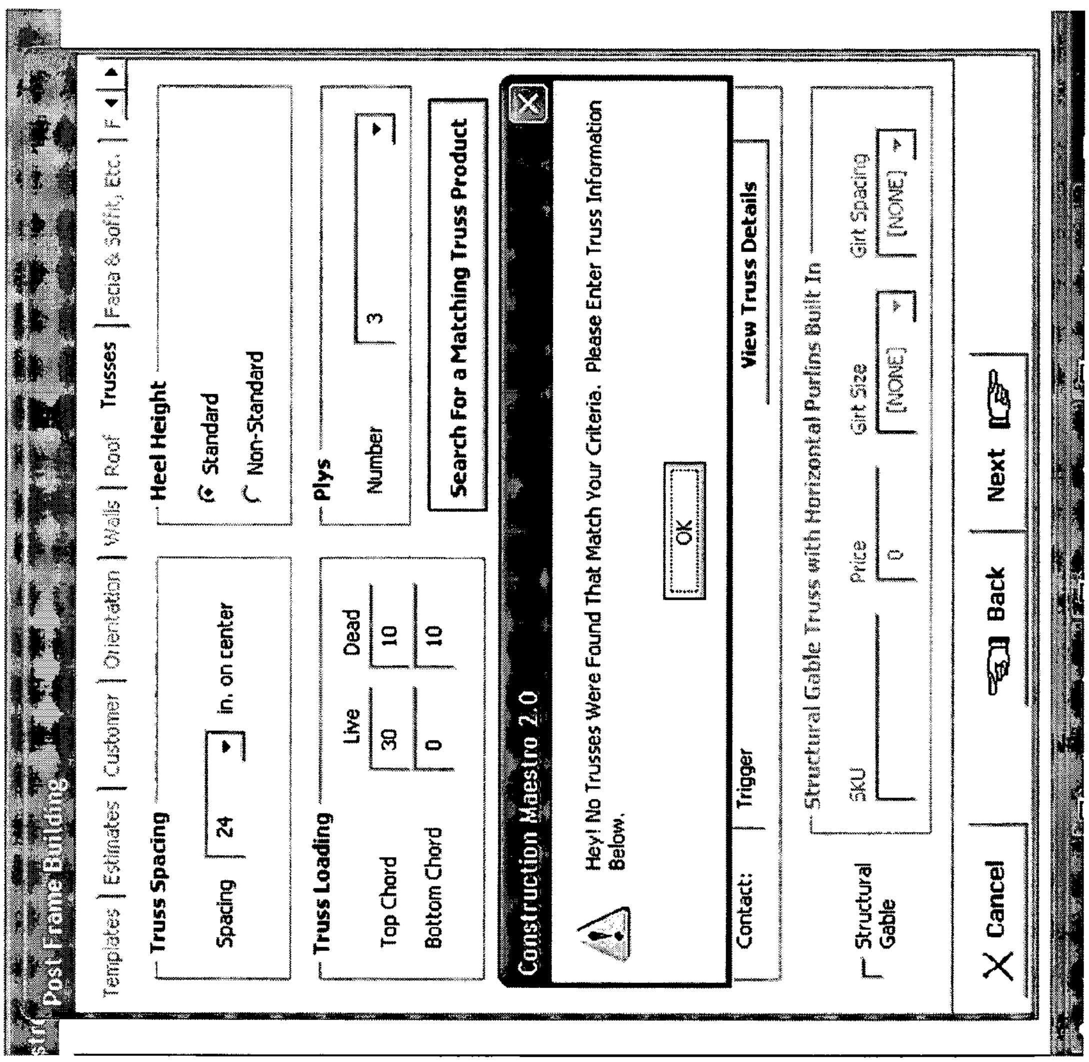

Referring to FIG. 32, the user next goes to the Trusses tab and chooses the following: Truss Spacing, Truss Loading, Heel Height and Plys. Then the specific Truss Product is chosen that meets these design requirements. Finally, a Structural Gable Truss with Horizontal Purlins Built-In might also be used.

For Truss Spacing, the desired value ("inches on center") can be selected from a picklist See FIG. 32.

Referring to FIG. 32, for Truss Loading the following four numerical entries must be made in the appropriate fields: the maximum Live load and Dead load) that the Top Chord and Bottom Chord of each truss must be capable of withstanding. Numbers can be entered in these fields that are not realistic. (BIPEC will flag any negative numbers.) But unless the entries match the parameters of trusses previously loaded into the program, the user will not be successful when the command "Search for a Matching Truss Product" is selected (see FIG. 33 "no trusses were found . . . "). Not finding a suitable truss from the preloaded ones should cause the user to reconsider their truss design. However, if the user wants to use a truss configuration not currently in the Product Setup and Pricing database, this can be done by simply updating the desired fields on the Truss tab and then goes the next page. If a new SKU number has also been entered by the user (or generated by the program), the updated configuration is stored as a new truss product. However, an error message is generated if they try to create a new truss product without using a new SKU number.

For truss Heel Height either Standard, or a user-specified Non-Standard, height can be entered. Either 1, 2 or 3 Plys per truss can be selected.

Figure 34:
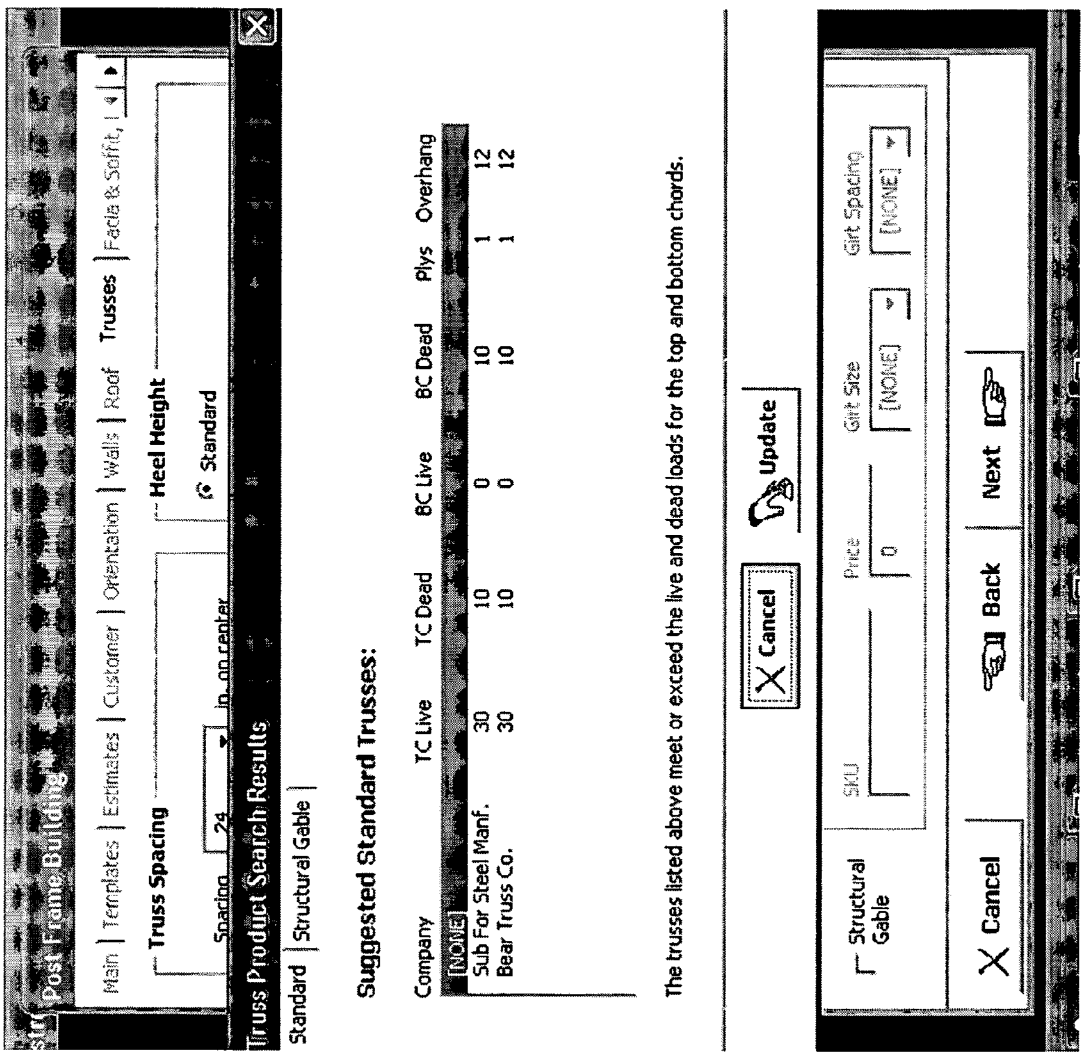
Figure 35:
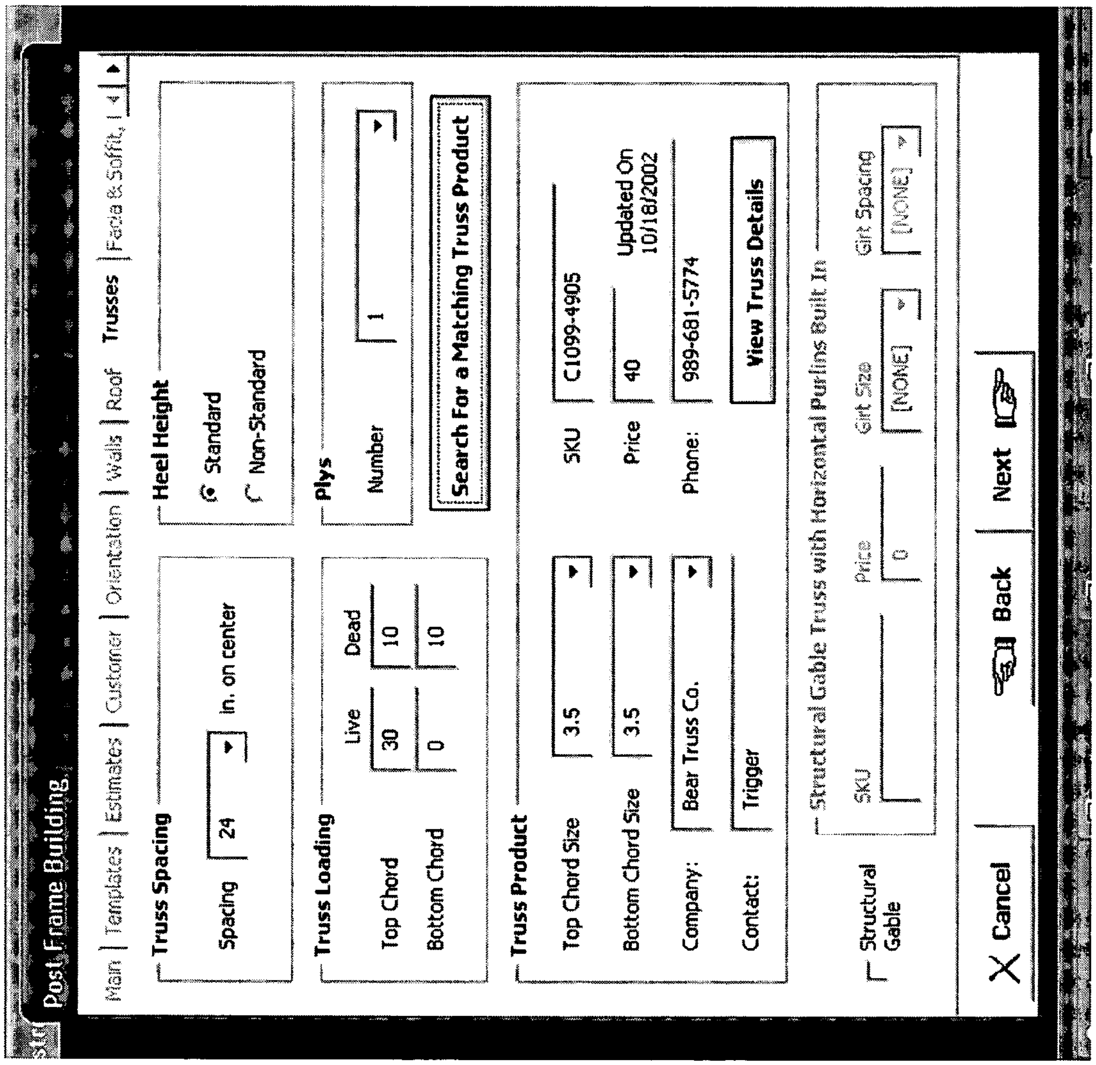

If the combination of these entries corresponds with one or more trusses in the Product Setup database, then after using the "Search" command, the Truss Product Search Results are displayed under two tabs: Standard and Structural Gable. Under the Standard tab a list of Suggested Standard Trusses will appear (FIG. 34). Under the Structural Gable tab a list of Suggested Structural Gable Trusses, if any, will appear. After the user chooses a Standard Truss, the following parameters are displayed in the Truss Product section of the main Truss tab: Top Chord Size, Bottom Chord Size, Company, Contact, SKU number, Price (including when it was last updated), and the seller's Phone number. Please refer to FIG. 35. After the user chooses a Structural Gable, the following parameters are displayed in the Structural Gable Truss with Horizontal Purlins Built-In section of the main Truss tab: SKU number, Price, Girt Size, Girt Spacing and a checkbox which indicates that a Structural Gable has been selected.

Figure 36:
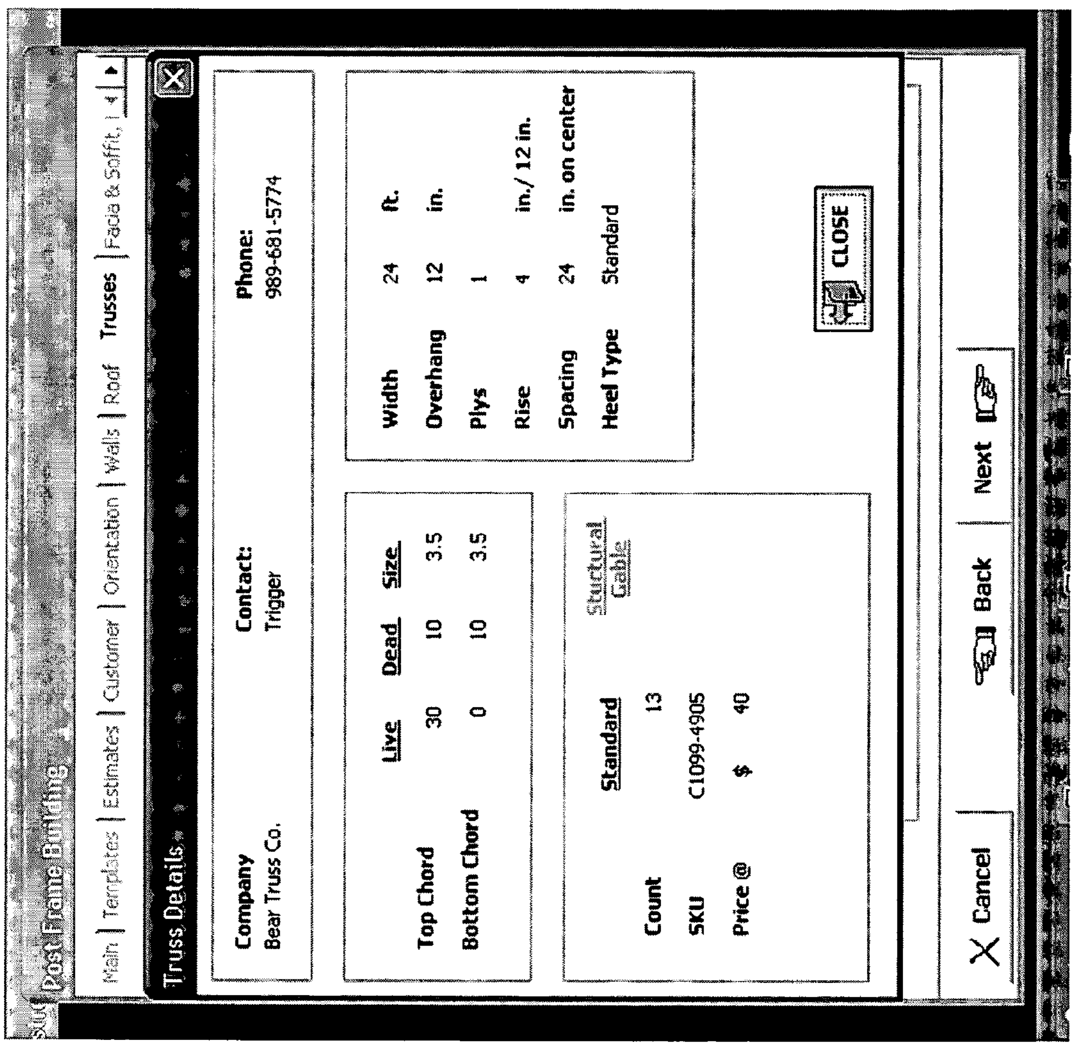
Figure 37:
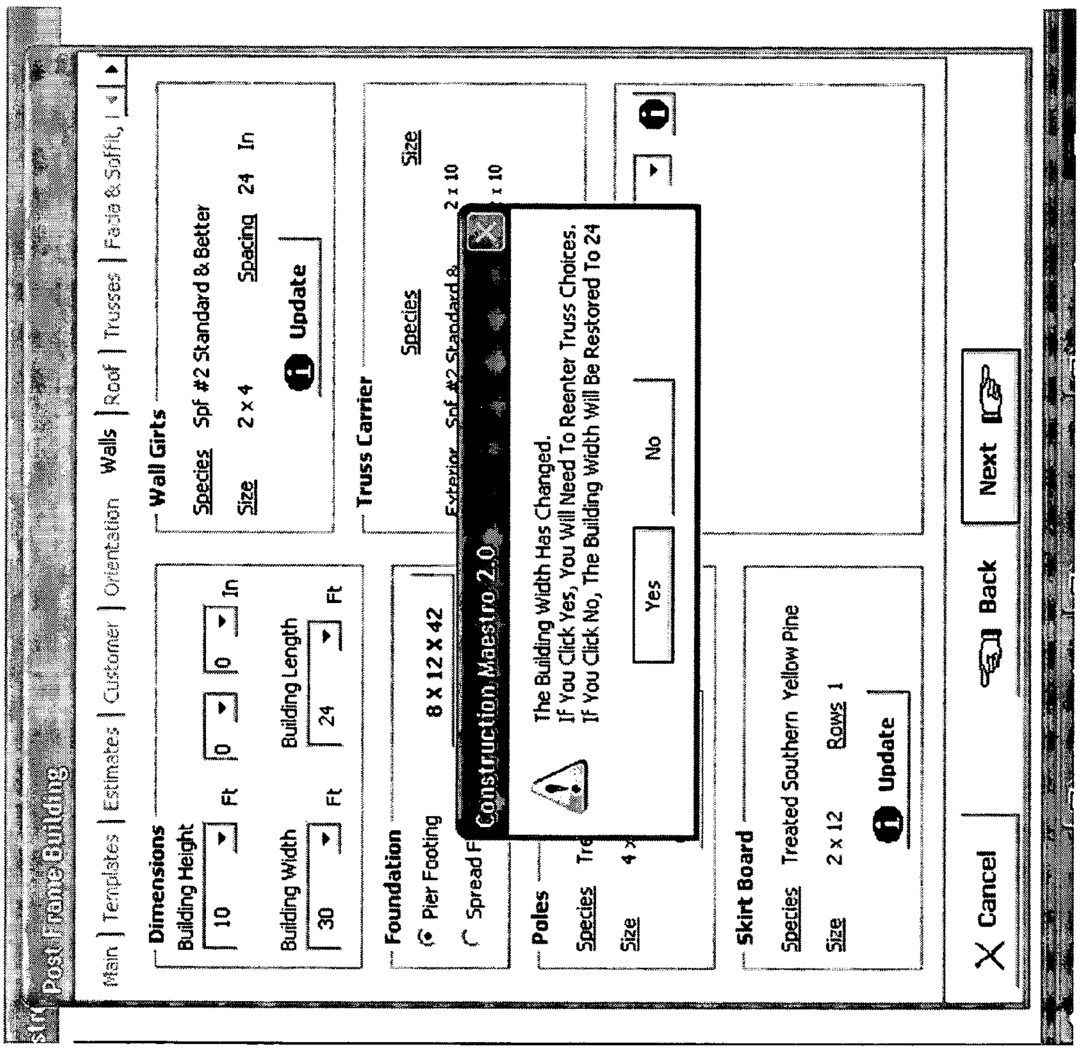

Selecting the soft button View Truss Details provides additional information for both kinds of trusses as shown in FIG. 36.

Figure 38:
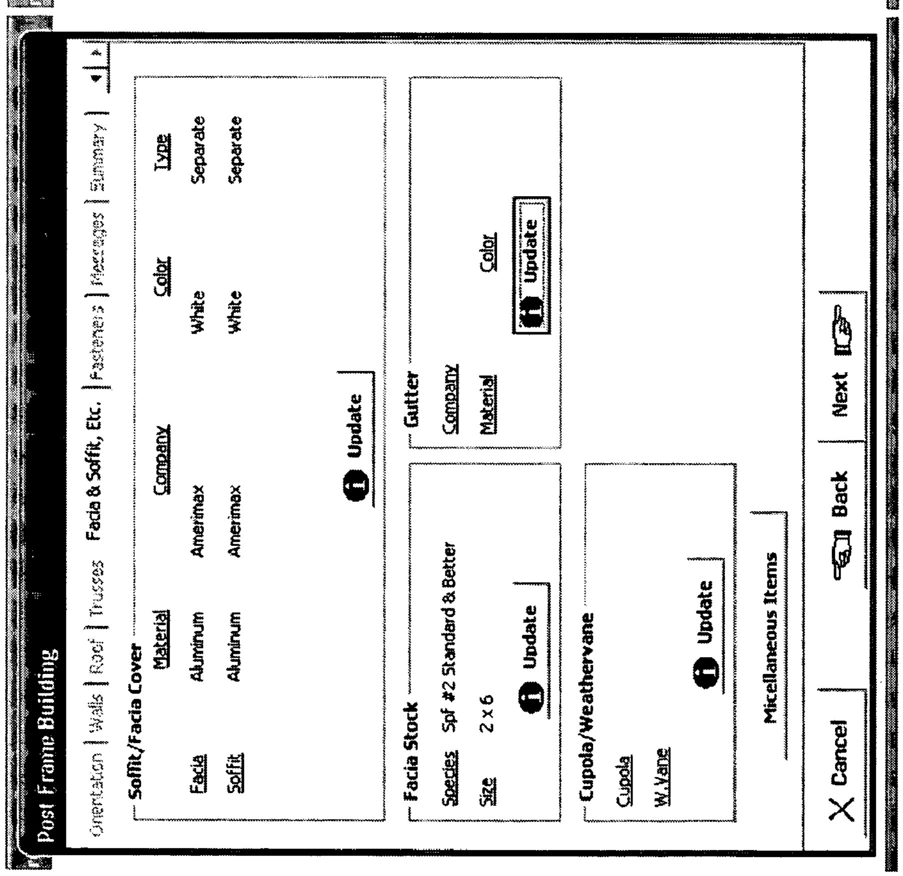

Referring to FIG. 38, the user next goes to the Facia & Soffit, Etc. tab and chooses the following: Soffit/Facia Cover, Facia Stock, Gutter, Cupola/Weathervane and Miscellaneous Items.

Figure 39:
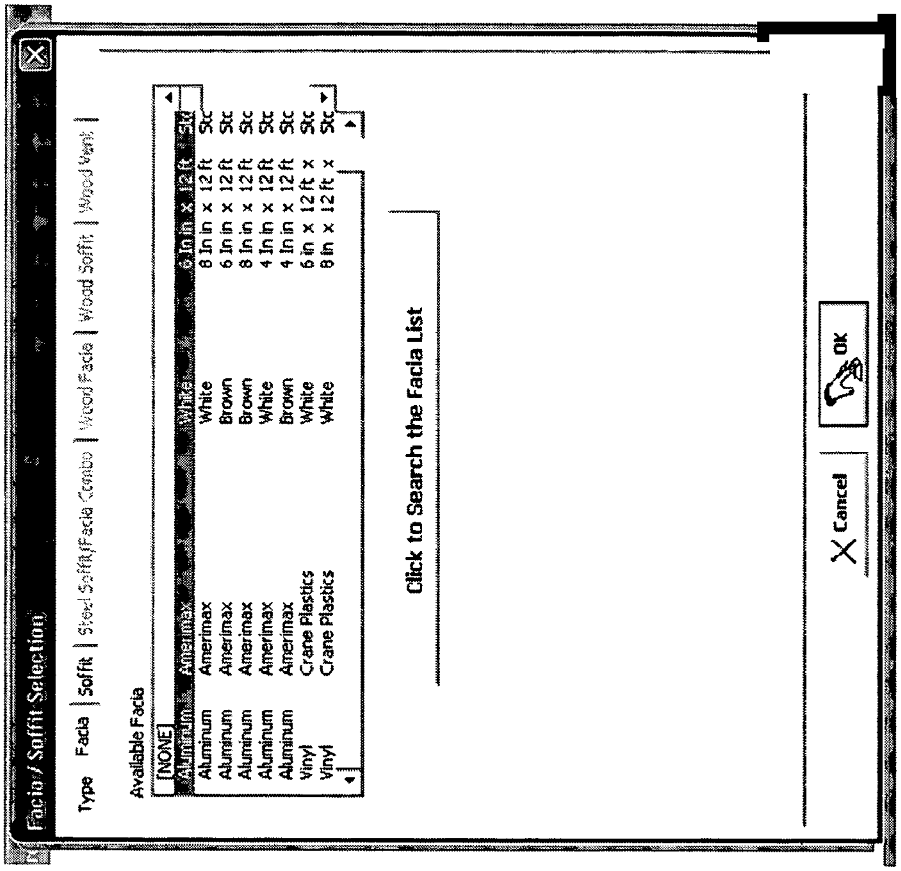
Figure 40:
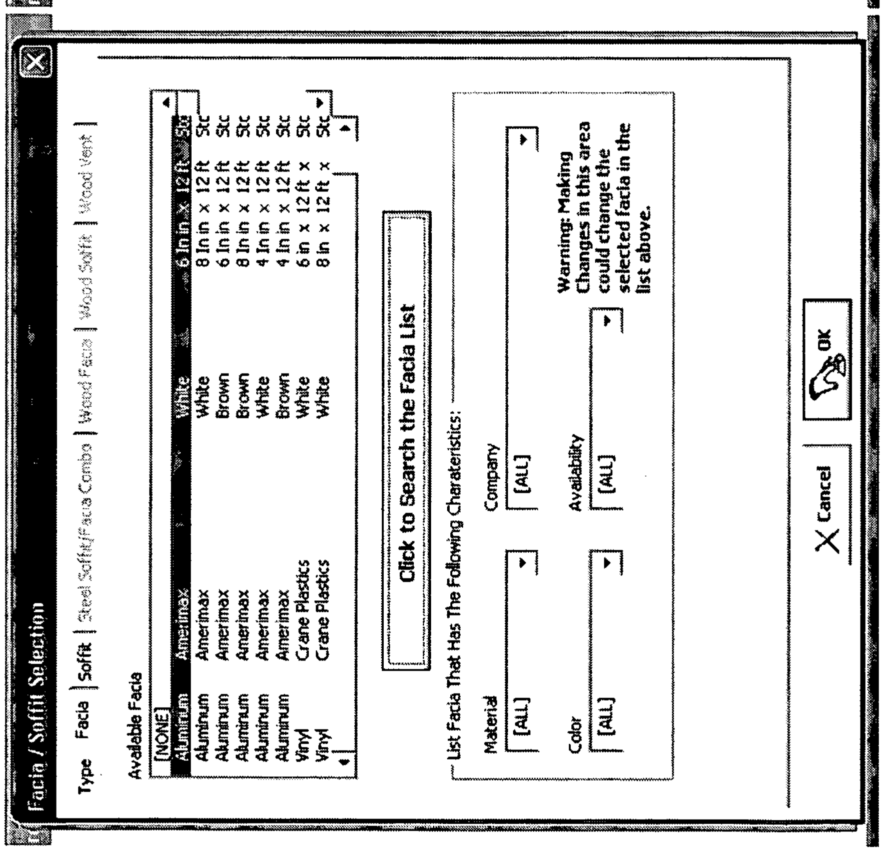
Figure 41:
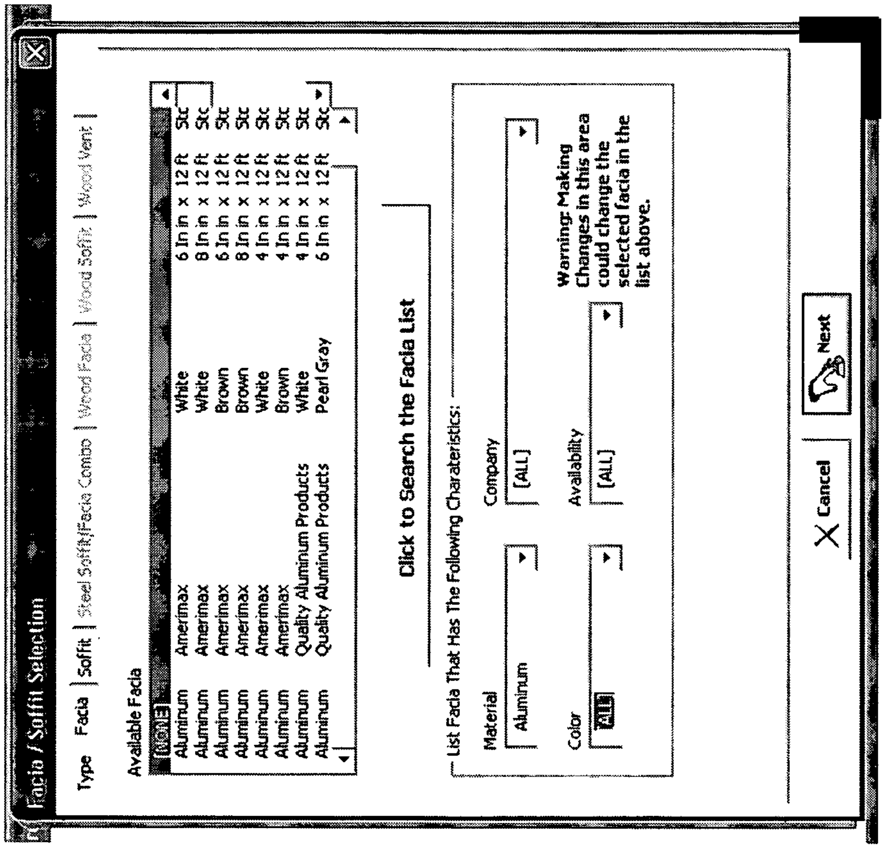

Referring to FIG. 39, under the Facia tab the user can select from the Available Facia preloaded in the Product Setup database. The command Click to Search the Facia List can also be used to narrow the available selections. See FIGS. 40-41.

Figure 42:
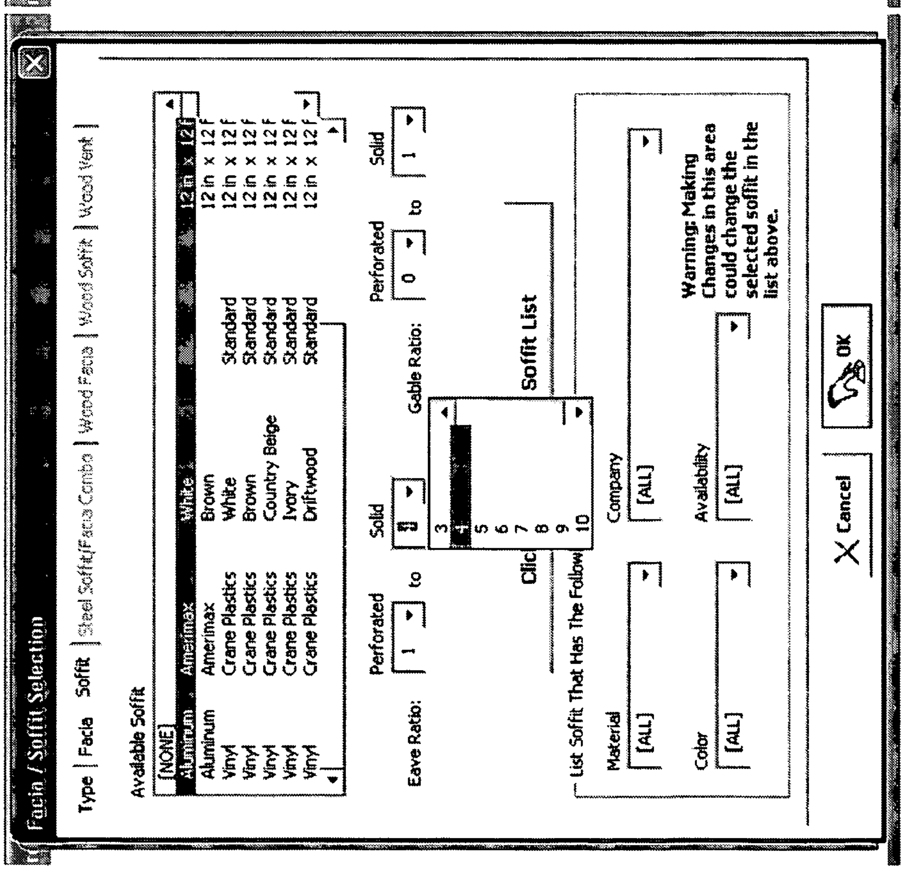

Referring to FIG. 42, under the Soffit tab the Available Soffit in Product Setup can be seen. The command Click to Search the Soffit List can be used to narrow the available selections. Additionally, the Eave Ratio of Perforated to Solid pieces of soffit can be selected (see FIG. 42). The Gable Ratio can similarly be selected (see FIG. 43).

Other selections pertain to the Covering Type called Individual Soffit & Facia. Refer to the Type tab. If the other choice, Soffit Facia Combination, is selected the user is taken to the Steel Soffit/Facia Combo tab. (Steel is the only material for this category.) Available combinations for the Eave and Gable can then be searched and/or selected.

Under the Type tab there are two choices for Covering Material: "Wood" and "Aluminum, Vinyl or Steel." The screen displays have so far exemplified the second choice. However if Wood is selected, the user is taken to the following three tabs: Wood Facia, Wood Soffit and Wood Vent. Available choices can then be searched and/or selected. The Species and Size for the Facia Stock can be picked.

Figure 44:
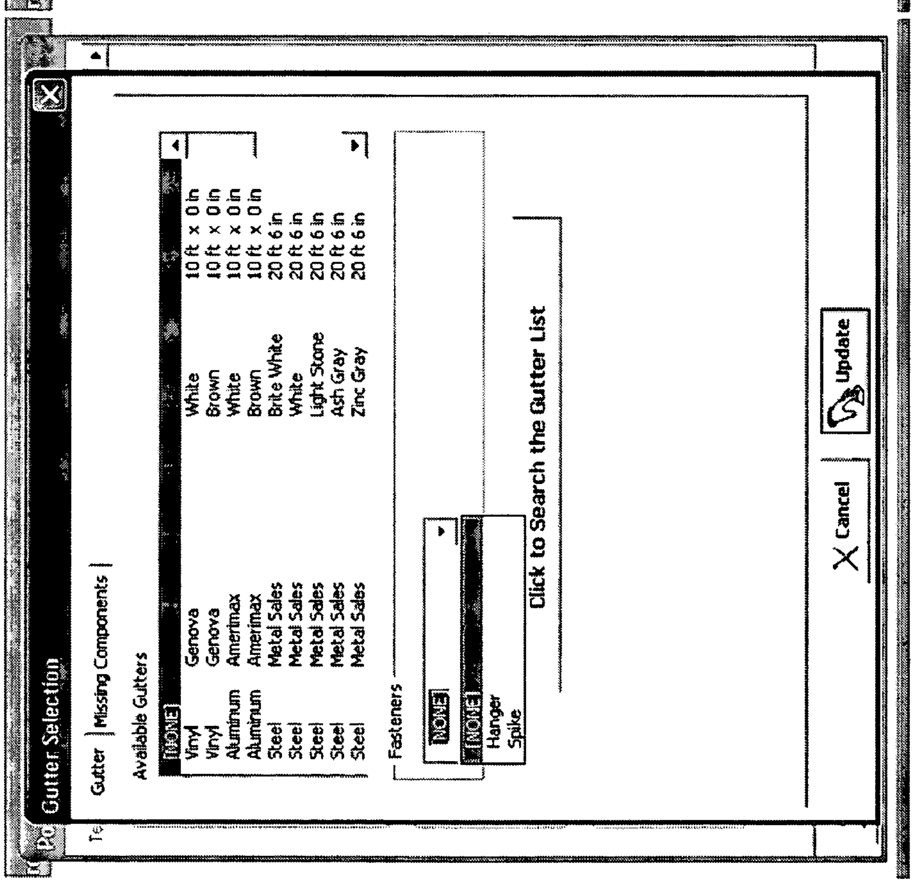
Figure 45:
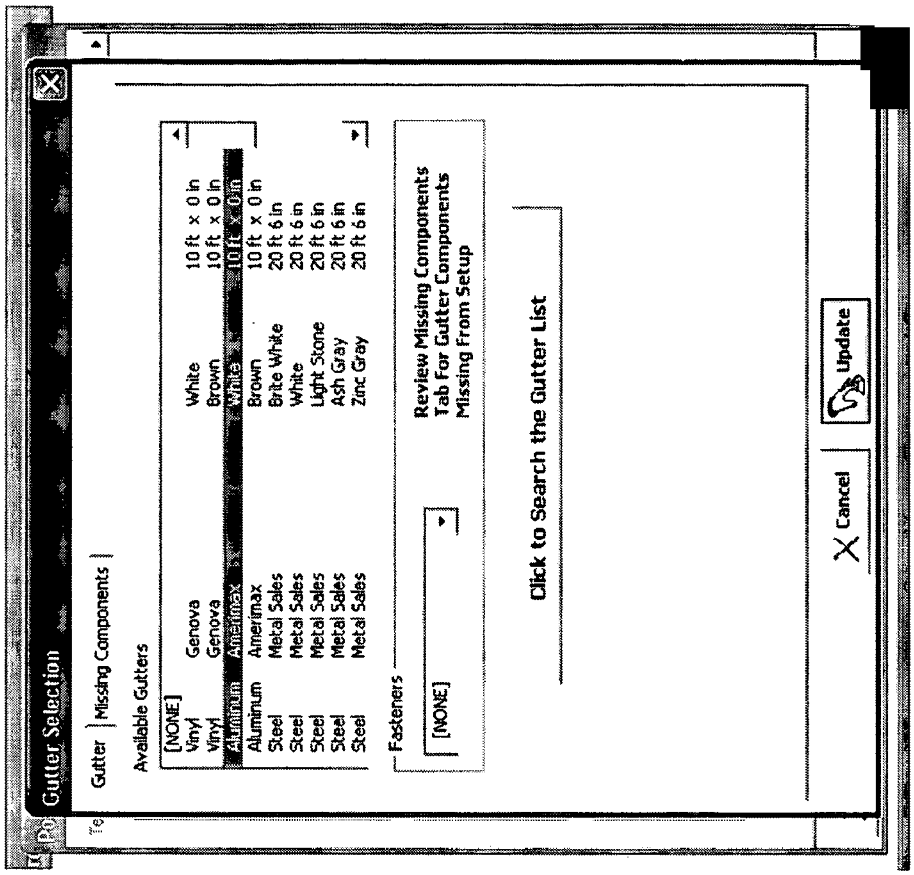
Figure 46:
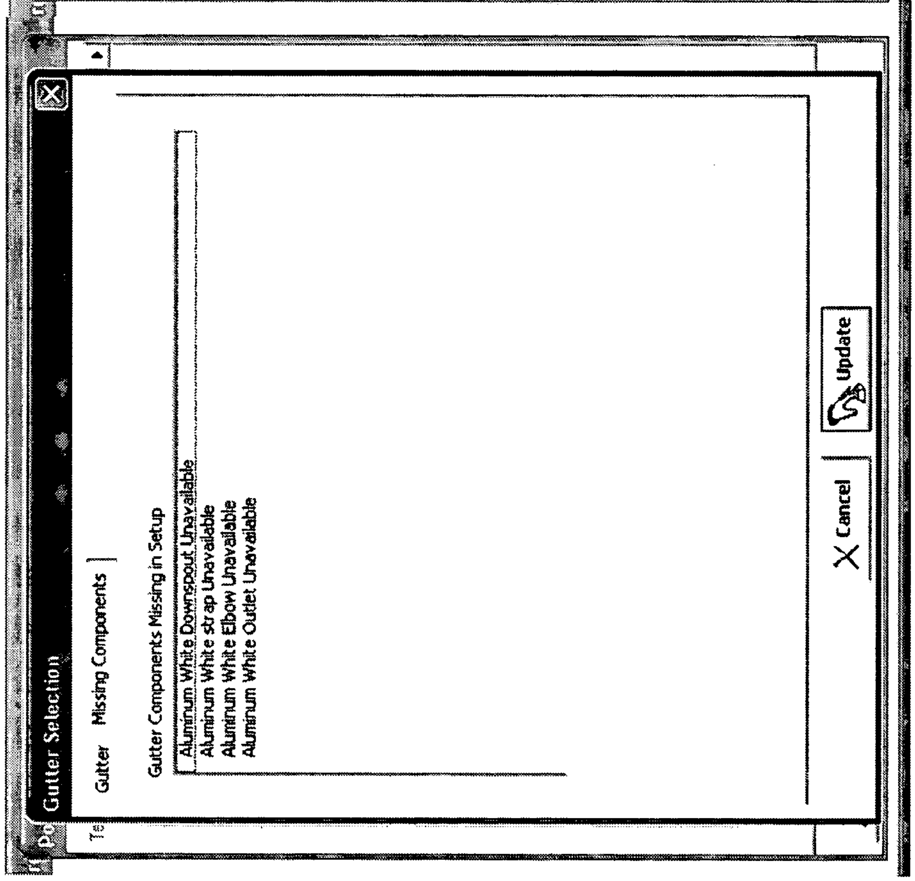

Referring to FIG. 44, the Gutter Material, Company and Color can be updated. A list of Available Gutters can be searched and/or selected. See FIG. 45. If a gutter is selected which produces the display "Review Missing Components Tab . . . " in bold letters, the user is thus notified to go to the Missing Components tab of FIG. 46 in order to see what gutter components are not currently in Product Setup. The gutter Fasteners (if any) can also be selected.

Figure 47:
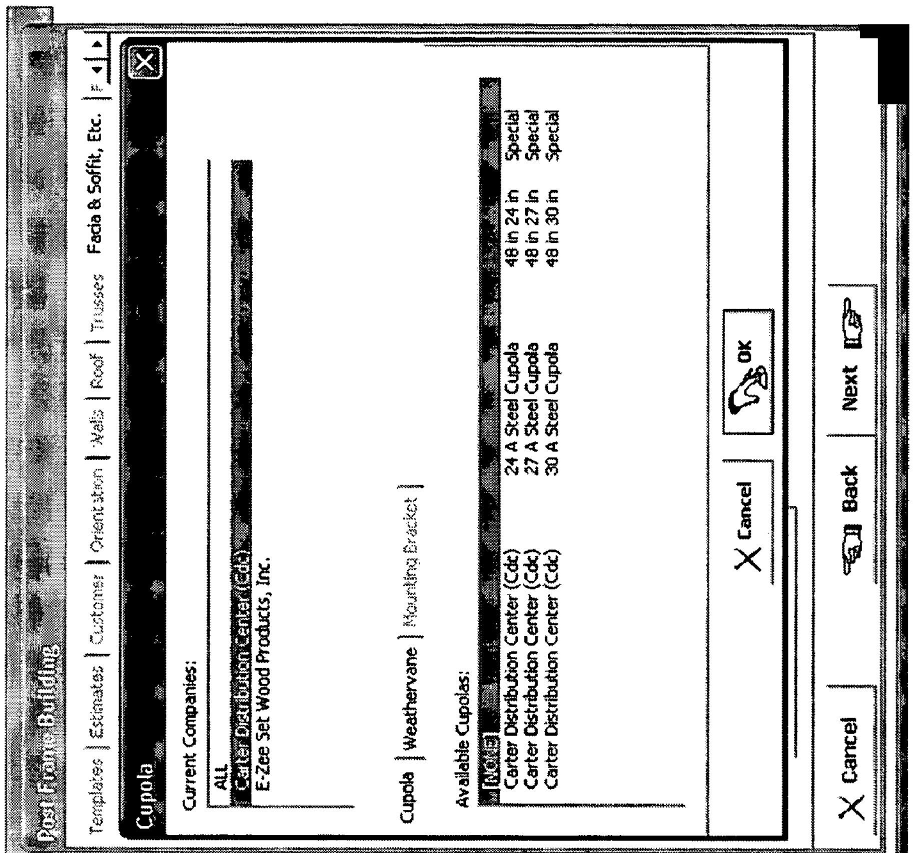

Referring to FIG. 47, for Cupola/Weathervane the user can select from the Current Companies, Available Cupolas and Available Weathervanes. If a weathervane is selected, the user can also choose from a list of Available Mounting Brackets in the Product Setup.

Figure 48:
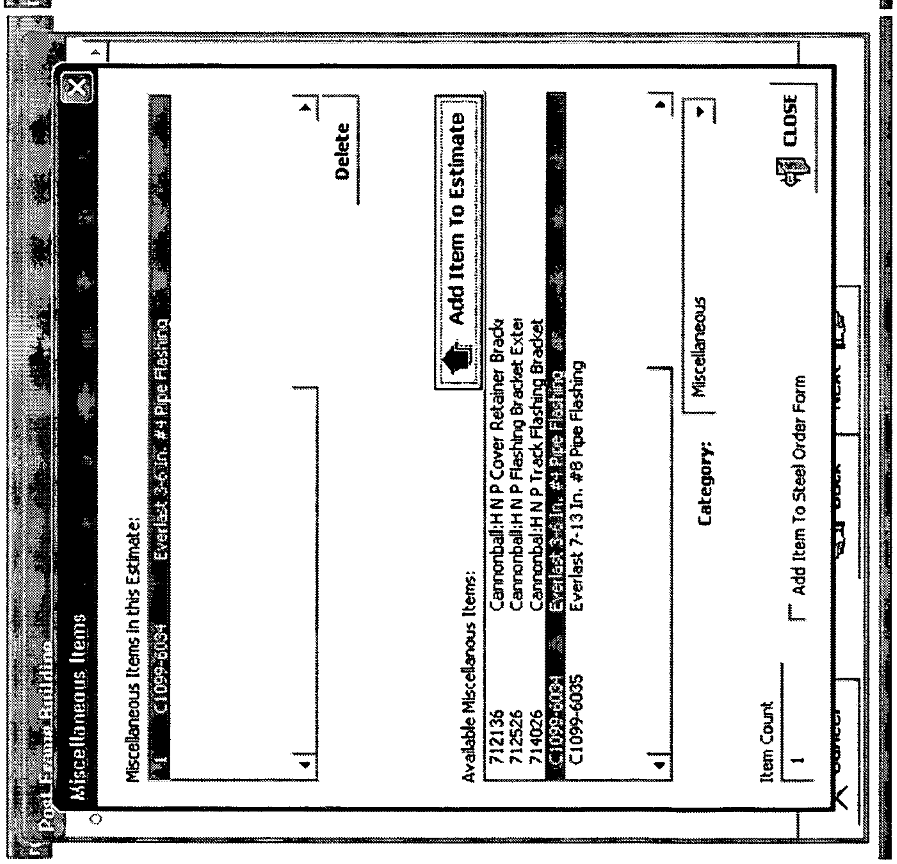

Referring to FIG. 48, for Miscellaneous Items under the Facia & Soffit, Etc. tab, the list of Available Miscellaneous Items can be reviewed. Then the Add Item to Estimate command is used if desired. Furthermore, under Category the user is permitted to review all of the items in Product Setup. If any item in Product Setup is now selected with the Add Item command, it will be added to the estimate (or even duplicated) as a Miscellaneous Item. Items can be removed with the Delete command. Item Count is used to specify more than one piece where appropriate, and a box can be checked in order to Add Item to the Steel Order Form of FIGS. 125-126. The Close command allows the estimate to continue.

Figure 49:
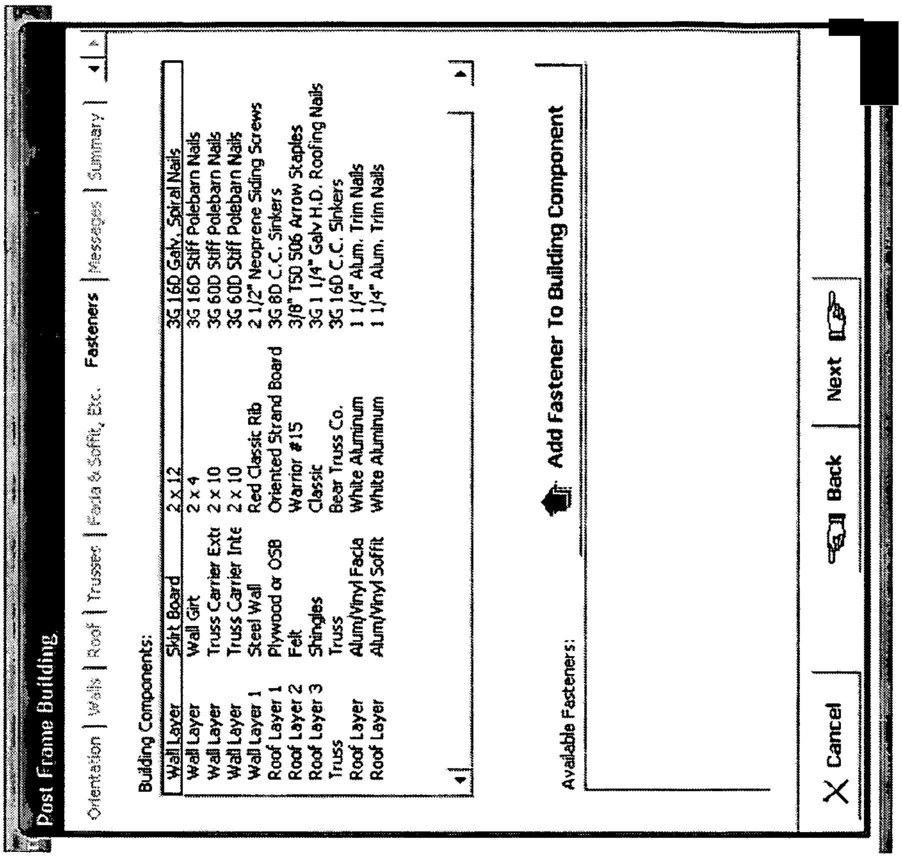

Referring to FIG. 49, the user next moves to the Fasteners tab and chooses from the list of Available Fasteners for each of the Building Components comprising the estimate. As the user steps through each Building Component (ex. Roof Layer 1, Roof Layer 2, etc.) the list of Available Fasteners is updated appropriately. After making a selection the user hits the soft button Add Fastener to Building Component. If the fasteners haven't been chosen already (in a template or previous estimate) the program will automatically advance to the next component when a fastener is selected. When selecting a building component, the only fasteners listed are those specified in Product Setup for use with that component. Also, fasteners are listed in the order of preference for use as specified in Product Setup. Specific uses and order of preference are described further below.

Figure 50:
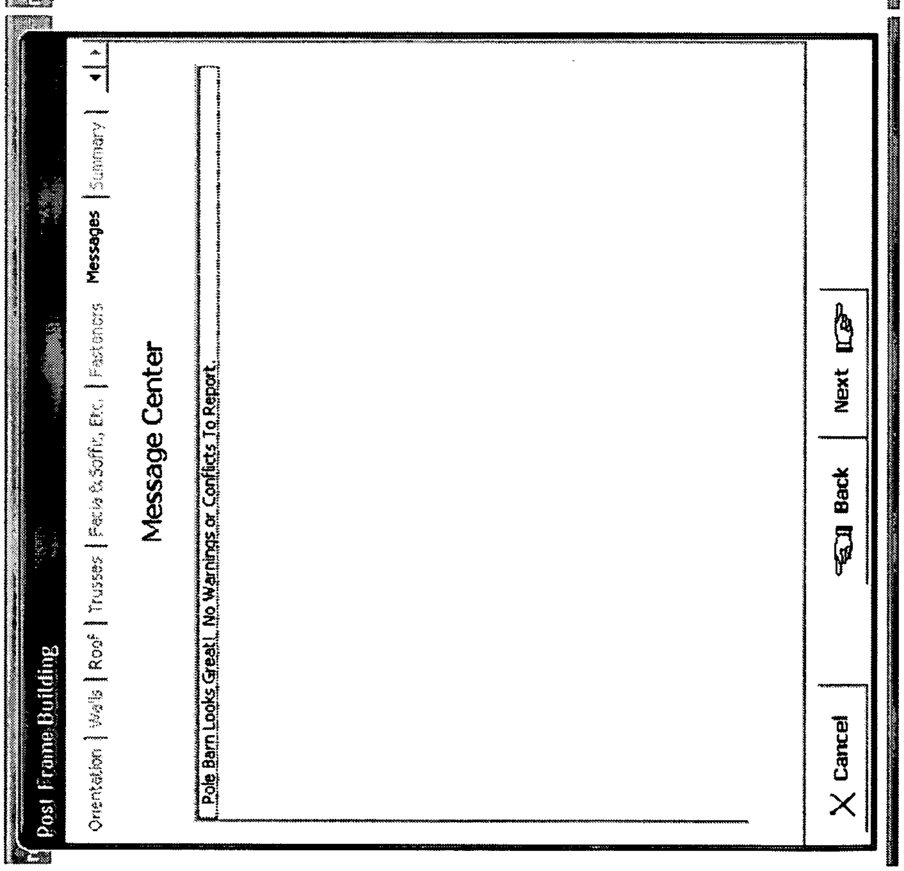

Referring to FIG. 50, the user next goes to the Messages tab. The Message Center displays any warnings, conflicts or other comments about the current estimate. A list of possible messages is shown in FIG. 158A-158B. If the user decides to modify the estimate in response to a message, they can do so by successively selecting the Back command until the appropriate tab is reached where the modification is needed. Once the change is made, they can successively select the Next command until reaching Messages again, to see if the item has been properly addressed.

Figure 51:
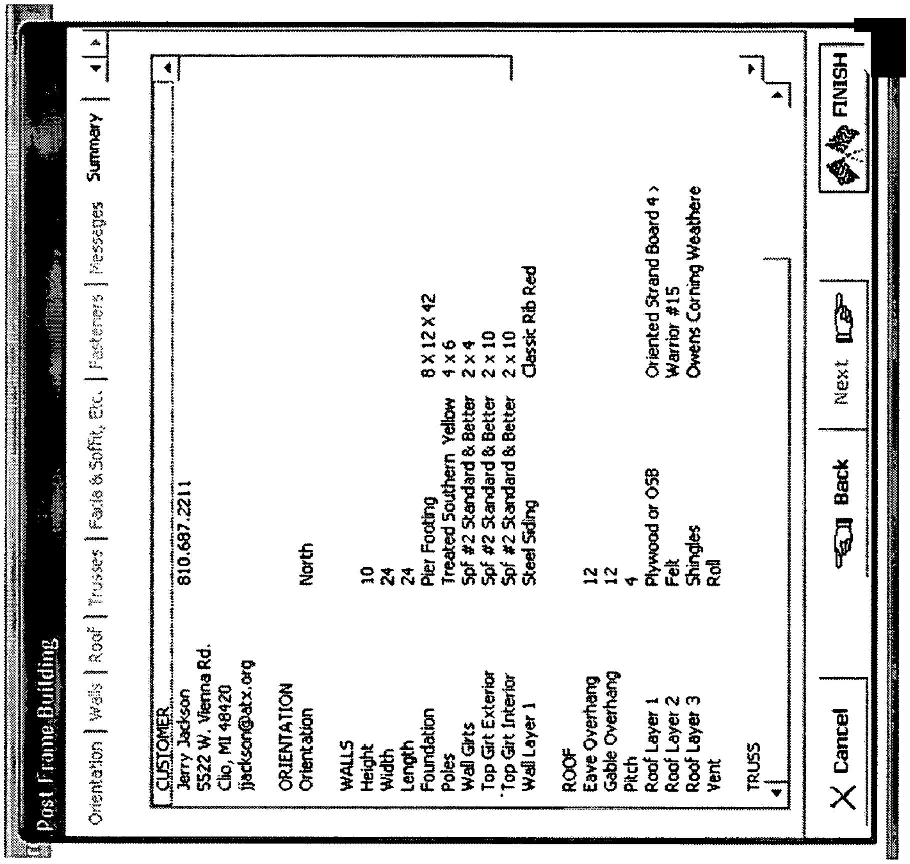
Figure 52:
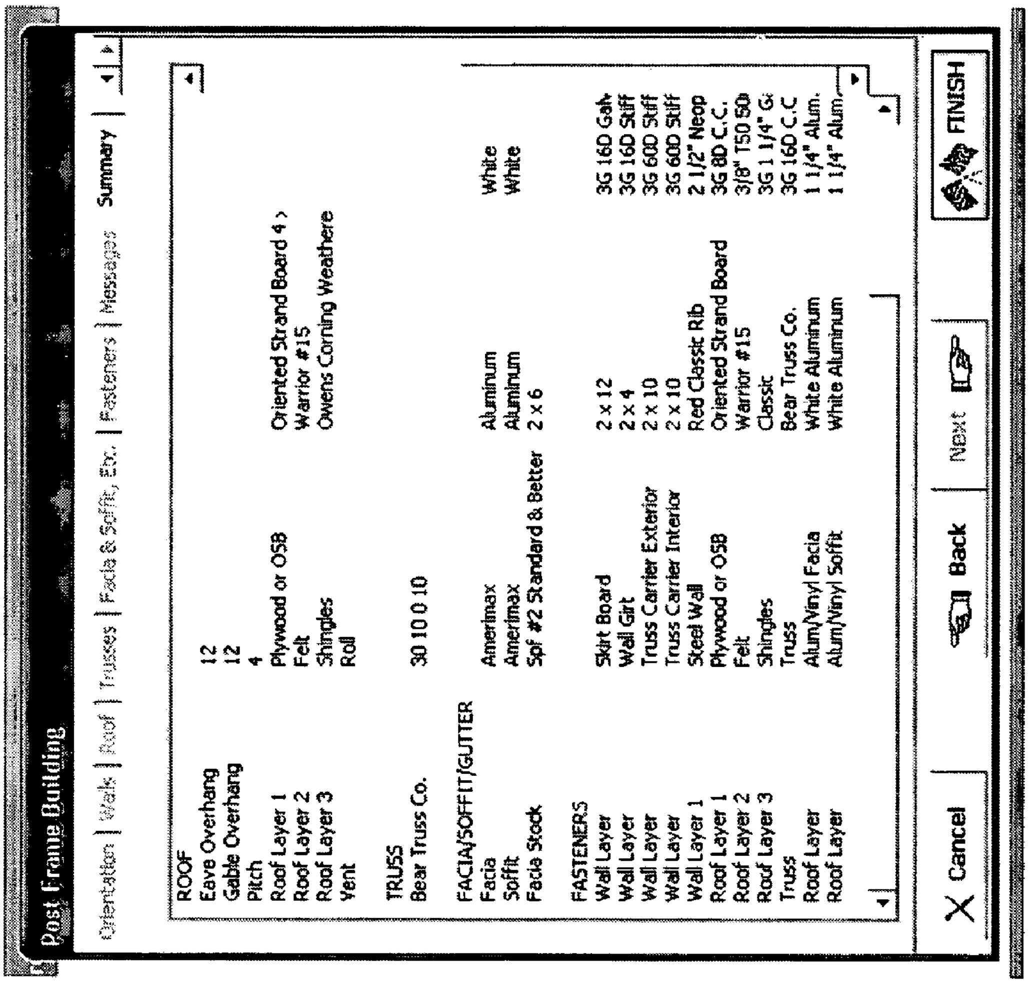

Referring to FIGS. 51-52, the user next moves to the Summary tab for an overview of the entire estimate. Use of the vertical and horizontal scroll bars permits all of the summary to be reviewed. No entries or modifications are permitted from this display. However, as described in the previous section, if the user sees an item to be changed this can be done using the Back command.

Figure 55:
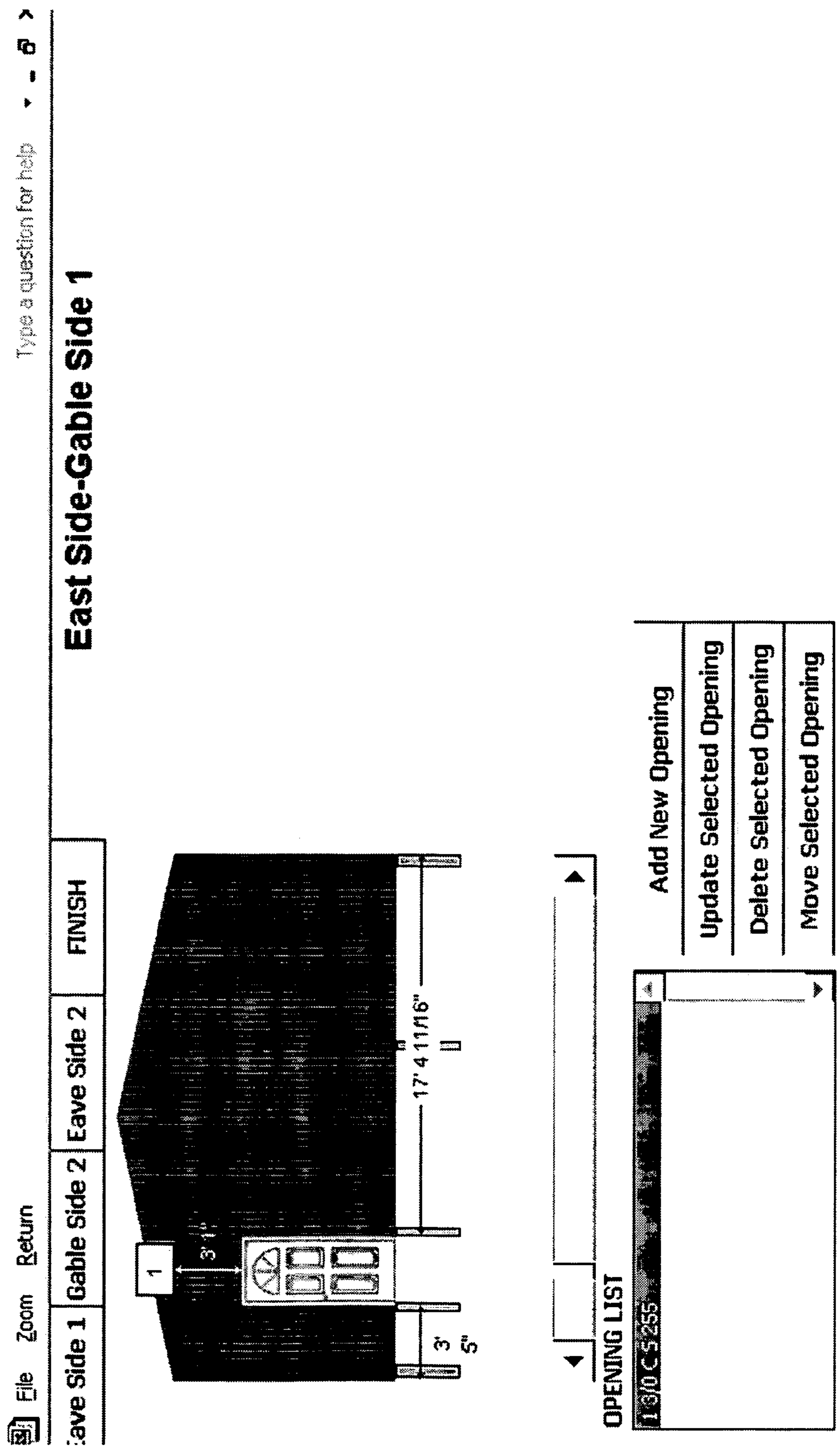
Figure 56:
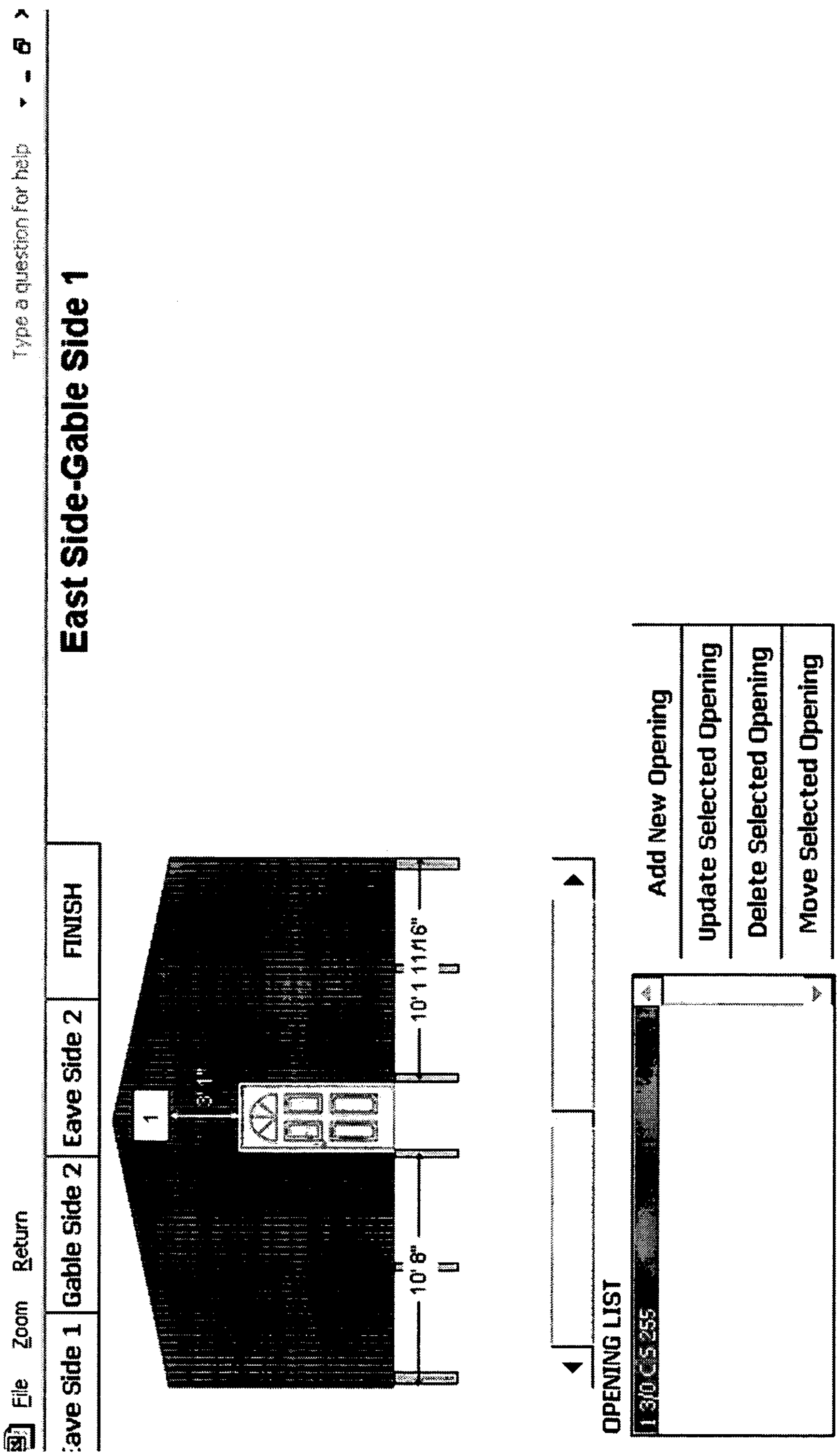

At this point, the user has defined a complete estimate except for the openings (doors, windows, etc.). By selecting Finish the program generates a graphic display of Gable Side 1. See FIG. 55. This display depicts the features that were selected for this demonstration estimate: sheet metal siding in the color selected, corner poles larger than the intermediate poles. This display gives the user their first good "look" at the estimate. The template for this estimate called for a service door (refer to item 1 in the OPENING LIST, as well as to the box labeled 1 in the graphic display). This door is currently located 3 feet from the left end of Gable Side 1 (or 3 feet south of the North Eave Side x). A feature of the invention is the ability to quickly relocate any opening. There are two ways to achieve this. First, using the horizontal scroll bar directly under the graphic display, the user can use a computer mouse to "drag and drop" the centerline of the opening wherever (feasibly) desired. Referring to FIG. 56, the door has now been moved to a location under the peak of Gable Side 1. Note that, due to the earlier selection of Let Program Optimize for Pole Spacing for the Gables, a sixth pole for this side has automatically been added. This sixth pole would now be included in the list of all materials to be generated, the pole layout, etc. To change this new location, the user can simply "drag and drop" again. In this way, an overall impression of the orientation of the openings can be obtained quickly. This is made all the more important when there are a number of windows, service doors, overhead doors, etc. to consider.

Figure 58:
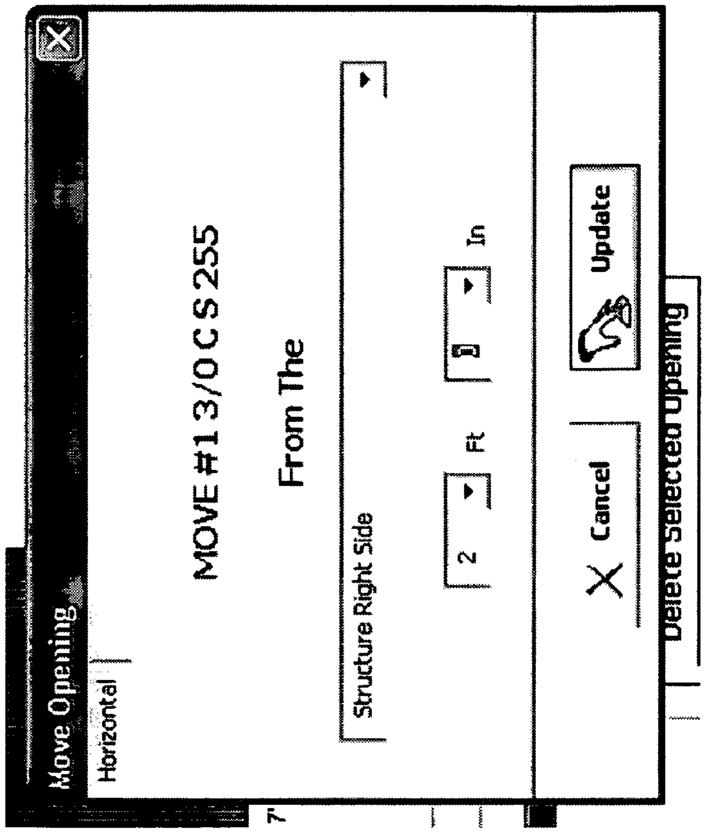
Figure 57:
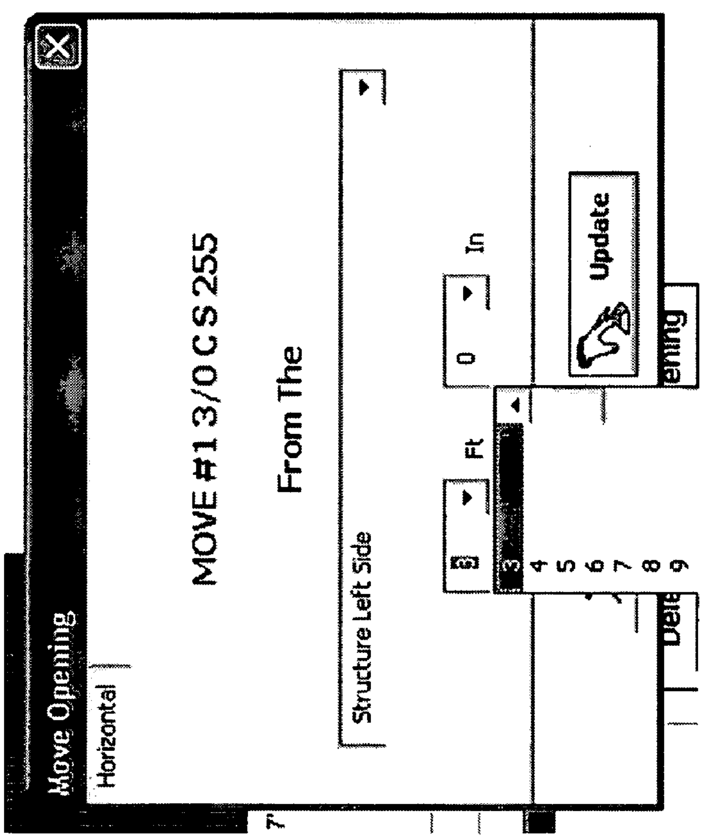
Figure 59:
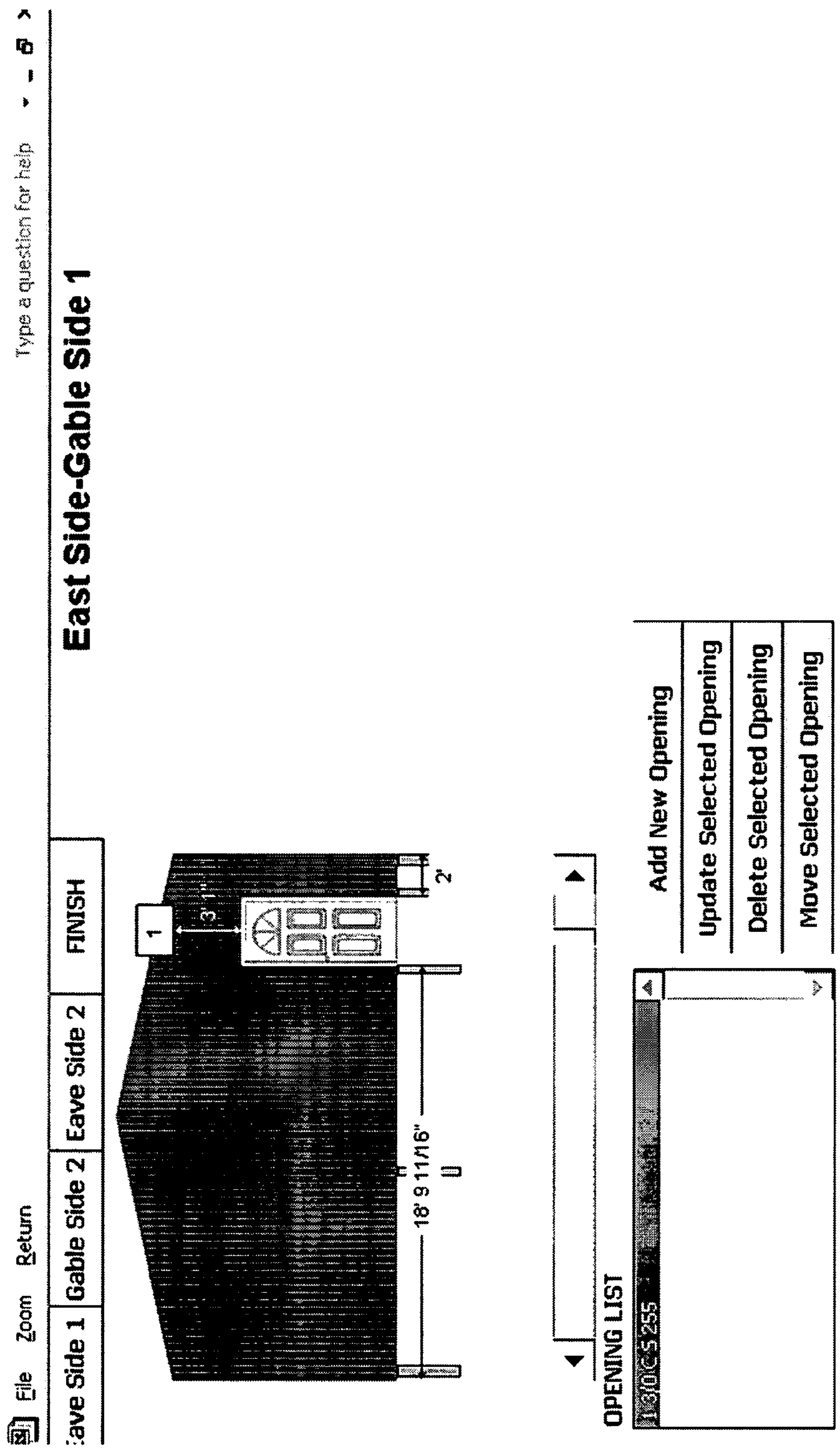

The second way to move a door (or any opening) is to use the command Move Selected Opening. See FIGS. 57-59. After highlighting the desired item in OPENING LIST (currently there's only one), the Move Opening dialog box appears. For a door, only Horizontal movement is permitted. (No movement is permitted for a Translucent Panel.) The description of the opening from Product Setup is shown, as well as a picklist of choices for what the opening is to be moved relative to, and how far. This makes it extremely simple to move an opening to a precise location.

Figure 53:
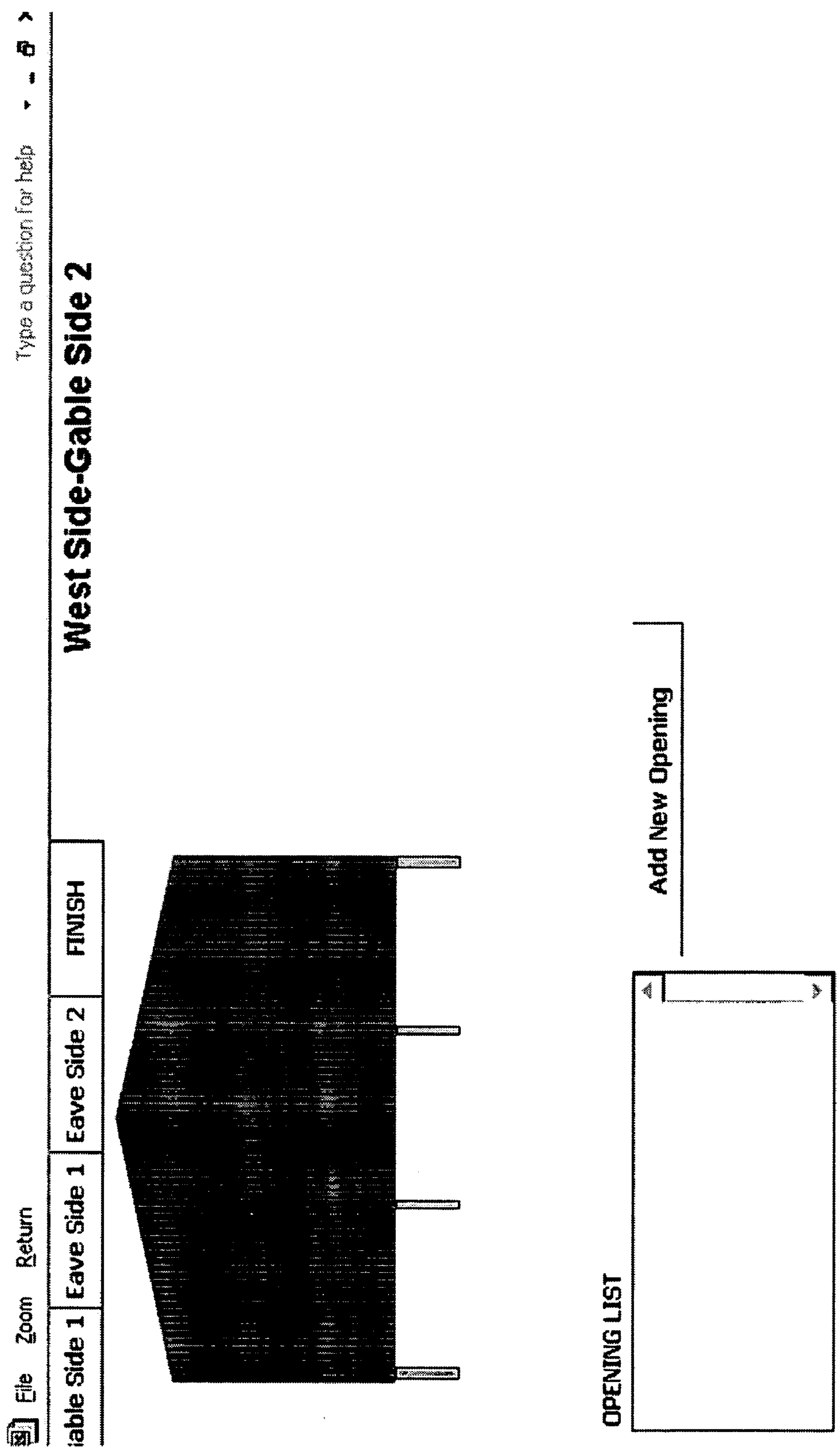
Figure 54:
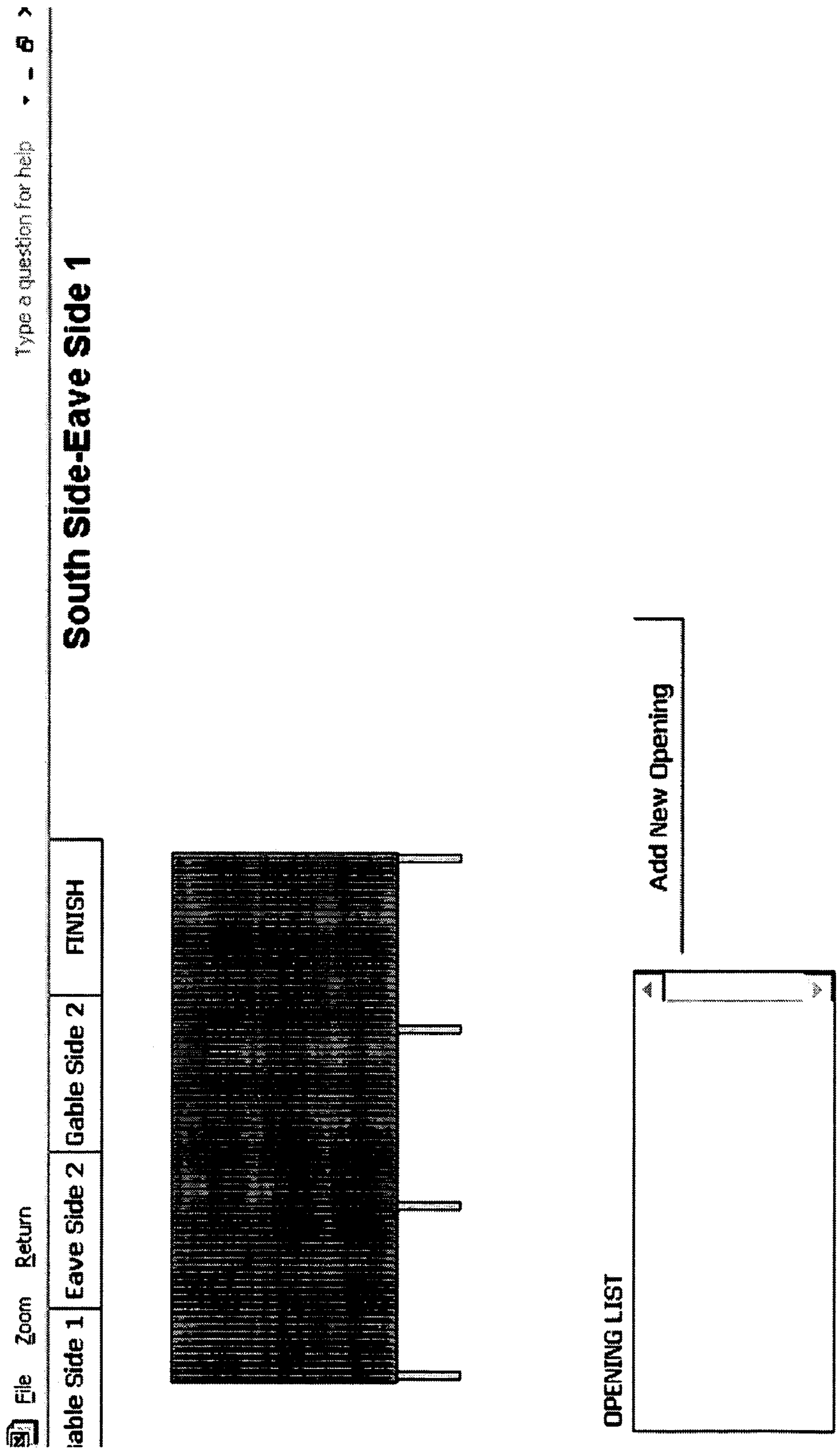
Figure 60:
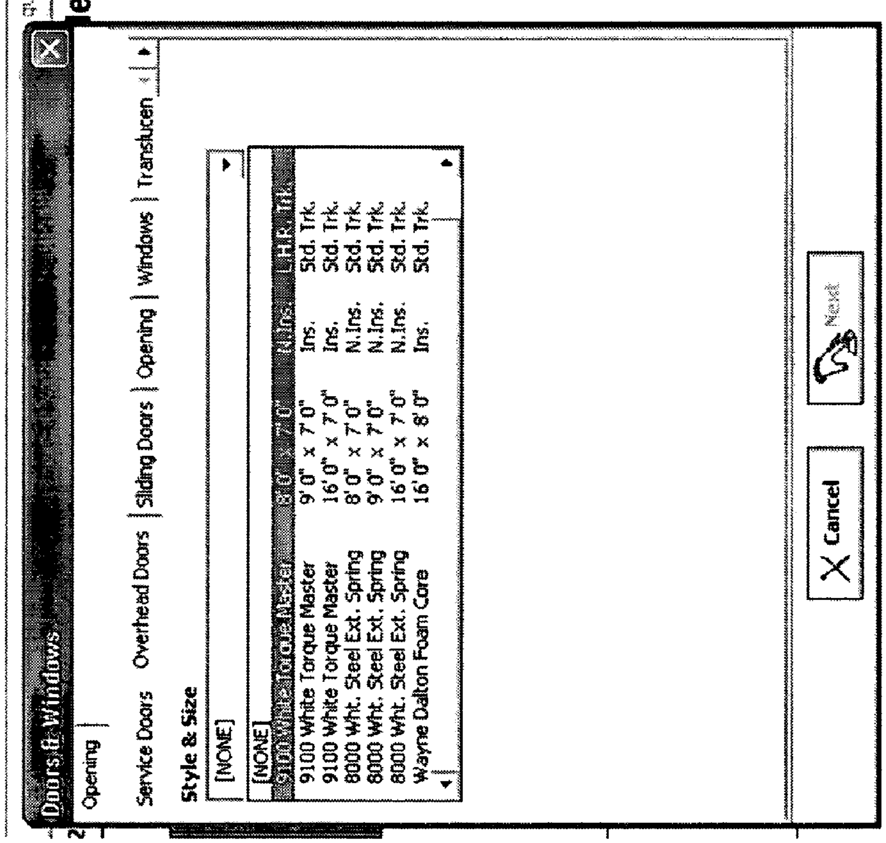
Figure 61:
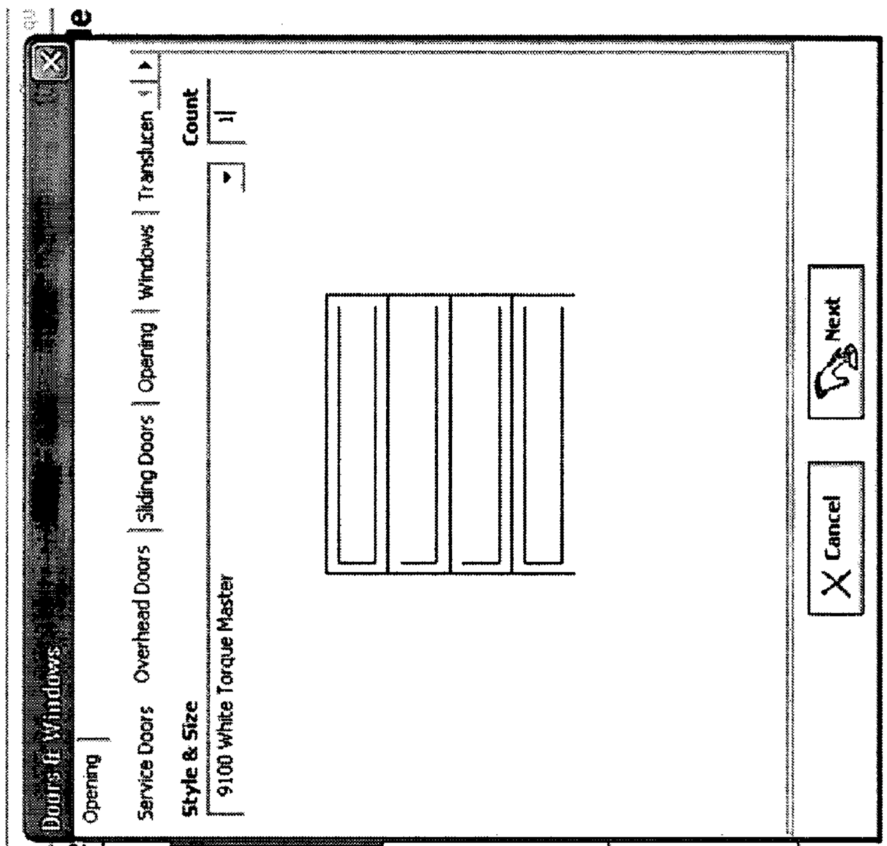
Figure 62:
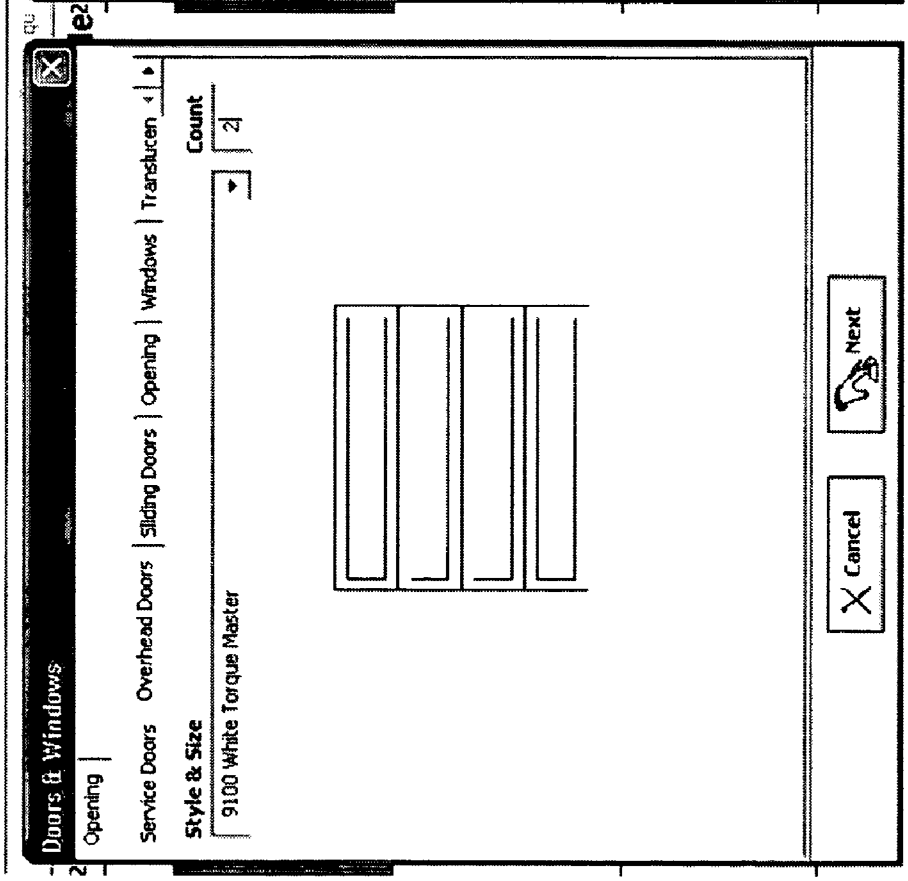
Figure 63:
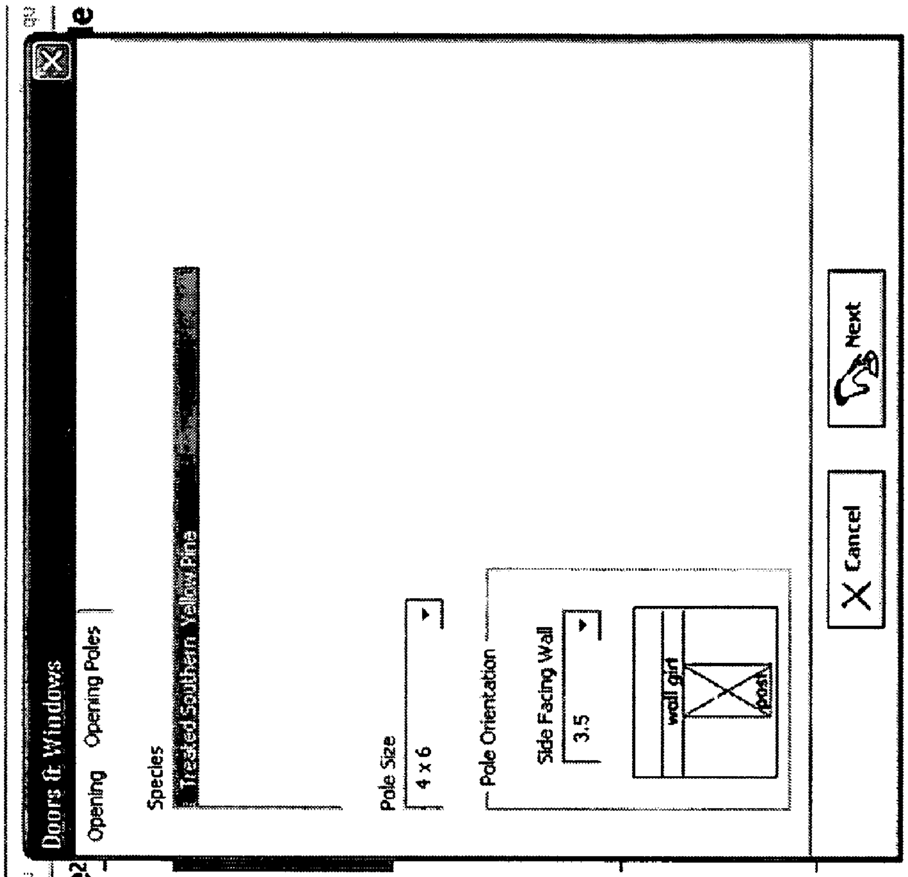
Figure 65:
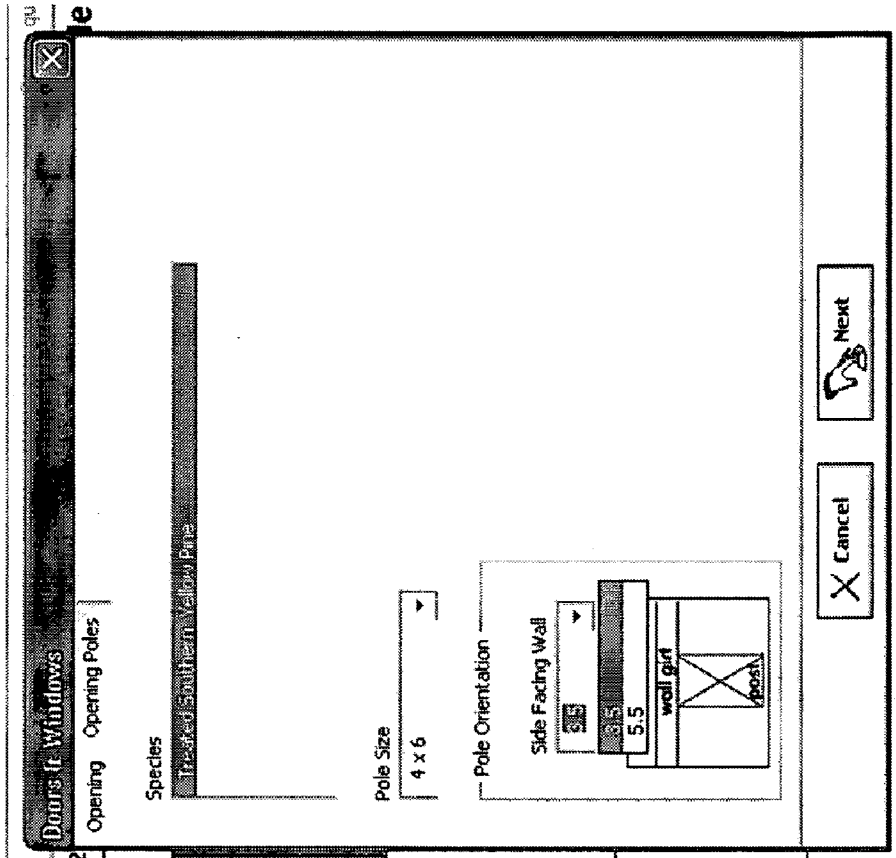
Figure 64:
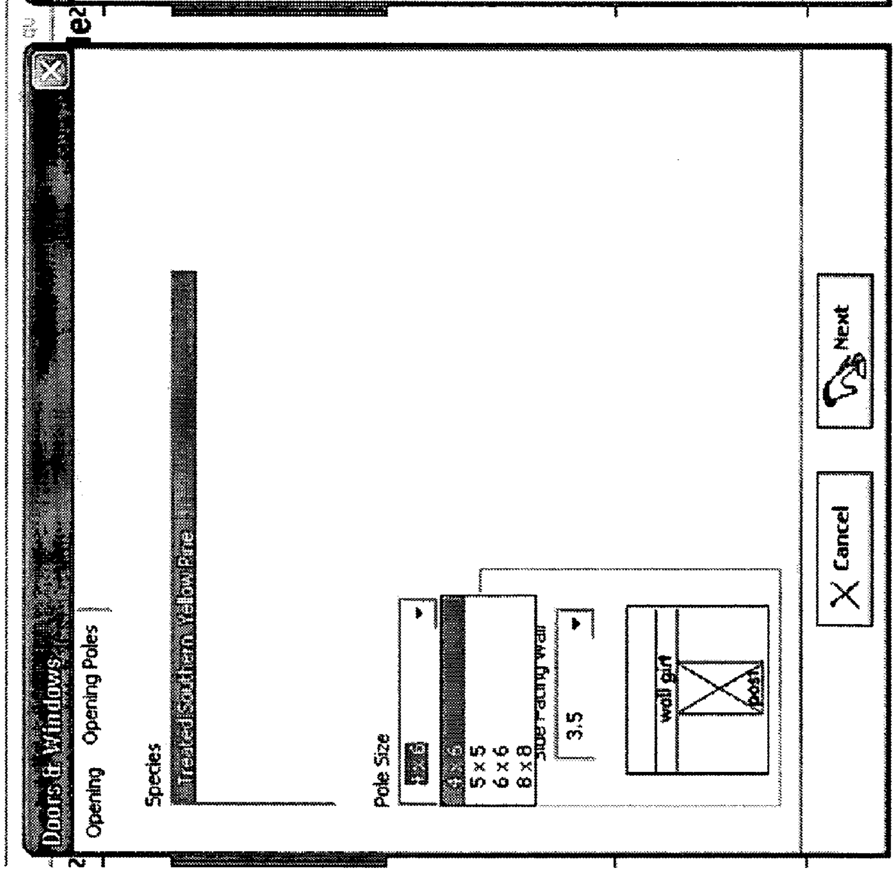
Figure 67:
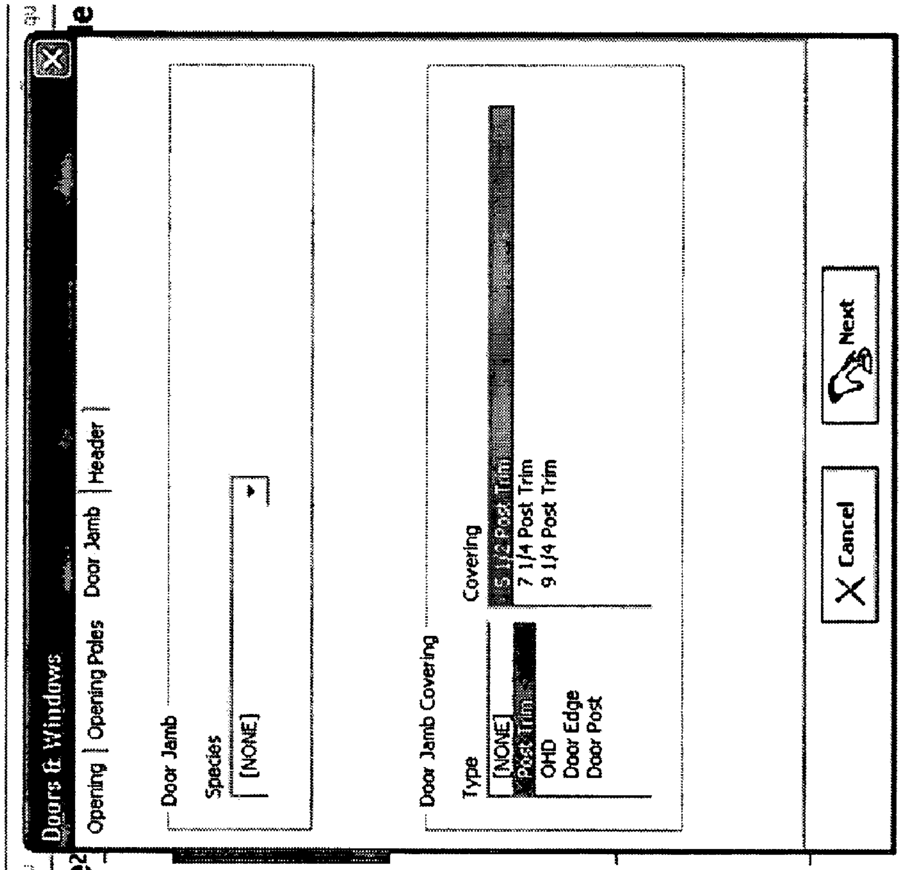
Figure 66:
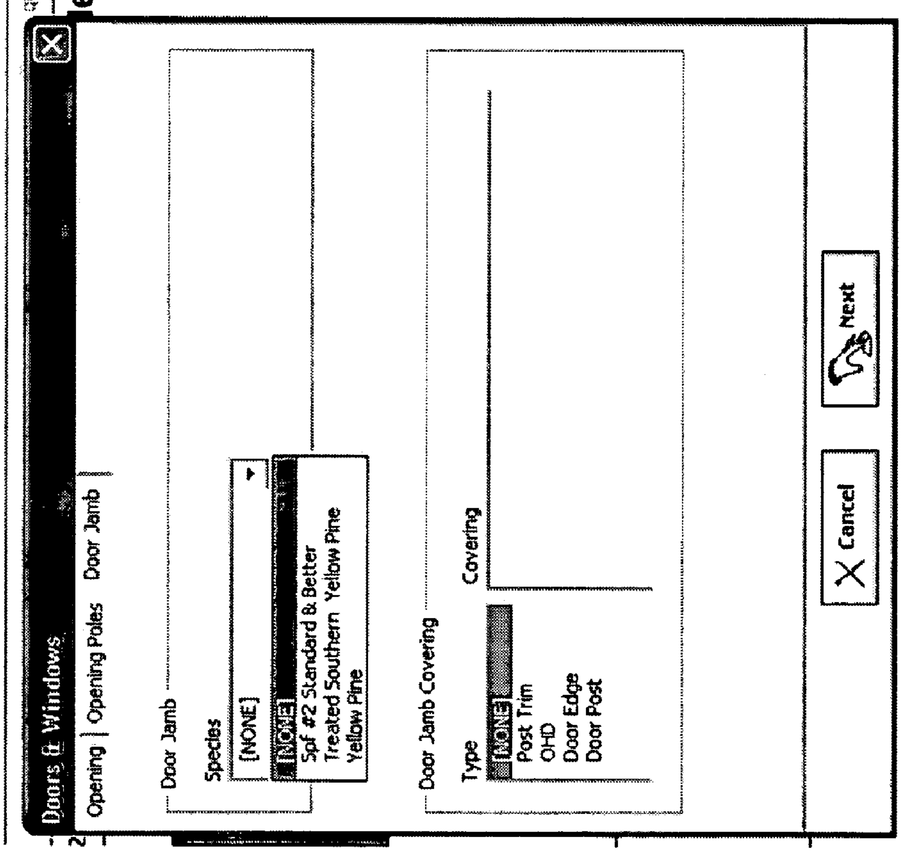
Figure 69:
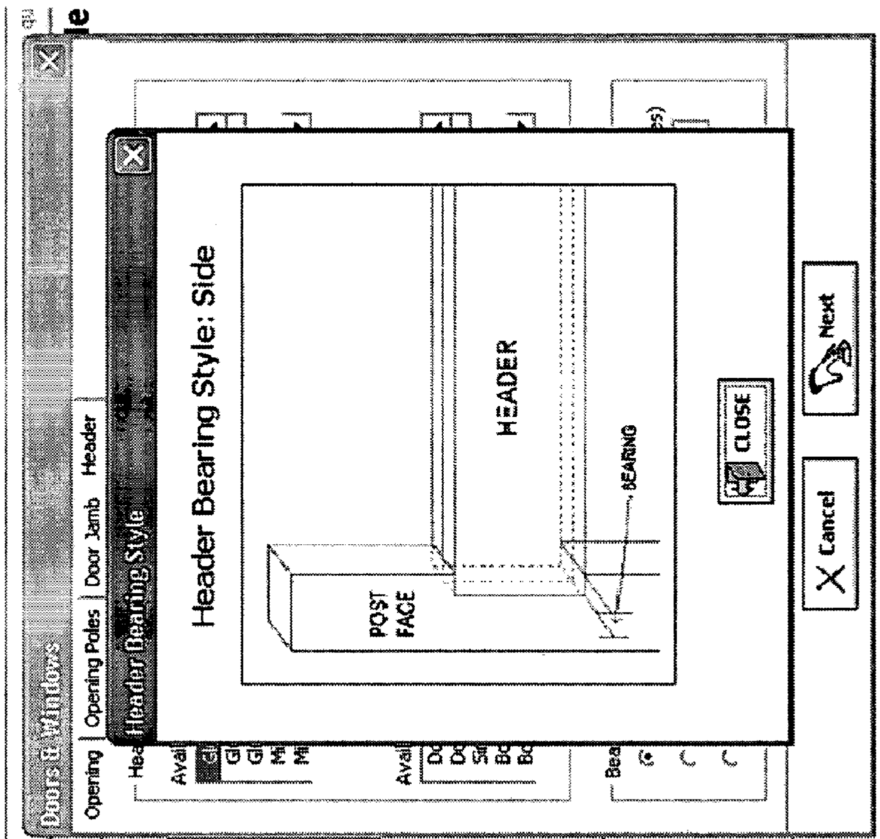
Figure 68:
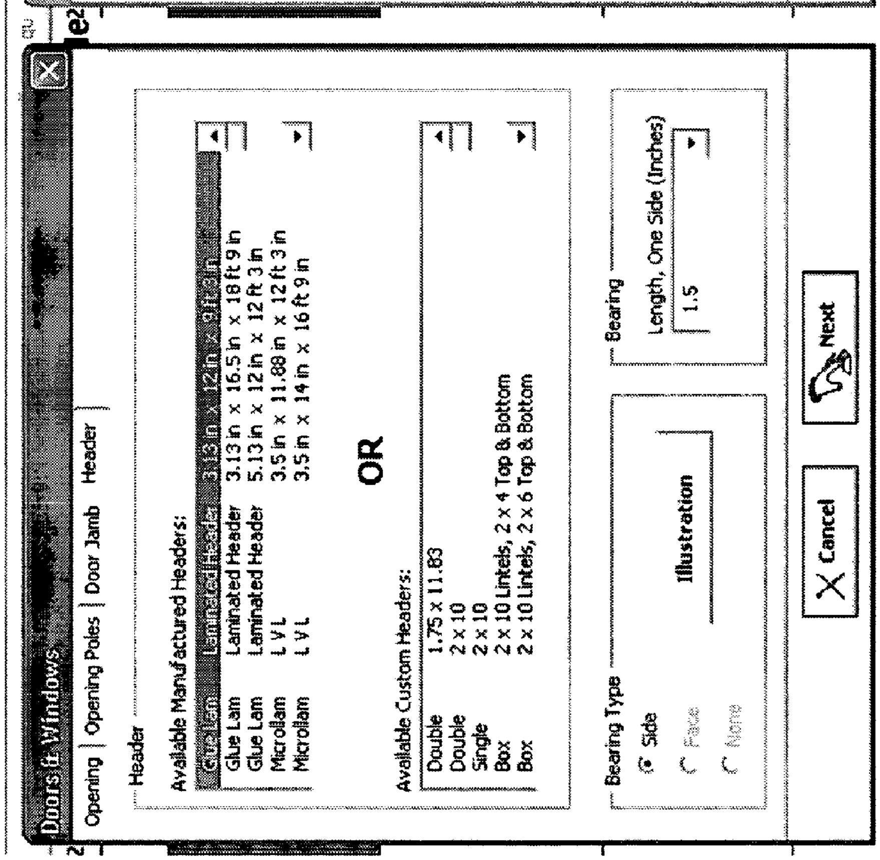
Figure 70:
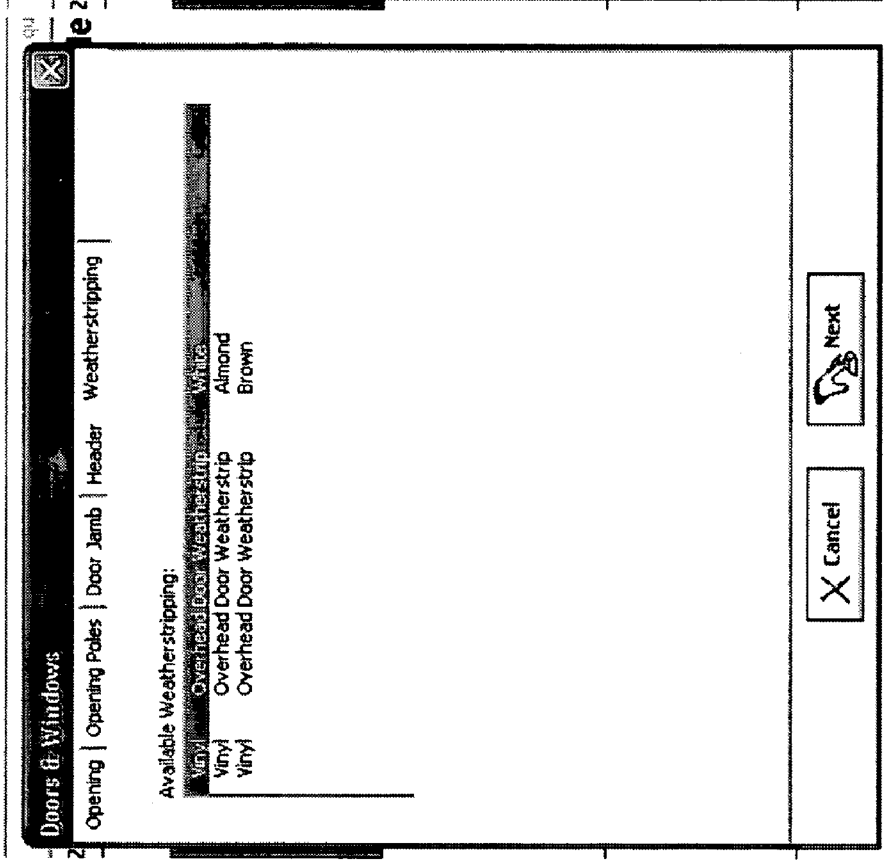
Figure 71:
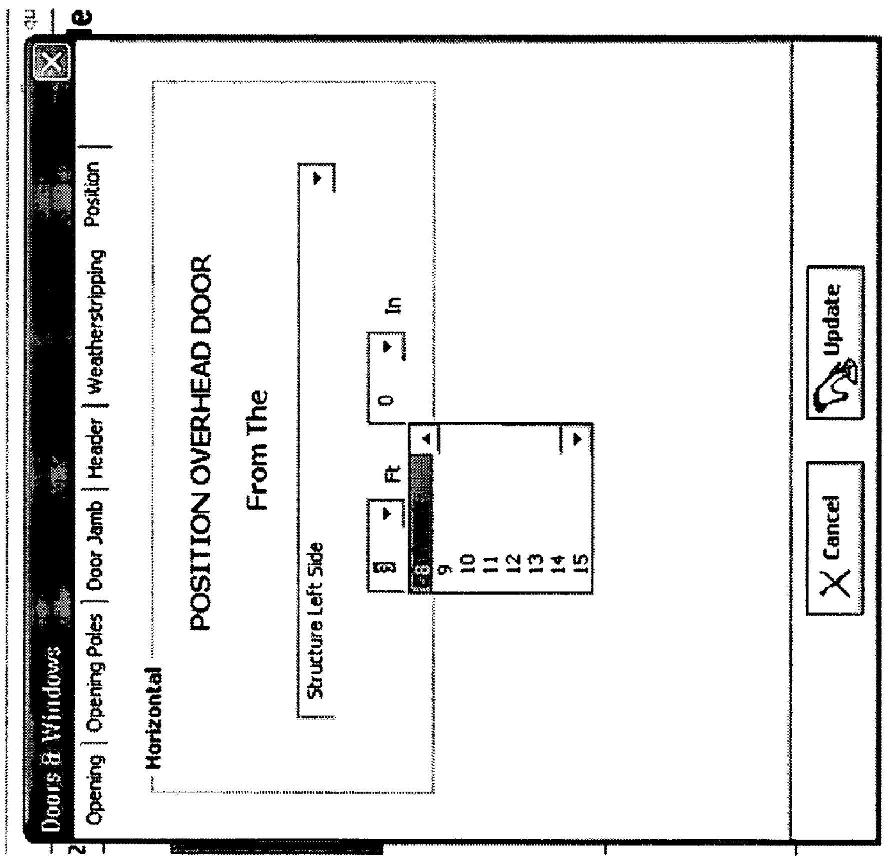
Figure 72:
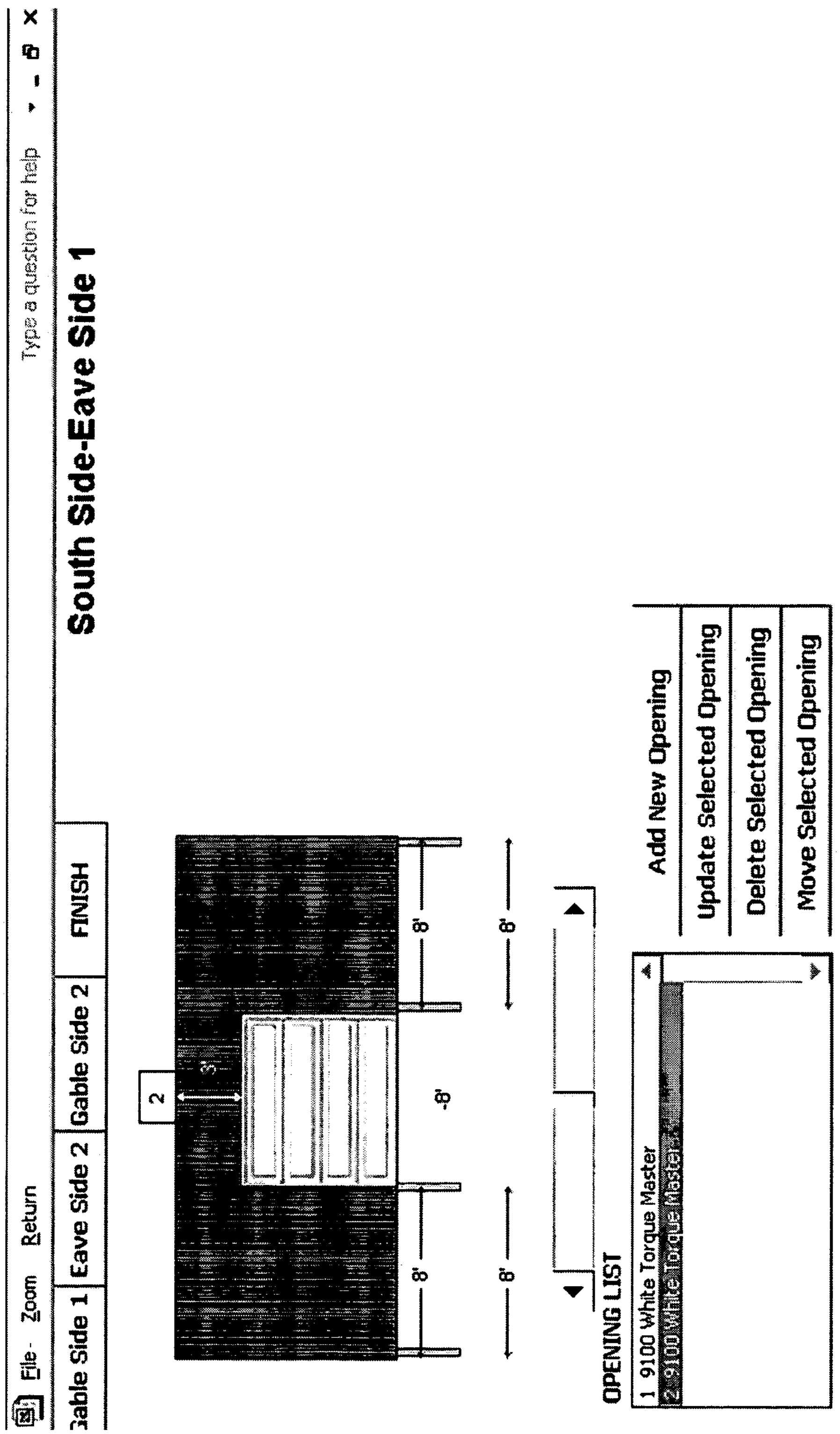
Figure 73:
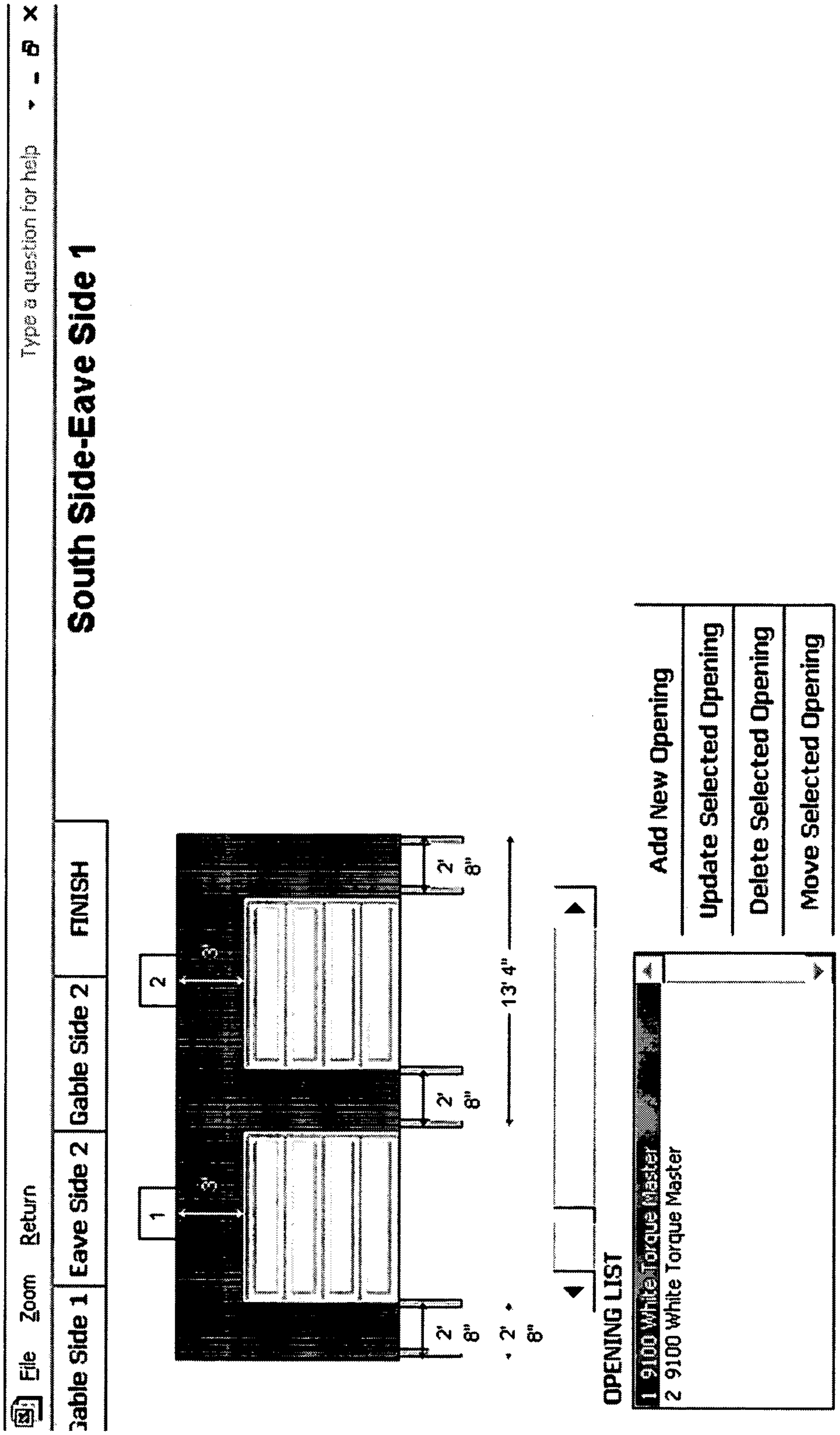

The discussion thus far has centered on Gable Side 1. The other sides can be viewed by selecting Gable Side 2, Eave Side 1 and Eave Side 2. See FIGS. 53-54. This template called for no other openings beyond the one service door described above. But a feature of the invention is the ease with which openings can be added to the estimate. For purposes of demonstration, select the next wall for which an opening is desired (in this case, the South Side—Eave Side 1). As described above, there is no opening currently on this side. Therefore the only command here concerning openings is Add New Opening. If selected, the user is taken to the Door & Windows dialog box (FIG. 60). Selecting the Style & Size picklist of the Service Doors tab would permit the addition of a second service door. Selecting the Style & Size picklist on the Overhead Doors tab permits the user to see the selections available from Product Setup. Making a selection takes the user to a screen like that of FIG. 61, where the type of door is graphically displayed. Count is used to select the number of openings (i.e. overhead doors). Here two is the number that has been selected (FIG. 62). Selecting Next moves the user to the Opening Poles tab (FIG. 63). The wood Species, Pole Size and Pole Orientation (Side Facing the Wall) can be chosen (FIGS. 64-65). Selecting Next moves the user to the Door Jamb tab, where the Door Jamb Species and Door Jamb Covering Type can be picked (FIGS. 66-67). Under the Header tab, Available Manufactured Headers or Available Custom Headers can be selected from items in Product Setup (FIG. 68). In the Bearing Type section under Illustration, the Header Bearing Style is graphically displayed (FIG. 69 is bearing style Side). Where appropriate, the Bearing Length on One Side (in Inches) can be selected. Under the Weatherstripping tab, the Available Weatherstripping can be selected (FIG. 70). Under the Position tab, the Horizontal POSITION of the OVERHEAD DOOR from the structure's left or right can be selected (in feet and inches, see FIG. 71). Selecting Next will cause the program to insert the two overhead doors into the display (note: they will be overlaid one on top of the other). See FIG. 72. As described above, moving an opening is straightforward, and can be followed (selecting first one opening/overhead door, then the other) to produce the layout of FIG. 73.

Figure 74:
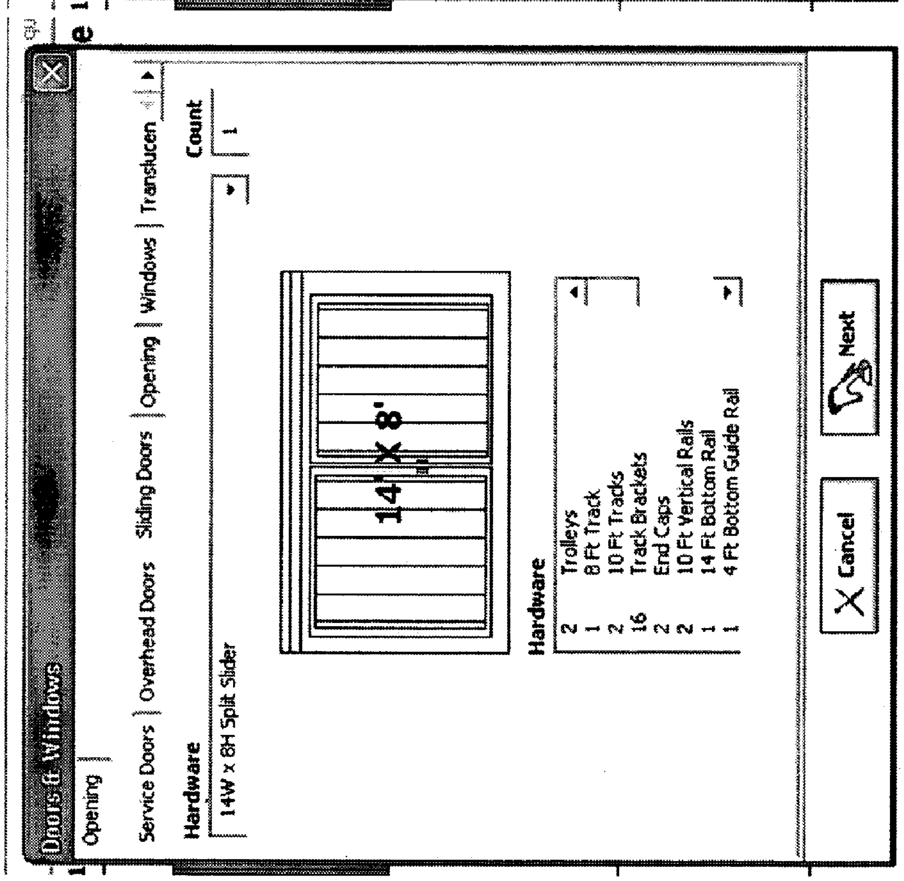
Figure 75:
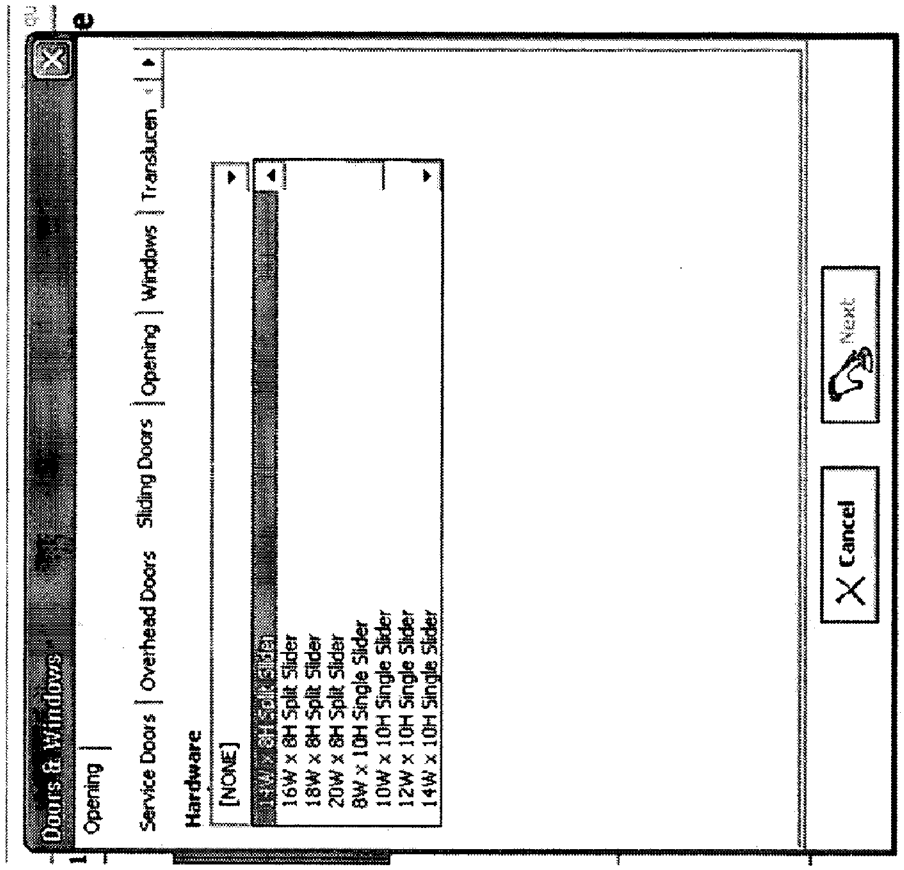
Figure 77:
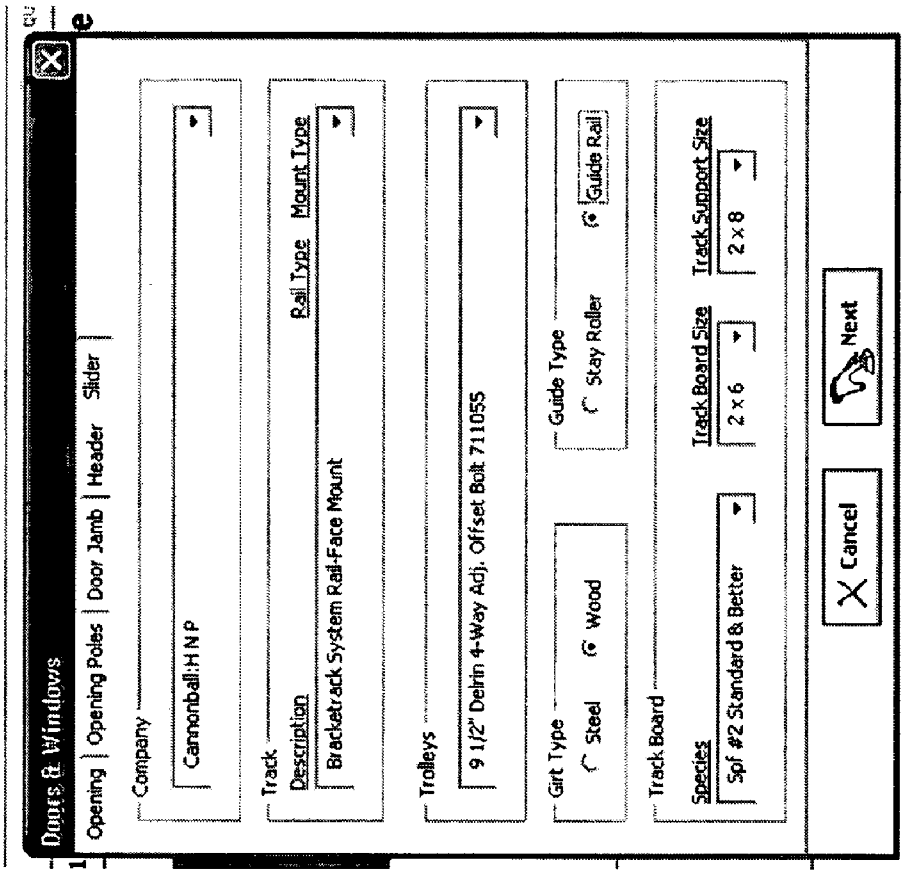
Figure 76:
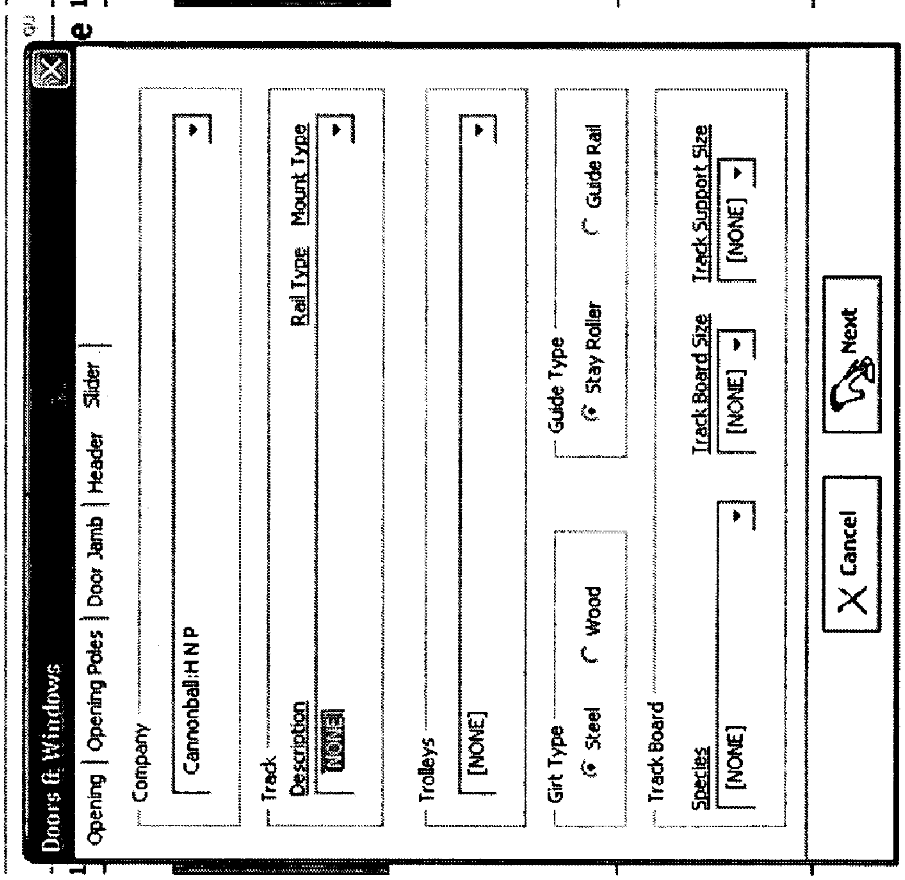
Figure 78:
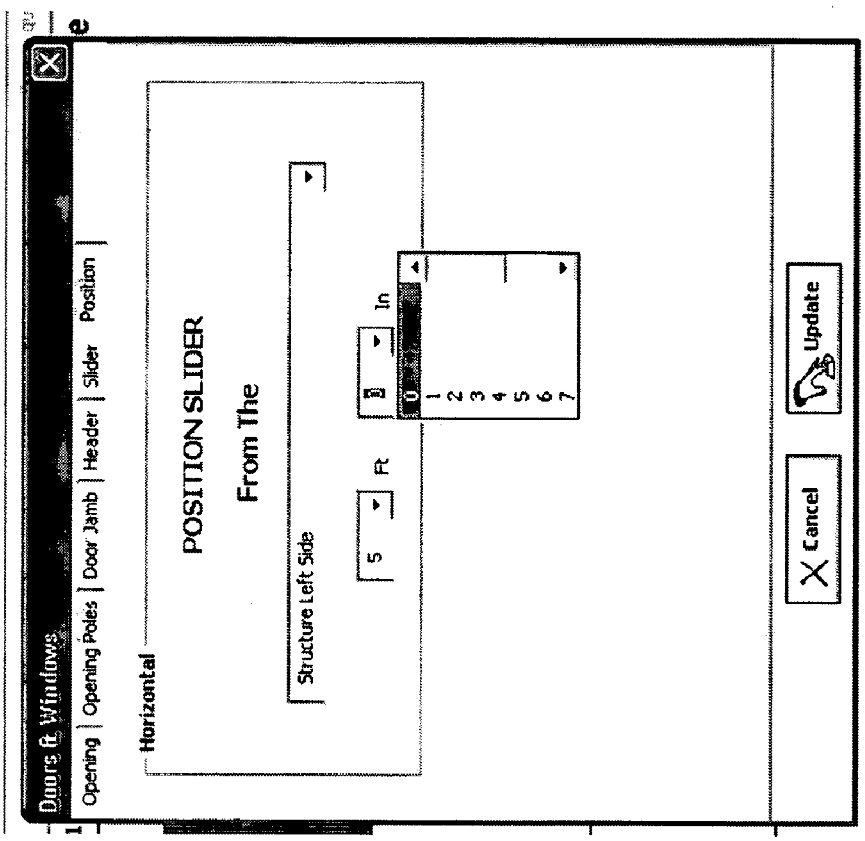
Figure 79:
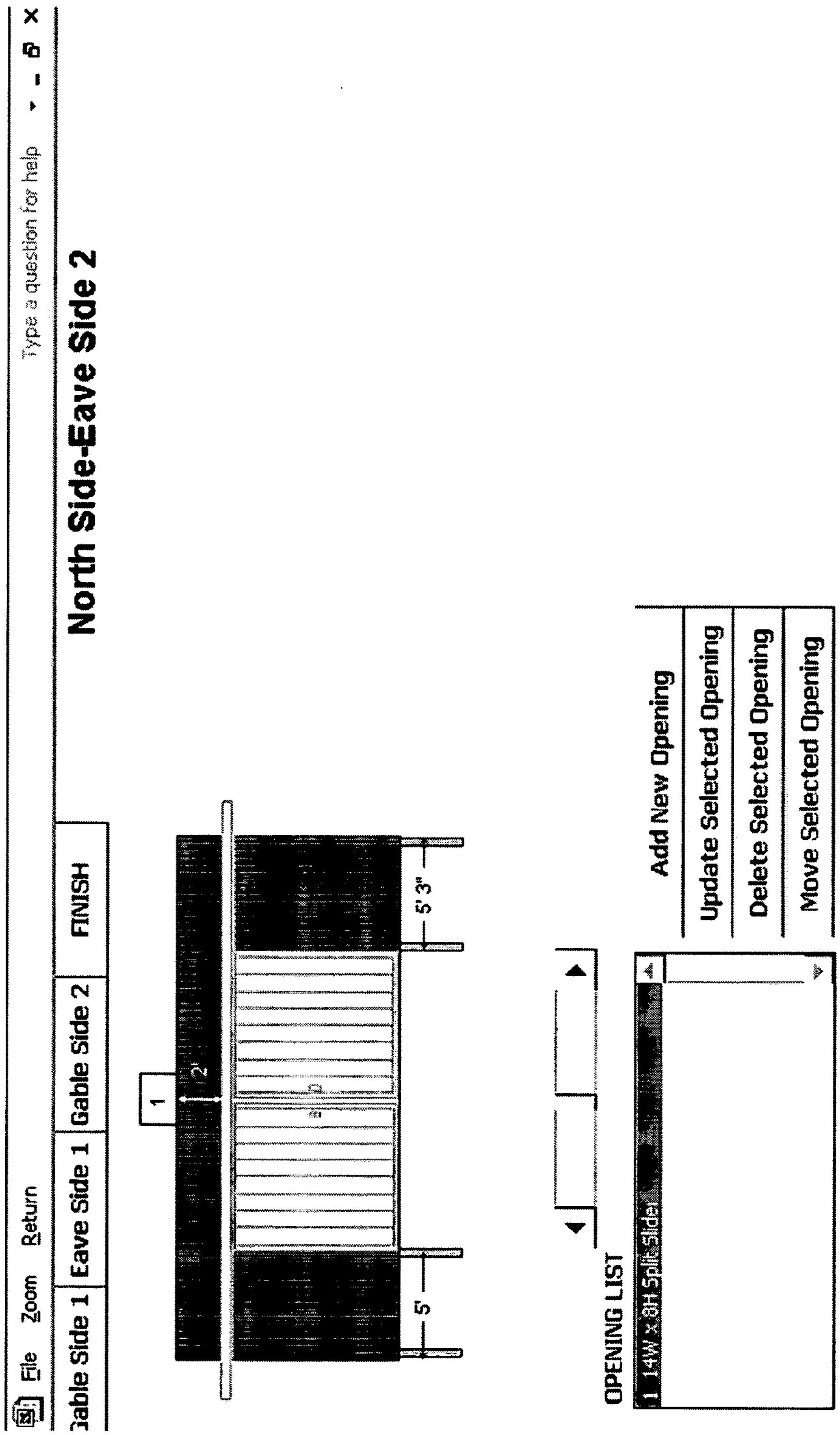

Continuing this demonstration, select the next wall for which an opening is desired (in this case, a split sliding door for the North Side—Eave Side 2). After selecting Add New Opening, then the tab for Sliding Doors, and the Hardware picklist, the user can select from the list of doors in Product Setup. After choosing a sliding door, the user is taken to the display of FIGS. 74-75. All of the necessary Hardware can be viewed using the vertical scroll bar. Next the user advances through the Opening Poles, Door Jamb and Header tabs (as described above). Under the Slider tab, the user picks the Company, Track, Trolleys, Girt Type, Guide Type, and Track Board Species, Size and Track Support Size (FIG. 76). Under the Position tab, the Horizontal POSITION of the SLIDER from the structure's left or right can be selected (in feet and inches, see FIGS. 78-79). Selecting Update will cause the program to insert the split sliding door into the display.

Figure 81:
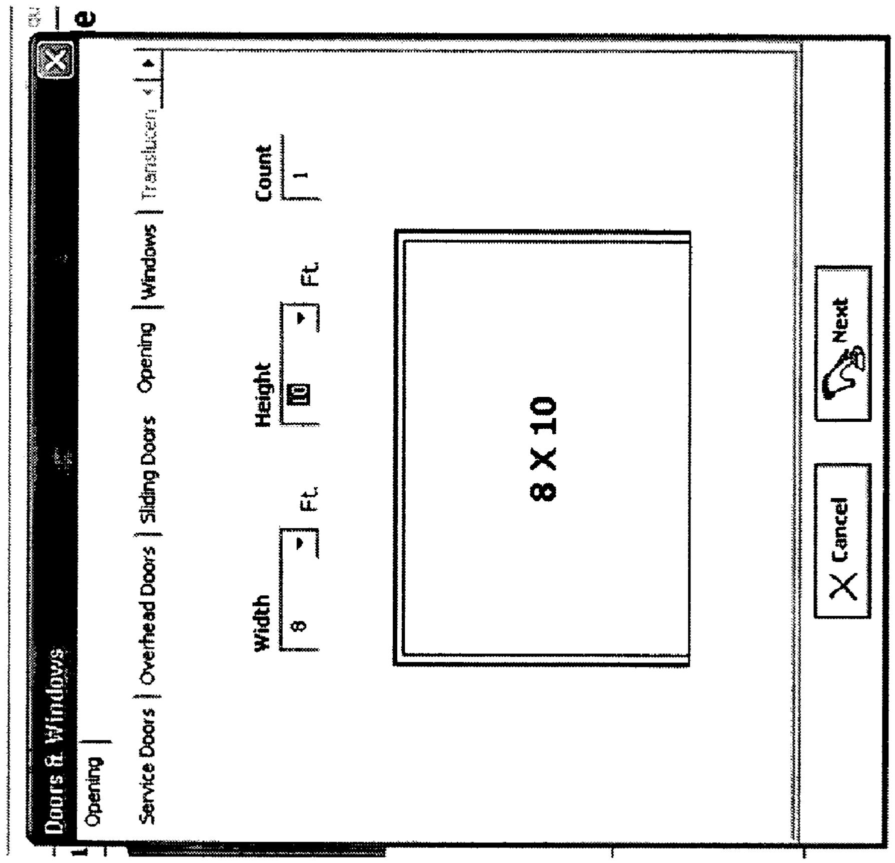
Figure 80:
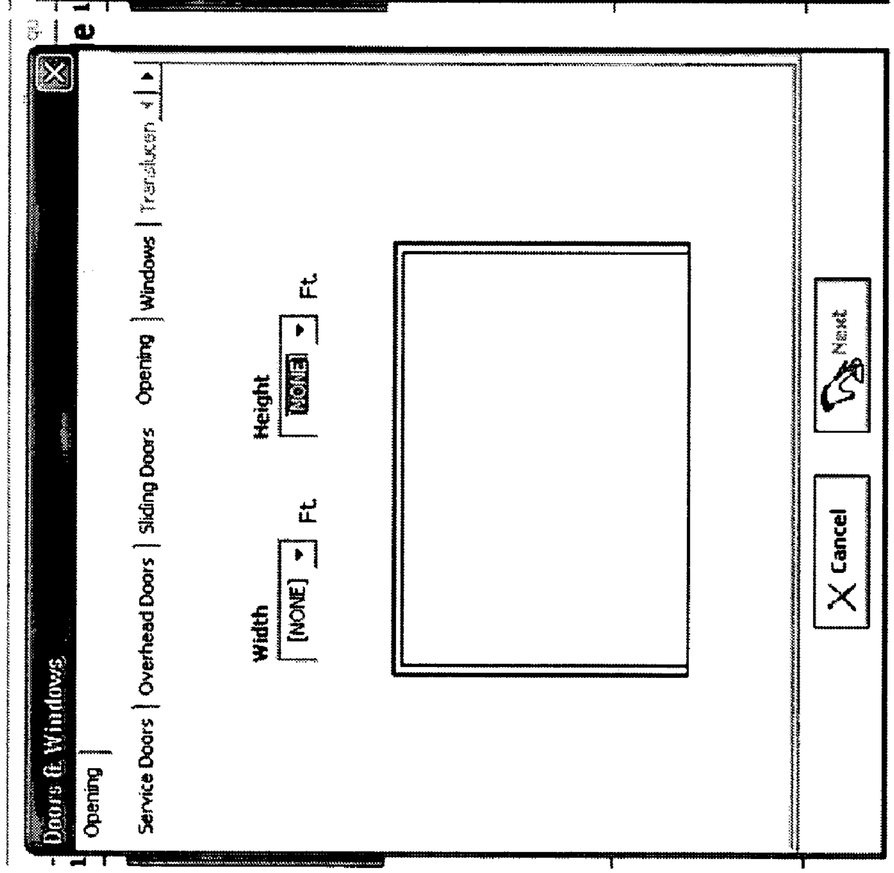
Figure 82:
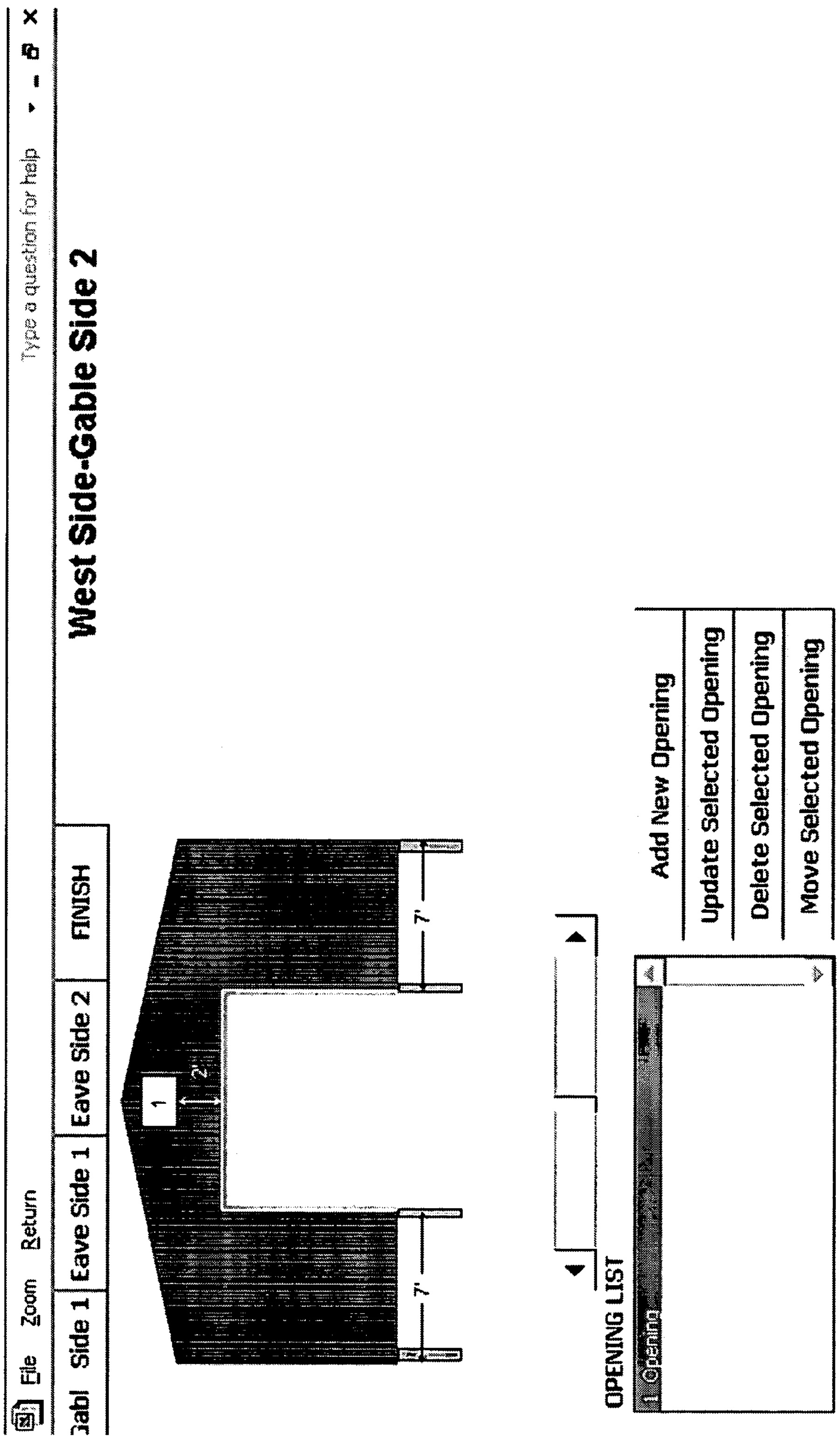

Continuing this demonstration, select the next wall for which an opening is desired (in this case, an opening for the West Side—Gable Side 2). After selecting Add New Opening, then the tab for Opening, the user can choose the Width, Height and Count for the Opening(s). See FIGS. 80-81. A graphical display will be shown. Next the user advances through the Opening Poles, Door Jamb, Header and Position tabs (as described above). Selecting Update will cause the program to insert the Opening into the display. See FIG. 82. Note: the default horizontal location for any opening is the center (or near center) of the given side for the specified building length/width.

Figure 83:
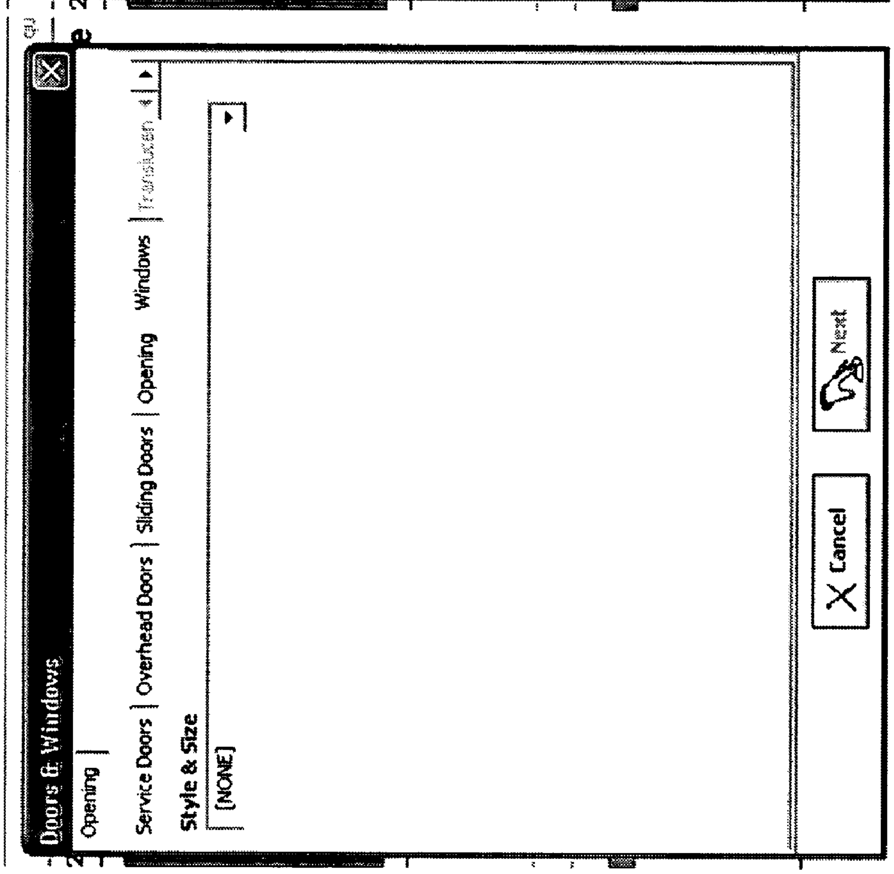
Figure 84:
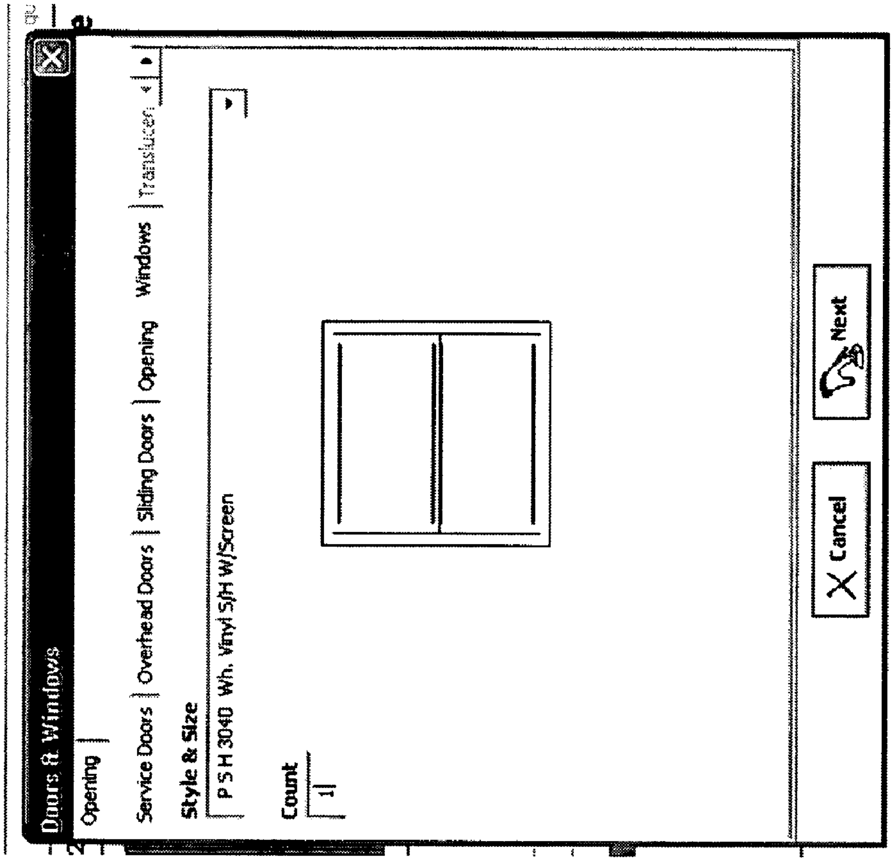
Figure 85:
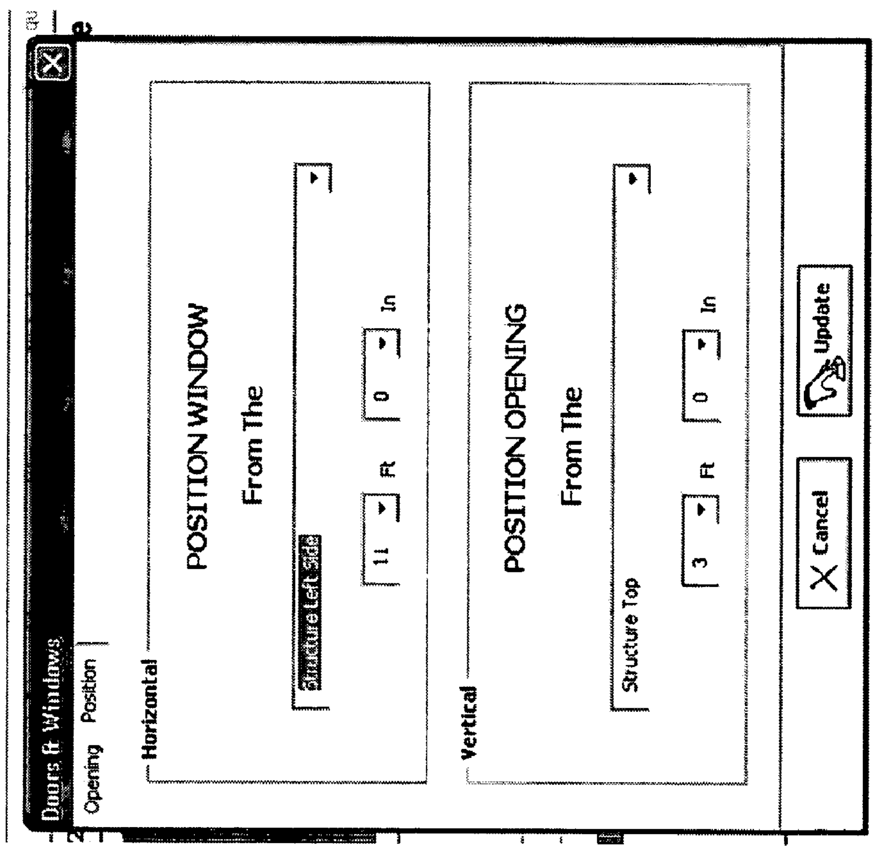

Continuing this demonstration, select the next wall for which an opening is desired (in this case, as permitted, returning to the East Side—Gable Side 1 to add a window). After selecting Add New Opening, then the tab for Windows of FIG. 83, then the Style & Size picklist of FIGS. 84-85, the user can select from the items in Product Setup and be taken to a display similar to FIG. On the Position tab the user selects the Horizontal POSITION WINDOW as already described. In addition, the user selects the Vertical POSITION OPENING in a similar fashion. Once these parameters have been entered the program will insert the window into the display. See FIG. 86. Note: the default vertical location for any window, wall vent, etc. is the center (or near center) of the given side for the specified building height. In other words, the height of the building contributed by the trusses does not enter in to this default location. Nor can an opening be located above the specified building height.

Continuing this demonstration, select the next wall for which an opening is desired (South Side—Eave Side 1 to add translucent panels). After selecting Add New Opening, then the tab for Translucent Panels, the user selects the Color and Height of the panels. Selecting Update inserts the translucent panels into the display. The upper edge of the panels are located where the soffit, if any, "planes into" the wall when you have trusses that overhang the wall. Refer to the Overhang Detail display discussed below. (The same is true for the top edge of a panel of sheet metal siding.) The Height of a translucent panel is based on the location of the top three wall girts for that particular wall. Finally, if the spacing for wall girts is modified while keeping translucent panels, or if a new truss is selected so that greater truss overhang results, then when the program recalculates the estimate, BIPEC will inform the user that the Height of the translucent panels has also been changed. Another feature of the invention is the ability to Update Selected Opening(s). The user highlights the desired opening, selects this command, moves through the various tabs, and makes the required modification. Then after moving through the remaining tabs, the program updates the estimate and display accordingly. However, the modification (as with the original selection) is restricted within feasible limits.

When Delete Selected Opening is chosen (after an opening is highlighted), the user gets a "second chance" to confirm this command, in the form of the dialog box.

Figure 10:
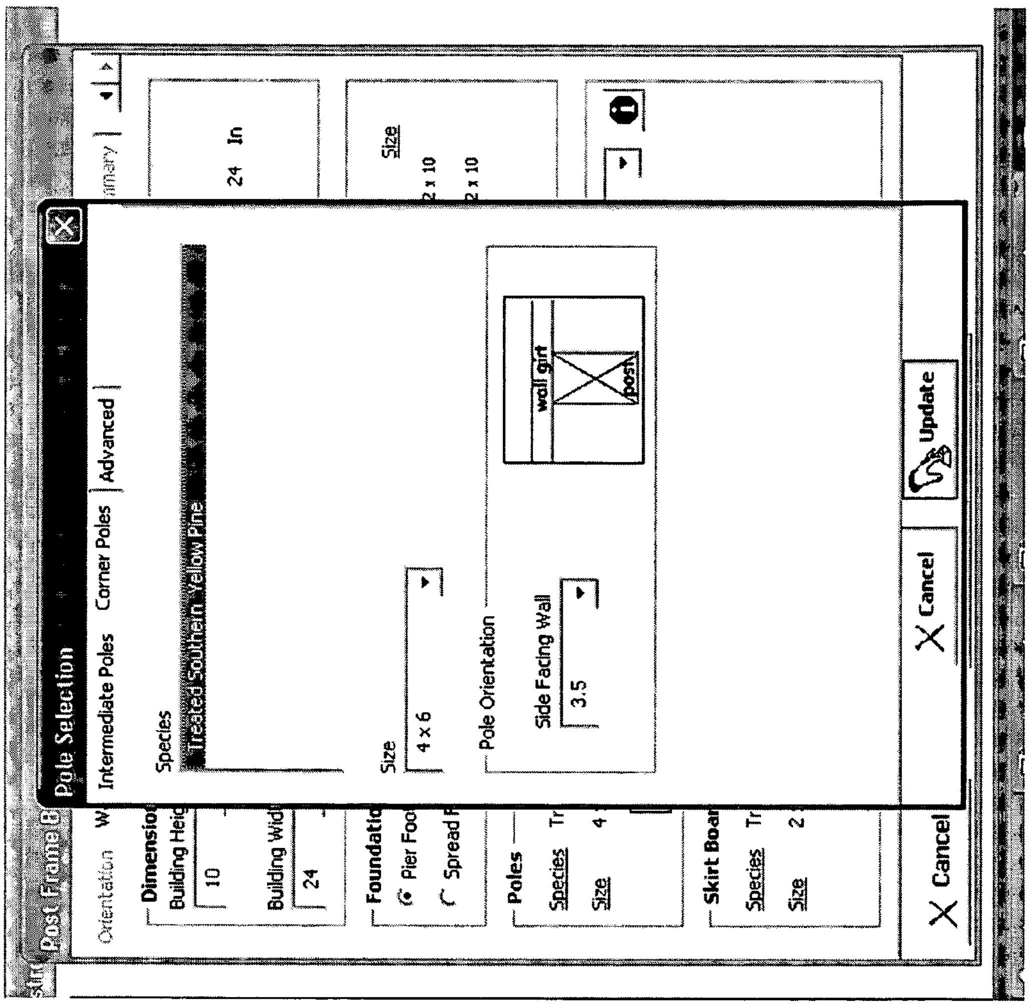
Figure 86:
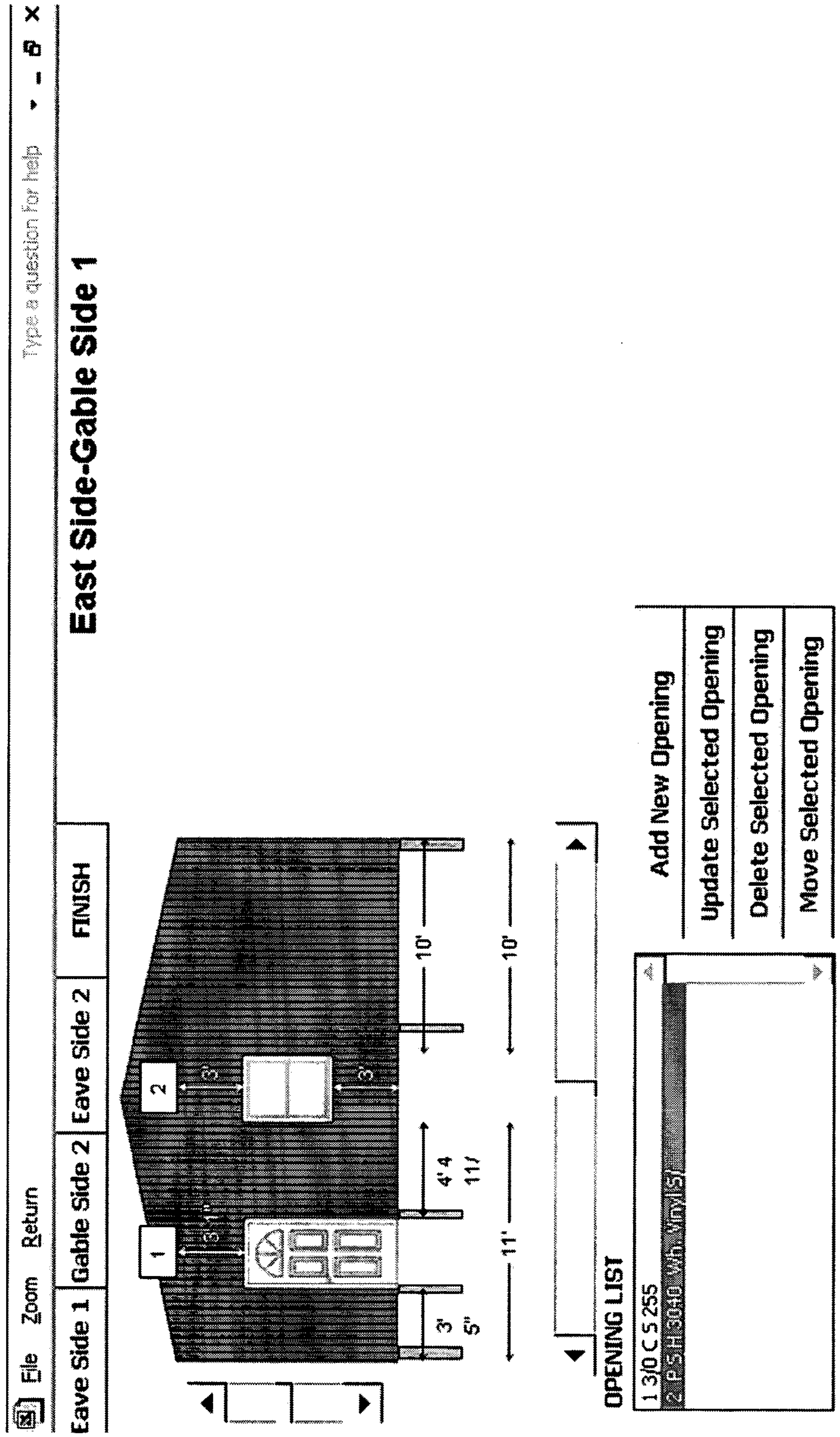
Figure 87:
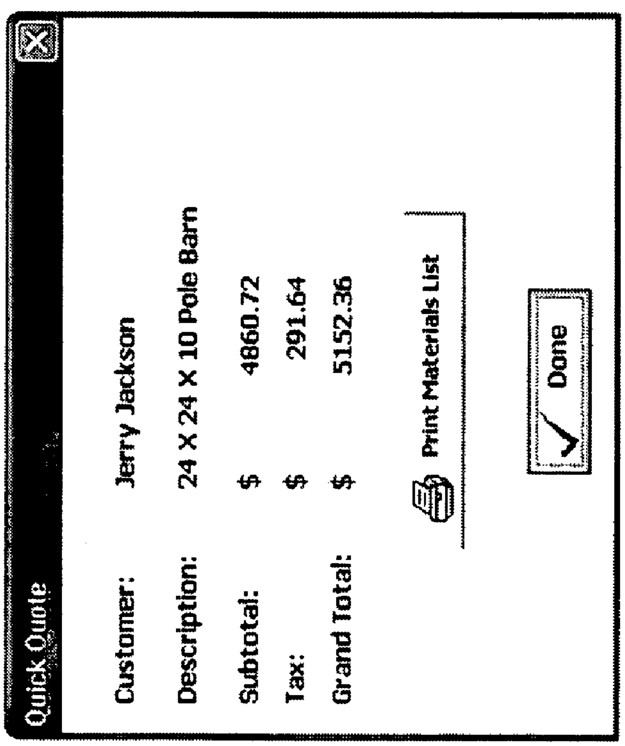
Figure 88:
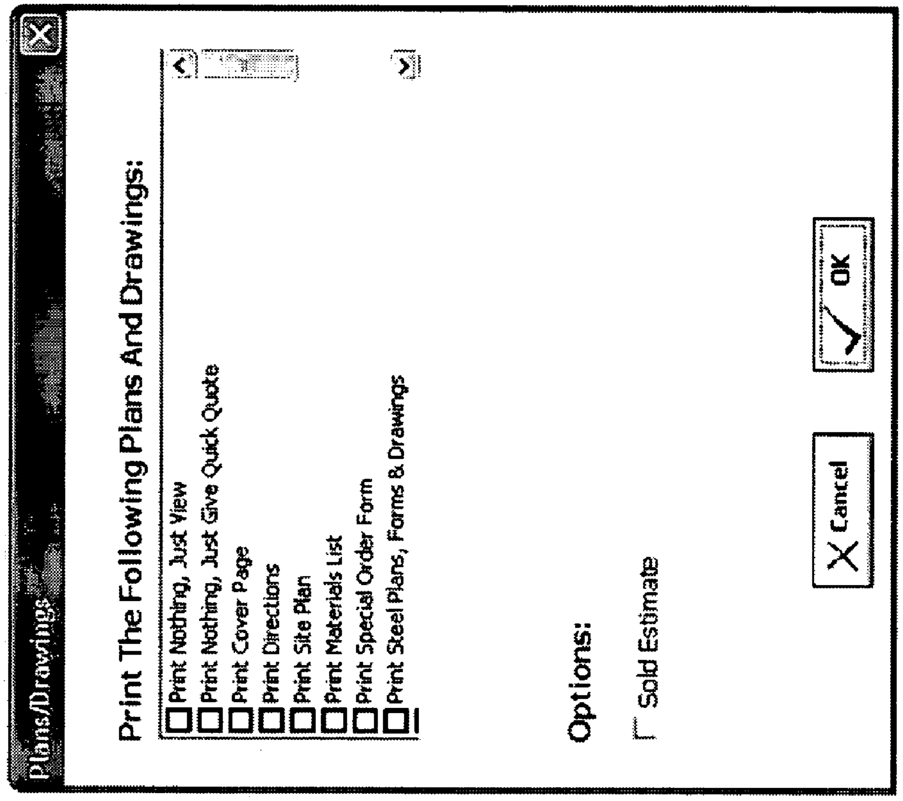
Figure 89:
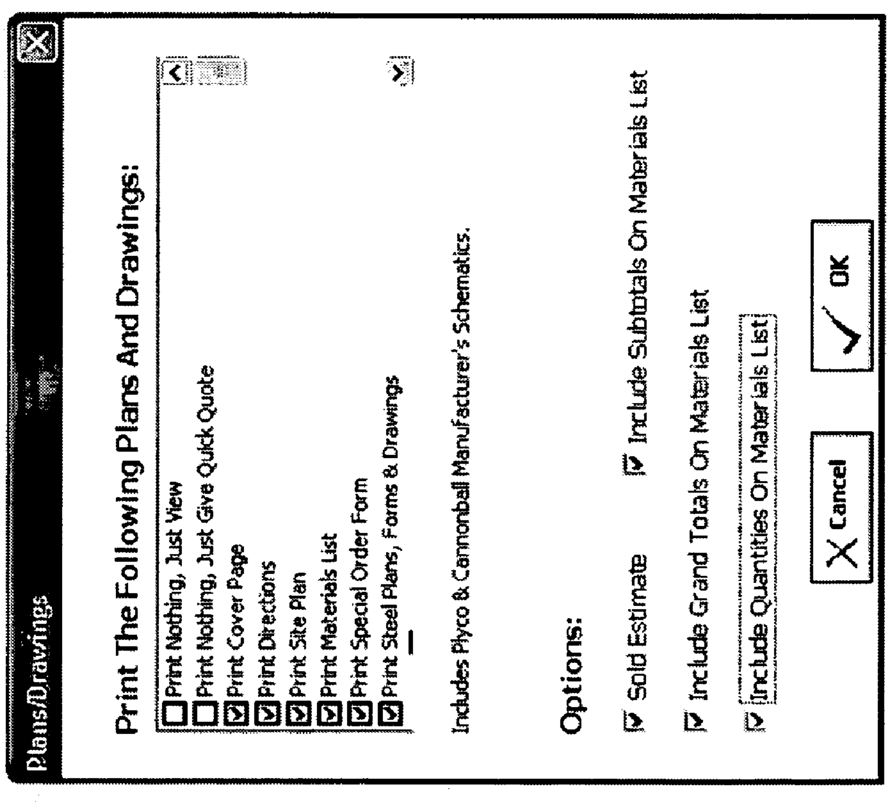
Figure 90:
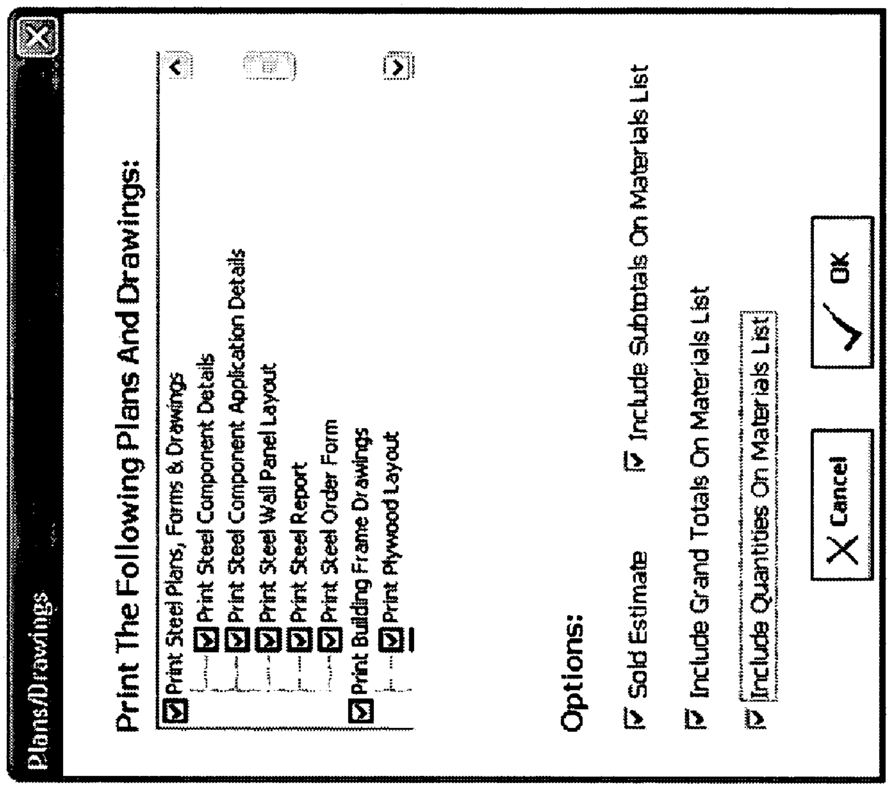
Figure 92:
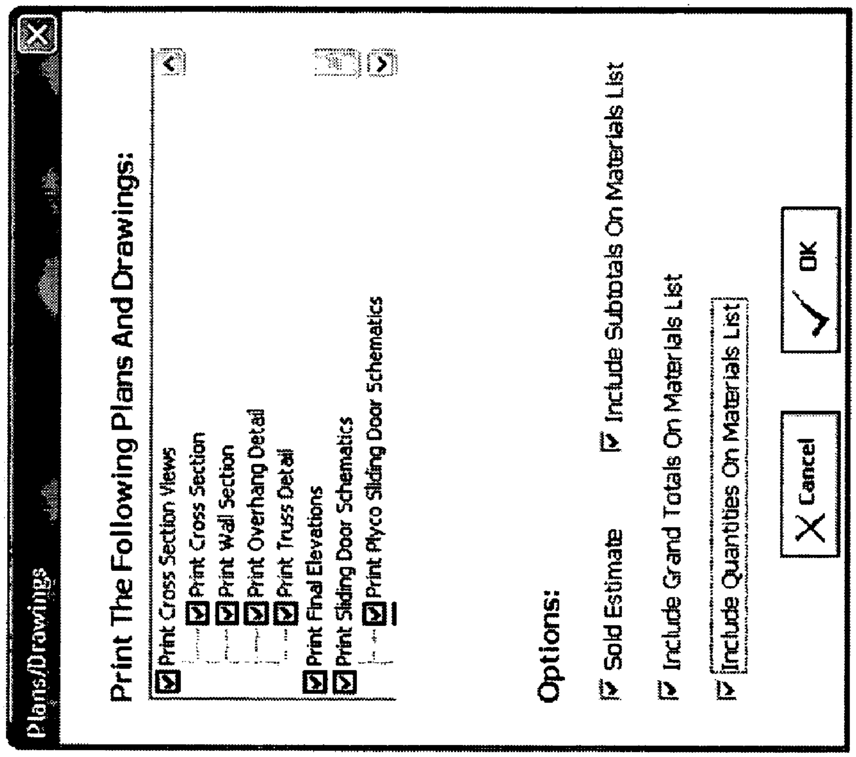
Figure 91:
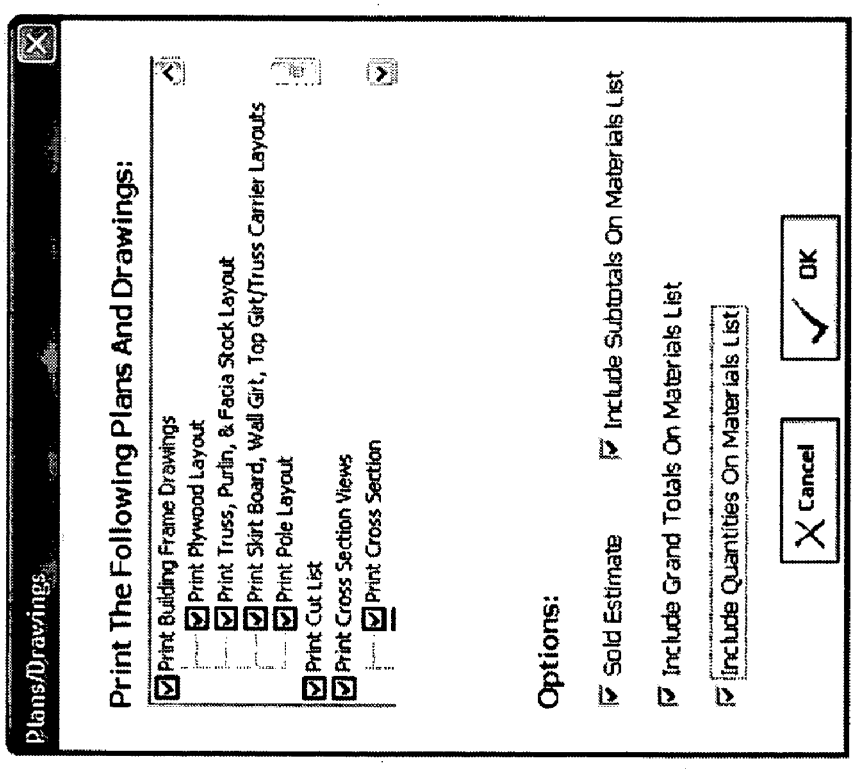
Figure 93:
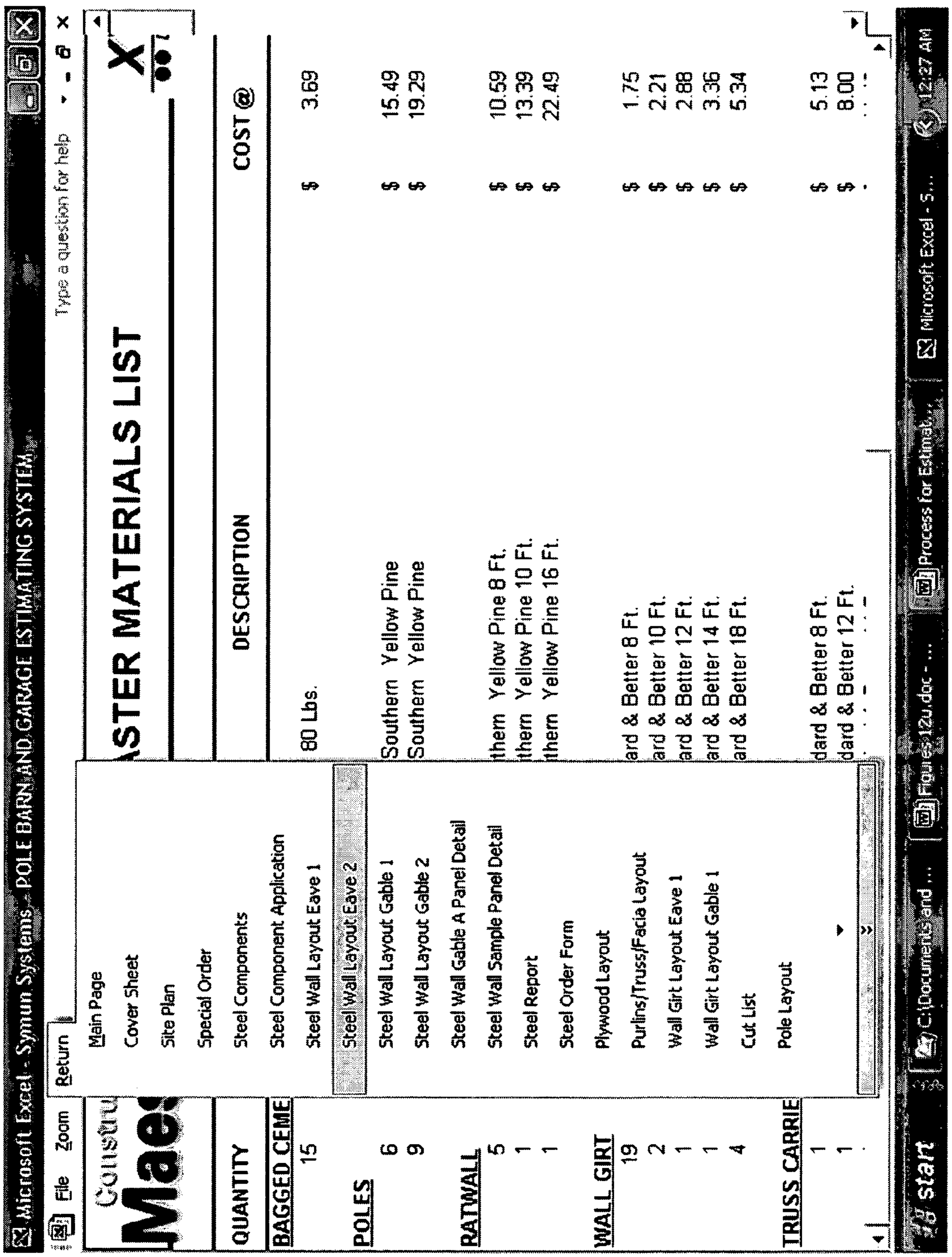
Figure 94:
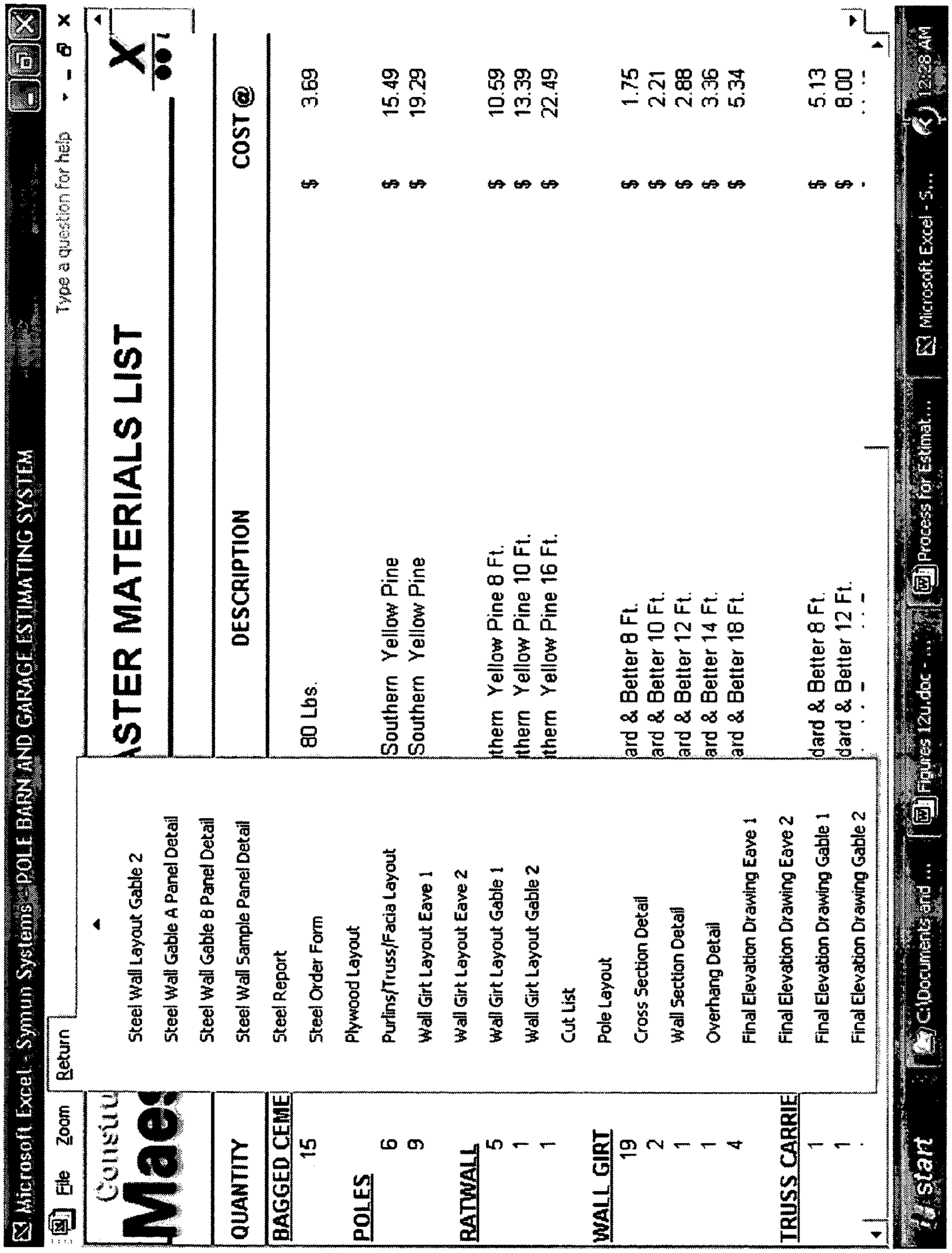
Figure 96:
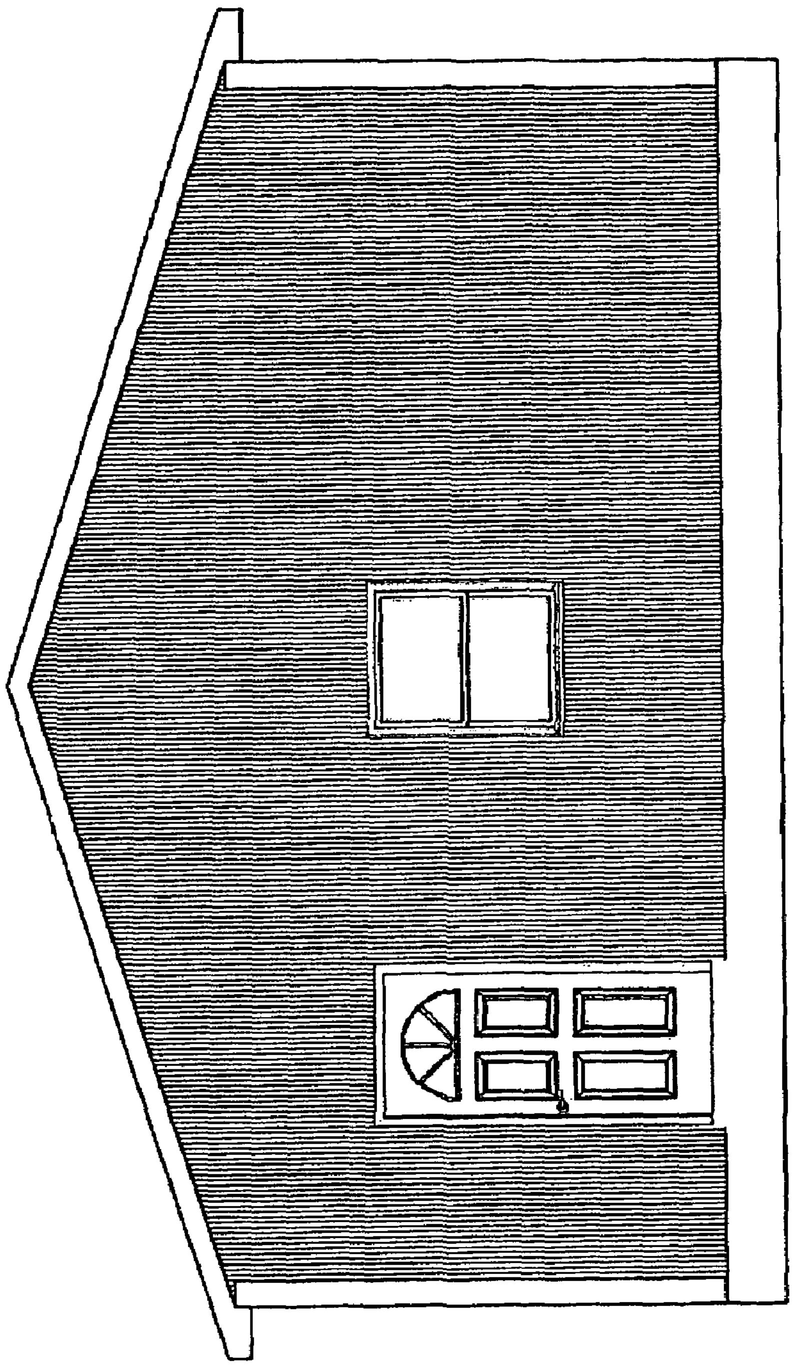
Figure 97:
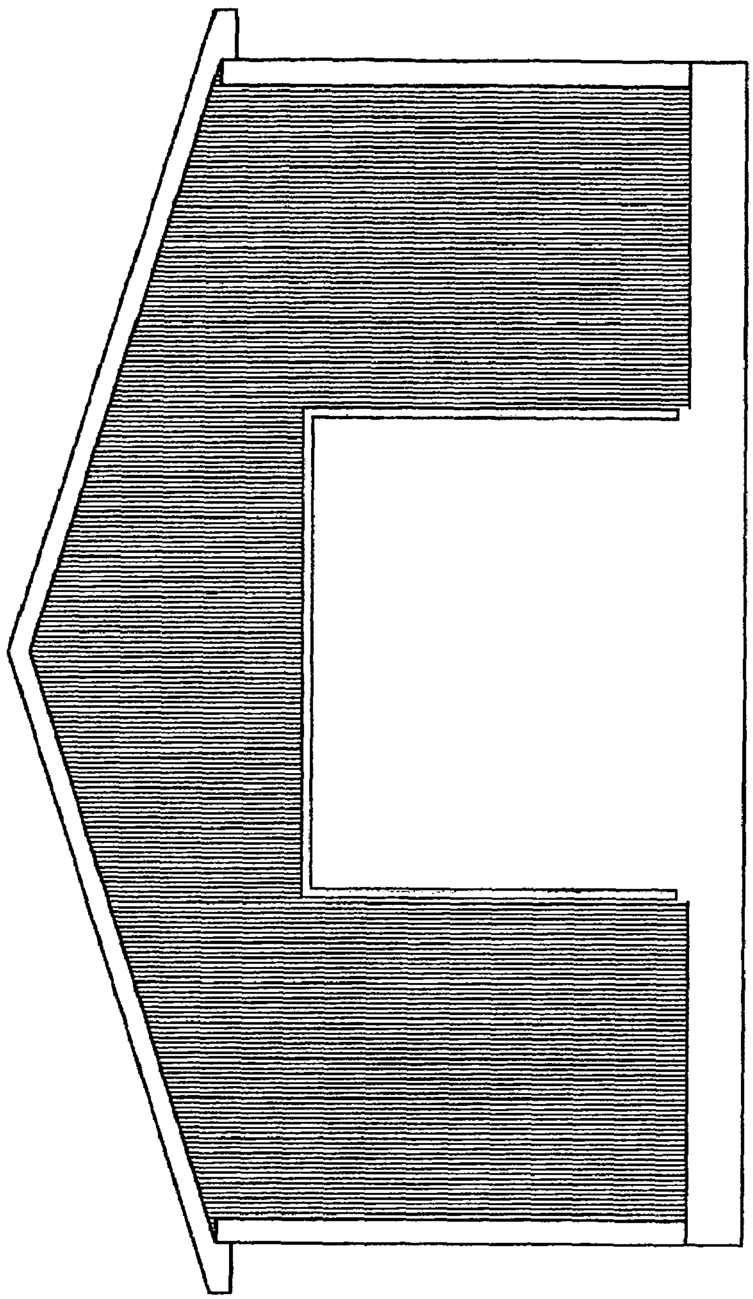
Figure 98:
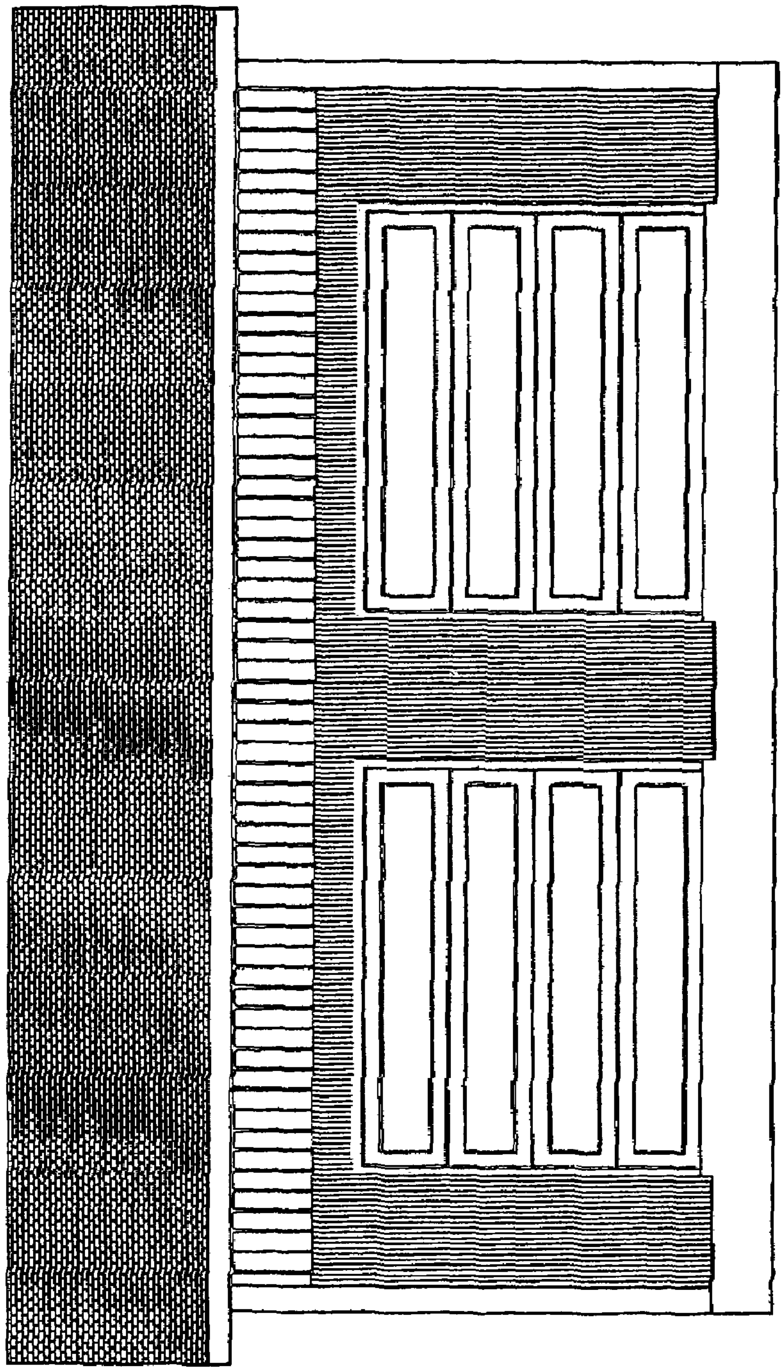
Figure 99:
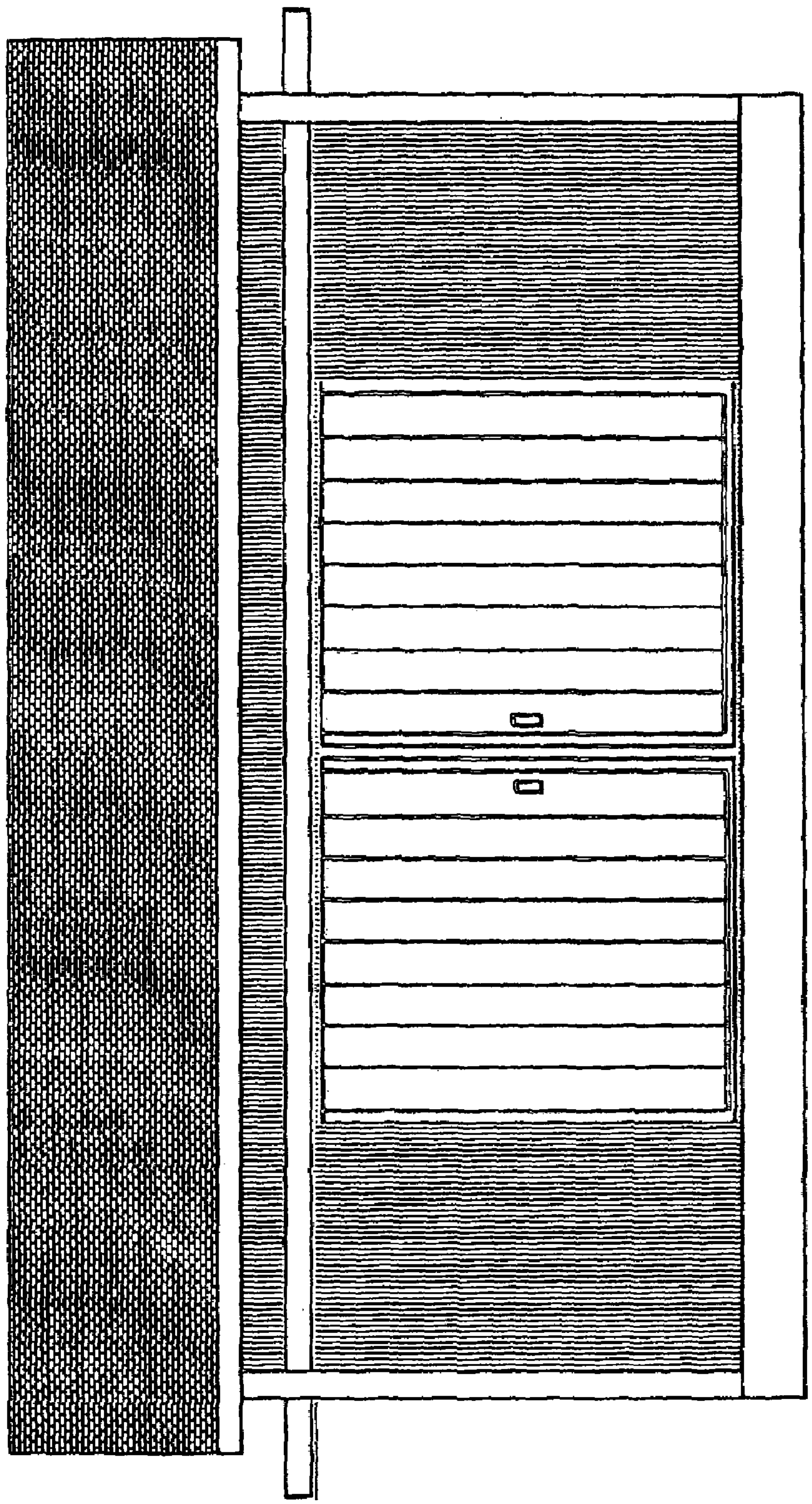
Figure 100:
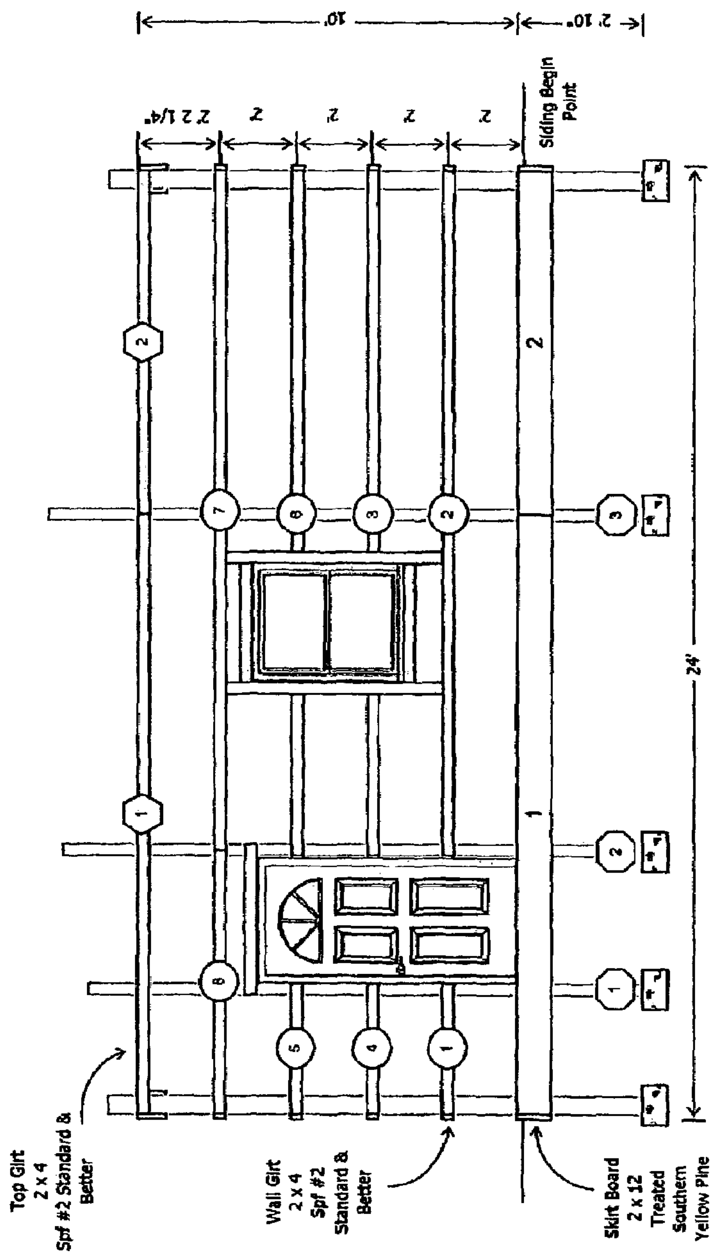
Figure 101:
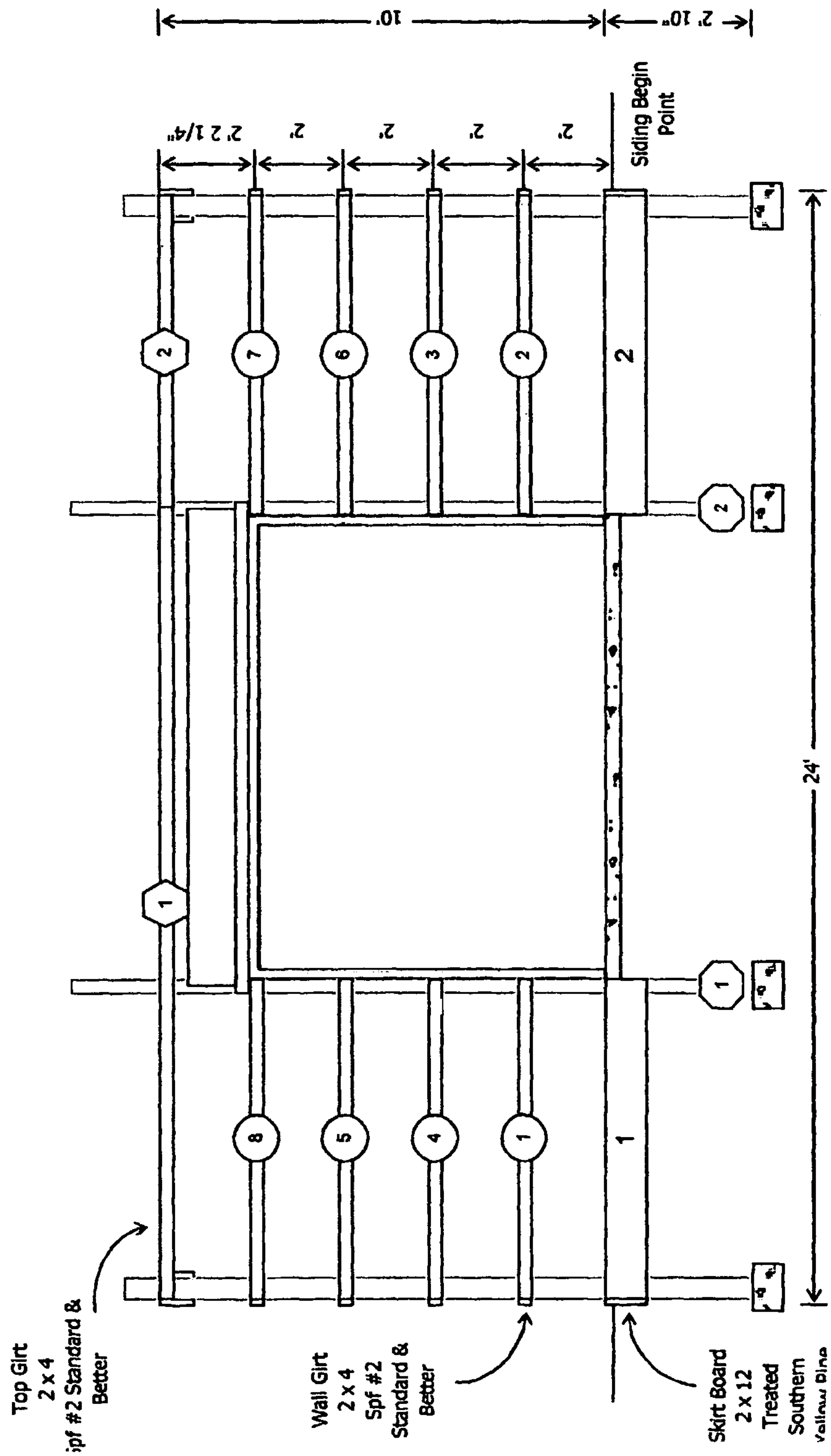
Figure 102:
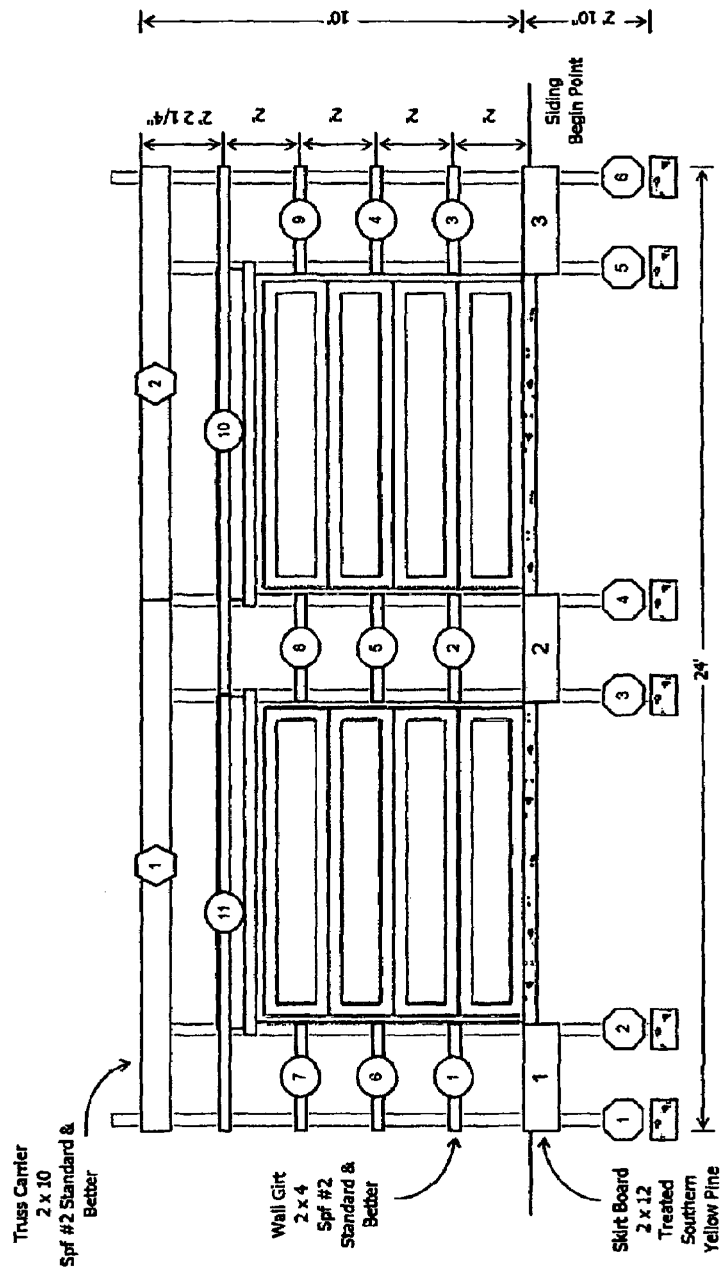
Figure 103:
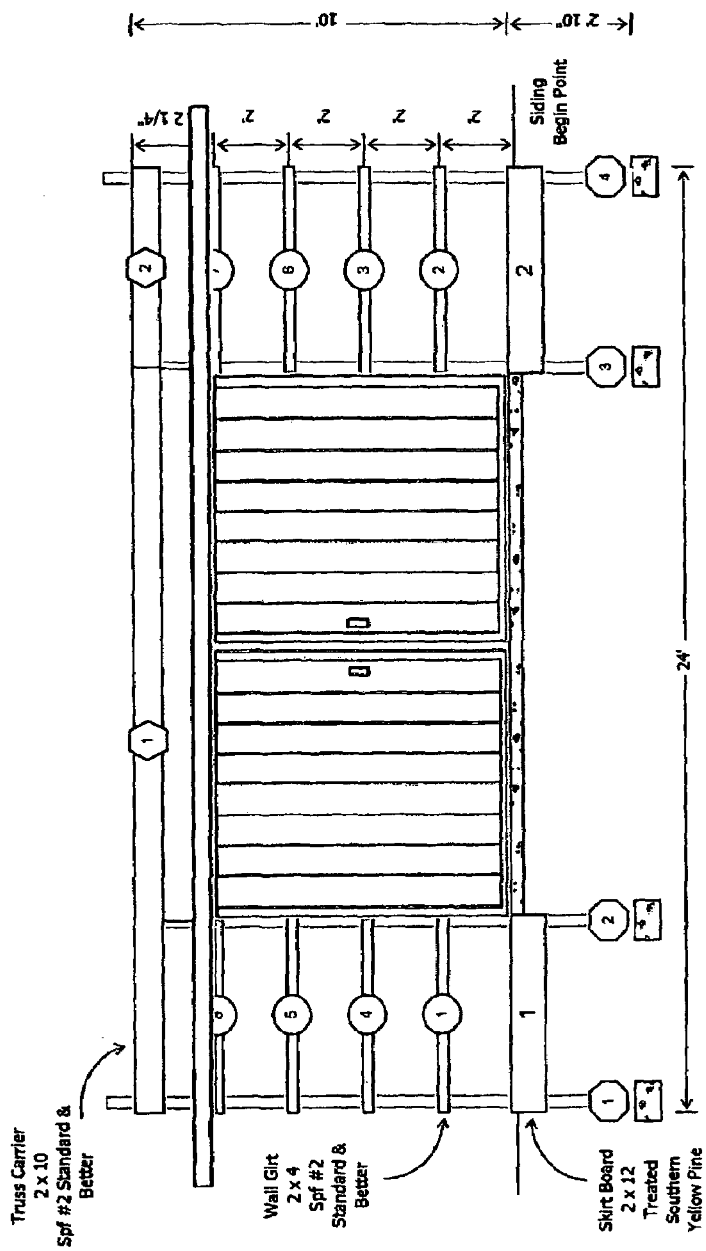

To complete the estimate, the user selects the FINISH command button located in the screen display for any side of the structure (FIG. 86). The user is then taken to the display of FIG. 88, entitled Plans/Drawings. Referring to FIG. 89, the user can select from a number of options, including Print Nothing, Just View (to see the many views, details, etc. which are the outputs of the program; and to print any of them individually), Print Cover Page, Print Directions, Print Site Plan, Just Give Quick Quote of FIG. 87, etc. Other print options are shown in FIGS. 90-92. Except for Print Nothing, Just View and Just Give Quick Quote, more than one of these options may be selected at a time. If the user selects Just View, the display options of FIGS. 93-94 appear. For example, the user can then select the Final Elevation Drawings of FIGS. 96-99, or the Wall Girt Layouts of FIGS. 100-103. A feature of the Wall Girt Views is that a plurality of the vertically oriented poles are displayed, the plurality of poles having sides facing the wall as shown in FIGS. 9-10, wherein the sides facing the wall are displayed in proportion to the dimensions for a given side.

Figure 104:
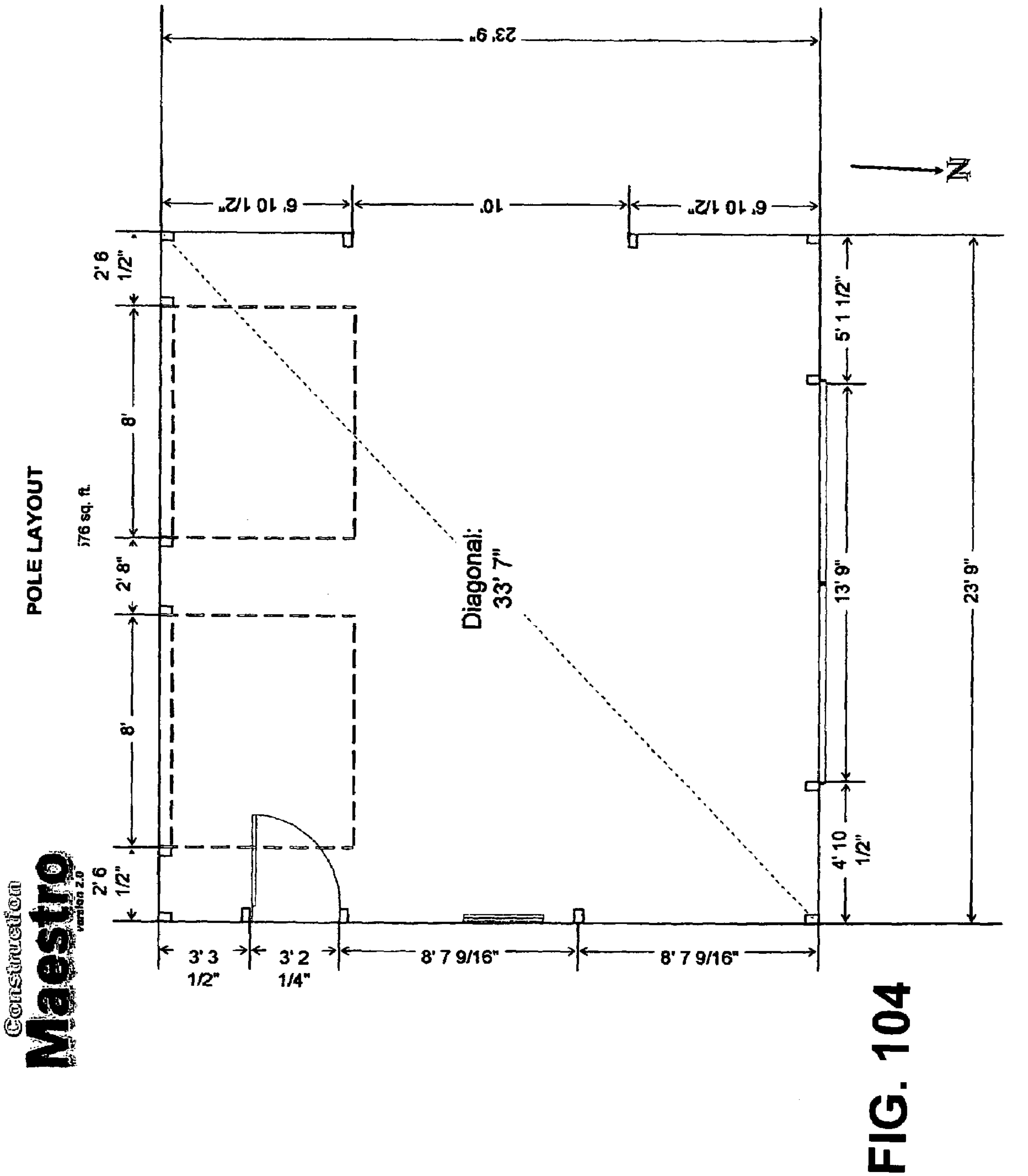
Figure 105:
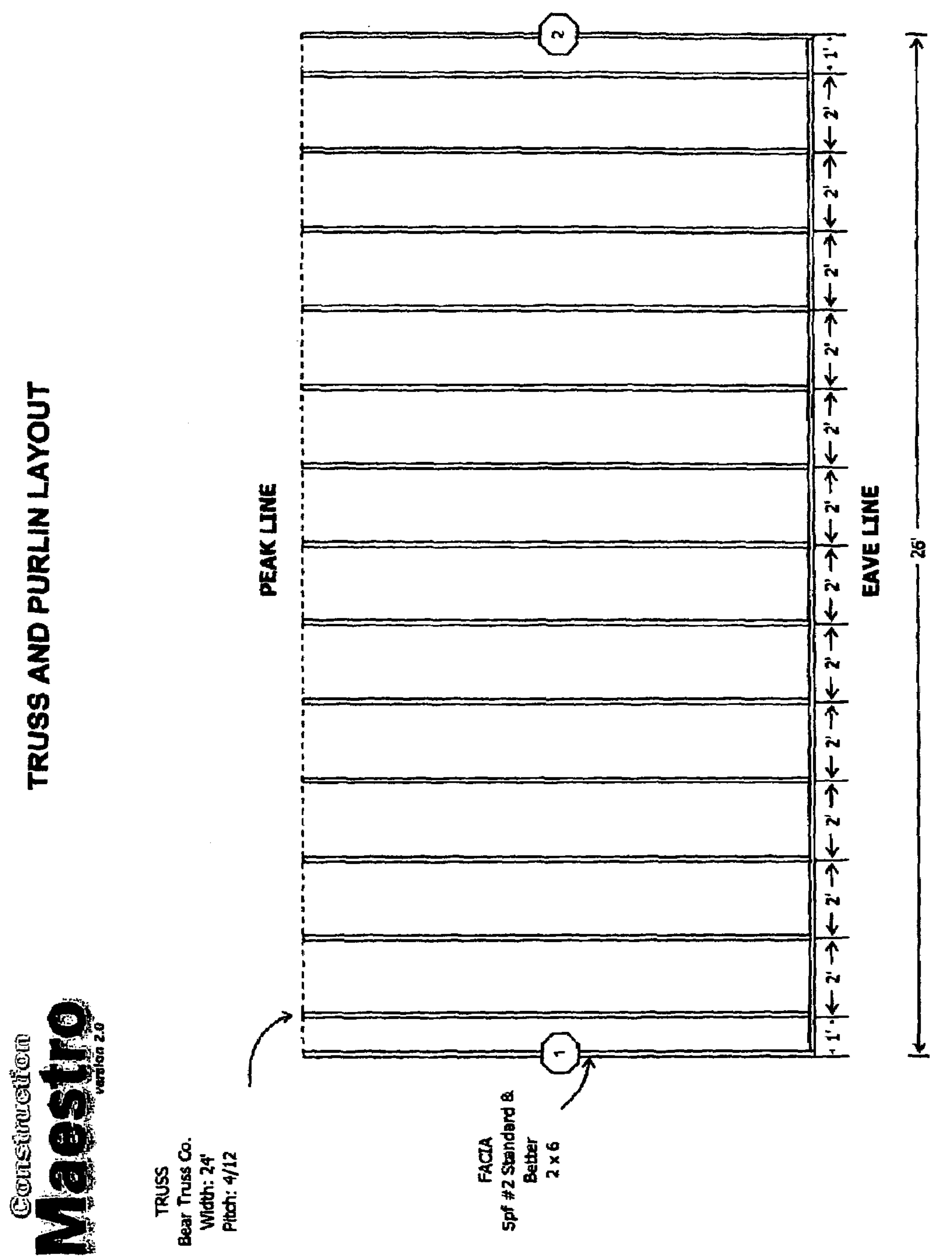
Figure 117:
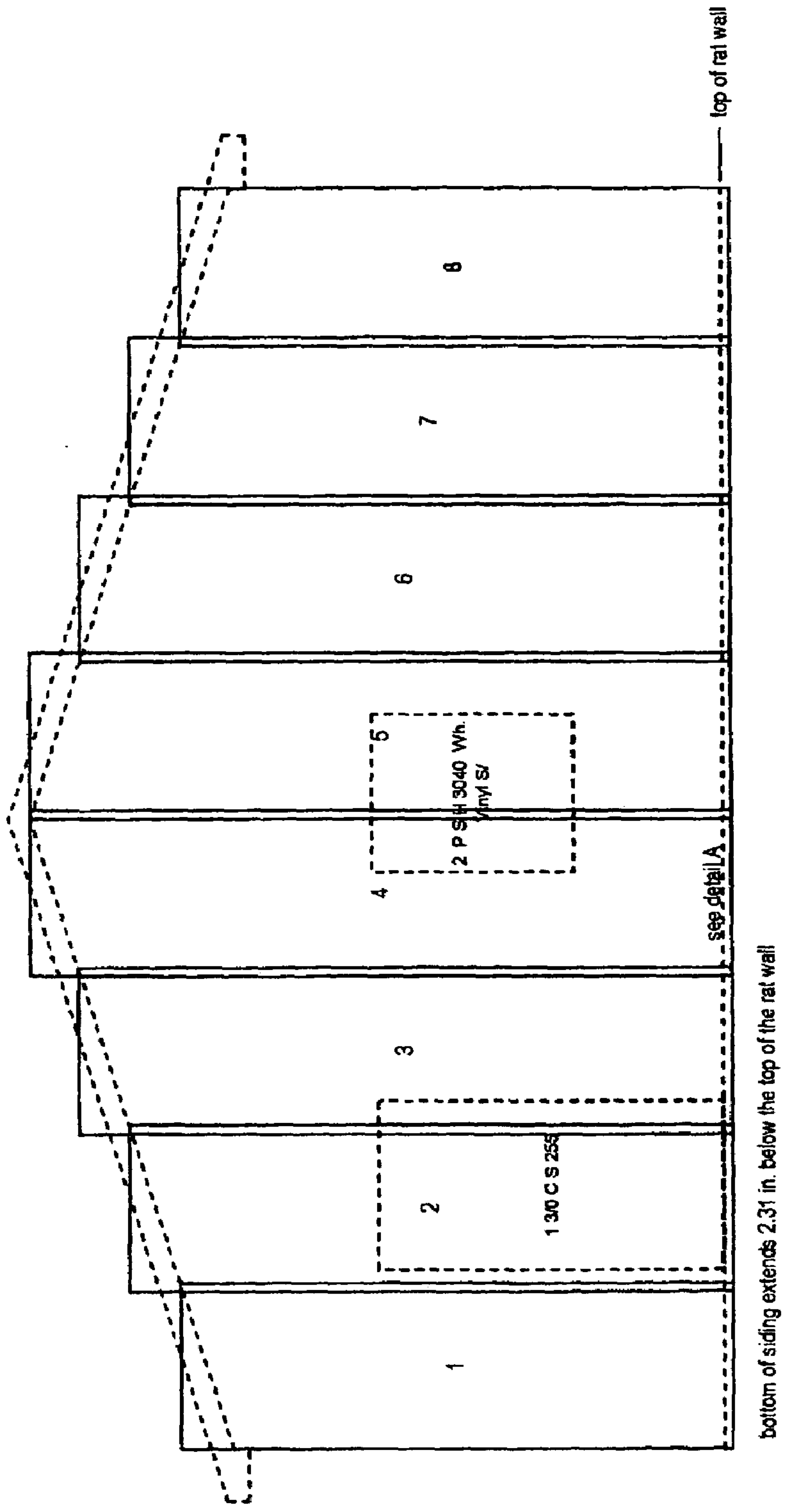
Figure 118:
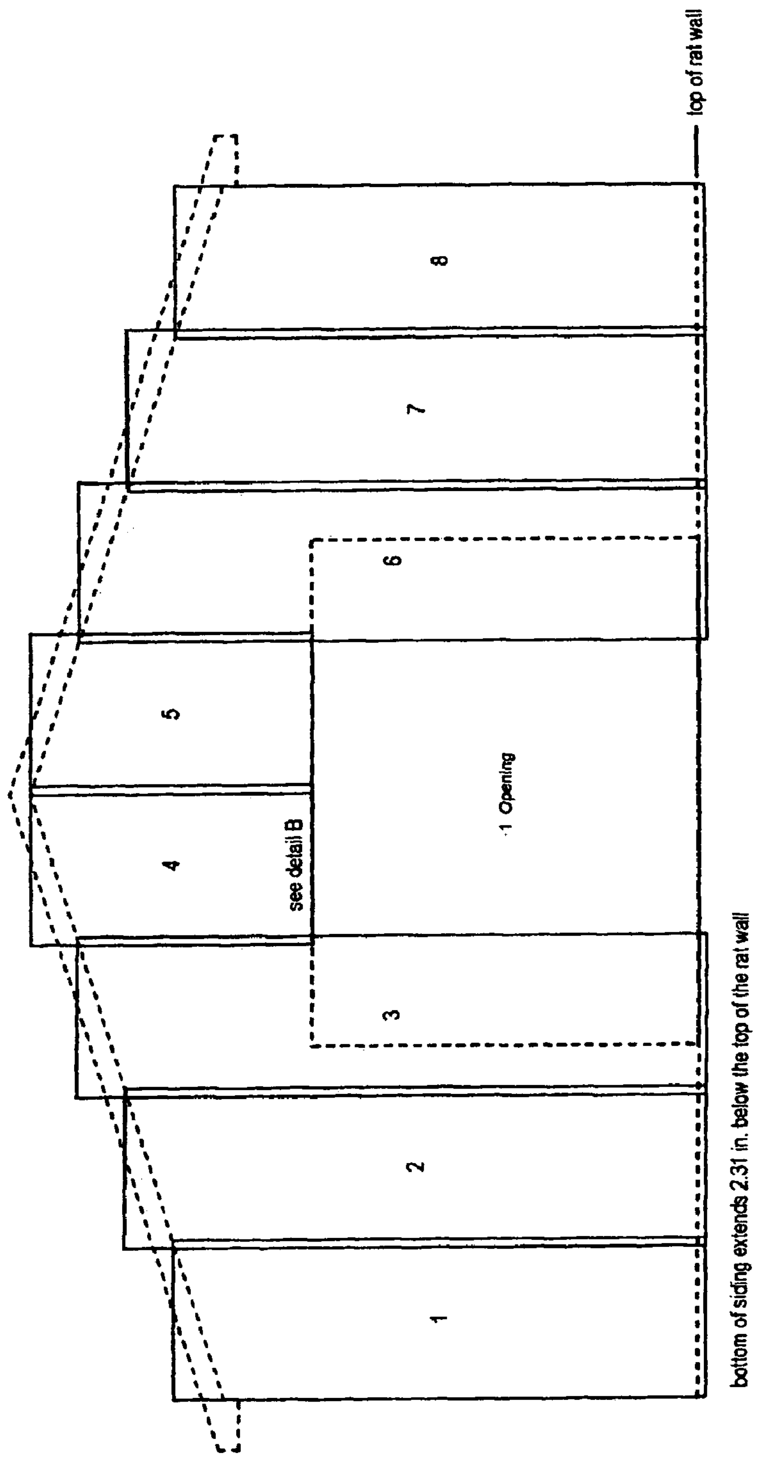
Figure 119:
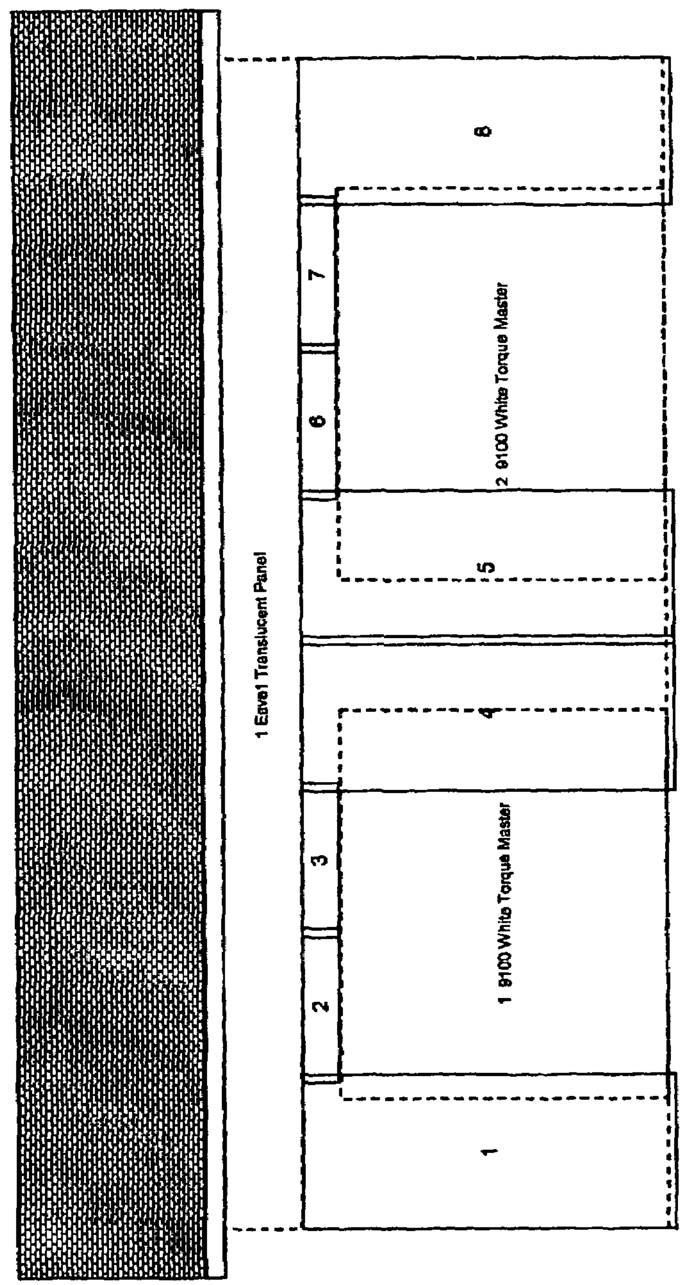
Figure 120:
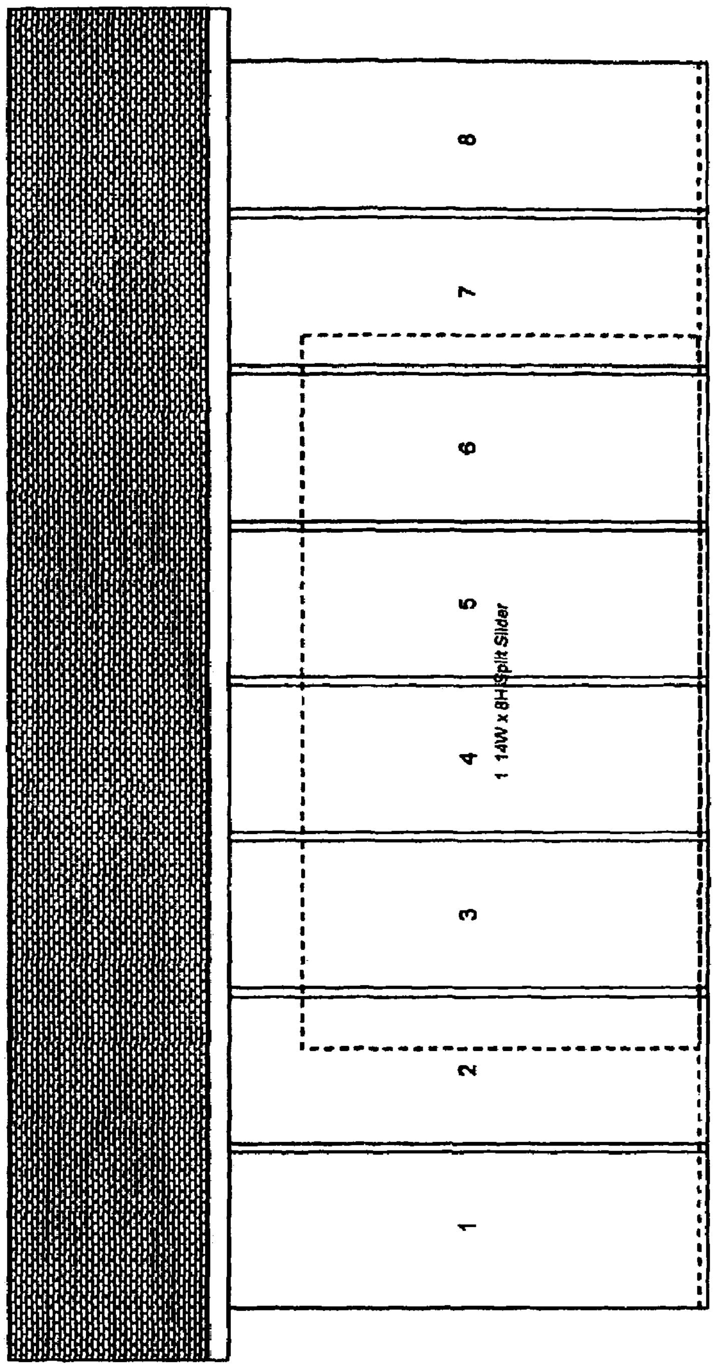

Referring to FIG. 104, when displaying a visual model, it is desirable to display a floor plan, a.k.a. pole layout, of the wood frame building. A floor plan in this case is a quasi cross-sectional view of the walls of the building at a plane parallel to the ground. Further it is desirable to indicate in the floor plan the location, height and width of an overhead door. This helps with interpreting the overall layout of the building. The user may also recognize potential problems with a particular placement for an overhead door when other openings are viewed with respect to their proximity to the overhead door, or with use of the overhead space within the building. In addition, the floor plan of FIG. 104 indicates substantially the distance between opposite corners of the wood frame building. A building crew typically uses this distance between opposite corners in order to check whether adjoining walls are perpendicular to each other. Referring again to FIG. 104, it is desirable to display a distance substantially between each of a plurality of poles for a wall. The displayed distance substantially between each of a plurality of poles can have some minor variations in how the distance is measured, even within the same floor plan. In one example, the distance can be measured from the surface of one pole facing an opening to the surface of another pole facing the opening, i.e. measuring "inside-to-inside." In another example, for the same floor plan the distance can be measured between poles "outside-to-outside," i.e. the sides of the respective poles that face in opposite directions. But in both of these examples the sum of the distance substantially between each of the plurality of poles for the wall is equal to the nominal building dimension for the wall, such as 24 feet in a building with selected dimensions of "24 feet by 24 feet," minus the combined nominal thicknesses of two wall girts. This is because it is desirable that, for a given wall, the spacing of the poles farthest from each other take into account the thickness of the wall girts attached to them. In this fashion, the nominal outer dimensions of the building will not exceed the specified nominal dimensions, as would be the case if the "outside-to-outside" dimensions of the poles was equated with the specified nominal dimensions of the building. Alternatively, it is desirable to display the distance between the opposite sides of the poles at each side of the wall wherein the distance displayed is the nominal building dimension for the wall minus the combined thickness of two wall girts.

Figure 127:
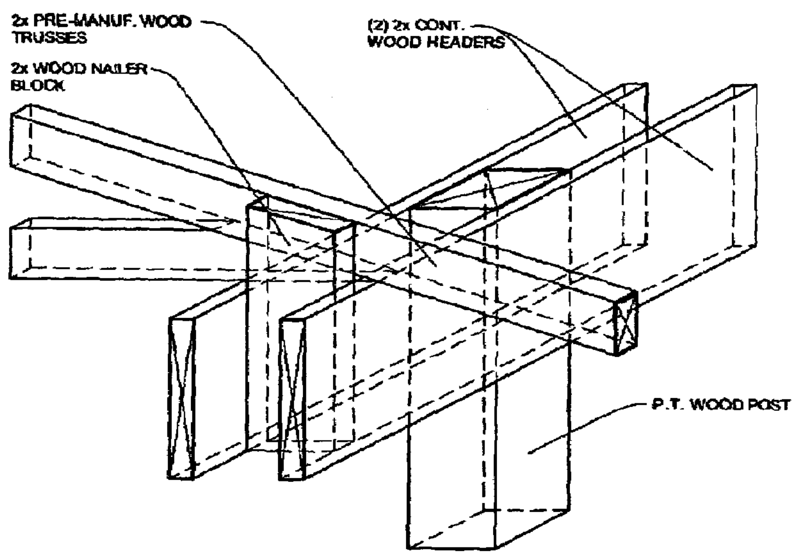
Figure 130:
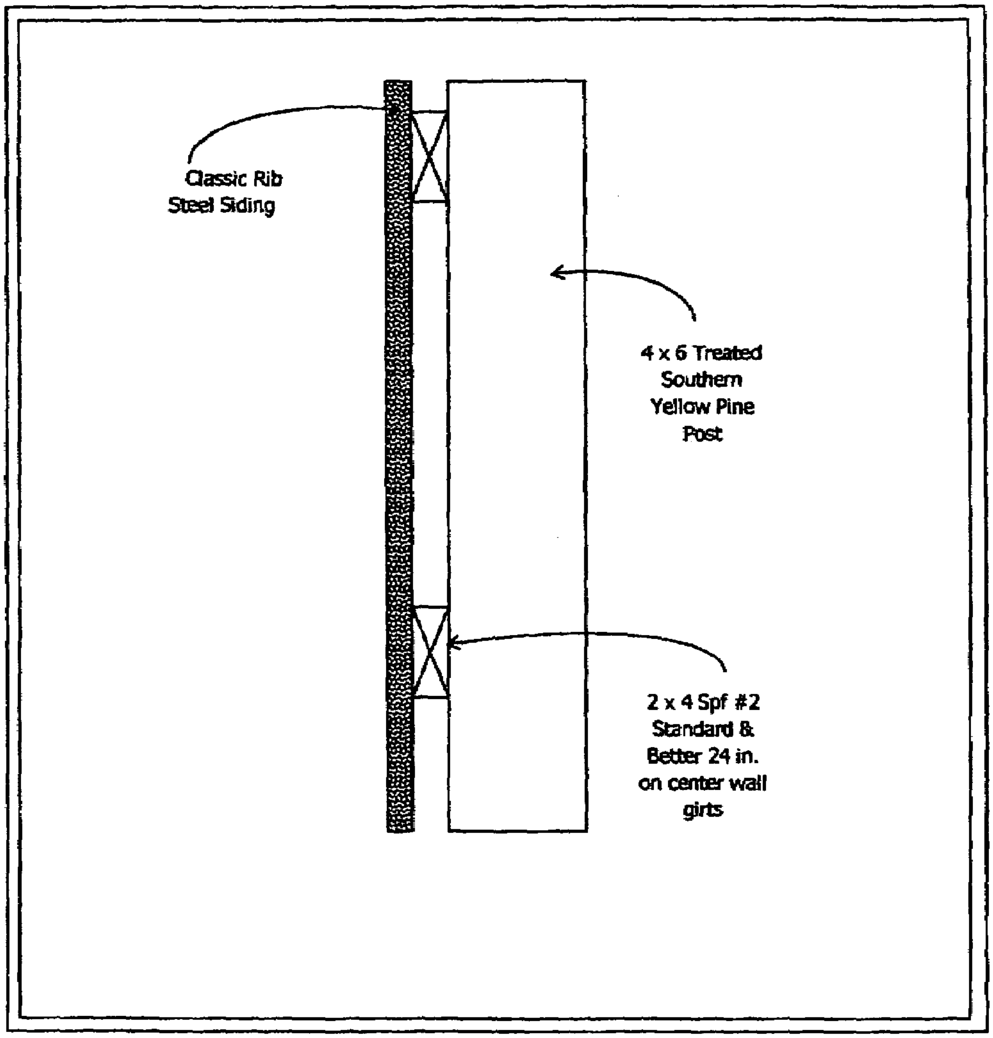
Figure 131:
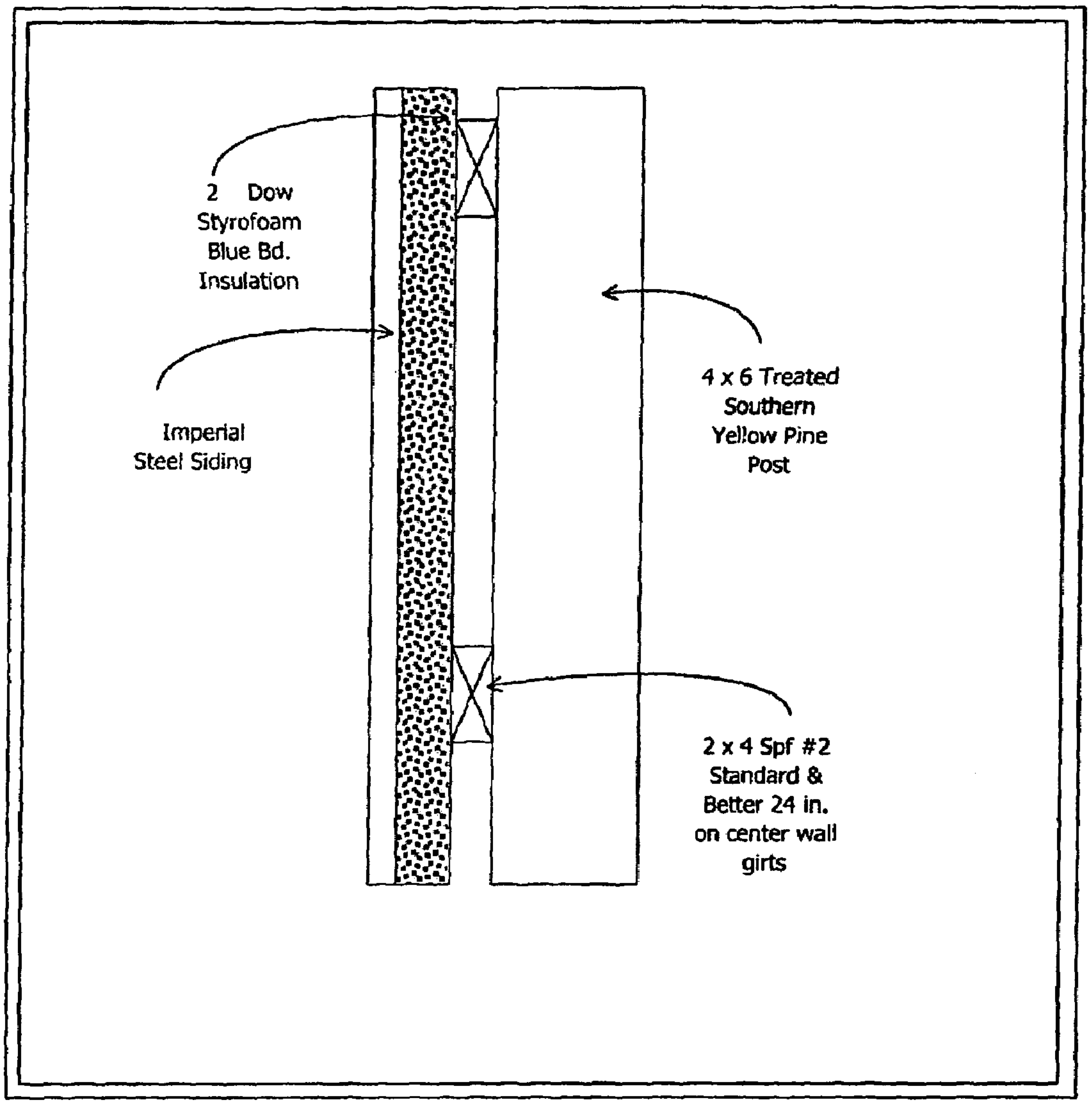
Figure 132:
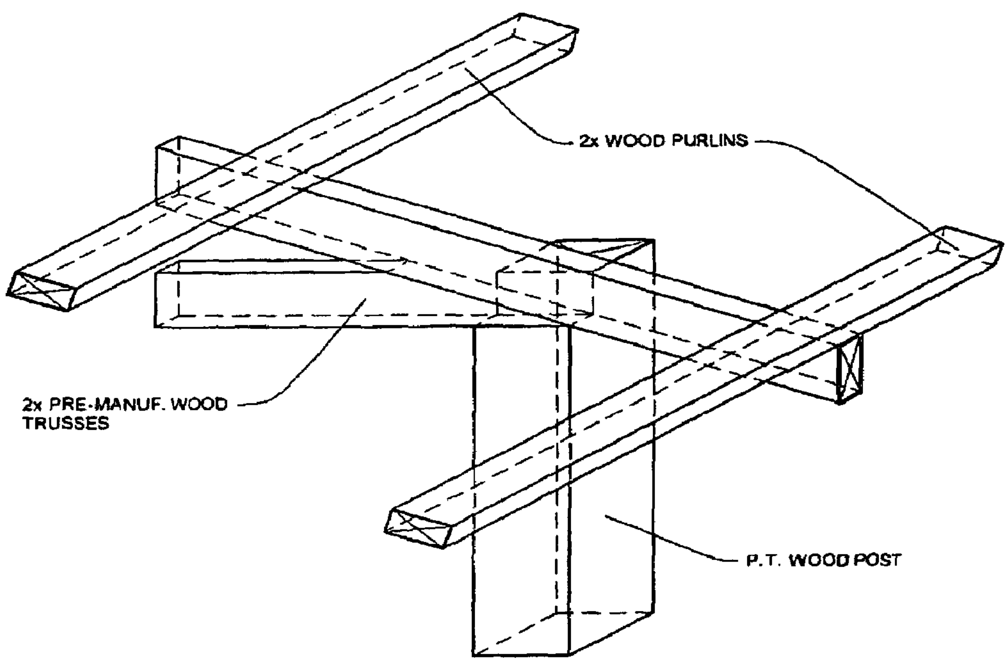
Figure 133:
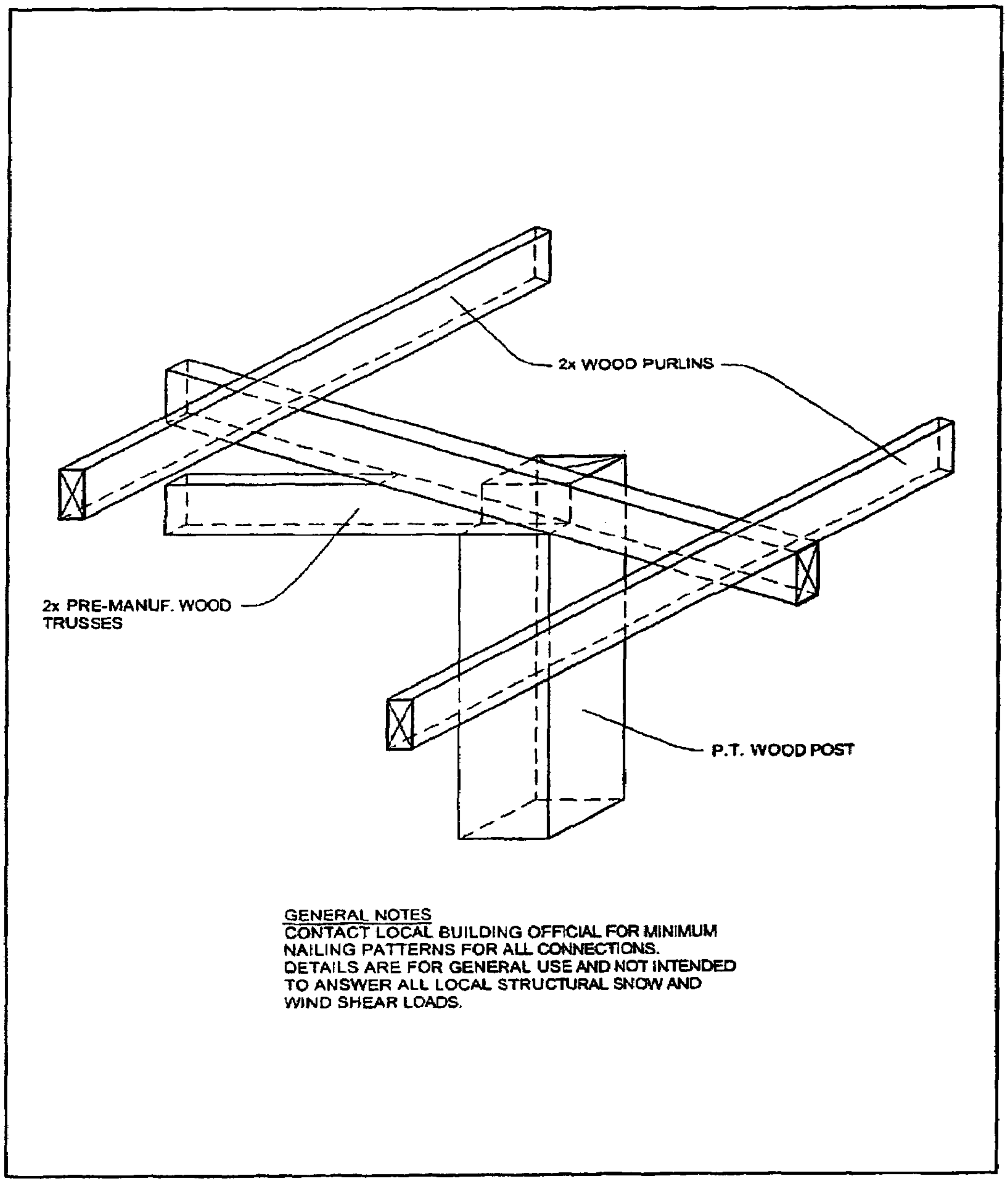
Figure 134:
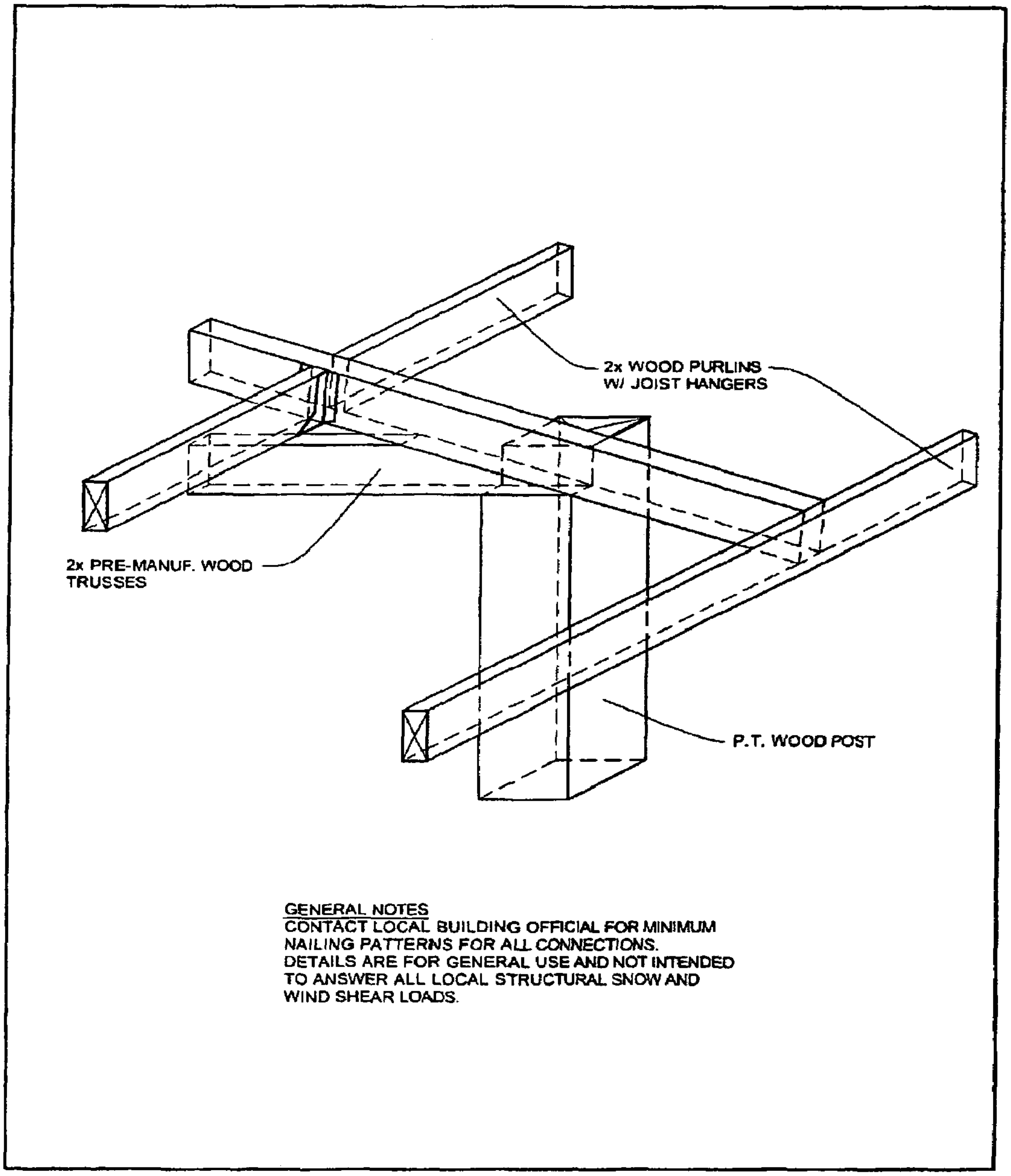
Figure 135:
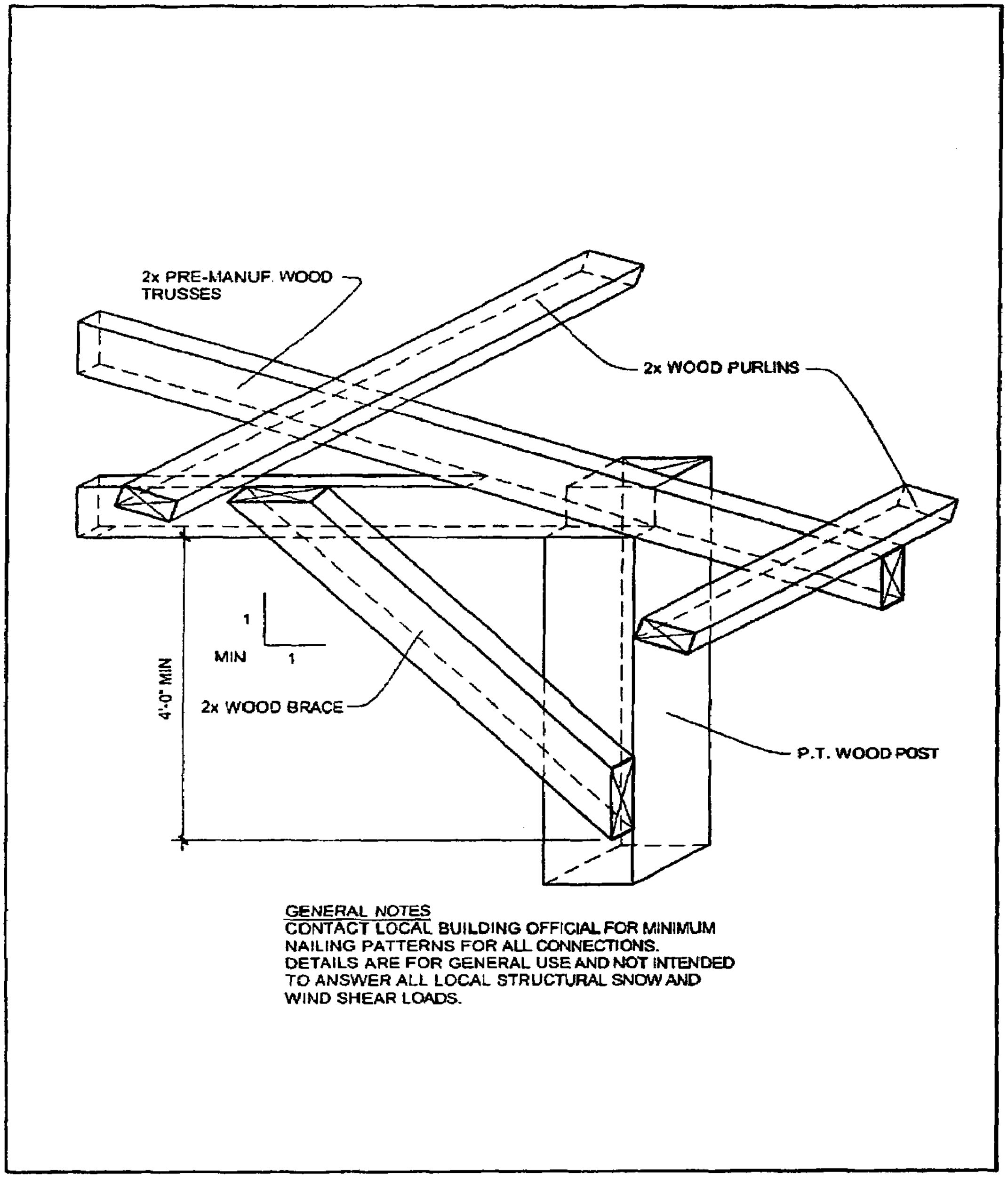
Figure 136:
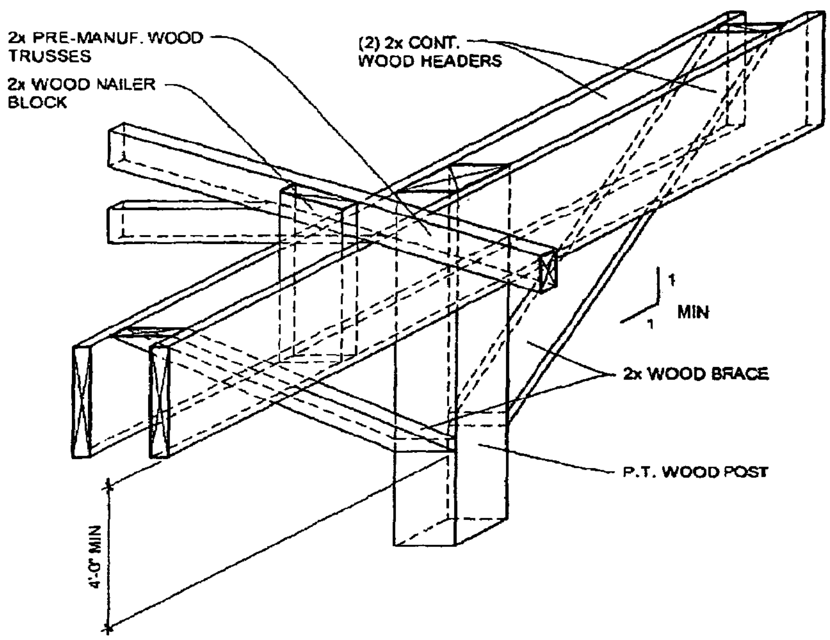

A feature of the invention is the level of detail in the following program outputs: Truss Application Detail of FIG. 127, Wall Sections of FIGS. 130-131, Purlin Application Details of FIGS. 132-134, and Bracing Details of FIGS. 135-136. This level of information greatly assists the builder during construction. For example, in the Truss Application Detail, the builder sees the exact orientation of the an exemplary post, headers, truss and nailer block. For the Wall Section, the orientation of the wall girts relative to an exemplary Post and the Steel Siding is highlighted.

Figure 163:
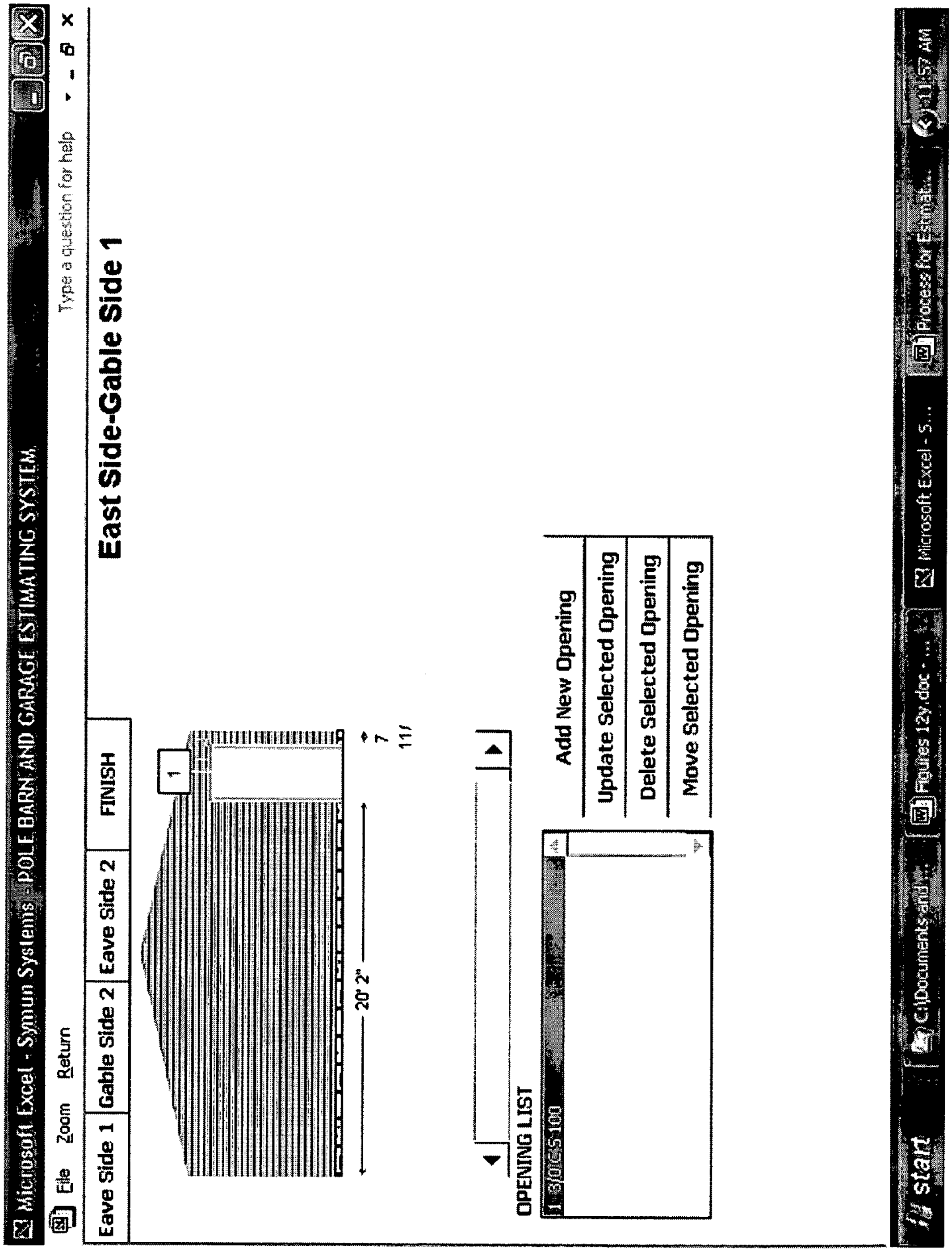
Figure 164:
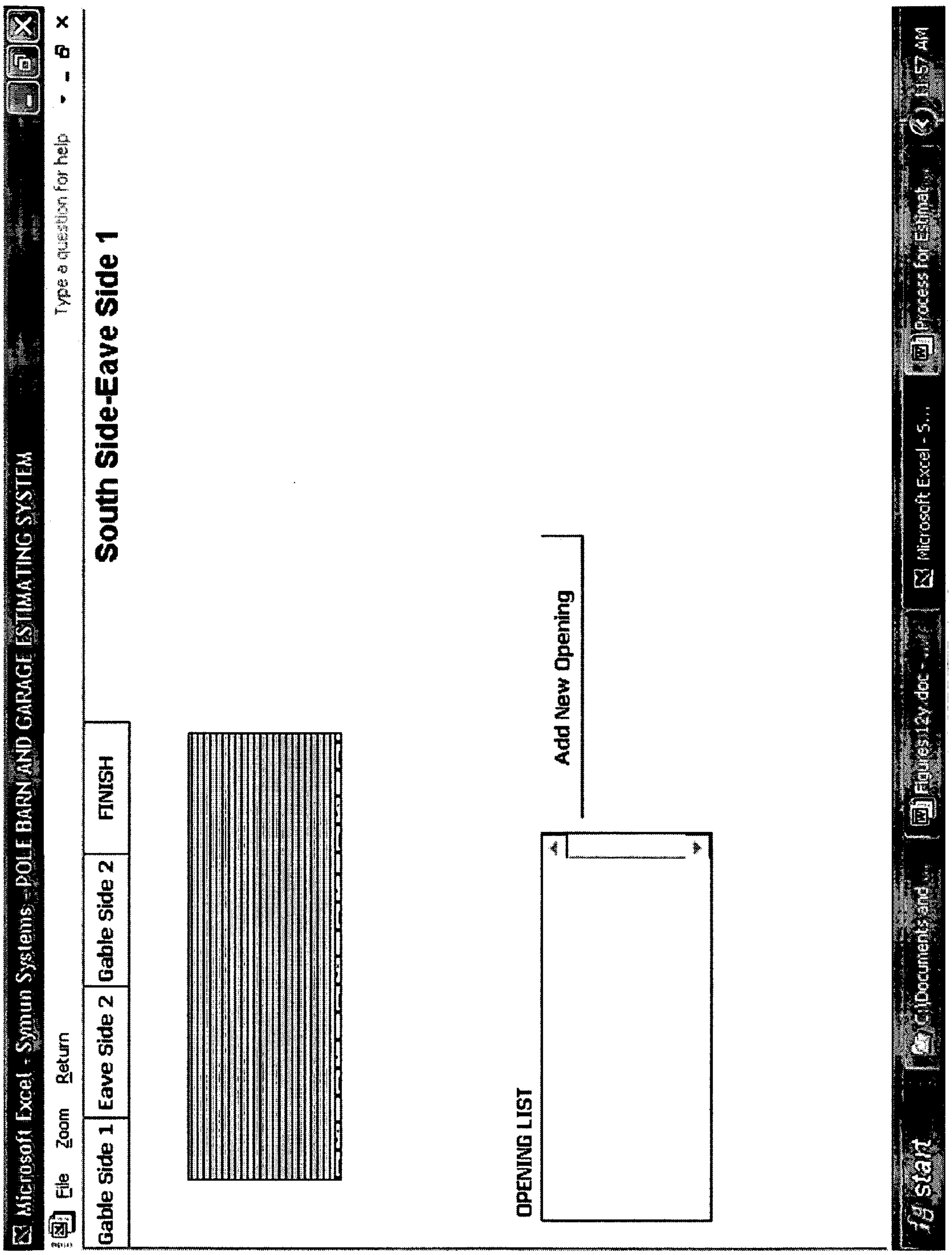
Figure 165:
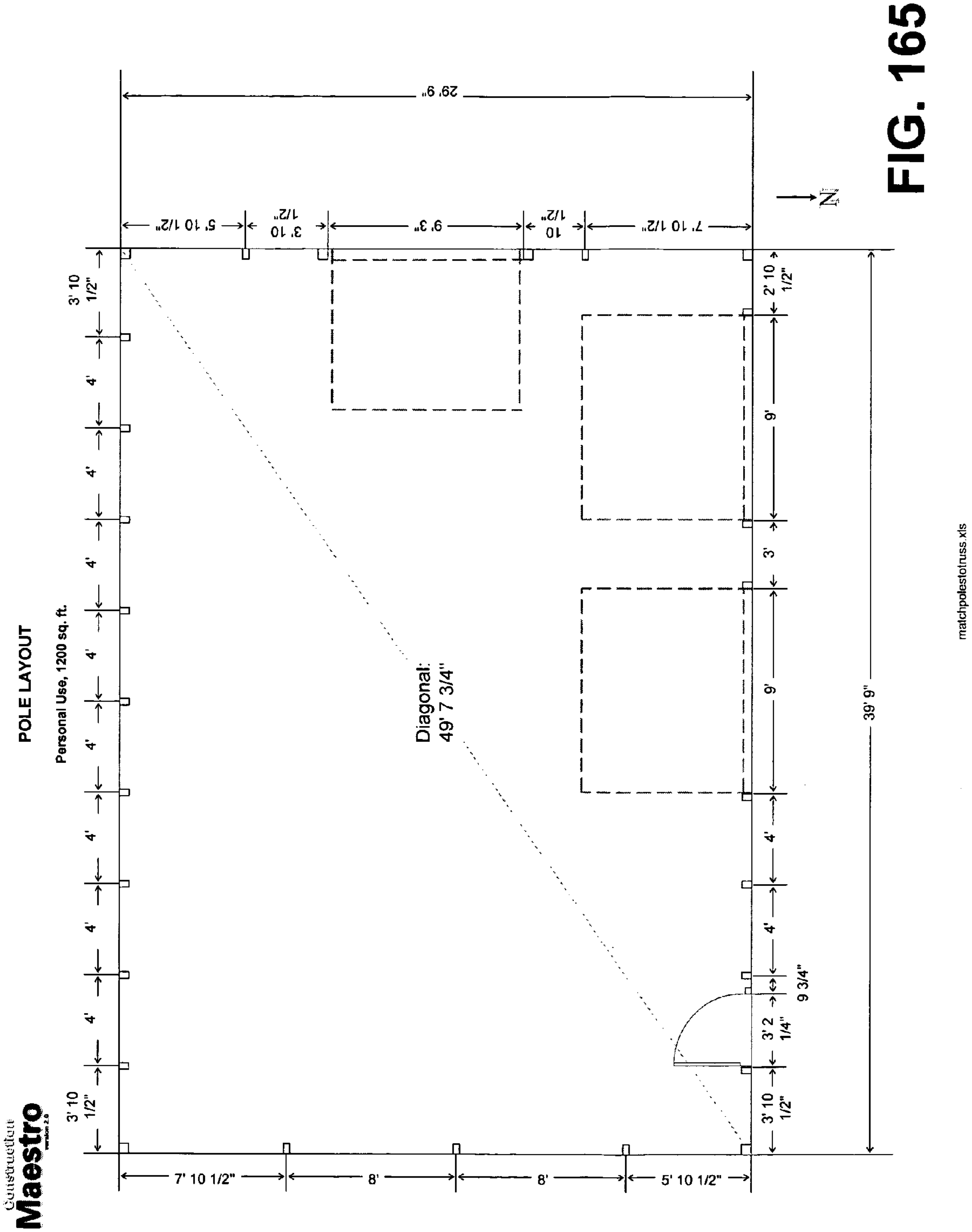

Referring to FIG. 2, an estimate of the construction materials needed for a stud frame building is initiated by selecting Stud Framed Kit on the Main Menu Page of the program. The selections and commands are similar to those for a post frame building. Some details from the Walls tab for such an estimate, including selections for the foundation, are shown in FIGS. 159-162. The estimate of this example has only one service door. Remaining displays and exemplary views are shown in FIGS. 163-164.

A feature of the invention is that a detailed list of all of the possible materials that could be used for an estimate (called Product Setup and Pricing, Product Setup, or simply Setup) can be preloaded into the program. It is from the Setup that the specific selections described above are made (pole species and sizes, trusses, sheet metal siding, felt, service doors, etc.) The advantages of having this information within the program include: the user can easily review all options available for a given item to be selected, prices can be quickly updated, generates a list of all materials for a particular estimate, permits calculation of the total cost for an estimate, permits recalculation of the total cost if the estimate is changed, etc.

Figure 139:
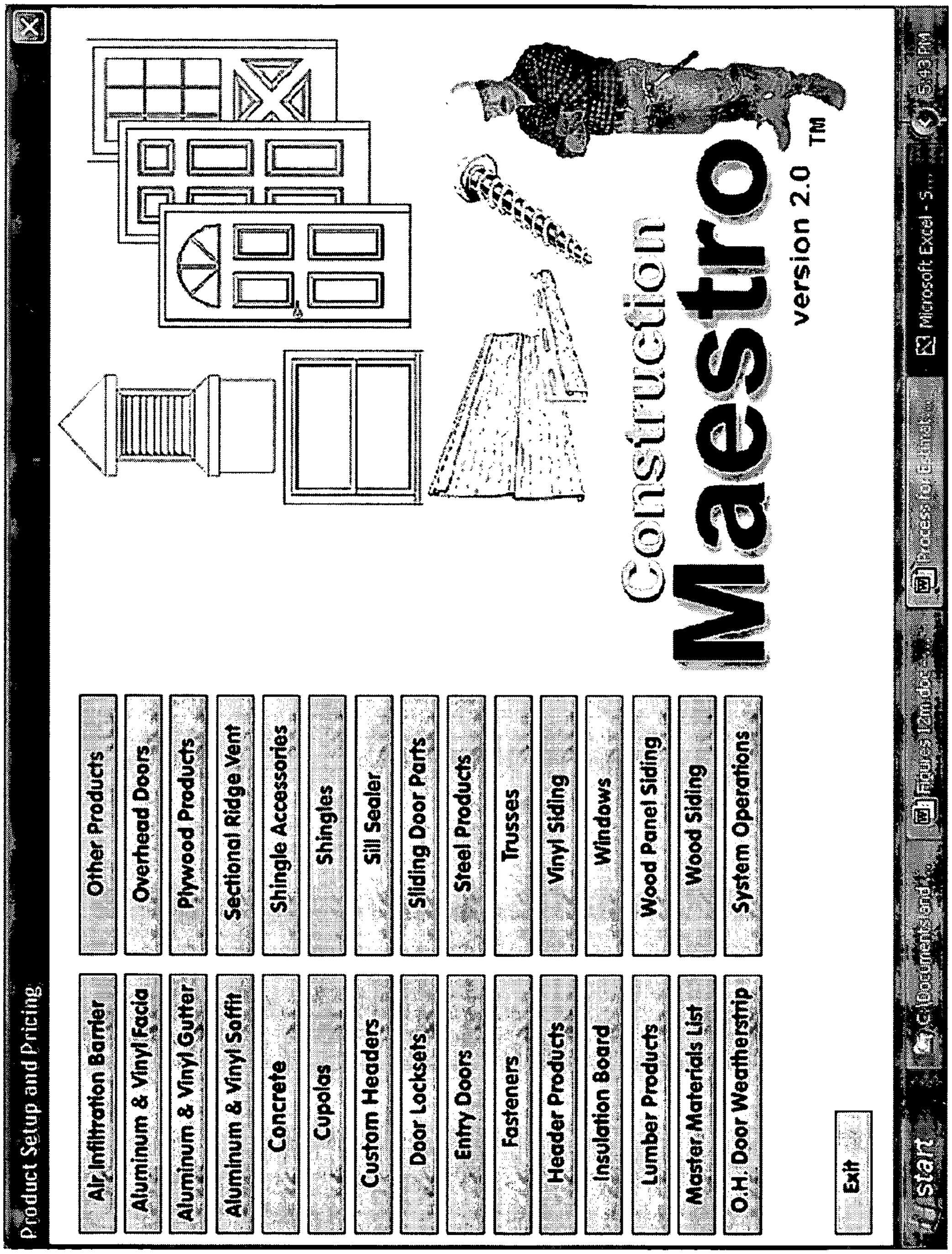
Figure 140:
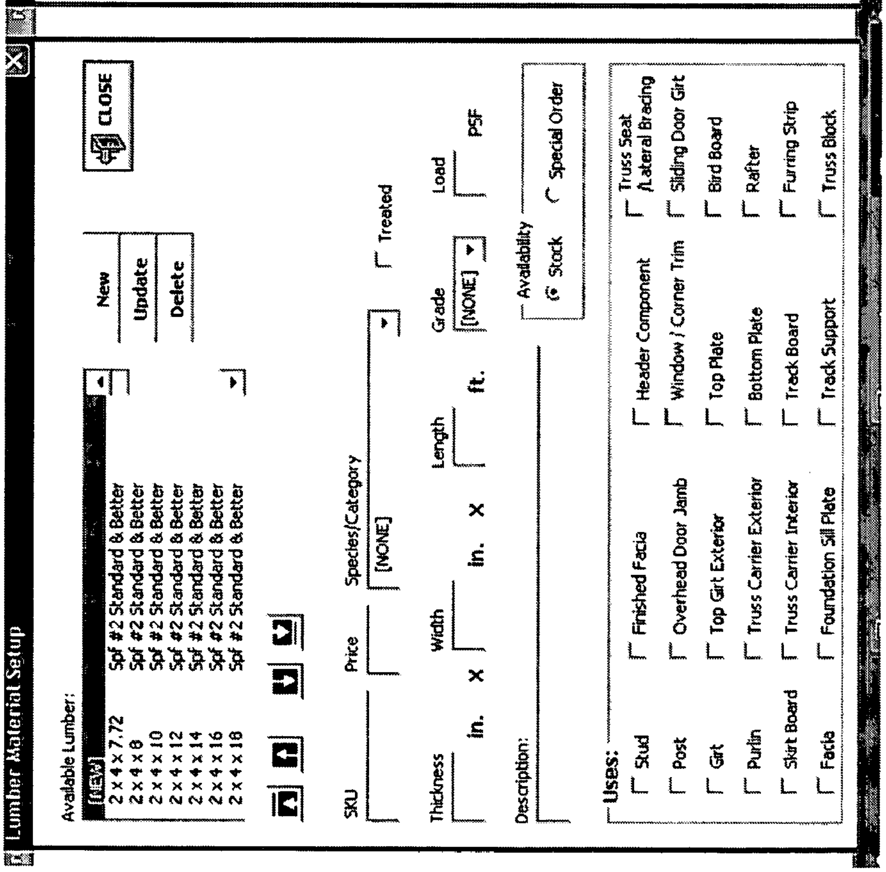
Figure 141:
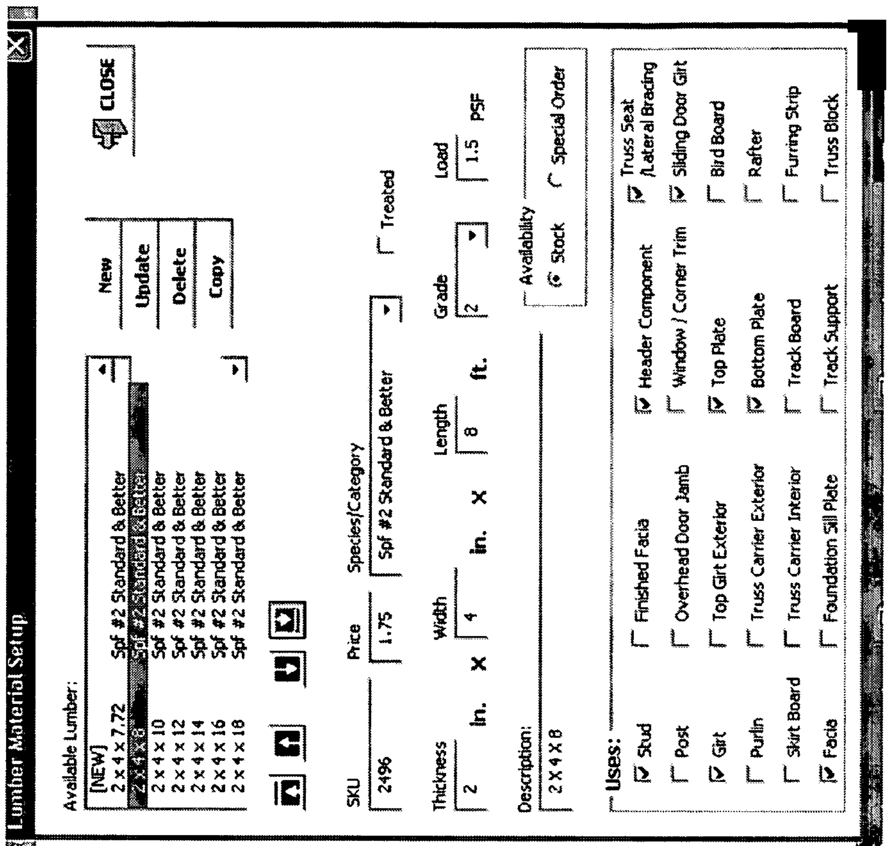
Figure 142:
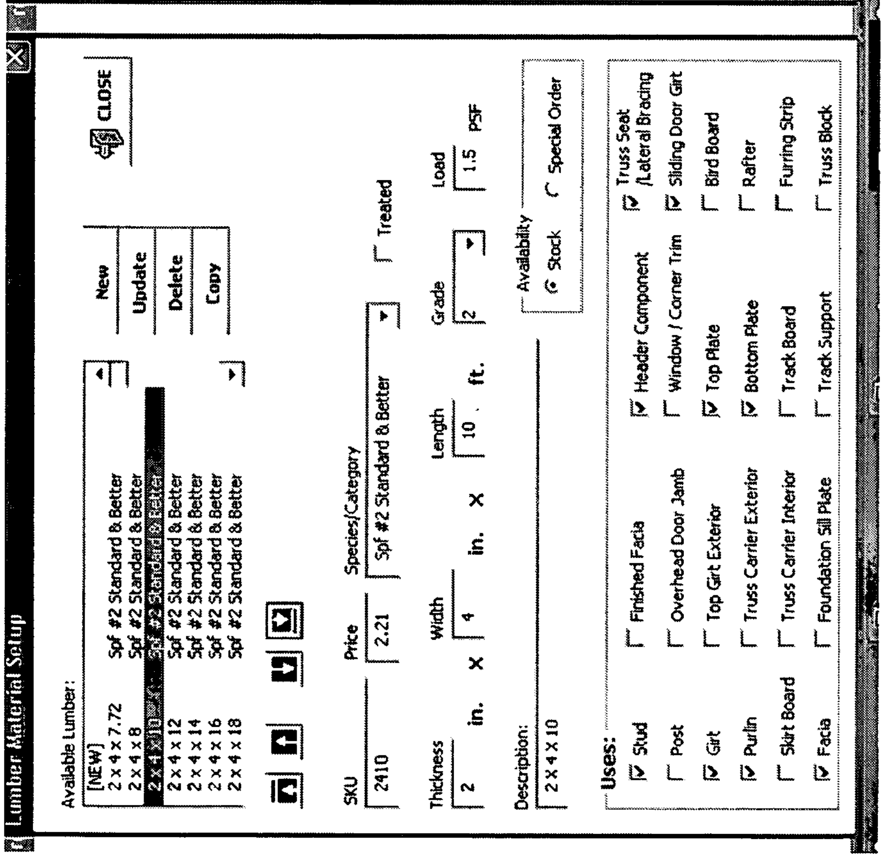

To use the Product Setup, the user first selects the Set Up command button on the Main Menu Page (FIG. 2). Since this information can be proprietary, accessing it requires a password. After entering the password, the user is taken to the display of FIG. 139. Here approximately 30 command buttons are available for reviewing the Product Setup information that has been preloaded into the program, and adding or editing information as desired. Selecting Lumber Products, for example, takes the user to the display of FIG. 140. At this point, the user can Update, Delete, Copy or simply view a previous entry after selecting it. Furthermore, the user can input a New entry. If the user enters "C1099" for the SKU the program will assign a unique SKU value for that item. The categories of information for Lumber Products include: SKU number, Price, Species/Category, Treated, Thickness, Width, Length, Grade, Load, Description, Availability (Stock or Special Order), and Uses (Stud, Post, Girt, etc.). Upon selecting 2×4×8 Spf #2 Standard & Better, for example, the user will see the details for this item as shown in FIG. 141. For example, note that a SKU number, Price and Load is shown, together with eight Uses that have been previously authorized for use in various building components as part of an estimate. A user who reaches this screen display is presumed to have authorization to add or delete a use, the price, etc. Note that this 2×4×8 cannot be used for a Purlin, but the next item down, a 2×4×10 can be used for a Purlin. See FIG. 142.

A feature for many of the categories in Product Setup is inputting and arranging product items in the order of the user's preference, i.e. selecting goods for the set of materials from the set of raw and finished goods in the Product Setup database according to a predetermined order of preference. If an estimate calls for a 2×4×8 stud for a particular component, the program will go to Lumber Products, then choose from the Available Lumber list the first 2×4×8 that has been designated for use as a stud.

Figure 143:
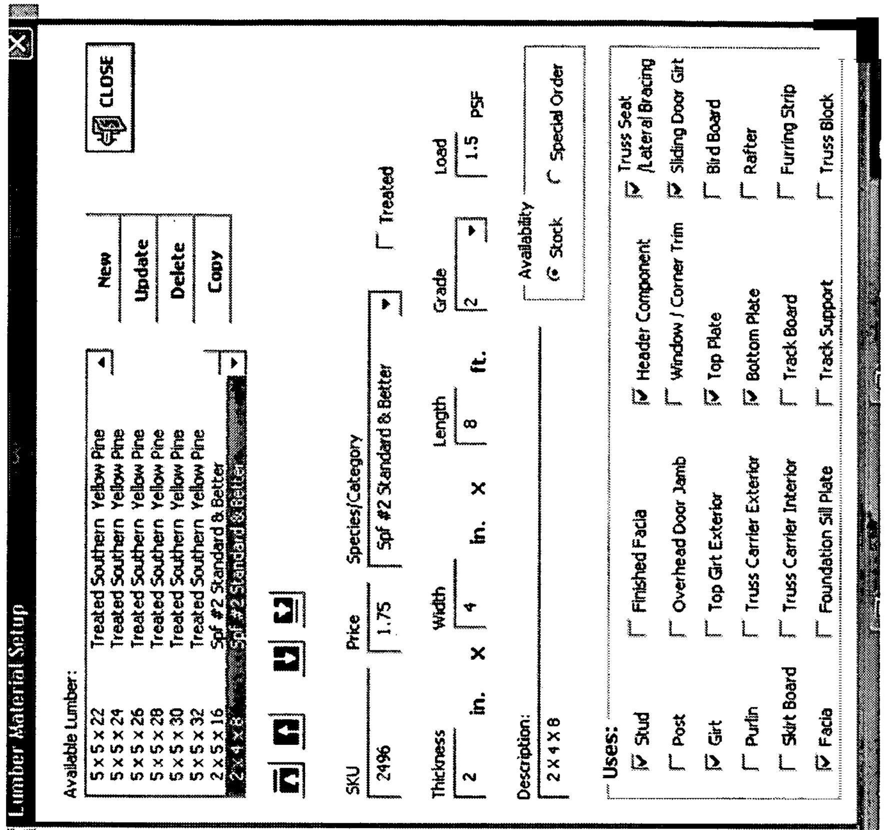
Figure 144:
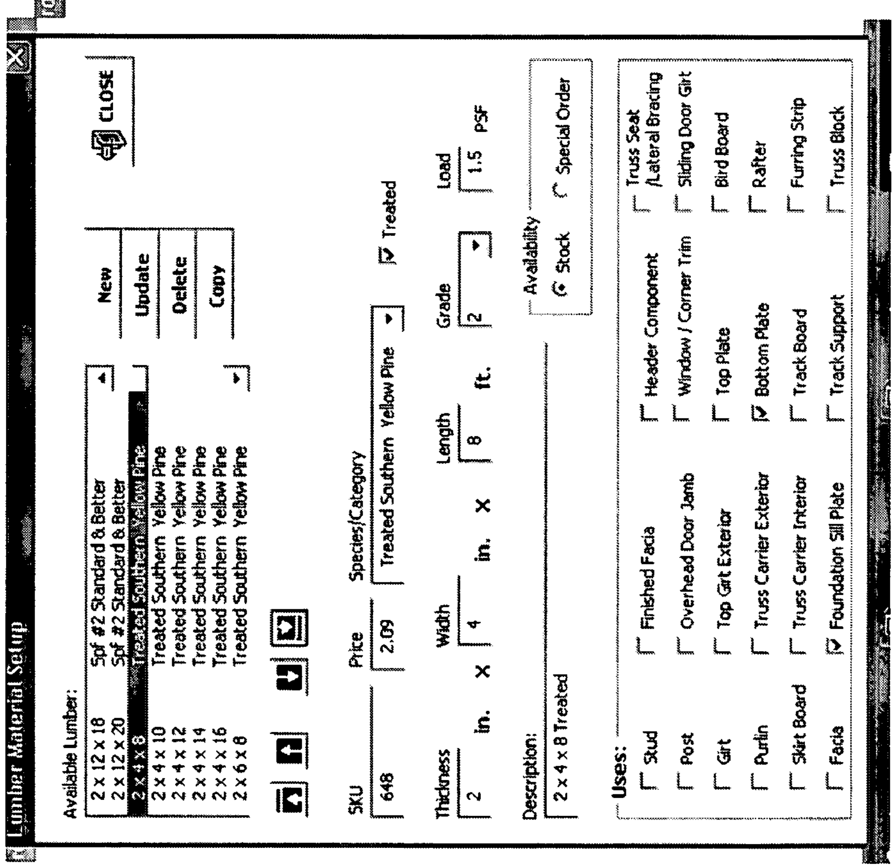

Referring to FIG. 143, note that the 2×4×8 described in FIG. 141 has been relocated from near the top of the list of Available Lumber to the bottom. (Compare the relative locations on the vertical scroll bar.) This was done by selecting the 2×4×8 and then selecting the "end of list arrow" command button (i.e. the rightmost in the group of four buttons). This means that the new uppermost 2×4×8 in the list that can be used for a stud will now be selected (for example, the Treated Southern Yellow Pine item of FIG. 144, but only if its Uses were changed to include Stud). If a user desires to only move an item one increment at a time, the "down arrow" (second from the right) is used. In other parts of Product Setup, a Company or Brand, as well as their individual items, can be given an order of preference. Also, the color of shingles, siding, etc. can be given an order of preference.

Figure 146:
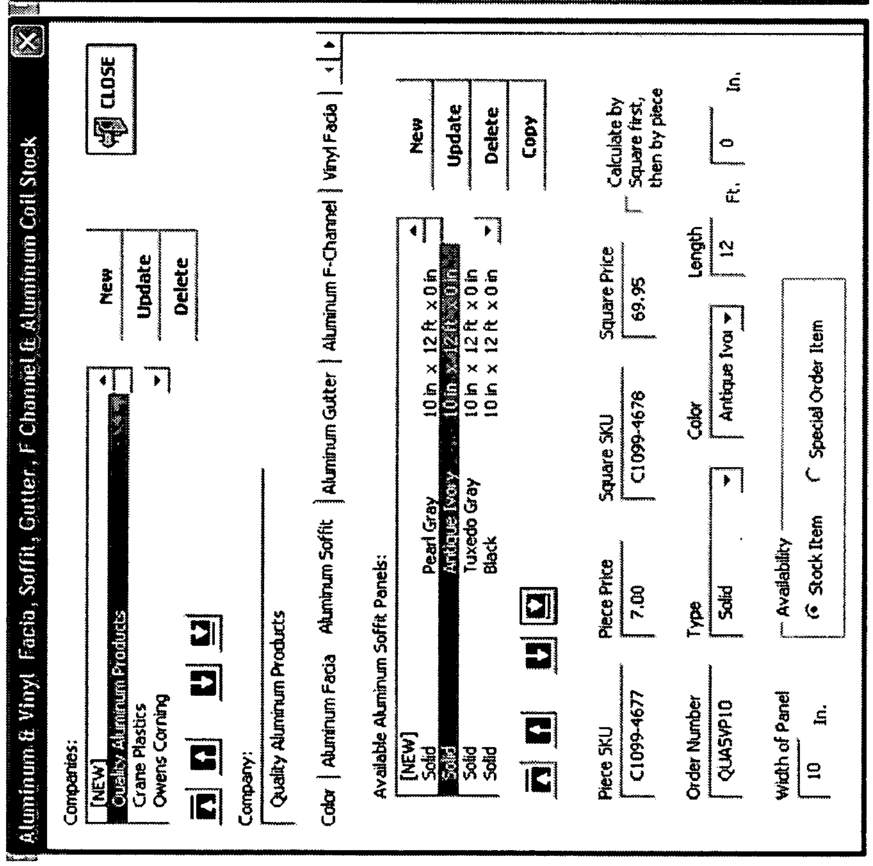
Figure 147:
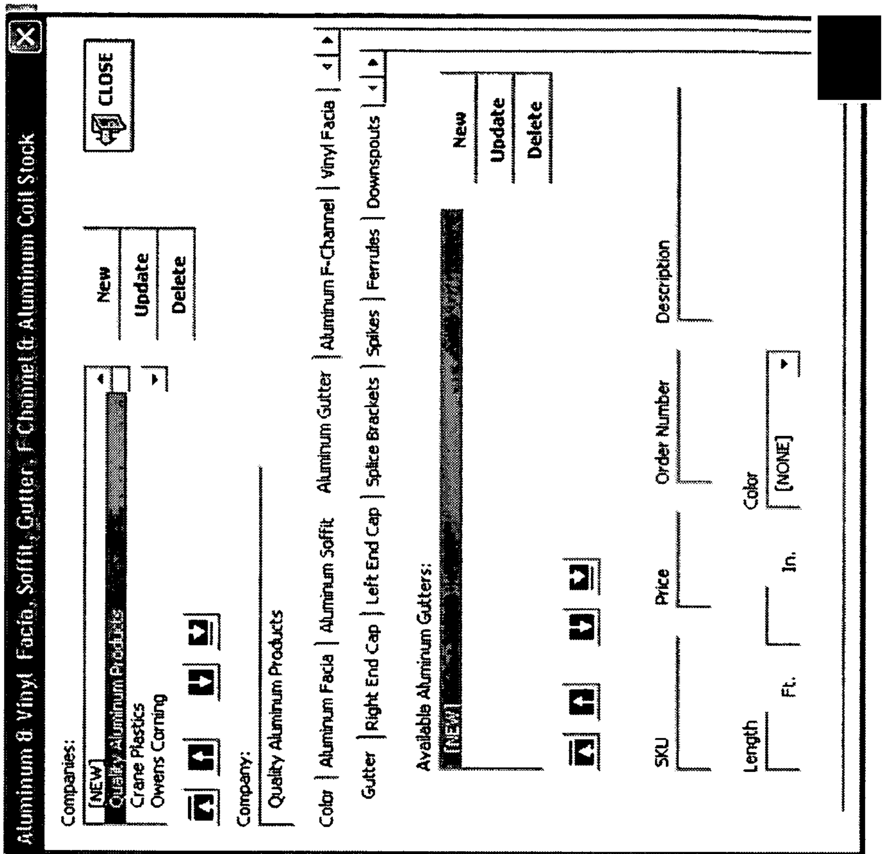

Note some other examples of materials described in Product Setup, for Aluminum & Vinyl Facia (FIG. 146) and Gutter (FIG. 147). It can readily be seen from these examples that the program is sophisticated in the breadth of information provided for individual items, including Uses, order of preference, Availability (Stock or Special Order), Style and Size for shingles and the Shingle Life, Right Hand or Left Hand Opening for doors, number of plys or OSB construction for plywood, etc. This is in contrast to other suppliers of software for estimating building materials, which might include only a single line description of a particular item, its SKU number and price.

Figure 145:
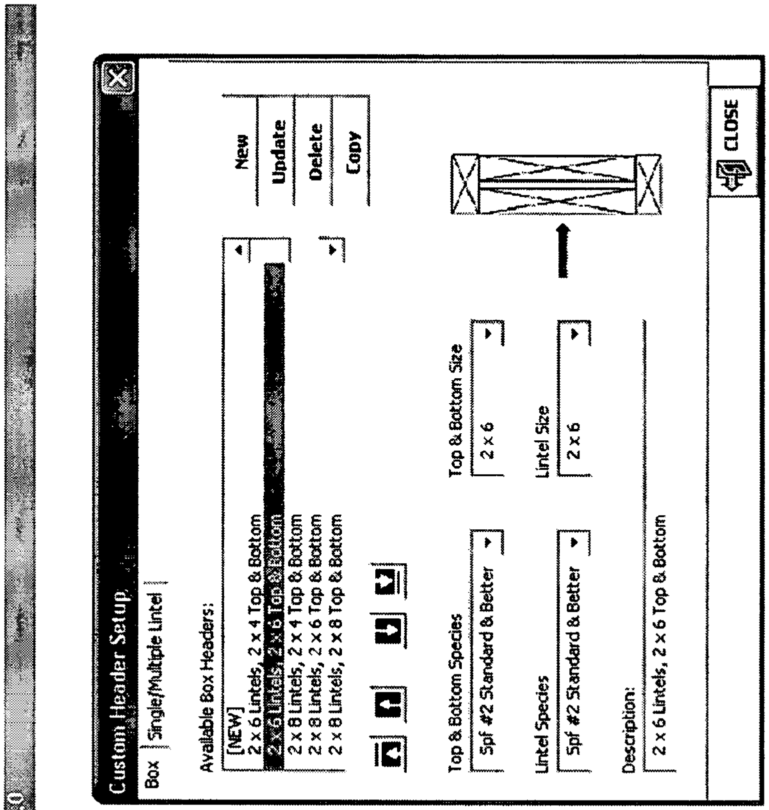
Figure 148:
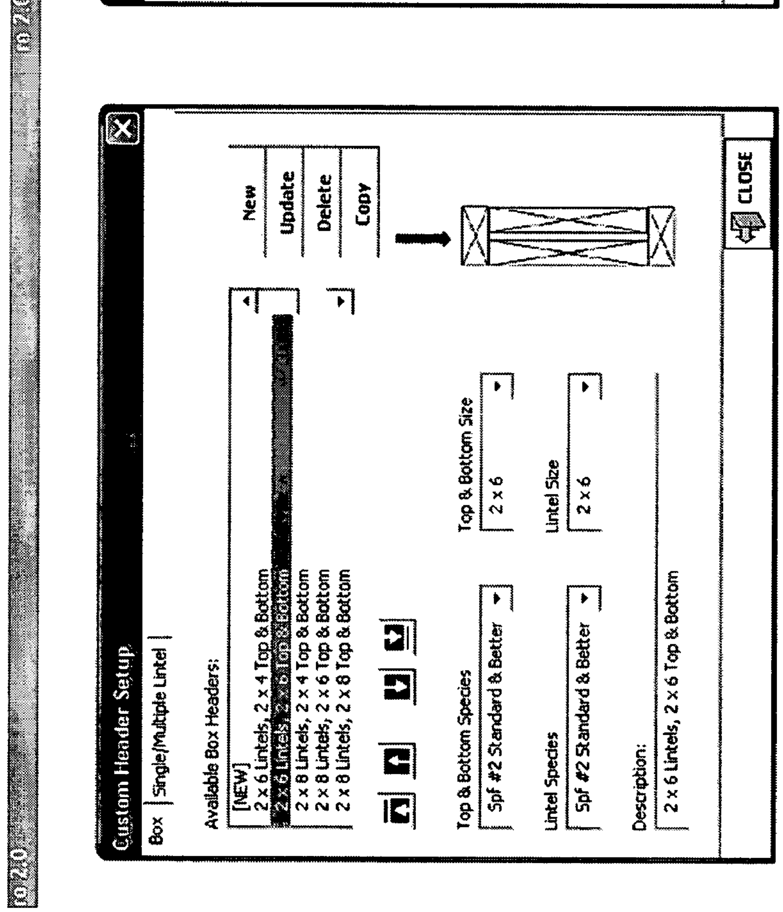
Figure 149:
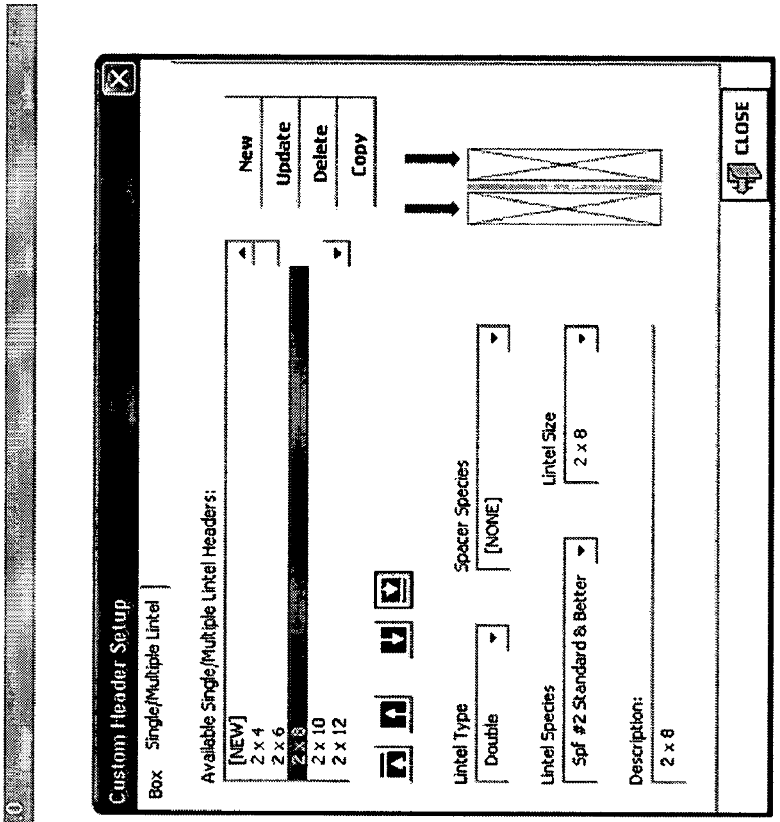
Figure 150:
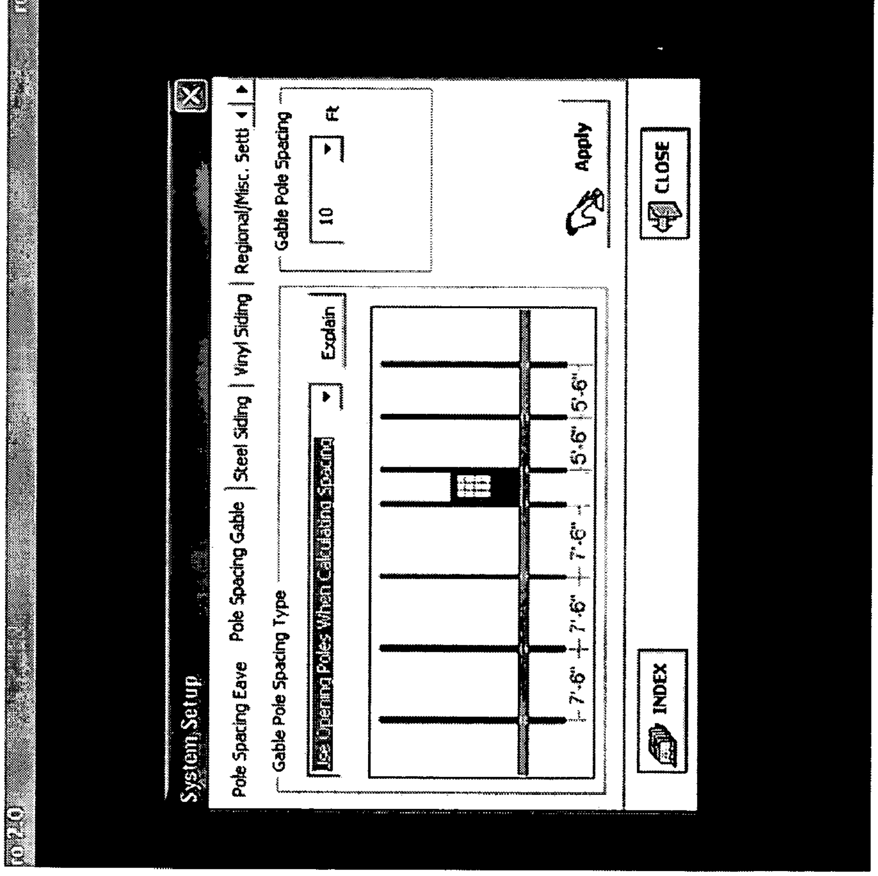
Figure 151:
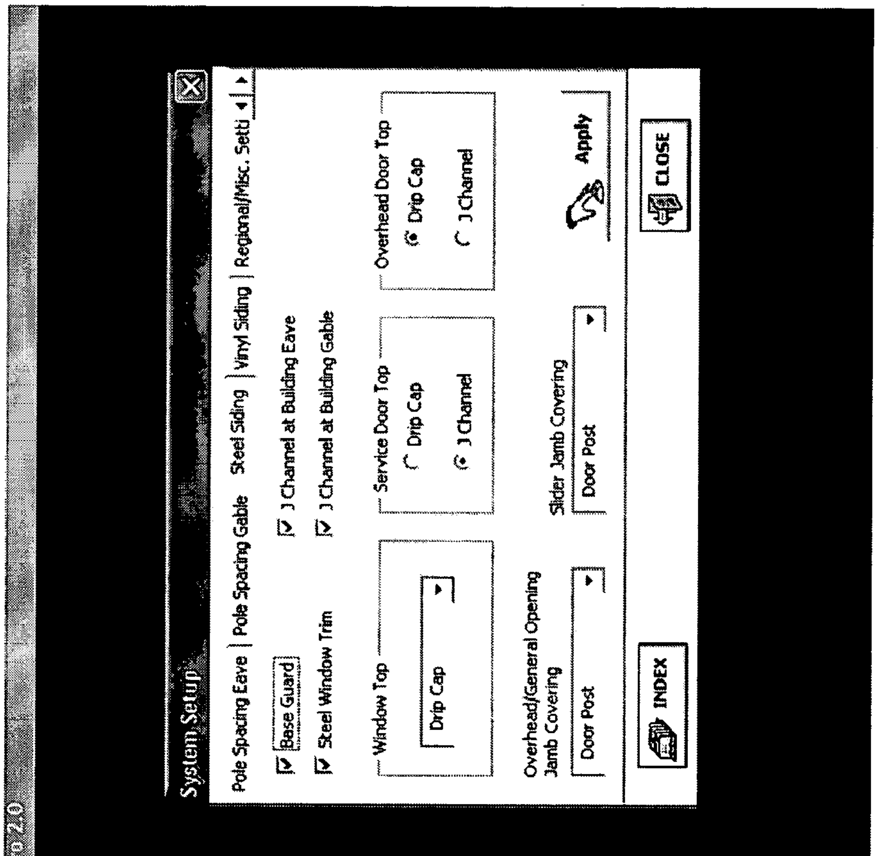

If Custom Headers is selected the user is taken to a dialog box entitled Custom Header Setup. Under the Box tab, the invention includes a feature to assist the user in correctly specifying a box header. When the user moves their computer mouse to Top & Bottom Species, the graphic display of the box header will show an arrow that points to the top species (FIG. 148). When the user moves their mouse to Lintel Species, the arrow shifts and points to the lintels (FIG. 145). In this way the user is reminded which part of the box header they are specifying. In a similar fashion, when the Single/Multiple Lintel tab is selected and the user moves their mouse to Lintel Species, the arrow points to the lintel(s) (FIG. 149); when the mouse is on Spacer Species, the arrow points to the spacer.

In Product Setup under System Operations, a whole range of default parameters for the program can be input. See FIGS. 150-153.

Figure 153:
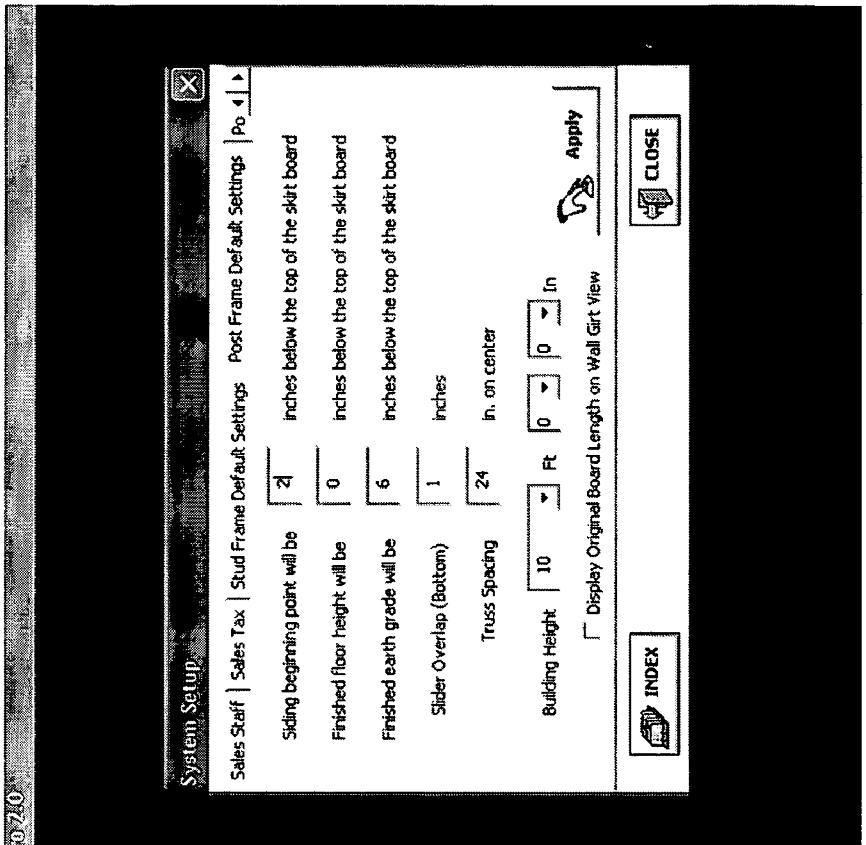
Figure 152:
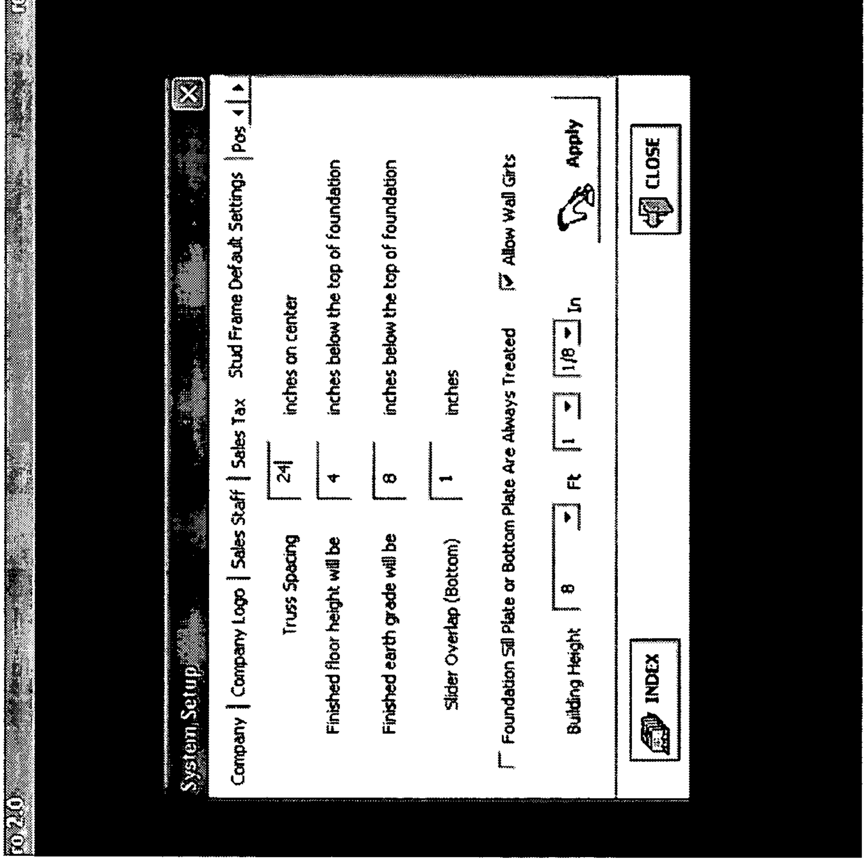
Figure 166:
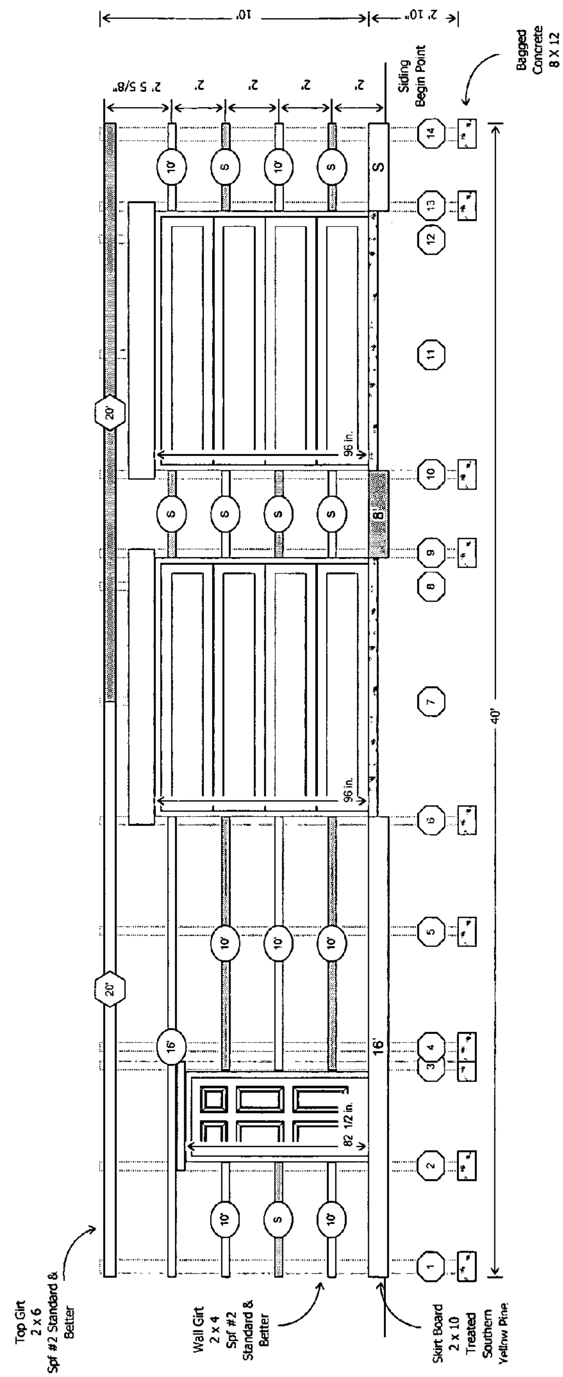
Figure 167:
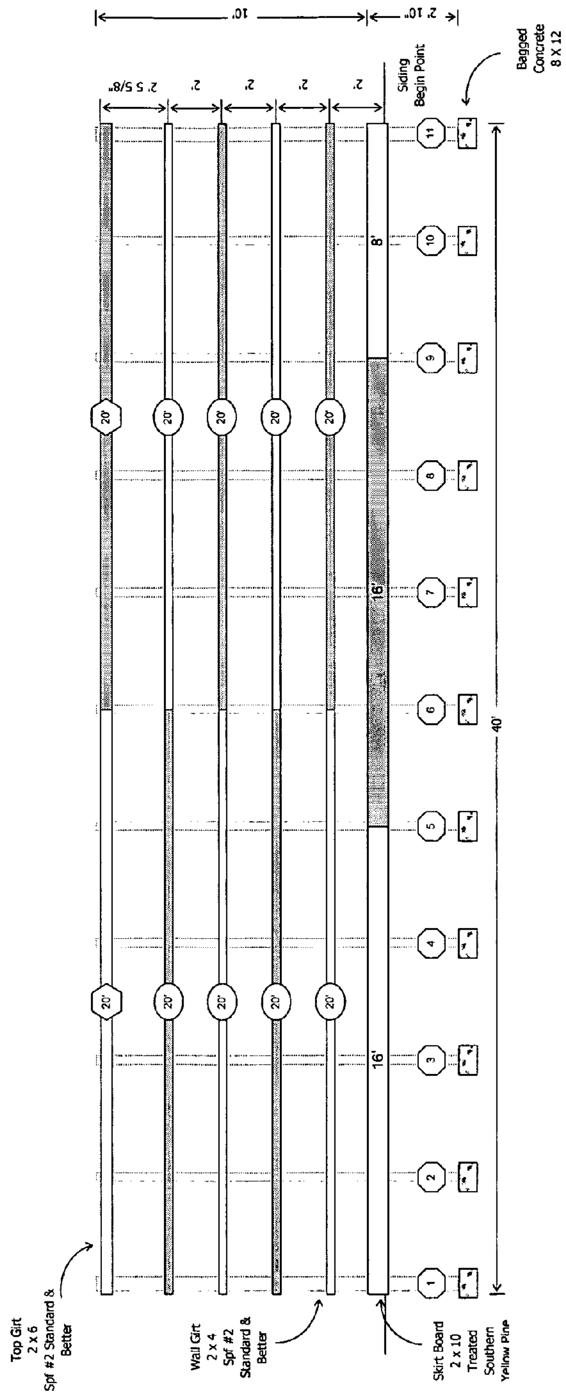
Figure 168:
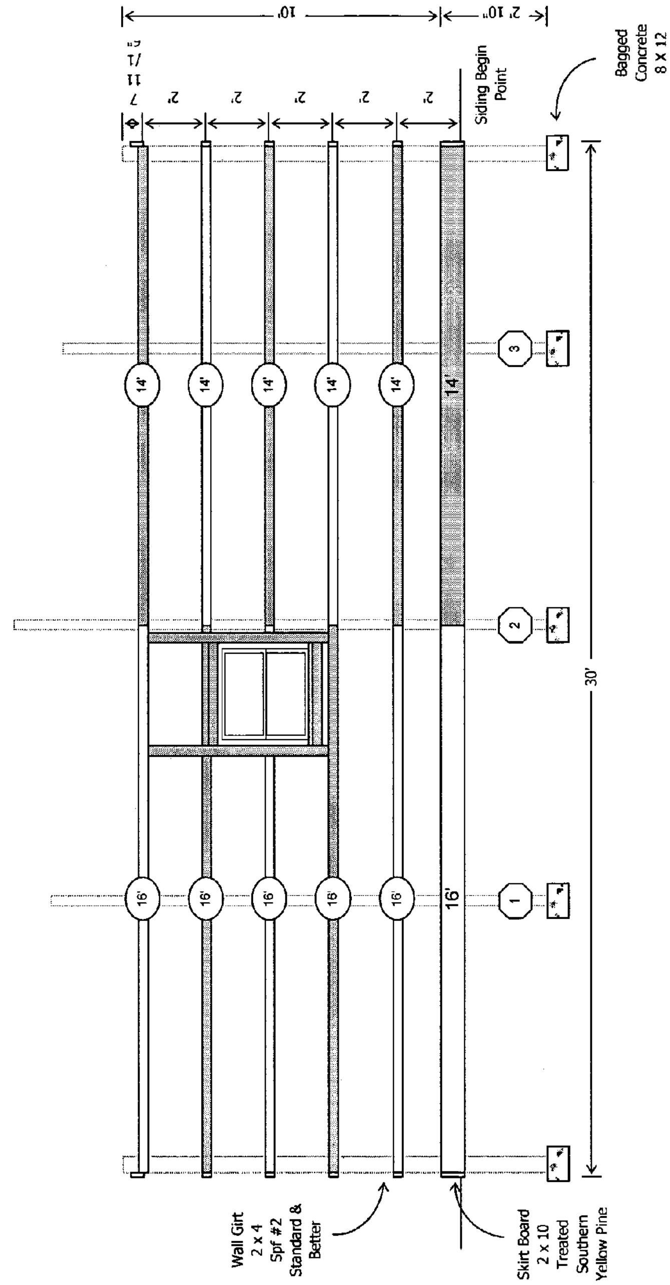
Figure 169:
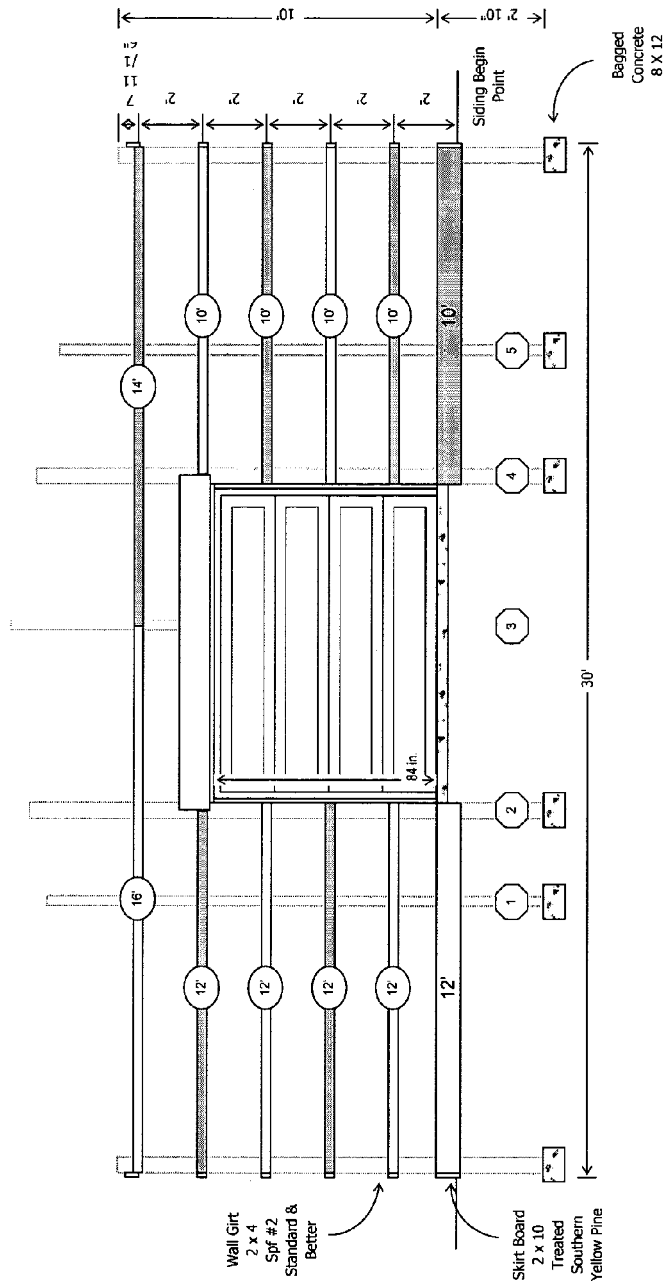
Figure 170:
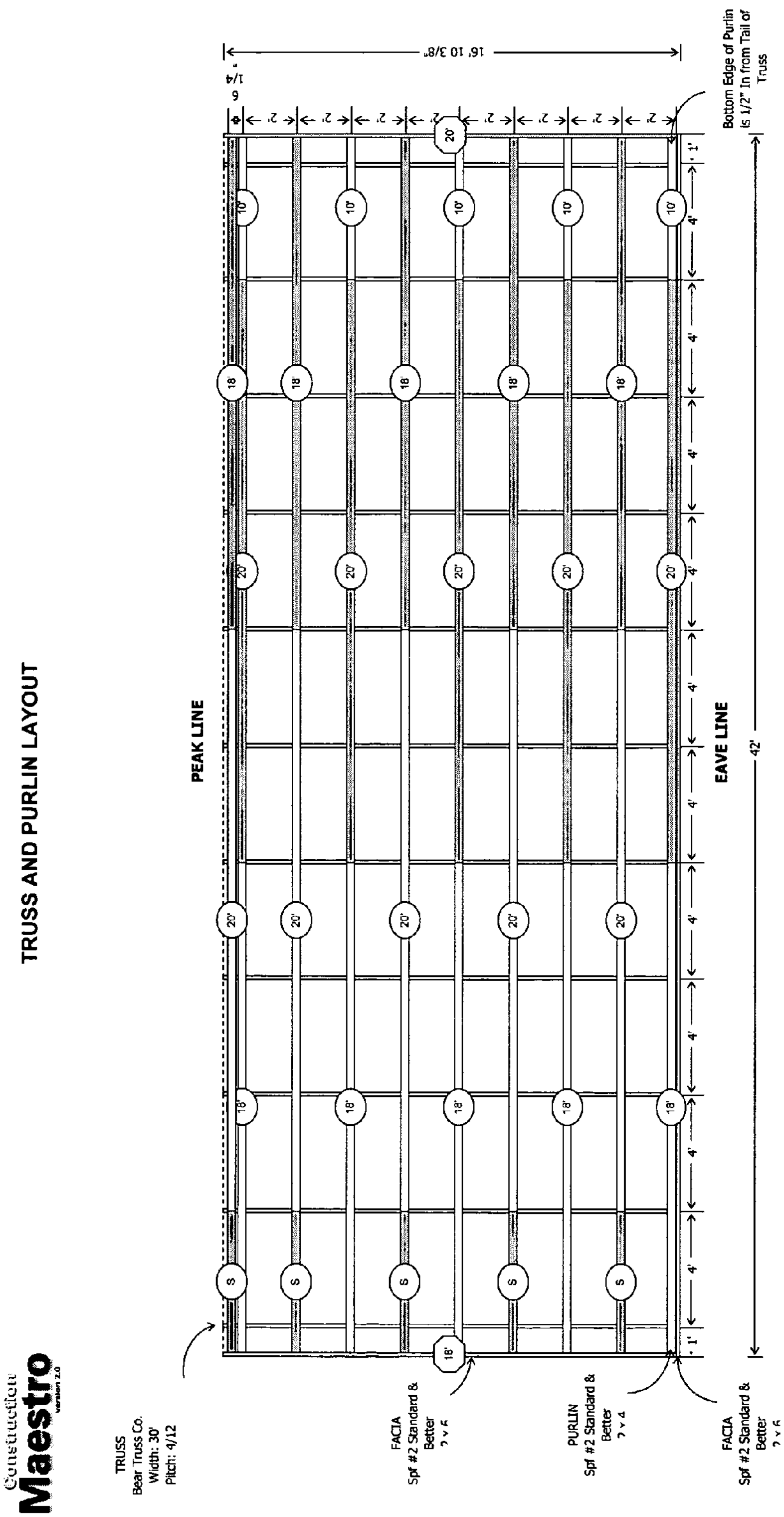

Referring to FIG. 116, displaying the set of materials for the building can include displaying the original board length for the lumber components, wherein the original board length is the length of a lumber component as-supplied by the lumber yard and before cutting to a selected length. Referring to FIGS. 166-167, displaying the model of the wood frame building can include displaying a wall girt view showing the posts, openings and horizontally oriented members such as the wall girts. It is beneficial to a building crew to identify the location of the individual wall girts with respect to the wall by their uncut or original board lengths. The benefit is that a building crew can work from a supply of wood having a given nominal length, cutting each piece of wood according to the Lumber Cut List of FIG. 116 and then immediately attaching it to the wall. In this fashion it is not necessary to locate a specific precut board from the entire supply of lumber at the job site. Therefore the invention displays the uncut or original board length dimension, typically in feet, substantially upon the horizontally oriented members. This feature is selected by checking a box from within the setup of the estimate as shown in FIG. 153.

Figure 43:
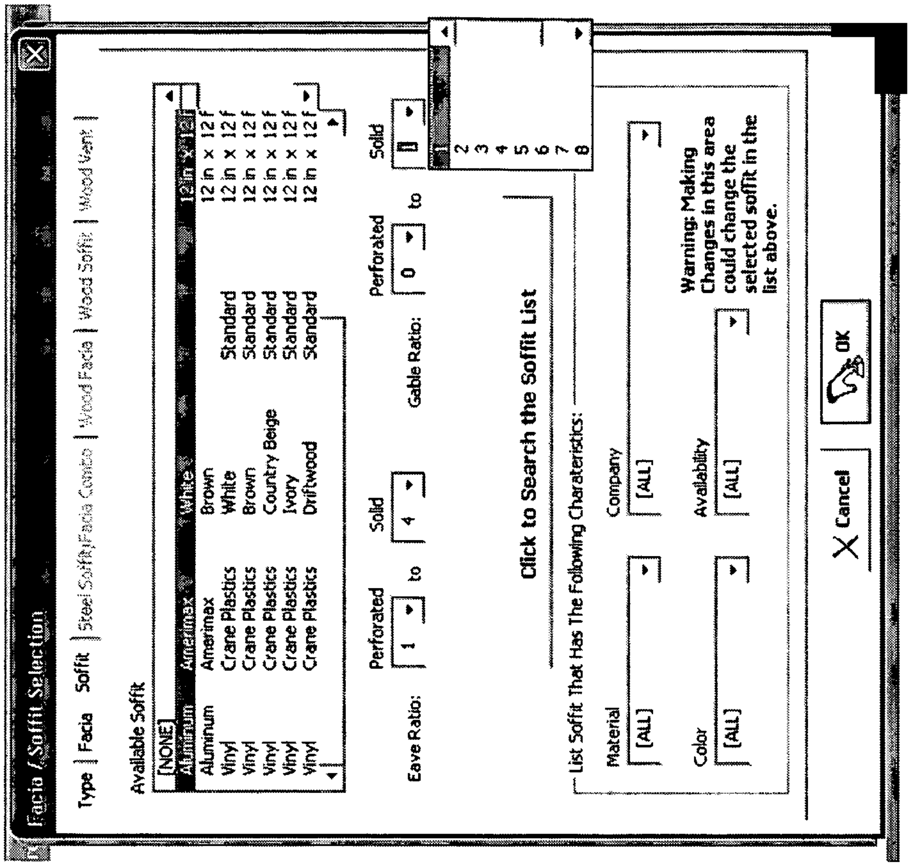
Figure 154:
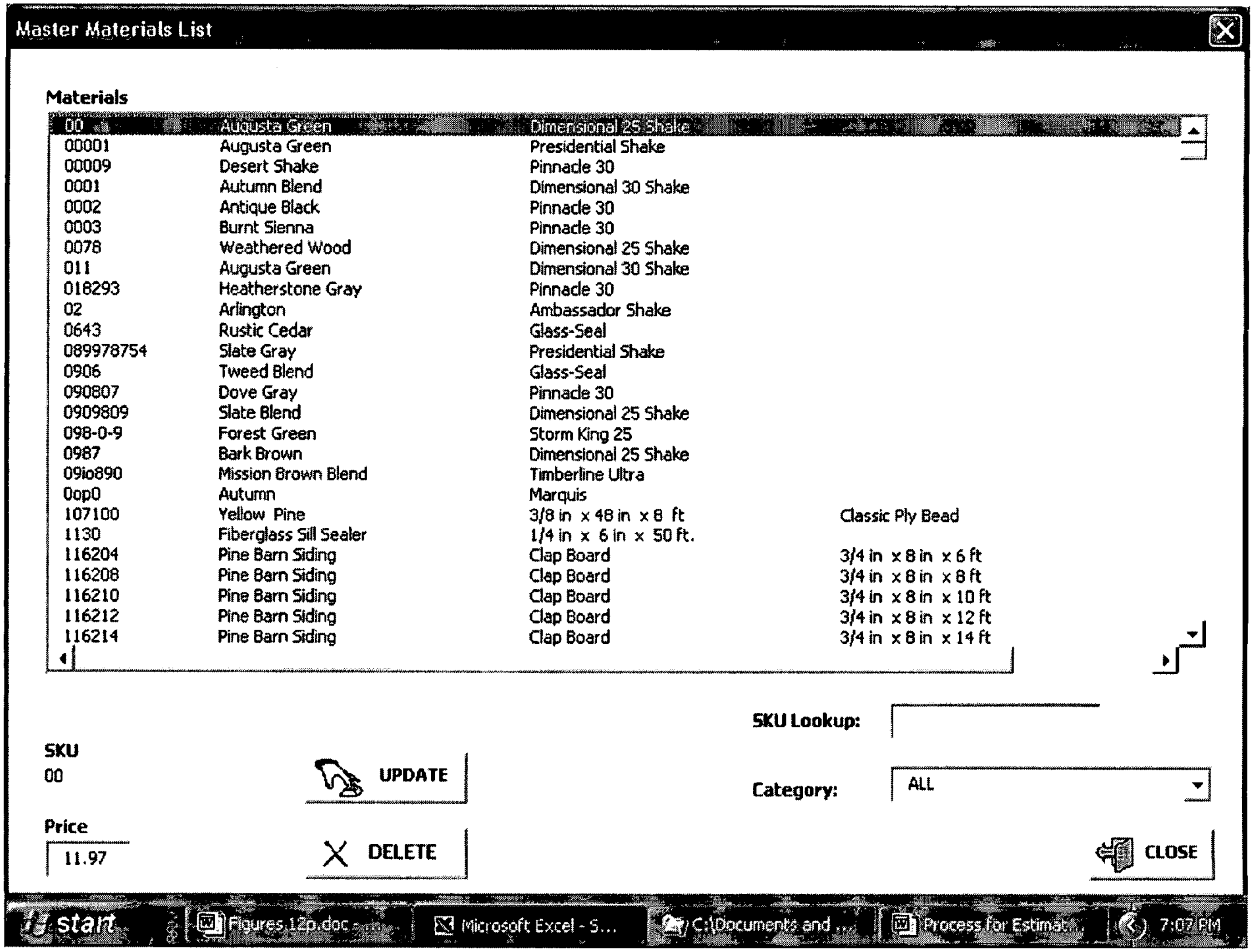
Figure 155:
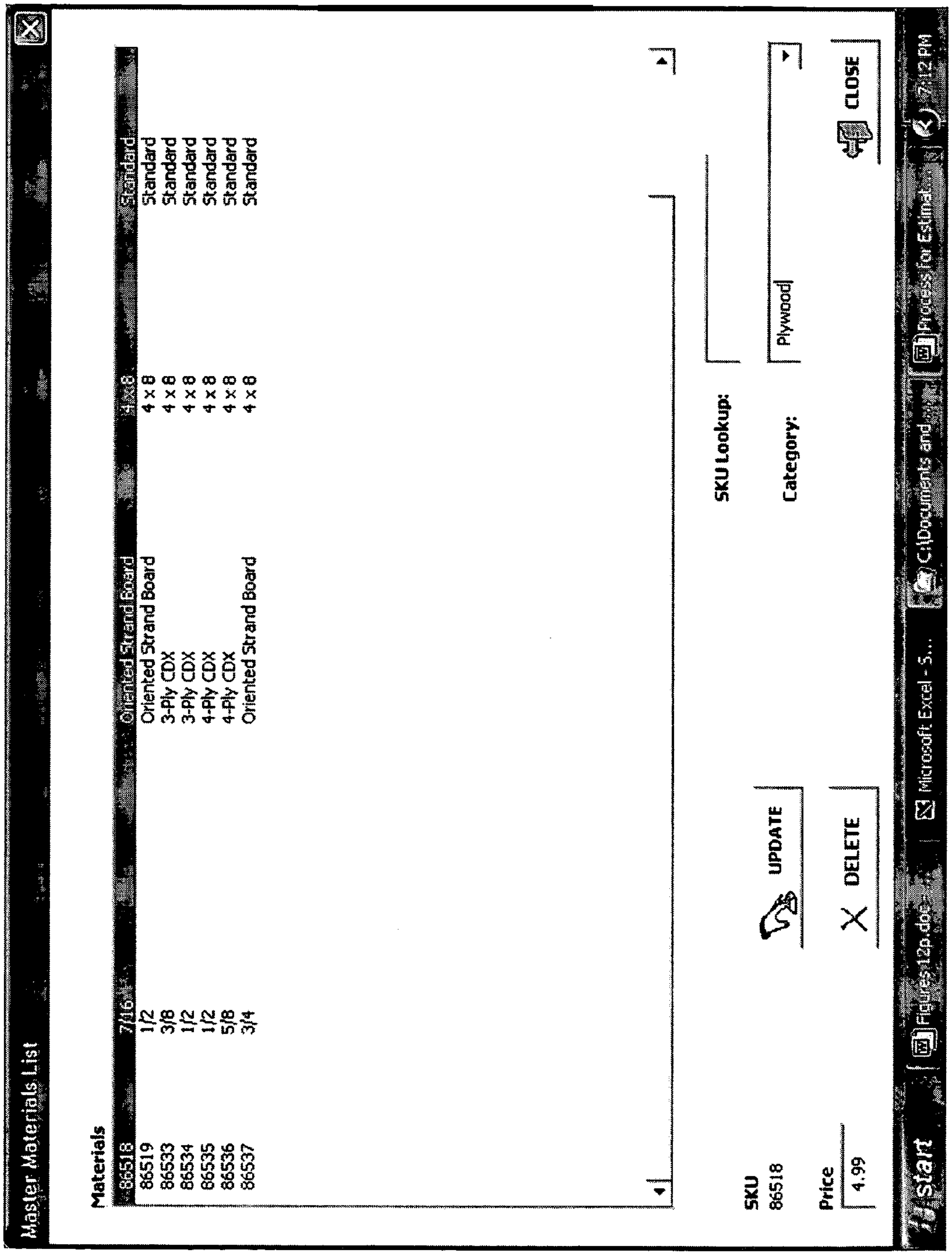
Figure 156:
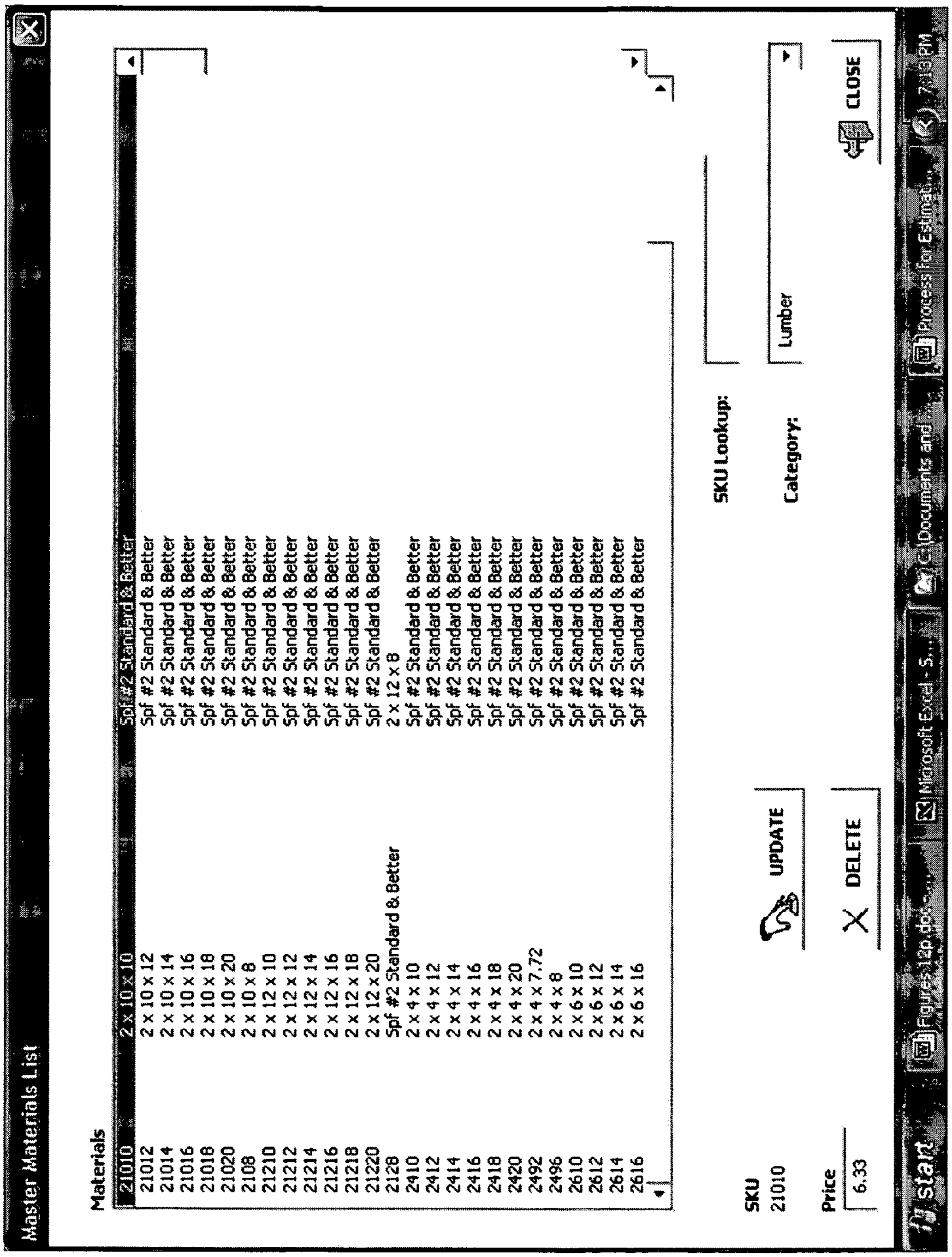
Figure 157:
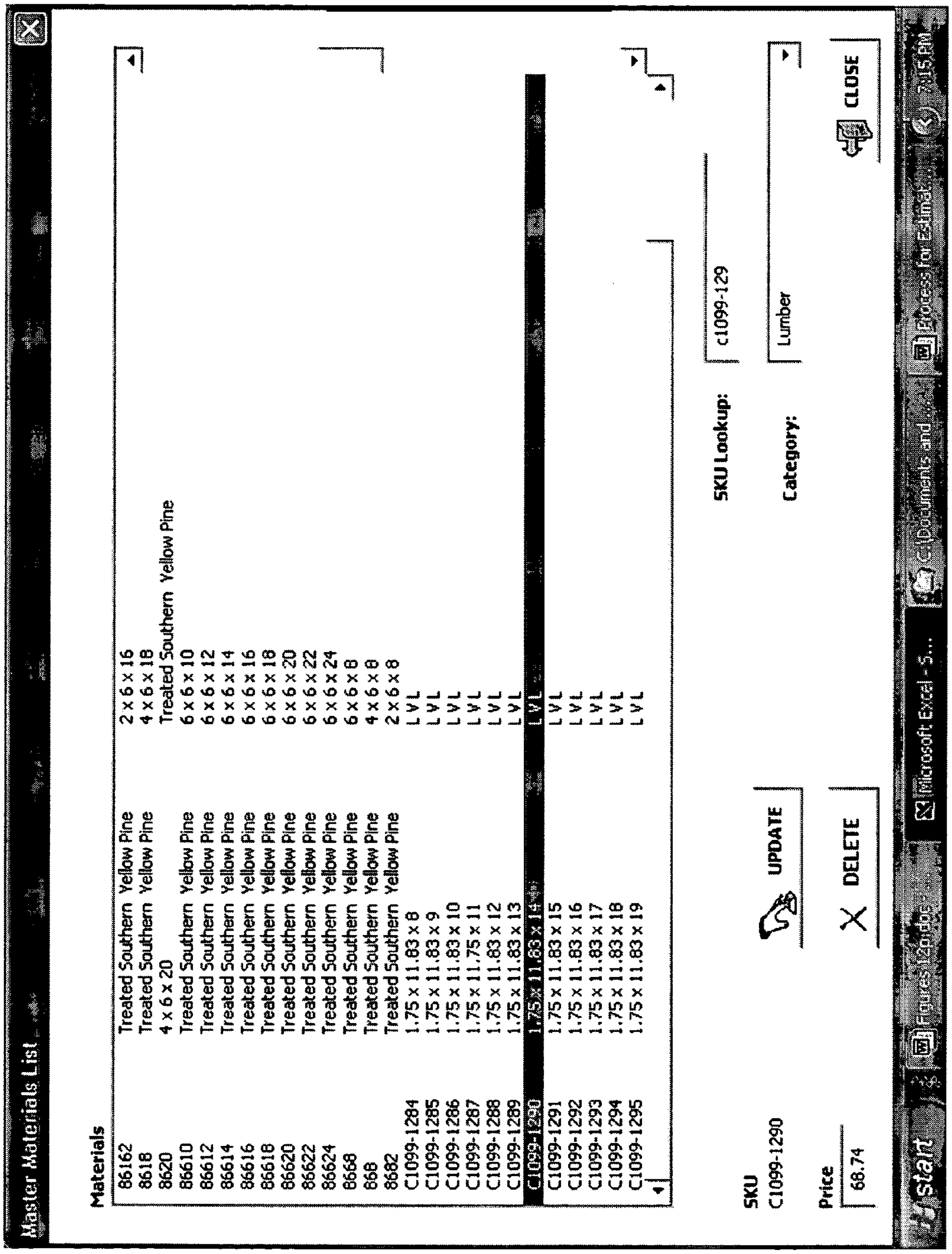
Figure 159:
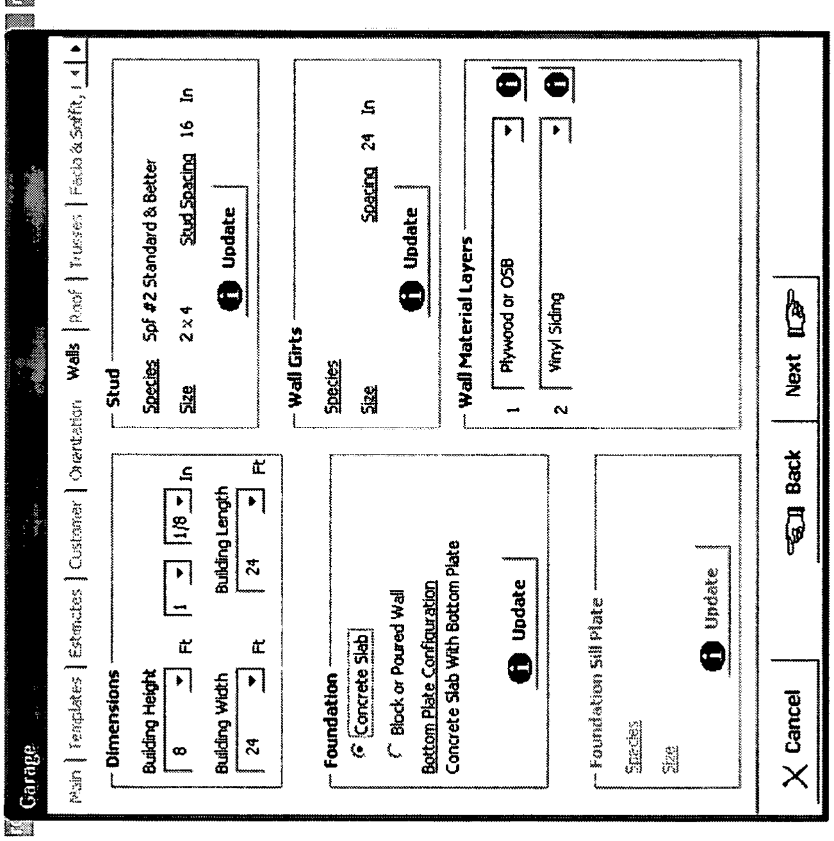
Figure 160:
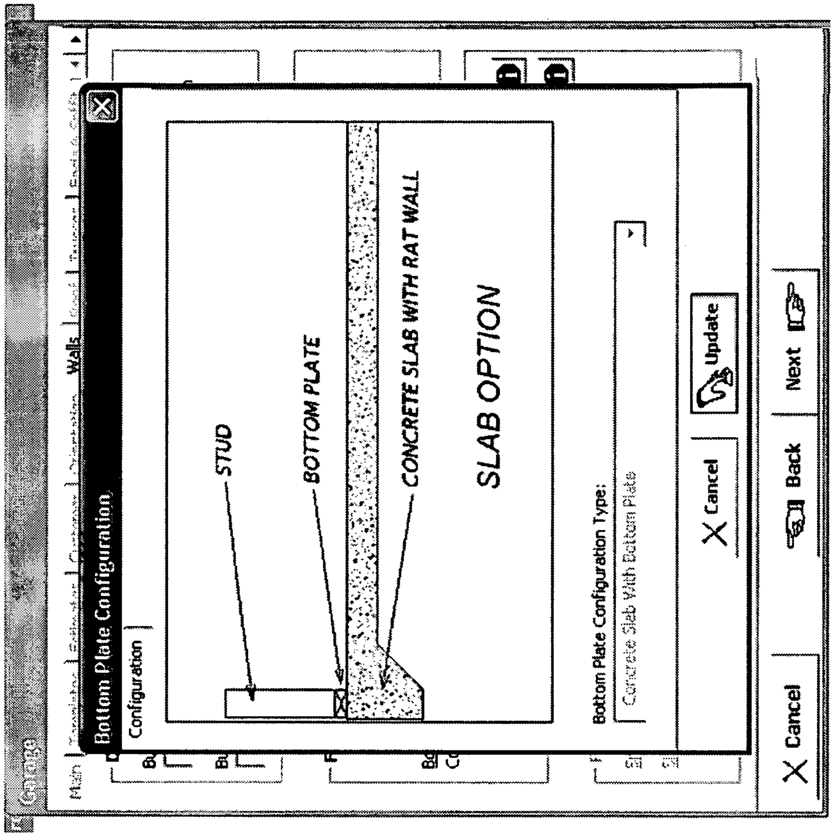
Figure 161:
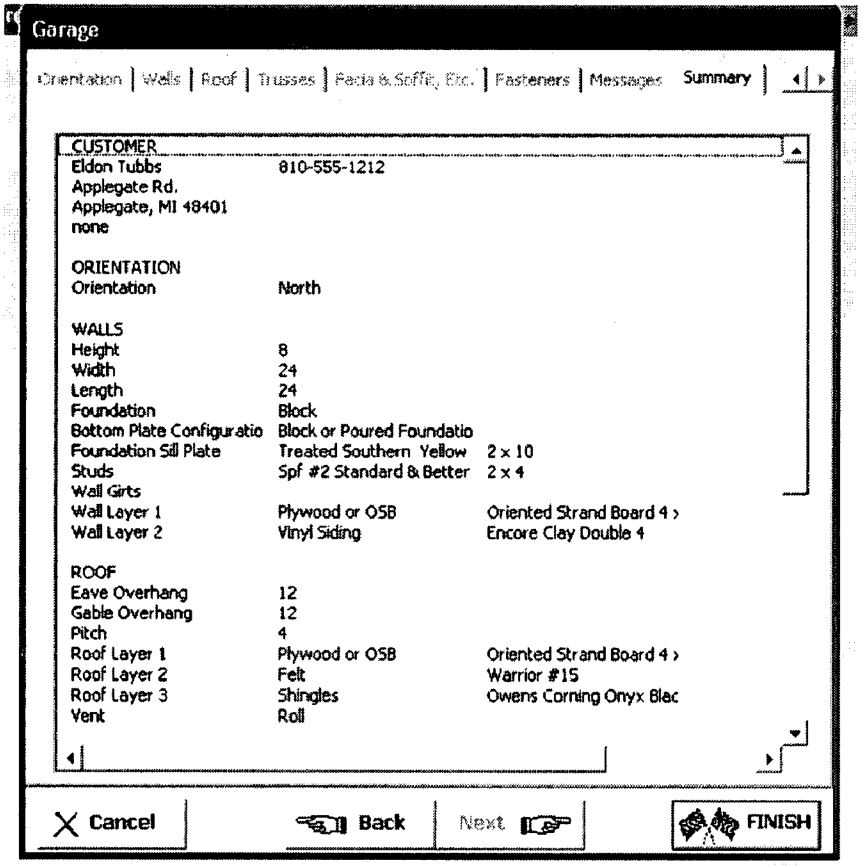
Figure 162:
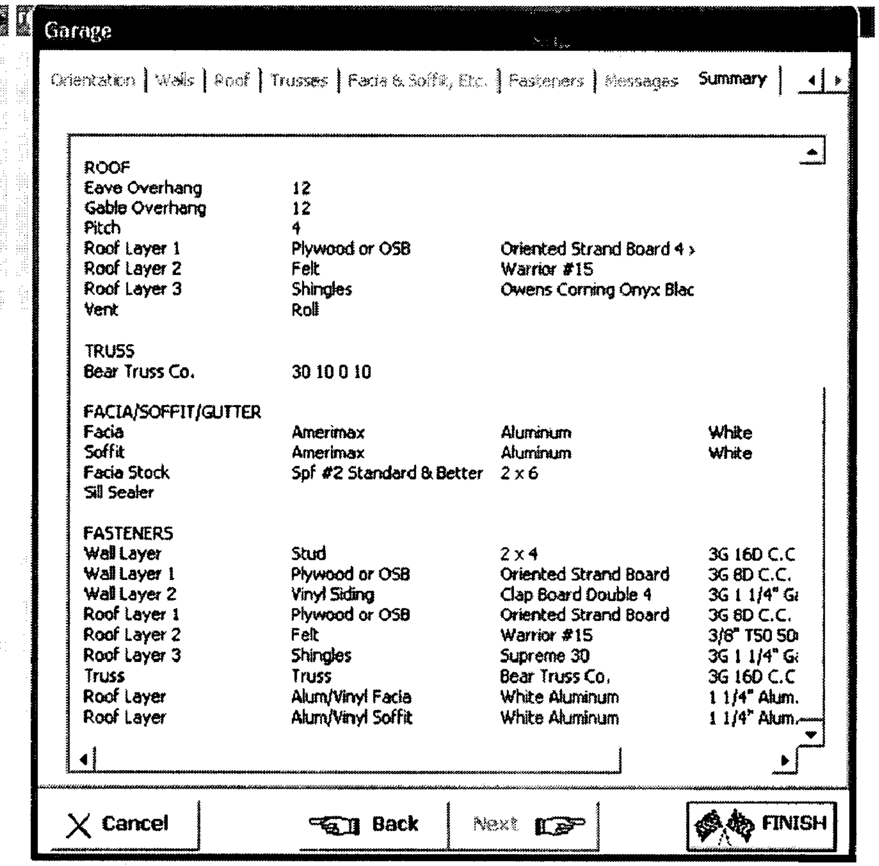

Selecting Master Materials List under Set Up permits the user to view, UPDATE or DELETE any of the thousands of individual building material items in Product Setup. See FIG. 154 for Category ALL. Other choices for Category will narrow the range of items displayed, for example, Plywood in FIG. 155 and Lumber in FIGS. 156-157. SKU Lookup can then be used with a SKU number (or part of one) to further refine the search. See FIG. 157. When the item of interest is located, the commands UPDATE for the Price or DELETE for the entire item can be executed. Note: for a given estimate, for example FIGS. 107-113, the Master Materials List for that estimate, or "MML," is drawn from the Master Materials List for the entire program. Referring to FIG. 114, a feature of the MML is that displaying the set of materials upon completing an estimate includes displaying the total cost of the trusses for the wood frame building. The cost of the trusses is a significant portion of the total cost estimated for the building, and in order for the estimate to be comprehensive, needs to be part of the information provided to the user. Referring to the post frame estimate of FIG. 107 and the stud frame estimate of FIG. 114, the estimates include displaying the quantity of cement for the wood frame building. Again, to provide a comprehensive set of materials to the user upon completion of the estimate, this important component of the building is needed. Referring to FIG. 110, the set of materials includes displaying the ratio of perforated soffit panels to solid soffit panels selected by the user as shown in FIGS. 42-43. Having the MML at the job site is beneficial to the building crew since it provides the documentation needed for properly fabricating the soffit according to its intended design and the materials that are supplied to the job site.

Referring to FIGS. 166-169, Wall Girt Views are shown displaying a plurality of wall girts of the wood frame building, and shading substantially every other wall girt. In this fashion, there is a visual separation of the various wall girts for the user, which is helpful for interpreting the relationship of the girts to one another and to other components of the building. The location of each wall girt becomes readily apparent to the user, which assists the building crew in fabricating the wall as well.

Referring to FIG. 116, a feature of the invention is that determining the set of materials includes determining that a first lumber component has an original board length sufficient for the length of the first lumber component as well as the length of a second lumber component. Upon making this determination, based on the relevant parameters of the building and the database of information about the set of raw and finished goods, the set of materials for the building is displayed in the MML. This includes information for the second lumber component that allows the user to observe that the first lumber component has an original board length sufficient for the length of the first and second lumber components. In other words, efficient use of lumber is promoted through the reduction of scrap boards. This is shown in FIG. 116 at, for example, "East Side—Gable Side 1" under Wall Girts, with "4" being the first lumber component and "5" being the second lumber component. The information concerning the second lumber component that informs the user of the ability to use up scrap lumber is the original board length as zero. Secondly, in column two entitled "Scrap Board Number," the identity of the first lumber component that the second one is to be cut from is shown as "Gable 14" meaning wall girt 4 of Gable Side 1. The first lumber component can be for the same wall as the second lumber component, as in this case, or for a different wall.

Referring to FIGS. 125-126, a feature of the invention is determining the nominal length dimensions for a plurality of metal panels for the walls. The nominal length dimensions can be the same as the intermediate dimensions for the plurality of metal panels before final trimming described above. The nominal length dimensions are sufficient for completing the fabrication of each metal panel. For instance, if a given metal panel is intended for use on a gable end, the nominal length dimension will be greater than the High Side dimension for the panel shown in FIGS. 123-124. The nominal length dimensions for all of the metal panels required for the building are displayed in the Steel Order Form of FIGS. 125-126.

Figure 137:
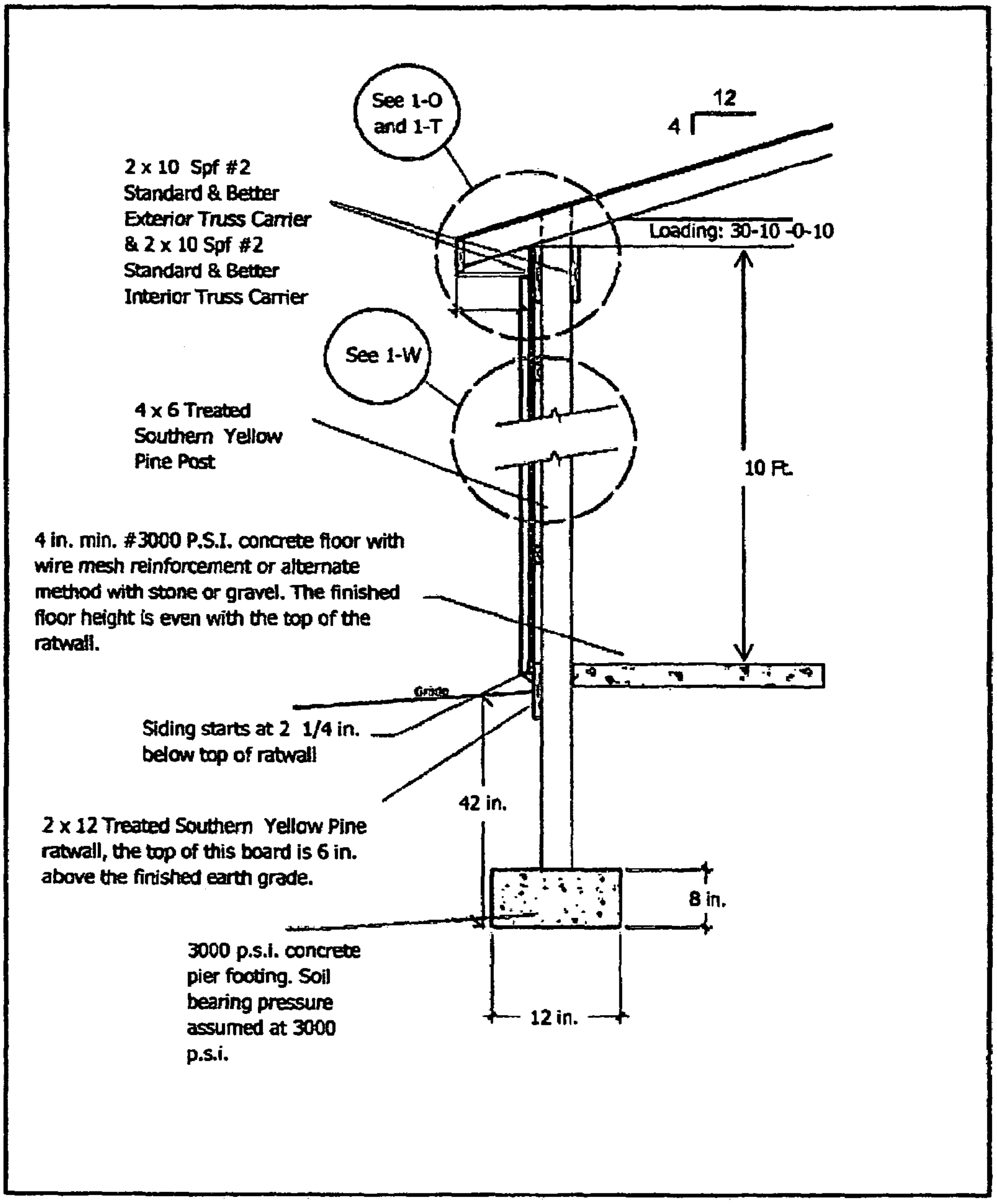
Figure 138:
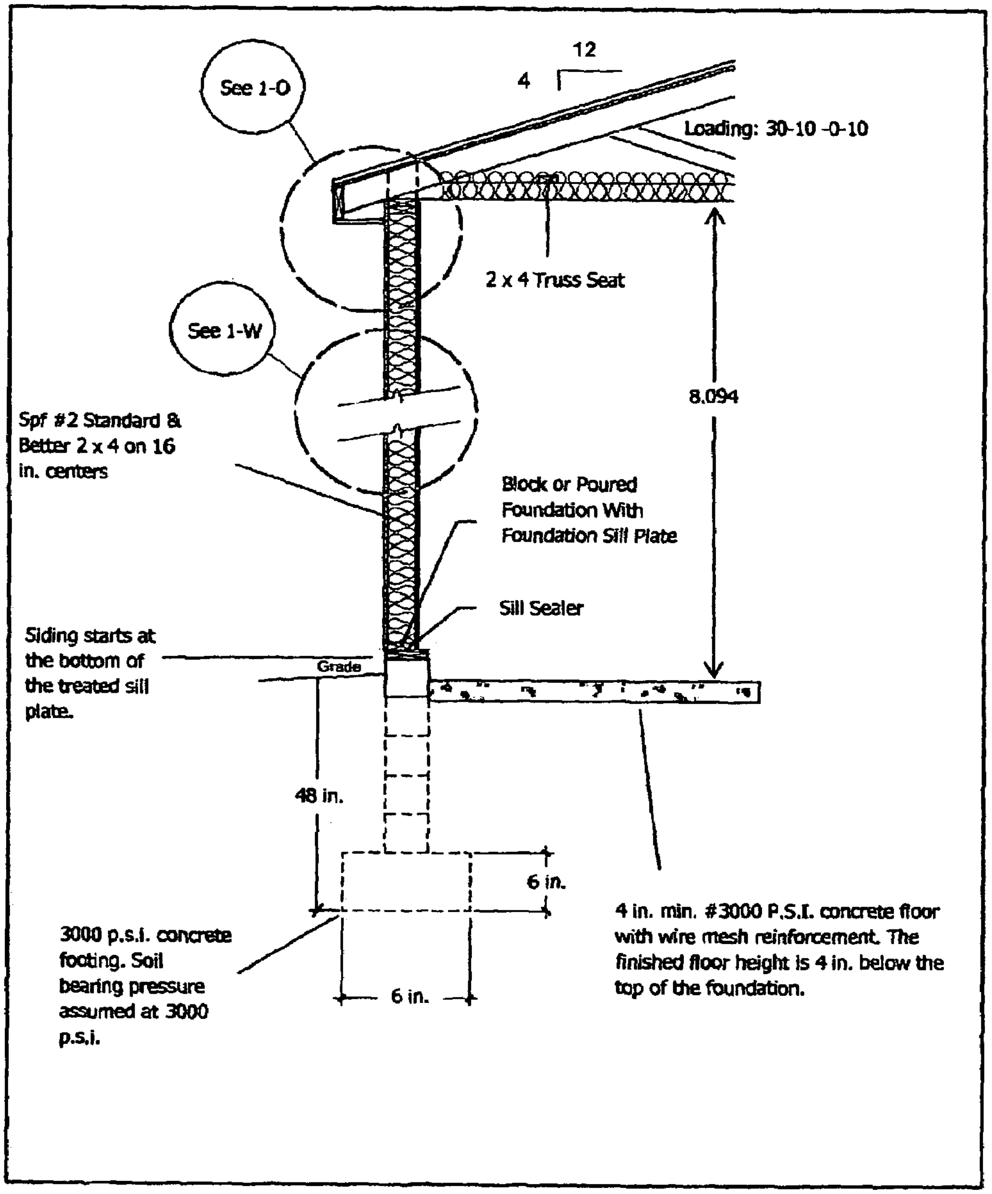

Referring to FIGS. 137-138, a feature of the invention is displaying the truss loading parameters selected by the user for the wood frame building. FIG. 137 shows a Pole Barn Cross Section. FIG. 138 shows a Garage Cross Section. These views show a plurality of parameters which are important to the design of the building, including the pitch of the roof, the truss loading parameters selected, the building height from the top of the finished floor to the bottom of the bottom chord of the trusses, the starting point for the siding, the finished floor height with respect to the top of the ratwall or top of the foundation, top of the ratwall relative to the finished earth grade, details for the foundation, etc. This information will be important when the building is inspected by the local building authorities, and the Cross Section views provide a useful summary for that occasion.

Figure 128:
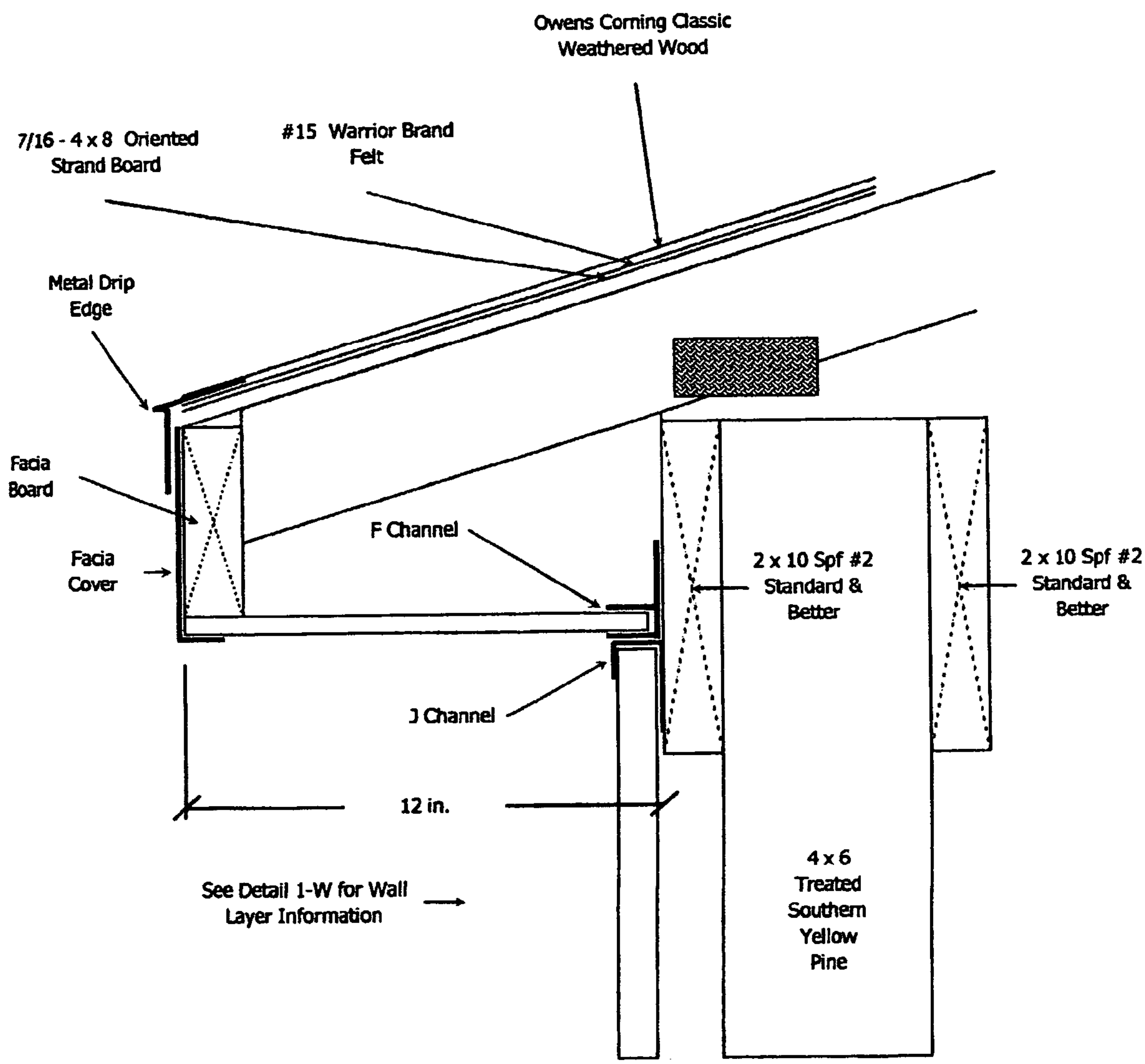
Figure 129:
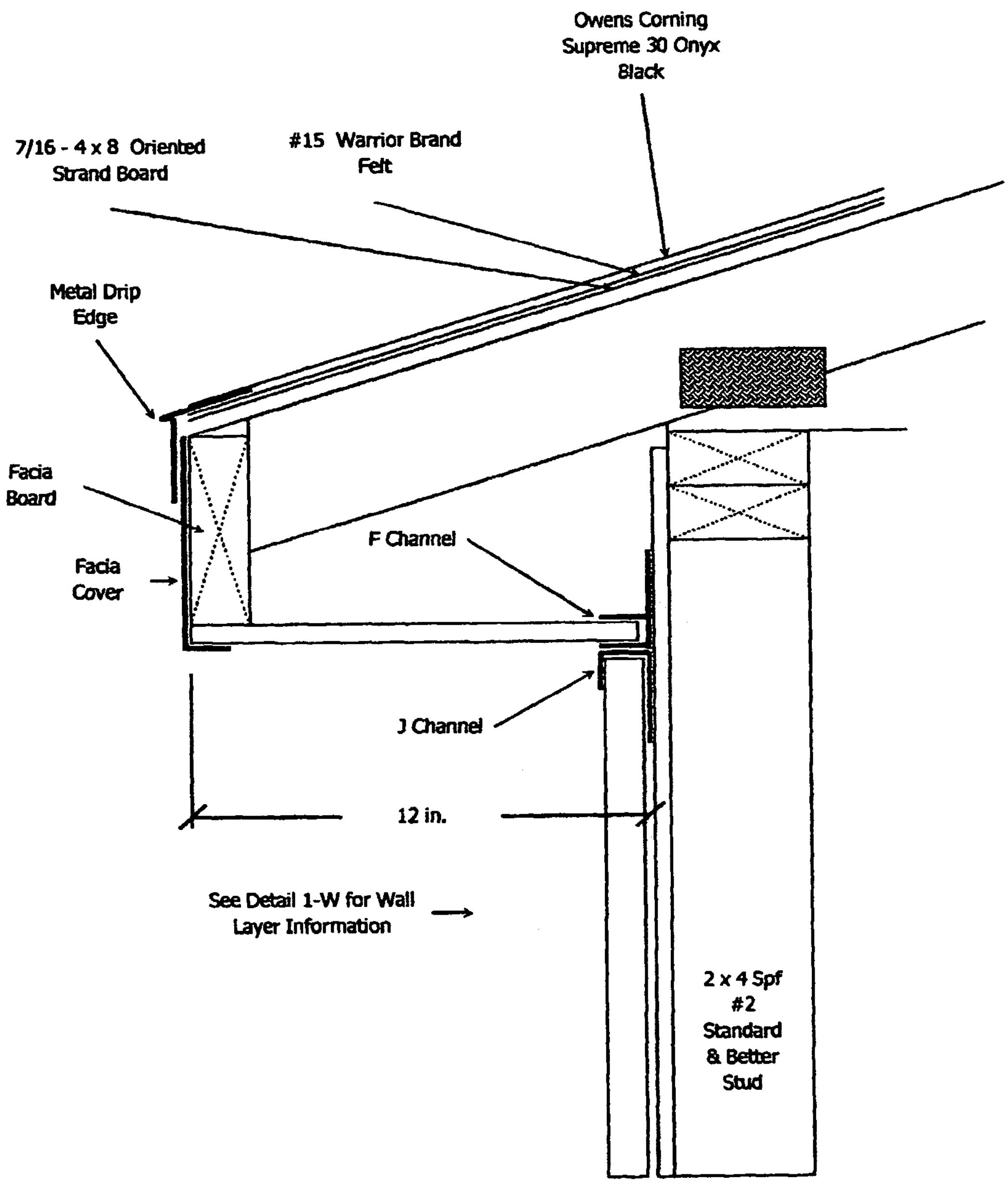

With reference to FIGS. 128-129, a feature of the invention is displaying a view of at least a portion of a plurality of components of the wood frame building near the top of a wall. In what is called the Overhang Detail, the user sees the proper placement and overlap for the Facia Cover, Facia Board, Metal Drip Edge, Felt, shingles, soffit F Channel, wall material, J Channel, etc. Furthermore the Overhang Detail displays the overhang distance by a roof of a wall for the wood frame building.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A computer-implemented method for determining a set of materials for constructing a wood frame building, comprising:

selecting a plurality of parameters for the wood frame building, including selecting a plurality of parameters for walls, selecting a plurality of parameters for a roof, selecting a plurality of parameters for at least one building opening and selecting a plurality of parameters for poles;

accessing a database having information about a set of raw and finished goods;

determining the set of materials based on the plurality of parameters for the wood frame building and the information about the set of raw and finished goods;

displaying the set of materials;

dynamically generating a visual model of at least one aspect of the wood frame building using the plurality of parameters for the wood frame building which have been selected; and displaying the visual model of at least one aspect of the wood frame building.

2. The computer-implemented method of claim 1, further wherein selecting a plurality of parameters for poles includes selecting a wood species, size and spacing for the poles.

3. The computer-implemented method of claim 1, further wherein selecting a plurality of parameters for poles includes selecting a spacing type for the poles.

4. The computer-implemented method of claim 1, wherein selecting a plurality of parameters for the wood frame building includes determining whether at least one selected parameter is within a range of selected values, the range of selected values having feasible alternatives for the at least one selected parameter, further wherein the range of selected values may be governed by at least one previously selected parameter; and if the at least one selected parameter is not within the range of selected values, indicating that the at least one selected parameter is not within the range of selected values.

5. The computer-implemented method of claim 4, further comprising, after indicating that the at least one selected parameter is not within the range of selected values, cyclically repeating the above steps until the at least one selected parameter is within the range of selected values.

6. The computer-implemented method of claim 5, further wherein the range of selected values includes feasible alternatives for numeric dimensions.

7. The computer-implemented method of claim 5, further wherein the range of selected values Includes feasible alternatives for materials.

8. The computer-implemented method of claim 5, further wherein the range of selected values may be governed by the information in the database concerning the existence of suitable goods in the database.

9. The computer-implemented method of claim 1, wherein displaying a visual model includes displaying a wall of the wood frame building having a plurality of metal panels, and displaying the location on the wall of each metal panel.

10. The computer-implemented method of claim 9, further comprising displaying an identity for each metal panel.

11. The computer-implemented method of claim 10, further comprising corresponding by identity each metal panel to a list of the plurality of metal panels, and displaying a parameter of each metal panel in the list.

12. The computer-implemented method of claim 9, further comprising indicating at least one building opening.

13. The computer-implemented method of claim 9, wherein selecting a plurality of parameters for walls includes selecting a layout for the plurality of metal panels, further wherein a metal panel has a nominal width and a longitudinal edge, and displaying the longitudinal edge aligned with a side of a gable end of the wood frame building.

14. The computer-implemented method of claim 9, wherein selecting a plurality of parameters for walls includes selecting a layout for the plurality of metal panels, further wherein a metal panel has a nominal width and a longitudinal edge, and displaying the longitudinal edge aligned with a peak of a gable end of the wood frame building.

15. The computer-implemented method of claim 9, wherein displaying the set of materials further comprises displaying a height of an eave side metal panel, wherein the height is a final dimension of the eave side metal panel prior to attaching the eave side metal panel to the wood frame building.

16. The computer-implemented method of claim 1, wherein displaying a visual model includes displaying an individual metal panel for a wall of the wood frame building and displaying the final dimensions of the individual metal panel.

17. The computer-implemented method of claim 1, wherein displaying a visual model includes displaying a floor plan of the wood frame building and indicating in the floor plan the location, height and width of an overhead door for the wood frame building.

18. The computer-implemented method of claim 1, wherein displaying a visual model includes displaying a floor plan of the wood frame building and indicating in the floor plan substantially the distance between opposite corners of the wood frame building.

19. The computer-implemented method of claim 1, wherein displaying a visual model includes displaying a wall of the wood frame building having a horizontally oriented member, and displaying the original board length of the horizontally oriented member upon the horizontally oriented member wherein the original board length is the length of the lumber component as supplied and before the lumber component is cut to a selected length.

20. The computer-implemented method of claim 1, wherein displaying the set of materials includes displaying the original board length of a lumber component, wherein the original board length is the length of the lumber component as supplied and before the lumber component is cut to a selected length.

21. The computer-implemented method of claim 1, wherein displaying a visual model comprises displaying a wall of the wood frame building having a plurality of vertically oriented poles, wherein the plurality of vertically oriented poles have sides facing the wall, and displaying the sides facing the wall in proportion to the dimensions of the sides facing the wall.

22. The computer-implemented method of claim 1, wherein displaying a visual model includes displaying a distance substantially between each of a plurality of poles for a wall, wherein the sum of the distance substantially between each of the plurality of poles for the wall is equal to the nominal building dimension for the wall minus the combined nominal thicknesses of two wall girts.

23. The computer-implemented method of claim 1, wherein displaying a visual model includes displaying a distance between the opposite sides of poles for a wall, wherein the poles are respectively at each side of the wall, further wherein the distance is the nominal building dimension for the wall minus the combined nominal thicknesses of two wall girts.

24. The computer-implemented method of claim 1, wherein displaying the set of materials includes displaying the total cost of the trusses for the wood frame building.

25. The computer-implemented method of claim 1, wherein displaying the set of materials includes displaying the quantity of cement for the wood frame building.

26. The computer-implemented method of claim 1, wherein displaying the set of materials includes displaying the ratio of perforated soffit panels to solid soffit panels selected by the user.

27. The computer-implemented method of claim 1, wherein displaying a visual model comprises displaying a plurality of wall girts of the wood frame building, and shading substantially every other wall girt, wherein the location of each wall girt is readily apparent to the user.

28. The computer-implemented method of claim 1, wherein determining the set of materials includes determining that a first lumber component has an original board length sufficient for the length of the first lumber component and the length of a second lumber component, and further wherein displaying the set of materials includes displaying information for the second lumber component wherein the user can observe that the first lumber component has an original board length sufficient for the length of the first and second lumber components, wherein efficient use of lumber is promoted.

29. The computer-implemented method of claim 1, wherein determining the set of materials includes determining the nominal length dimensions for a plurality of metal panels for the walls, wherein the nominal length dimensions are sufficient for completing the fabrication of each metal panel, and further wherein displaying the set of materials includes displaying the nominal length dimensions.

30. The computer-implemented method of claim 1, wherein displaying a visual model comprises displaying the truss loading parameters selected for the wood frame building.

31. The computer-implemented method of claim 1, wherein displaying a visual model comprises displaying a vertical distance from a reference point to a bottom edge of a metal panel when the metal panel is attached to the wood frame building.

32. The computer-implemented method of claim 31, wherein the reference point is a top surface of a skirt board attached to a wall of the wood frame building.

33. The computer-implemented method of claim 1, wherein displaying a visual model comprises displaying a vertical distance from a reference point to a top surface of a finished floor of the wood frame building.

34. The computer-implemented method of claim 33, wherein the reference point is a top surface of a skirt board attached to a wall of the wood frame building.

35. The computer-implemented method of claim 1, wherein displaying a visual model comprises displaying a vertical distance from a reference point to a top surface of a finished earth grade of the wood frame building.

36. The computer-implemented method of claim 35, wherein the reference point is a top surface of a skirt board attached to a wall of the wood frame building.

37. The computer-implemented method of claim 1, wherein displaying a visual model comprises displaying a vertical distance from a reference point to a top surface of a skirt board attached to a wall of the wood frame building.

38. The computer-implemented method of claim 1, wherein displaying a visual model comprises displaying a view of at least a portion of a plurality of components of the wood frame building near the top of a wall.

39. The computer-implemented method of claim 1, wherein displaying a visual model comprises displaying an overhang distance by a roof of a wall for the wood frame building.

40. The computer-implemented method of claim 1, wherein determining the set of materials comprises selecting goods for the set of materials from the set of raw and finished goods according to a predetermined order of preference.

41. The computer-implemented method of claim 1, wherein selecting a plurality of parameters for poles includes selecting a wood species for the poles.

42. The computer-implemented method of claim 1, wherein selecting a plurality of parameters for poles includes selecting a parameter for corner poles independently from selecting the parameter for intermediate poles.

43. The computer-implemented method of claim 1, wherein selecting a plurality of parameters for poles includes selecting a wood species for corner poles independently from selecting the wood species for intermediate poles.

44. The computer-implemented method of claim 1, wherein selecting a plurality of parameters for poles includes selecting a size for the poles.

45. The computer-implemented method of claim 1, wherein selecting a plurality of parameters for poles includes selecting a spacing for the poles.

46. The computer-implemented method of claim 1, wherein selecting a plurality of parameters for poles includes selecting a spacing for the poles for a gable side of the wood frame building independently from selecting the spacing for the poles for an eave side of the wood frame building.

47. The computer-implemented method of claim 1, wherein selecting a plurality of parameters for poles includes selecting a pole orientation for the poles.

48. The computer-implemented method of claim 1, wherein selecting a plurality of parameters for poles includes selecting using overhead plug poles.

49. The computer-implemented method of claim 1, wherein determining the set of materials comprises calculating the number of poles spaced substantially evenly and not greater apart than a selected pole spacing increment to cover a space between a side of the wood frame building and an adjacent side of an adjacent opening of the wood frame building; and using the number of poles for the set of materials;

wherein the placement of an opening pole of the wood frame building at the adjacent side of the adjacent opening is used in determining the placement of a nonopening pole of the wood frame building.

50. The computer-implemented method of claim 49, wherein determining the set of materials further comprises determining the number of poles spaced substantially evenly and not greater apart than a selected pole spacing increment to cover a space between an opposite side of the wood frame building and an opposite side of the adjacent opening.

51. The computer-implemented method of claim 1, wherein determining the set of materials comprises determining a spacing for poles on a side of the wood frame building having openings by dividing a space between adjacent sides of adjacent openings substantially evenly, wherein a spacing for poles specified by the user is not exceeded; and using the spacing for poles on the side of the wood frame building having openings for the set of materials;

wherein opening poles of the wood frame building are used as part of the configuration for intermediate poles of the wood frame building.

52. The computer-implemented method of claim 1, wherein determining the set of materials comprises determining a spacing for poles on a side of the wood frame building having no openings by dividing a space between left and right sides of the wood frame building substantially evenly, wherein a spacing for poles specified by the user is not exceeded; and using the spacing for poles on the side of the wood frame building having no openings for the set of materials.

53. The computer-implemented method of claim 1, wherein selecting a plurality of parameters for poles includes selecting a spacing for the poles for an eave side of the wood frame building, wherein the spacing for the poles does not equal the spacing for the trusses of the wood frame building.

54. The computer-implemented method of claim 1, wherein displaying a visual model includes displaying a location on the roof of the visual model for a plurality of plywood sheets used in the set of materials.

55. The computer-implemented method of claim 1, wherein displaying a visual model includes displaying a number of plywood sheets used for the roof in the set of materials.

56. The computer-implemented method of claim 1, wherein displaying a visual model comprises displaying a plurality of purlins for the roof of the wood frame building, and shading substantially every other purlin, wherein the location of each purlin is readily apparent to the user.

57. The computer-implemented method of claim 1, wherein displaying a visual model comprises selecting a final elevation view of a side of the wood frame building, and displaying a selected exposed wall material layer in the final elevation view.

58. The computer-implemented method of claim 57, wherein displaying a visual model further comprises displaying a selected roofing material layer in the final elevation view.

59. The computer-implemented method of claim 1, wherein displaying the set of materials further comprises displaying a height of an eave side metal panel, wherein the height is a final dimension of the eave side metal panel prior to attaching the eave side metal panel to the wood frame building.

60. A computer program product comprising a computer usable medium having computer readable program code means embodied in the medium for causing an application program to execute on a computer that determines a set of materials for constructing a wood frame building, the computer readable program code means comprising:

first computer readable program code means for causing the computer to select a plurality of parameters for the wood frame building, including select a plurality of parameters for walls, select a plurality of parameters for a roof, select a plurality of parameters for at least one building opening and select a plurality of parameters for poles;

second computer readable program code means for causing the computer to access a database having information about a set of raw and finished goods;

third computer readable program code means for causing the computer to determine the set of materials based on the plurality of parameters for the wood frame building and the information about the set of raw and finished goods;

fourth computer readable program code means for causing the computer to display the set of materials;

fifth computer readable program code means for causing the computer to dynamically generate a visual model of at least one aspect of the wood frame building using the plurality of parameters for the wood frame building which have been selected; and sixth computer readable program code means for causing the computer to display the visual model of at least one aspect of the wood frame building.

61. A computer-implemented method for determining a set of materials for constructing a wood frame building, comprising:

selecting a plurality of parameters for the wood frame building, including selecting a plurality of parameters for walls, selecting a plurality of parameters for a roof, selecting a plurality of parameters for at least one building opening and selecting a plurality of parameters for poles;

accessing a database having information about a set of raw and finished goods;

determining the set of materials based on the plurality of parameters for the wood frame building and the information about the set of raw and finished goods;

displaying the set of materials;

displaying a visual model of at least one aspect of the wood frame building, wherein displaying a visual model includes providing a scroll bar, wherein the scroll bar is operable for relocating an opening of the wood frame building to a new location; and displaying the opening in the new location.

* * * * *